United States Patent
Kataoka et al.

(10) Patent No.: US 9,709,892 B2
(45) Date of Patent: Jul. 18, 2017

(54) ACTINIC-RAY- OR RADIATION-SENSITIVE RESIN COMPOSITION AND METHOD OF FORMING PATTERN USING THE SAME

(75) Inventors: Shohei Kataoka, Shizuoka (JP); Kaoru Iwato, Shizuoka (JP); Sou Kamimura, Shizuoka (JP); Toru Tsuchihashi, Shizuoka (JP); Yuichiro Enomoto, Shizuoka (JP); Kana Fujii, Shizuoka (JP); Kazuyoshi Mizutani, Shizuoka (JP); Shinji Tarutani, Shizuoka (JP); Keita Kato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 38 days.

(21) Appl. No.: 13/637,269

(22) PCT Filed: Mar. 25, 2011

(86) PCT No.: PCT/JP2011/058371
§ 371 (c)(1),
(2), (4) Date: Sep. 25, 2012

(87) PCT Pub. No.: WO2011/118853
PCT Pub. Date: Sep. 29, 2011

(65) Prior Publication Data
US 2013/0017377 A1 Jan. 17, 2013

(30) Foreign Application Priority Data
Mar. 26, 2010 (JP) ................................. 2010-072840

(51) Int. Cl.
| | | |
|---|---|---|
| *G03F 7/30* | (2006.01) | |
| *G03F 7/039* | (2006.01) | |
| *G03F 7/075* | (2006.01) | |
| *C08F 220/28* | (2006.01) | |
| *G03F 7/004* | (2006.01) | |
| *G03F 7/20* | (2006.01) | |
| *G03F 7/32* | (2006.01) | |
| *G03F 7/038* | (2006.01) | |
| *C08F 232/08* | (2006.01) | |

(52) U.S. Cl.
CPC .............. *G03F 7/30* (2013.01); *C08F 220/28* (2013.01); *G03F 7/0045* (2013.01); *G03F 7/039* (2013.01); *G03F 7/0397* (2013.01); *G03F 7/0758* (2013.01); *G03F 7/2041* (2013.01); *G03F 7/325* (2013.01); *C08F 232/08* (2013.01); *G03F 7/0382* (2013.01); *Y10T 428/24802* (2015.01)

(58) Field of Classification Search
CPC .................... G03F 7/0382; G03F 7/0392
See application file for complete search history.

(56) References Cited

U.S. PATENT DOCUMENTS

| | | | |
|---|---|---|---|
| 6,171,755 B1 * | 1/2001 | Elian et al. ................. | 430/270.1 |
| 8,017,298 B2 | 9/2011 | Tsubaki | |
| 8,088,550 B2 * | 1/2012 | Tarutani et al. ........... | 430/270.1 |
| 8,088,557 B2 | 1/2012 | Tsubaki | |
| 8,088,564 B2 * | 1/2012 | Abdallah et al. ............. | 430/323 |
| 8,227,183 B2 | 7/2012 | Tsubaki et al. | |
| 8,658,346 B2 * | 2/2014 | Watanabe et al. ............ | 430/312 |
| 8,951,718 B2 | 2/2015 | Tsubaki et al. | |
| 9,291,904 B2 | 3/2016 | Tsubaki et al. | |
| 9,465,298 B2 | 10/2016 | Tsubaki et al. | |
| 2004/0053161 A1 * | 3/2004 | Kanna et al. ............... | 430/270.1 |
| 2006/0210916 A1 * | 9/2006 | Yamazaki et al. ......... | 430/270.1 |
| 2008/0187860 A1 | 8/2008 | Tsubaki et al. | |
| 2008/0318171 A1 | 12/2008 | Tsubaki | |
| 2009/0035692 A1 | 2/2009 | Tarutani et al. | |
| 2009/0181325 A1 * | 7/2009 | Takeshita ................... | 430/285.1 |
| 2009/0317744 A1 | 12/2009 | Fuji et al. | |
| 2010/0047710 A1 | 2/2010 | Yamagishi et al. | |
| 2011/0076625 A1 | 3/2011 | Tsubaki | |
| 2012/0058436 A1 | 3/2012 | Tsubaki et al. | |
| 2012/0315449 A1 | 12/2012 | Tsubaki et al. | |
| 2015/0079522 A1 | 3/2015 | Tsubaki et al. | |
| 2016/0103395 A1 | 4/2016 | Tsubaki et al. | |
| 2016/0349619 A1 | 12/2016 | Tsubaki et al. | |

FOREIGN PATENT DOCUMENTS

| | | |
|---|---|---|
| EP | 2 020 615 A1 | 2/2009 |
| JP | 9-50126 A | 2/1997 |
| JP | 2003-5374 A | 1/2003 |
| JP | 2005-70327 A | 3/2005 |
| JP | 2006-251761 A | 9/2006 |
| JP | 2006-276458 A | 10/2006 |

(Continued)

OTHER PUBLICATIONS

English translation of JP,2009-025723, A (2009) from machine translation from AIPN Japan Patent Office National Center for Industrial Property Information and Training, generated May 23, 2-14, pp. 1-50 plus 1-33.*

Camphorsulfonic acid—Wikipedia, the free encyclopedia, three pages, Retrieved from "http://en.wikipedia.org/w/index.php?title=Camphorsulfonic_acid&oldid=612870791" Categories: Sulfonic acids, page was last modified on Jun. 14, 2014.*

Thackeray et al, SPIE, vol. 2438 pp. 73-83 from vol. 2438, Advances in Resist Technology and Processing XII, ed. Robert D. Allen, Santa Clara, CA | Feb. 19, 1995.*

(Continued)

*Primary Examiner* — Cynthia Hamilton
(74) *Attorney, Agent, or Firm* — Sughrue Mion, PLLC

(57) ABSTRACT

Provided is an actinic-ray- or radiation-sensitive resin composition and a method of forming a pattern using the same, ensuring excellent the etching resistivity and the stability during a post-exposure delay (PED) period. The composition contains a resin containing a repeating unit containing a group that is decomposed when acted on by an acid to thereby produce an alcoholic hydroxyl group, and a compound that generates an acid of $pKa \geq -1.5$ when exposed to actinic rays or radiation.

9 Claims, No Drawings

(56) References Cited

FOREIGN PATENT DOCUMENTS

| JP | 2008-203639 | A |   | 9/2008 |
|----|-------------|---|---|--------|
| JP | 2008-309879 | A |   | 12/2008 |
| JP | 2008292975  | A |   | 12/2008 |
| JP | 2009-025723 | A |   | 2/2009 |
| JP | 2009-025723 | A | * | 2/2009 |
| JP | 2009-53688  | A |   | 3/2009 |
| JP | 2009-193041 | A |   | 8/2009 |
| JP | 2009-258585 | A |   | 11/2009 |
| JP | 2009-258586 | A |   | 11/2009 |
| JP | 2009-282224 | A |   | 12/2009 |
| TW | 200831546   | A |   | 8/2008 |
| TW | 201002744   | A |   | 1/2010 |

OTHER PUBLICATIONS

CAS Registry No. 25601-74-5 and Scifinder database information for this cas registry number downloaded Nov. 17, 2014.*
English translation of JP, 2005-070327, A (2005) from machine translation from AIPN Japan Patent Office National Center for Industrial Property Information and Training, generated Nov. 17, 2014, 109 pages.*
Reijenga et al "Review: Development of Methods for the Determination of pKa Values", Analytical CHemistry Insights, vol. 8, 2013, published online Aug. 8, 2013 pp. 53-71.*
Manchester et al , "Evaluation of pKa Estmimation Methods on 2011 Druglike Compounds", J. CHemis. Inf. MOdel, 2010, 50, pp. 565-571, published on the Web Mar. 12, 2010, American Chemical Society.*
Cameron et al, "Impact of Photoacid Generator Structure on DUV Resist Performance", SPIE Conference on Advances in Resist Technology and PRocessing XVI, Santa Clara, California, Mar. 1999, SPIE vol. 3678, pp. 85-99.*
"Acetic acid | C2H4)2 -Pub Chem" downloaded Aug. 9, 2015, pp. 1 of 111, 15 of 111, 16 of 111, 104 of 111, 109 of 111 to 111 of 111.*
Lamanna et al "New ionic photo-acid generators (PAGs) incorporating novel perfluorinated anions", Advances in Resist Technology and Processing XIX, Theodore H. Fedynyshyn, Editor, Proceedings of SPIE vol. 4690 (2002) © 2002 SPIE • 0277-786X/02.*
"Imidic acids" PAC, 1995, 67, 1307 (Glossary of class names of organic compounds and reactivity intermediates based on structure (IUPAC Recommendations 1995)) on p. 1342.*
Japanese Office Action issued in corresponding application No. 2010-072840 dated Jan. 21, 2014.
Japanese Office Action issued in corresponding Application No. 2010-072840 dated May 28, 2013.
Chinese Office Action issued corresponding application No. 201180015971.8 dated Jan. 30, 2014.
Taiwanese Office Action issued in corresponding application No. 100110146 dated Dec. 30, 2014.
Korean Office Action dated Jul. 9, 2015 issued in application No. 2012-7025157.
Singapore Office Action dated Jun. 2, 2015 issued in application No. 2012071619.
Taiwanese Office Action dated Jun. 2, 2015 issued in application No. 100110146.
Communication dated Nov. 10, 2015 from the Korean Patent Office in counterpart application No. 2012-7025157.
Communication dated Sep. 20, 2016, issued by the Korean Intellectual Property Office in corresponding Korean Application No. 10-2012-7025157.
Communication dated Apr. 26, 2017, from the Korean Intellectual Property Office in counterpart Korean application No. 10-2016-7003431.

* cited by examiner

ACTINIC-RAY- OR RADIATION-SENSITIVE RESIN COMPOSITION AND METHOD OF FORMING PATTERN USING THE SAME

CROSS REFERENCE TO RELATED APPLICATIONS

This application is based upon and claims the benefit of priority from Japanese Patent Application No. 2010-072840, filed Mar. 26, 2010; the entire contents of which are incorporated herein by reference.

TECHNICAL FIELD

The present invention relates to an actinic-ray- or radiation-sensitive resin composition and a method of forming a pattern using the same. More specifically, the present invention relates to a composition and a method of forming a pattern therewith that is suitable for use in lithography operations employed in a semiconductor production process for an IC or the like, the production of a circuit board for a liquid crystal, a thermal head or the like and other photofabrication. Further more specifically, the present invention relates to a composition and a method of forming a pattern therewith that is suitable for exposure using an ArF exposure apparatus, ArF liquid-immersion projection exposure apparatus or EUV exposure apparatus in which a far-ultraviolet light of wavelength 300 nm or shorter is employed as a light source, and relates to a composition for use in the method.

In the present invention, the terms "actinic rays" and "radiation" mean, for example, a mercury lamp bright line spectrum, far ultraviolet rays represented by an excimer laser, extreme ultraviolet rays, X-rays, electron beams and the like. In the present invention, the term "light" means actinic rays or radiation.

The expression "exposure" used herein, unless otherwise noted, means not only light irradiation using a mercury lamp, far ultraviolet, X-rays, EUV light, etc. but also lithography using particle beams, such as an electron beam and an ion beam.

BACKGROUND ART

Since the emergence of the resist for a KrF excimer laser (248 nm), it has been of common practice to employ a pattern forming method in which chemical amplification is utilized in order to compensate for any sensitivity decrease caused by light absorption. For example in a positive chemical amplification method, first, a photoacid generator contained in exposed areas is decomposed by light irradiation to thereby generate an acid. Then, in the stage of, for example, the bake after the exposure (Post-Exposure Bake: PEB), the generated acid exerts a catalytic action so that the alkali-insoluble group contained in the photosensitive composition is converted to an alkali-soluble group. Thereafter, development is carried out using, for example, an alkali solution. Thus, the exposed areas are removed to obtain a desired pattern.

For use in the above method, various alkali developers have been proposed. For example, an aqueous alkali developer containing 2.38 mass % TMAH (aqueous solution of tetramethylammonium hydroxide) is generally used.

The wavelength shortening of the exposure light source and the realization of high numerical apertures (high NA) for projector lenses have been advanced in order to cope with the miniaturization of semiconductor elements. To now, an exposure unit using an ArF excimer laser of 193 nm wavelength as a light source has been developed. Further, a method in which the space between a projector lens and a sample is filled with a liquid of high refractive index (hereinafter also referred to as an "immersion liquid"), namely liquid-immersion method has been proposed as a technology for enhancing the resolving power. Still further, an EUV lithography in which exposure is carried out using an ultraviolet of further shorter wavelength (13.5 nm) has been proposed.

However, the current situation is that it is extremely difficult to discover an appropriate combination of resist composition, developer, rinse liquid, etc., required for the formation of a pattern realizing comprehensively excellent performance. In particular, in accordance with the decrease of the resolved line width of resists, there is a demand for an enhancement of line pattern roughness performance and an enhancement of pattern dimension in-plane uniformity.

In this current situation, in recent years, various formulations have been proposed as a positive resist composition (see, for example, patent references 1 to 4). Moreover, the development of negative resist compositions for use in the pattern formation by alkali development is progressing (see, for example, patent references 5 to 8). These reflect the situation in which in the production of semiconductor elements and the like, while there is a demand for the formation of a pattern with various configurations, such as a line, a trench and a hole, there exist patterns whose formation is difficult with the use of current positive resists.

In recent years, also, a pattern forming method using a negative developer, namely, a developer containing an organic solvent is being exploited (see, for example, patent references 9 to 11). For example, patent reference 11 discloses a pattern forming method comprising the operations of applying onto a substrate a positive resist composition that when exposed to actinic rays or radiation, increases its solubility in a positive developer and decreases its solubility in a negative developer, exposing the applied resist composition and developing the exposed resist composition using a negative developer. This method realizes the stable formation of a high-precision fine pattern.

However, as for the composition described above, there is still a demand for further enhancements of the etching resistivity and the stability during a post-exposure delay (PED) period from exposure to post-bake.

PRIOR ART REFERENCE

Patent reference

Patent reference 1: Jpn. Pat. Appln. KOKAI Publication No. (hereinafter referred to as JP-A-) 2008-203639,
Patent reference 2: JP-A-2007-114613,
Patent reference 3: JP-A-2006-131739,
Patent reference 4: JP-A-2000-122295,
Patent reference 5: JP-A-2006-317803,
Patent reference 6: JP-A-2006-259582,
Patent reference 7: JP-A-2006-195050,
Patent reference 8: JP-A-2000-206694,
Patent reference 9: JP-A-2008-281974,
Patent reference 10: JP-A-2008-281975, and
Patent reference 11: JP-A-2008-292975.

DISCLOSURE OF INVENTION

It is an object of the present invention to provide an actinic-ray- or radiation-sensitive resin composition and a method of forming a pattern using the same, ensuring excellent the etching resistivity and the stability during a post-exposure delay (PED) period.

Some aspects of the present invention are as follows.

[1] An actinic-ray- or radiation-sensitive resin composition comprising: a resin containing a repeating unit containing a group that is decomposed when acted on by an acid to thereby produce an alcoholic hydroxyl group; and a compound that generates an acid of pKa≥−1.5 when exposed to actinic rays or radiation.

[2] The composition according to [1], wherein the acid generated by the compound is at least one member selected from the group consisting of a sulfonic acid, a carboxylic acid, an imidic acid, and a methide acid.

[3] The composition according to [1] or [2], wherein the acid generated by the compound is expressed by any one of general formulae (B-1) to (B-3) below:

$R_B$—SO$_3$H  (B-1)

$R_B$—COOH  (B-2)

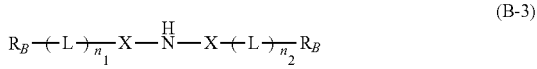

(B-3)

in which $R_B$, or each of $R_B$s independently, represents a monovalent organic group, provided that in general formula (B-3), two $R_B$s may be bonded to each other to thereby form a ring;

each of X's independently represents —CO—, —SO$_2$— or —SO—;

L, or each of L's independently, represents a bivalent connecting group; and each of $n_1$ and $n_2$ independently is 0 or 1.

[4] The composition according to any of [1] to [3], wherein the group that is decomposed when acted on by an acid to thereby produce an alcoholic hydroxyl group is expressed by at least one selected from the group consisting of general formulae (II-1) to (II-4) below:

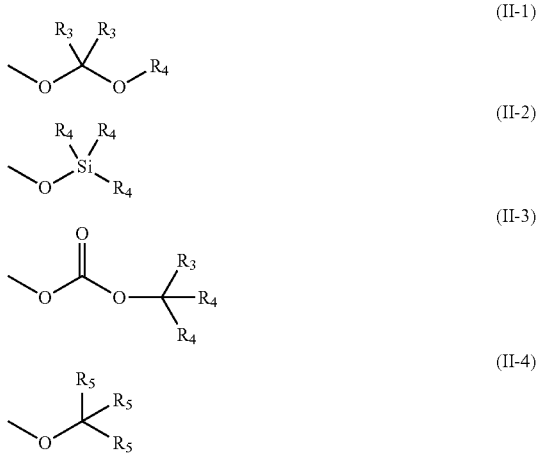

in which $R_3$, or each of $R_3$s independently, represents a hydrogen atom or a monovalent organic group, provided that two $R_3$s may be bonded to each other to thereby form a ring;

$R_4$, or each of $R_4$s independently, represents a monovalent organic group, provided that at least two $R_4$s may be bonded to each other to thereby form a ring and that $R_3$ and $R_4$ may be bonded to each other to thereby form a ring; and each of $R_5$s independently represents a hydrogen atom, an alkyl group, a cycloalkyl group, an aryl group, an alkenyl group or an alkynyl group, provided that at least two $R_5$s may be bonded to each other to thereby form a ring and that when one or two of three $R_5$s are a hydrogen atom, at least one of the rest of $R_5$s represents an aryl group, an alkenyl group or an alkynyl group.

[5] The composition according to any of [1] to [4], wherein the repeating unit is contained in an amount of 70 to 100 mol % based on the total amount of repeating units containing an acid-decomposable group contained in the resin.

[6] A resist pattern formed from the composition of any of [1] to [5].

[7] A method of forming a pattern, comprising: (A) forming a film from the composition of any of [1] to [5], (B) exposing the film to light, and (C) developing the exposed film.

[8] The method according to [7], wherein the development is performed using a developer containing an organic solvent.

[9] The method according to [8], wherein a pattern formed by the developing is a negative pattern.

[10] The method according to [8] or [9], wherein an amount of the organic solvent used in the developer is in the range of 95 to 100 mass % based on the whole amount of the developer.

[11] A method of manufacturing a semiconductor device, comprising the method of forming a pattern according to any of [7] to [10].

[12] A semiconductor device manufactured by the method according to [11].

The present invention has made it feasible to provide an actinic-ray- or radiation-sensitive resin composition and a method of forming a pattern using the same, ensuring excellent the etching resistivity and the stability during a post-exposure delay (PED) period.

BEST MODE FOR CARRYING OUT THE INVENTION

The present invention will be described below.

Note that, with respect to the expression of a group (or an atomic group) used in this specification, the expression without explicitly referring to whether the group is substituted or unsubstituted encompasses not only groups with no substituents but also groups having one or more substituents. For example, the expression "alkyl group" encompasses not only alkyl groups having no substituents (viz. unsubstituted alkyl groups) but also alkyl groups having one or more substituents (viz. substituted alkyl groups).

<Actinic-Ray- or Radiation-Sensitive Resin Composition>

First, the composition of the present invention will be described. The composition may be used in negative development and also in positive development. Namely, this composition may be used in development using a developer containing an organic solvent and also in development using an alkali developer. The composition of the present invention is typically used in negative development, namely, development using a developer containing an organic solvent. That is, the composition of the present invention is typically a negative composition.

The composition of the present invention comprises a resin (a) that when acted on by an acid, decreases its solubility in a developer containing an organic solvent or increases its solubility in an alkali developer (hereinafter also referred to as an acid-decomposable resin) and a compound (b) that when exposed to actinic rays or radiation, generates an acid (hereinafter also referred to as an acid generator).

Moreover, the composition may further contain at least any of a basic compound (c), a solvent (d), a hydrophobic resin (e), a surfactant (f) and other additives (g). These components will be sequentially described below.

(a) Acid-Decomposable Resin

The composition of the present invention comprises an acid-decomposable resin. The acid-decomposable resin contains a repeating unit (P) containing a group that is decomposed when acted on by an acid to thereby produce an alcoholic hydroxyl group as an acid-decomposable group.

The inventors have found that, for example, the sensitivity, limiting resolving power, roughness characteristic, exposure latitude (EL), dependence on post-exposure bake (PEB) temperature and focus latitude (depth of focus DOF) are superior when at least a part of the acid-decomposable group is a group that is decomposed when acted on by an acid to thereby produce an alcoholic hydroxyl group compared to, for example, those exhibited when the acid-decomposable group consists only of a group that is decomposed when acted on by an acid to thereby produce a carboxyl group. The reason therefor is not necessarily apparent. However, the inventors presume that the reason would be that when a group that is decomposed when acted on by an acid to thereby produce an alcoholic hydroxyl group is used as at least a part of the acid-decomposable group, the reactivity of the acid-decomposable resin is increased and accordingly the resin exhibits an increased polarity change by the decomposition of the acid-decomposable group, thereby enhancing a dissolution contrast to a developer containing an organic solvent or an alkali developer.

The inventors have further found that, for example, the decrease of the film thickness by post-exposure bake (PEB) can be suppressed more effectively when at least part of the acid-decomposable group is a group that is decomposed when acted on by an acid to thereby produce an alcoholic hydroxyl group than when the acid-decomposable group consists only of a group that is decomposed when acted on by an acid to thereby produce a carboxyl group. The inventors presume that the reason would be that the change of the polarity of the resin occurring after the decomposition by the action of an acid is greater in the former instance than in the latter instance. The difference in the magnitude of the polarity change is especially conspicuous when the protective group cleaved by the action of an acid has a small molecular weight.

The pKa value of the alcoholic hydroxyl group produced by the decomposition of the above group under the action of an acid is, for example, 12 or greater, and typically in the range of 12 to 20. When the pKa value is extremely small, the stability of the composition containing the acid-decomposable resin tends to decrease and the change over time of the resist performance tends to be large. Herein, the term "pKa" means the value calculated using "ACD/pKa DB" available from Fujitsu Limited under noncustomized initial setting.

It is preferred for the repeating unit (P) to contain two or more groups that are decomposed to thereby produce an alcoholic hydroxyl group when acted on by an acid. Namely, it is preferred for the repeating unit (P) to have a structure that is decomposed when acted on by an acid to thereby produce two or more alcoholic hydroxyl groups. The limiting resolving power and roughness characteristic of the composition comprising the acid-decomposable resin can be enhanced by having this structure.

It is preferred for the repeating unit (P) to be any of those of at least one selected from the group consisting of general formulae (I-1) to (I-10) below. This repeating unit is more preferably any of those of at least one selected from the group consisting of general formulae (I-1) to (I-3) below, further more preferably any of those of general formula (I-1) below.

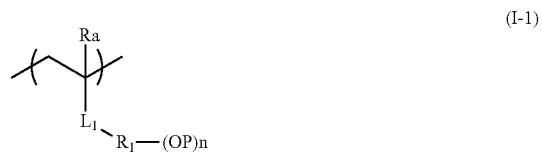
(I-1)

(I-2)

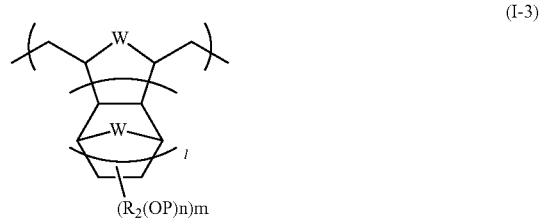
(I-3)

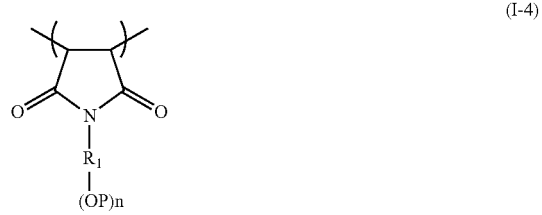
(I-4)

(I-5)

(I-6)

(I-7)

-continued

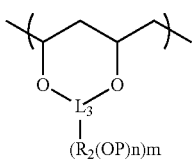
(I-8)

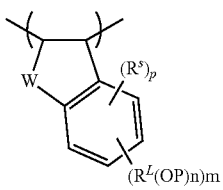
(I-9)

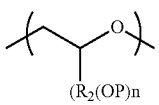
(I-10)

In the formulae,

Ra, or each of Ra's independently, represents a hydrogen atom, an alkyl group or any of groups of the formula —$CH_2$—O—Ra2 in which Ra2 represents a hydrogen atom, an alkyl group or an acyl group.

$R_1$ represents a (n+1)-valent organic group.

$R_2$, when m≥2 each of $R_2$s independently, represents a single bond or a (n+1)-valent organic group.

OP, or each of OPs independently, represents the group that is decomposed when acted on by an acid to thereby produce an alcoholic hydroxyl group, provided that when n≥2 and/or m≥2, two or more OPs may be bonded to each other to thereby form a ring.

W represents a methylene group, an oxygen atom or a sulfur atom.

Each of n and m is an integer of 1 or greater, provided that in general formulae (I-2), (I-3) and (I-8), n is 1 when $R_2$ represents a single bond.

l is an integer of 0 or greater.

$L_1$ represents a connecting group of the formula —COO—, —OCO—, —CONH—, —O—, —Ar—, —$SO_3$— or —$SO_2NH$—, the Ar representing a bivalent aromatic ring group.

Each of R's independently represents a hydrogen atom or an alkyl group.

$R_0$ represents a hydrogen atom or an organic group, $L_3$ represents a (m+2)-valent connecting group.

$R^L$, when m≥2 each of $R^L$s independently, represents a (n+1)-valent connecting group.

$R^S$, when p≥2 each of $R^S$s independently, represents a substituent, provided that when p≥2, two or more $R^S$s may be bonded to each other to thereby form a ring, and p is an integer of 0 to 3.

Ra represents a hydrogen atom, an alkyl group or any of groups of the formula —$CH_2$—O—Ra2. Ra is preferably a hydrogen atom or an alkyl group having 1 to 10 carbon atoms, more preferably a hydrogen atom or a methyl group.

W represents a methylene group, an oxygen atom or a sulfur atom. W is preferably a methylene group or an oxygen atom.

$R_1$ represents a (n+1)-valent organic group. $R_1$ is preferably a nonaromatic hydrocarbon group. In particular, $R_1$ may be a chain hydrocarbon group or an alicyclic hydrocarbon group. $R_1$ is more preferably an alicyclic hydrocarbon group.

$R_2$ is a single bond or a (n+1)-valent organic group. $R_2$ is preferably a single bond or a nonaromatic hydrocarbon group. In particular, $R_2$ may be a chain hydrocarbon group or an alicyclic hydrocarbon group.

When $R_1$ and/or $R_2$ are/is a chain hydrocarbon group, the chain hydrocarbon group may be in the form of a linear chain or a branched chain. The chain hydrocarbon group preferably has 1 to 8 carbon atoms. When $R_1$ and/or $R_2$ are/is, for example, an alkylene group, it is preferred for $R_1$ and/or $R_2$ to be a methylene group, an ethylene group, an n-propylene group, an isopropylene group, an n-butylene group, an isobutylene group or a sec-butylene group.

When $R_1$ and/or $R_2$ are/is an alicyclic hydrocarbon group, the alicyclic hydrocarbon group may be monocyclic or polycyclic. The alicyclic hydrocarbon group has, for example, a monocyclo, bicyclo, tricyclo or tetracyclo structure. The alicyclic hydrocarbon group has generally 5 or more carbon atoms, preferably 6 to 30 carbon atoms and more preferably 7 to 25 carbon atoms.

As the alicyclic hydrocarbon groups, there can be mentioned, for example, those having a series of partial structures shown below. A substituent may be introduced in each of these partial structures. In each of these partial structures, the methylene group (—$CH_2$—) may be replaced by an oxygen atom (—O—), a sulfur atom (—S—), a carbonyl group [—(=O)—], a sulfonyl group [—S(=O)$_2$-], a sulfinyl group [—S(=O)—] or an imino group [—N(R)—] (R is a hydrogen atom or an alkyl group).

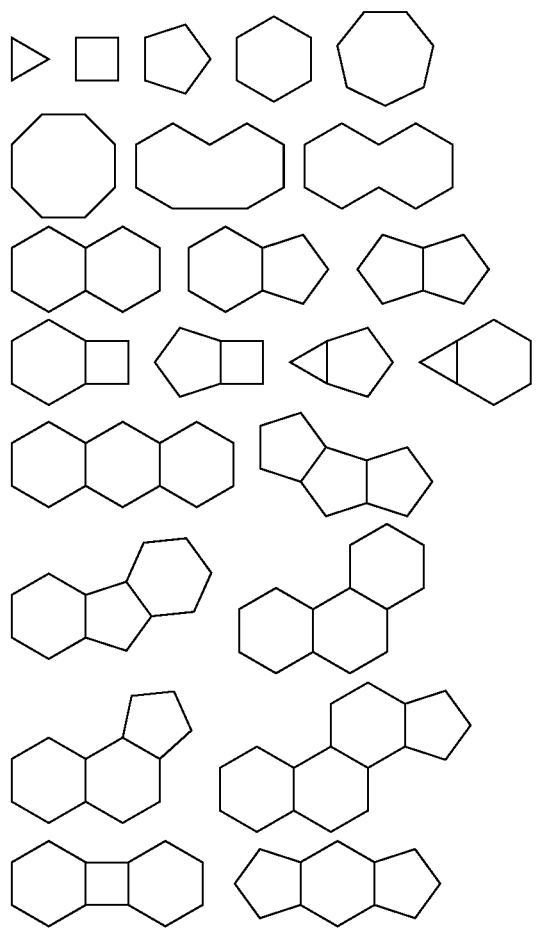

-continued

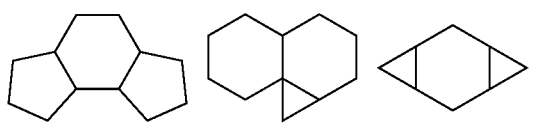
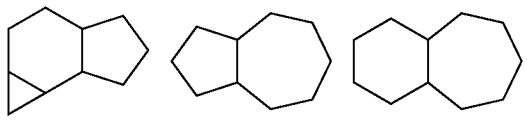
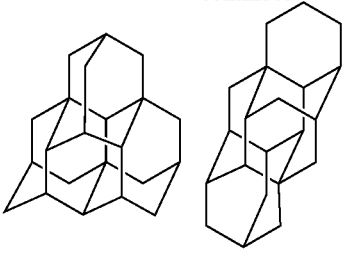
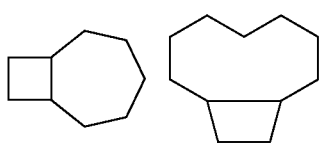
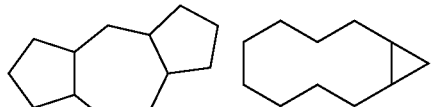
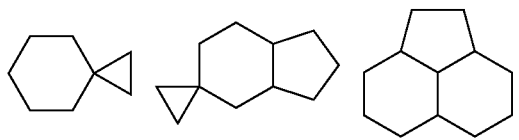
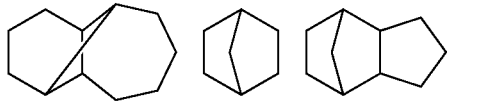

When $R_1$ and/or $R_2$ are/is, for example, a cycloalkylene group, it is preferred for $R_1$ and/or $R_2$ to be an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group. Of these, an adamantylene group, a norbornylene group, a cyclohexylene group, a cyclopentylene group, a tetracyclododecanylene group and a tricyclodecanylene group are more preferred.

One or more substituents may be introduced in the nonaromatic hydrocarbon group represented by $R_1$ and/or $R_2$. As the substituent, there can be mentioned, for example, an alkyl group having 1 to 4 carbon atoms, a halogen atom, a hydroxyl group, an alkoxy group having 1 to 4 carbon atoms, a carboxyl group or an alkoxycarbonyl group having 2 to 6 carbon atoms. A substituent may further be introduced in the alkyl group, alkoxy group and alkoxycarbonyl group. As such a substituent, there can be mentioned, for example, a hydroxyl group, a halogen atom or an alkoxy group.

$L_1$ represents a connecting group of the formula —COO—, —OCO—, —CONH—, —O—, —Ar—, —SO$_3$— or —SO$_2$NH—. Herein, Ar represents a bivalent aromatic ring group. $L_1$ is preferably a connecting group of the formula —COO—, —CONH— or —Ar—, more preferably a connecting group of the formula —COO— or —CONH—.

R represents a hydrogen atom or an alkyl group. The alkyl group may be in the form of a linear chain or a branched chain. The alkyl group preferably has 1 to 6 carbon atoms, more preferably 1 to 3 carbon atoms. It is preferred for R to be a hydrogen atom or a methyl group, especially a hydrogen atom.

$R_0$ represents a hydrogen atom or an organic group. As the organic group, there can be mentioned, for example, an alkyl group, a cycloalkyl group, an aryl group, an alkynyl group or an alkenyl group. It is preferred for Ro to be a hydrogen atom or an alkyl group, especially a hydrogen atom or a methyl group.

$L_3$ represents a (m+2)-valent connecting group. Namely, $L_3$ represents a tri- or higher valent connecting group. As such a connecting group, there can be mentioned, for example, a corresponding group contained in each of particular examples shown below.

$R^L$ represents a (n+1)-valent connecting group. Namely, $R^L$ represents a bi- or higher valent connecting group. As such a connecting group, there can be mentioned, for example, an alkylene group, a cycloalkylene group or a corresponding group contained in each of particular examples shown below. $R^L$s, or $R^L$ and $R^S$, may be bonded to each other to thereby form a ring structure.

$R^S$ represents a substituent. As the substituent, there can be mentioned, for example, an alkyl group, an alkenyl group, an alkynyl group, an aryl group, an alkoxy group, an acyloxy group, an alkoxycarbonyl group or a halogen atom.

In the formula, n is an integer of 1 or greater, preferably an integer of 1 to 3, and more preferably 1 or 2. When n is 2 or greater, the dissolution contrast to a developer containing an organic solvent or an alkali developer can be enhanced. Accordingly, if so, the limiting resolving power and roughness characteristic can be enhanced.

In the formula, m is an integer of 1 or greater, preferably an integer of 1 to 3, and more preferably 1 or 2, l is an integer of 0 or greater, preferably 0 or 1, and p is an integer of 0 to 3.

Specific examples of the repeating units each containing a group that is decomposed when acted on by an acid to thereby produce an alcoholic hydroxyl group will be shown below. In the particular examples, Ra and OP are as defined in general formulae (I-1) to (I-3). When a plurality of OPs are bonded to each other to thereby form a ring, the corresponding ring structure is expressed as "O—P—O" for the sake of convenience.

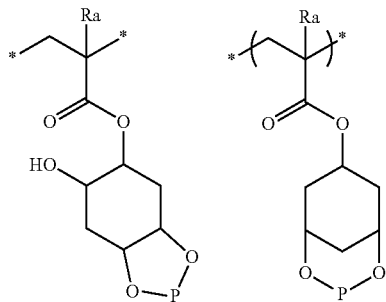

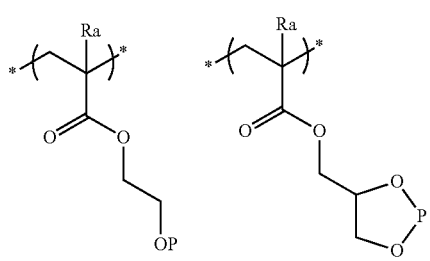

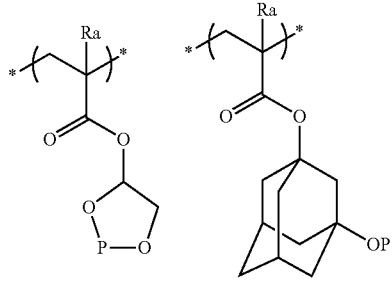

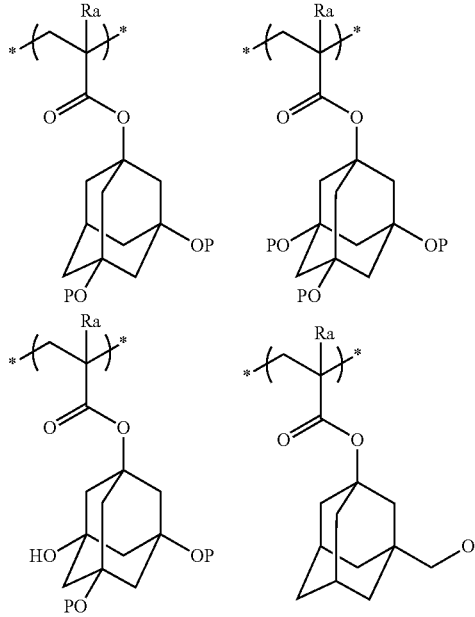

-continued

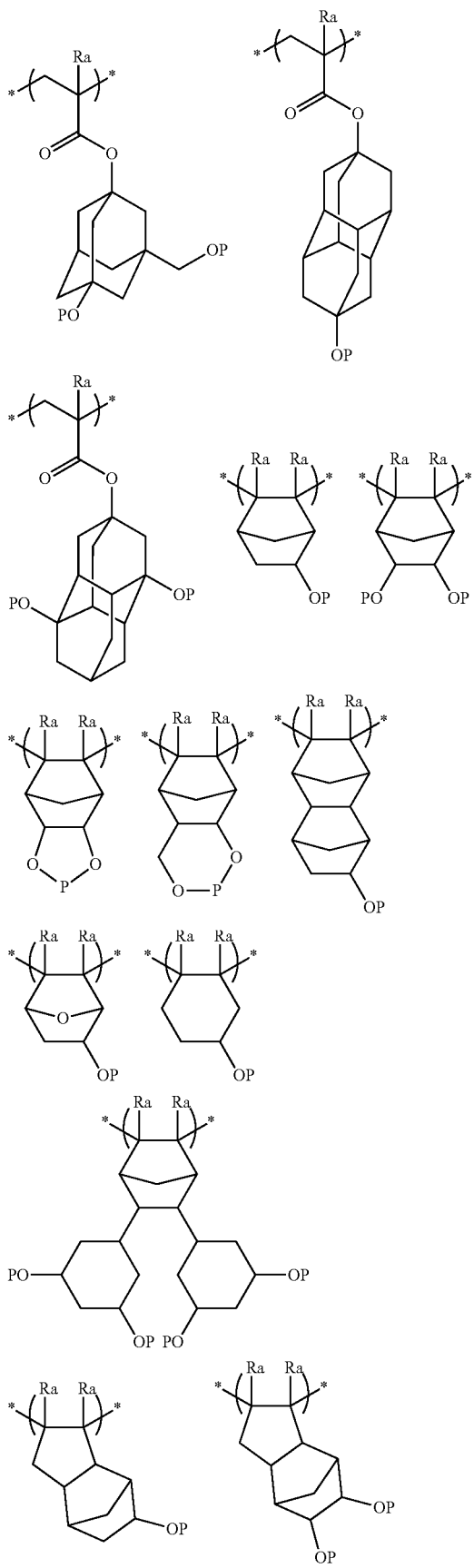

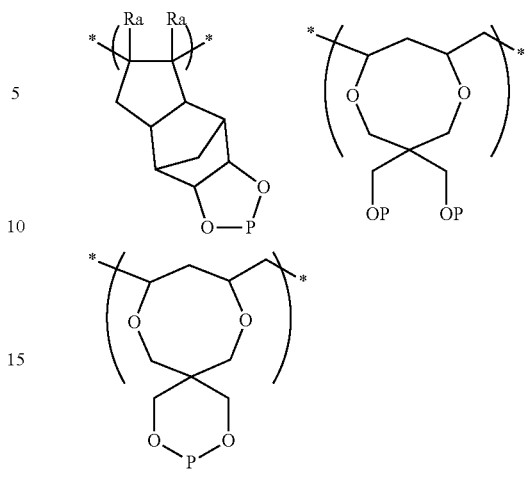

It is preferred for the group that is decomposed when acted on by an acid to thereby produce an alcoholic hydroxyl group to be any of those of at least one selected from the group consisting of general formulae (II-1) to (II-4) below.

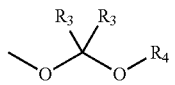

(II-1)

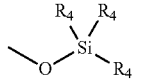

(II-2)

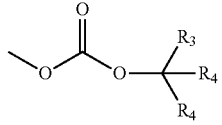

(II-3)

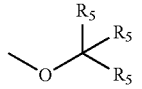

(II-4)

In the formulae, $R_3$, or each of $R_3$s independently, represents a hydrogen atom or a monovalent organic group, provided that $R_3$s may be bonded to each other to thereby form a ring.

$R_4$, or each of $R_4$s independently, represents a monovalent organic group, provided that $R_4$s may be bonded to each other to thereby form a ring and that $R_3$ and $R_4$ may be bonded to each other to thereby form a ring.

Each of $R_5$s independently represents a hydrogen atom, an alkyl group, a cycloalkyl group, an aryl group, an alkenyl group or an alkynyl group, provided that at least two $R_5$s may be bonded to each other to thereby form a ring and that when one or two of three $R_5$s are a hydrogen atom, at least one of the rest of $R_5$s represents an aryl group, an alkenyl group or an alkynyl group.

It is preferred for the group that is decomposed when acted on by an acid to thereby produce an alcoholic hydroxyl group to be any of those of at least one selected from the group consisting of general formulae (II-5) to (II-9) below.

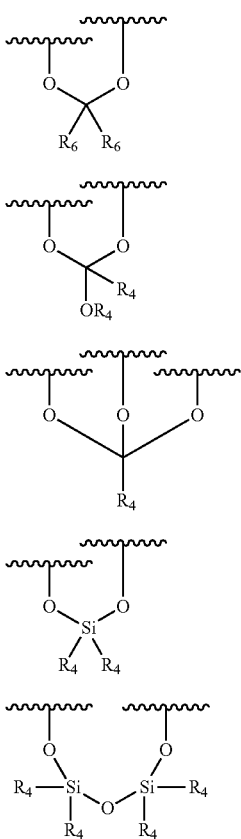

(II-5)
(II-6)
(II-7)
(II-8)
(II-9)

In the formulae,

R$_4$ is as defined above in general formulae (II-1) to (II-3).

Each of R$_6$s independently represents a hydrogen atom or a monovalent organic group, provided that R$_6$s may be bonded to each other to thereby form a ring.

The group that is decomposed when acted on by an acid to thereby produce an alcoholic hydroxyl group is more preferably any of those of at least one selected from among general formulae (II-1) to (II-3), further more preferably any of those of general formula (II-1) or (II-3) and most preferably any of those of general formula (II-1).

As mentioned above, R$_3$ represents a hydrogen atom or a monovalent organic group. R$_3$ is preferably a hydrogen atom, an alkyl group or a cycloalkyl group, more preferably a hydrogen atom or an alkyl group.

The alkyl group represented by R$_3$ may be in the form of a linear chain or a branched chain. The alkyl group represented by R$_3$ preferably has 1 to 10 carbon atoms, more preferably 1 to 3 carbon atoms. As the alkyl group represented by R$_3$, there can be mentioned, for example, a methyl group, an ethyl group, an n-propyl group, an isopropyl group or an n-butyl group.

The cycloalkyl group represented by R$_3$ may be monocyclic or polycyclic. The cycloalkyl group represented by R$_3$ preferably has 3 to 10 carbon atoms, more preferably 4 to 8 carbon atoms. As the cycloalkyl group represented by R$_3$, there can be mentioned, for example, a cyclopropyl group, a cyclobutyl group, a cyclopentyl group, a cyclohexyl group, a norbornyl group or an adamantyl group.

In general formula (II-1), it is preferred for at least one of R$_3$s to be a monovalent organic group. If so, an especially high sensitivity can be attained.

R$_4$ represents a monovalent organic group. R$_4$ is preferably an alkyl group or a cycloalkyl group, more preferably an alkyl group. One or more substituents may be introduced in the alkyl group and cycloalkyl group.

Preferably, the alkyl group represented by R$_4$ is unsubstituted, or one or more aryl groups and/or one or more silyl groups are introduced therein as substituents. The unsubstituted alkyl group preferably has 1 to 20 carbon atoms. The alkyl group moiety of the alkyl group substituted with one or more aryl groups preferably has 1 to 25 carbon atoms. The alkyl group moiety of the alkyl group substituted with one or more silyl groups preferably has 1 to 30 carbon atoms. When the cycloalkyl group represented by R$_4$ is unsubstituted, the number of carbon atoms thereof is preferably in the range of 3 to 20.

R$_5$ represents a hydrogen atom, an alkyl group, a cycloalkyl group, an aryl group, an alkenyl group or an alkynyl group, provided that when one or two of three R$_5$s are hydrogen atoms, at least one of the rest of R$_5$s represents an aryl group, an alkenyl group or an alkynyl group. R$_5$ is preferably a hydrogen atom or an alkyl group. The alkyl group may be substituted or unsubstituted. When the alkyl group is unsubstituted, it preferably has 1 to 6 carbon atoms, more preferably 1 to 3 carbon atoms.

As mentioned above, R$_6$ represents a hydrogen atom or a monovalent organic group. R$_6$ is preferably a hydrogen atom, an alkyl group or a cycloalkyl group, more preferably a hydrogen atom or an alkyl group and further more preferably a hydrogen atom or an unsubstituted alkyl group. In particular, R$_6$ is preferably a hydrogen atom or an alkyl group having 1 to 10 carbon atoms, more preferably a hydrogen atom or an unsubstituted alkyl group having 1 to 10 carbon atoms.

As the alkyl groups and cycloalkyl groups represented by R$_4$, R$_5$ and R$_6$, there can be mentioned, for example, those set forth above with respect to R$_3$.

Specific examples of the groups that are decomposed to thereby produce an alcoholic hydroxyl group when acted on by an acid will be shown below.

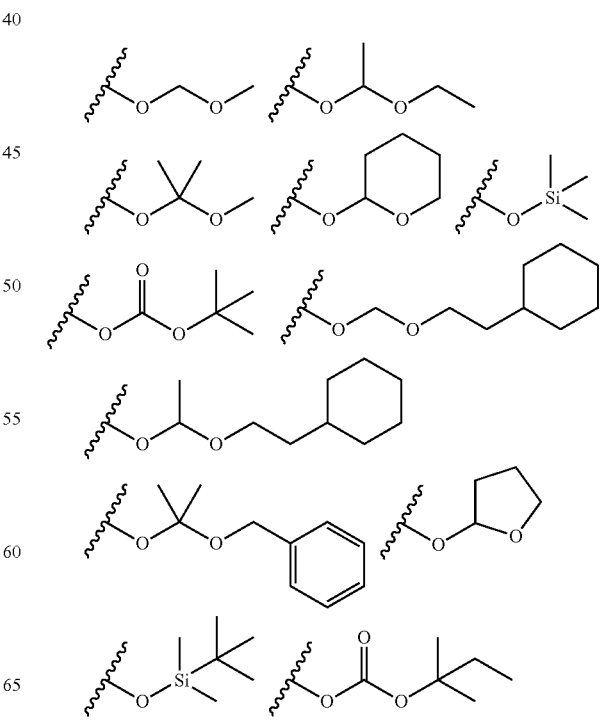

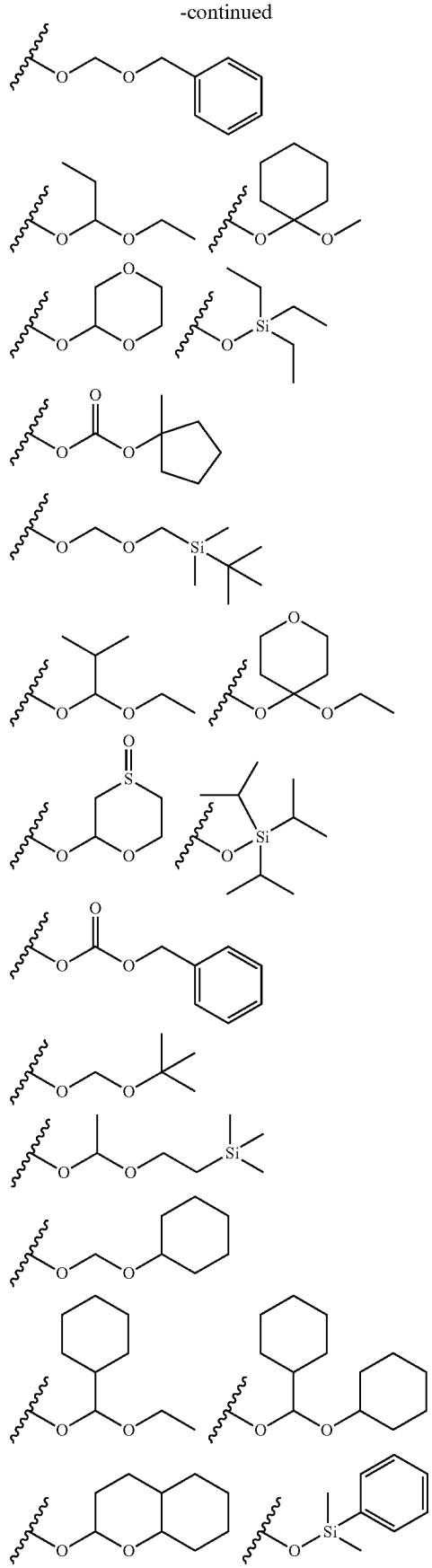
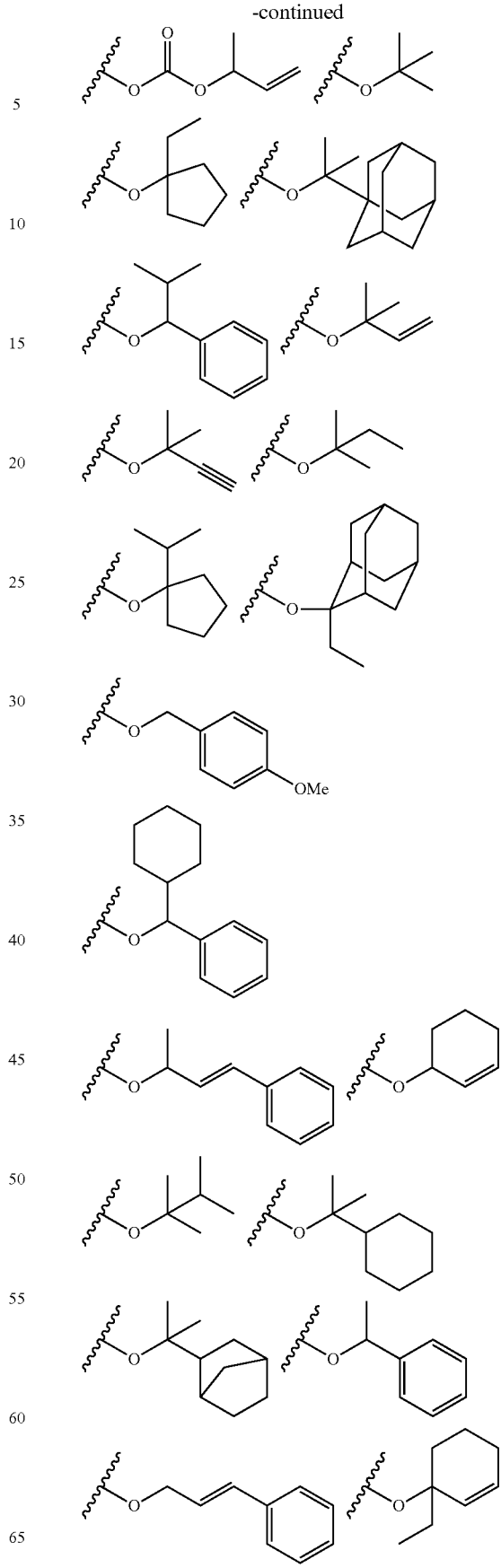

-continued

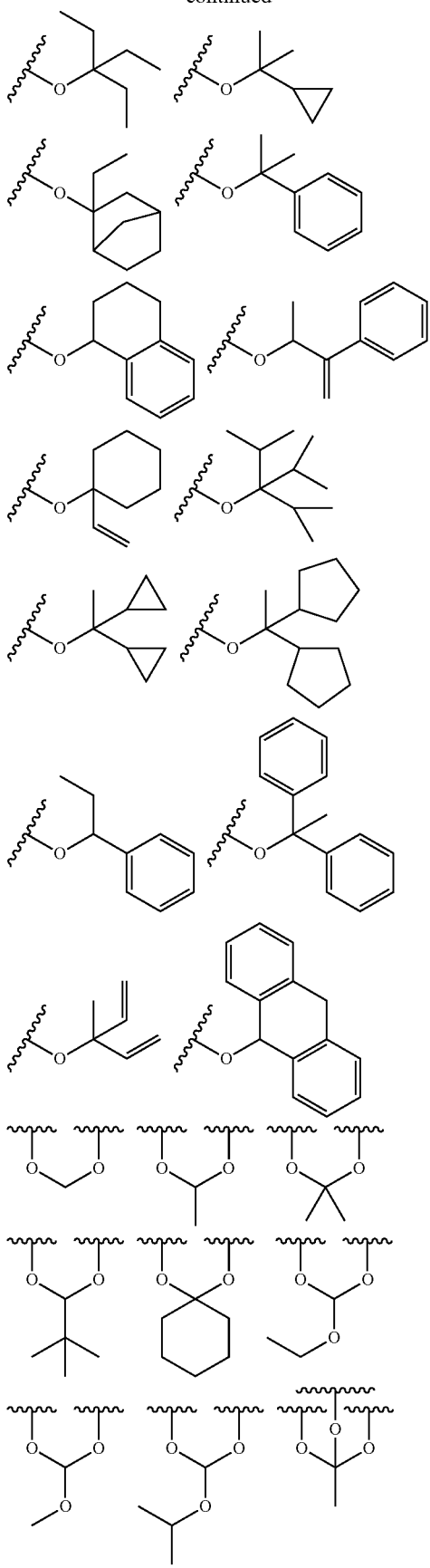

-continued

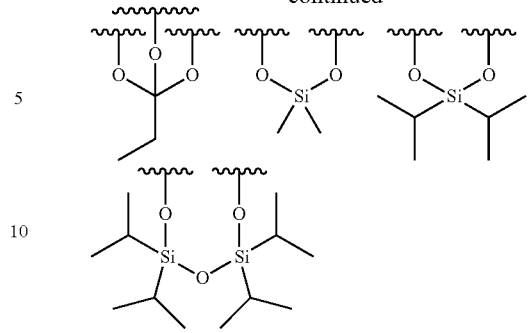

As mentioned above, it is especially preferred for the repeating unit (P) to be any of those of general formula (I-1) above. Further, it is especially preferred for the group that is decomposed when acted on by an acid to thereby produce an alcoholic hydroxyl group to be any of those of general formula (II-1) above. Therefore, it is especially preferred for the repeating unit (P) to be any of those of general formula (III) below.

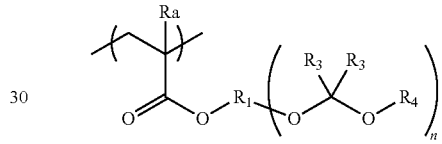

(III)

In the formula, $R_1$, Ra, $R_3$, $R_4$ and n are as defined above in connection with general formulae (I-1) and (II-1).

The acid-decomposable resin may contain two or more types of repeating units (P) each containing a group that is decomposed when acted on by an acid to thereby produce an alcoholic hydroxyl group. If so, fine regulation of reactivity and/or developability can be effected, thereby facilitating the optimization of various performances.

The content of repeating unit containing a group that is decomposed when acted on by an acid to thereby produce an alcoholic hydroxyl group, based on all the repeating units of the acid-decomposable resin, is preferably in the range of 10 to 100 mol %, more preferably 30 to 90 mol % and further more preferably 50 to 80 mol %.

The acid-decomposable resin may further contain repeating units other than the above repeating units (P). Examples of the other repeating units include the following.

(A) repeating unit containing a polar group

It is preferred for the acid-decomposable resin to further contain a repeating unit (A) containing a polar group. If so, for example, the sensitivity of the composition comprising the acid-decomposable resin can be enhanced.

As the "polar group" that can be contained in the repeating unit (A), there can be mentioned, for example, functional groups (1) to (4) below. In the following, "electronegativity" means a value according to Pauling.

(1) Functional group containing a structure in which an oxygen atom is bonded through a single bond to an atom whose electronegativity exhibits a difference of 1.1 or greater from that of the oxygen atom As this polar group, there can be mentioned, for example, a group containing the structure of O—H, such as a hydroxyl group.

(2) Functional group containing a structure in which a nitrogen atom is bonded through a single bond to an atom whose electronegativity exhibits a difference of 0.6 or greater from that of the nitrogen atom As this polar group, there can be mentioned, for example, a group containing the structure of N—H, such as an amino group.

(3) Functional group containing a structure in which two atoms whose electronegativity values exhibit a difference of 0.5 or greater are bonded to each other through a double bond or triple bond As this polar group, there can be mentioned, for example, a group containing the structure of C=N, C=O, N=O, S=O or C=N.

(4) Functional group containing an ionic moiety

As this polar group, there can be mentioned, for example, a group containing the moiety of $N^+$ or $S^+$.

The "polar group" that can be contained in the repeating unit (A) is, for example, at least one selected from the group consisting of (I) a hydroxyl group, (II) a cyano group, (III) a lactone group, (IV) a carboxylate group or a sulfonate group, (V) an amido group, a sulfonamido group or a group corresponding to a derivative thereof, (VI) an ammonium group or a sulfonium group, and a group formed of a combination of two or more thereof.

It is especially preferred for the polar group to be an alcoholic hydroxyl group, a cyano group, a lactone group or a group containing a cyanolactone structure.

The exposure latitude (EL) of the composition comprising the acid-decomposable resin can be enhanced by causing the acid-decomposable resin to further contain a repeating unit containing an alcoholic hydroxyl group.

The sensitivity of the composition comprising the acid-decomposable resin can be enhanced by causing the acid-decomposable resin to further contain a repeating unit containing a cyano group.

The dissolution contrast to a developer containing an organic solvent of the composition can be enhanced by causing the acid-decomposable resin to further contain a repeating unit containing a lactone group. Also, if so, the dry etching resistance, applicability and adhesion to substrates of the composition comprising the acid-decomposable resin can also be enhanced.

The dissolution contrast to a developer containing an organic solvent of the composition can be enhanced by causing the acid-decomposable resin to further contain a repeating unit containing a group having a lactone structure containing a cyano group. Also, if so, the sensitivity, dry etching resistance, applicability and adhesion to substrates of the composition comprising the acid-decomposable resin can also be enhanced. In addition, if so, the functions respectively attributed to the cyano group and the lactone group can be introduced in a single repeating unit, so that the freedom of the design of the acid-decomposable resin can be increased.

Specific examples of the structures that can be contained in the "polar group" will be shown below.

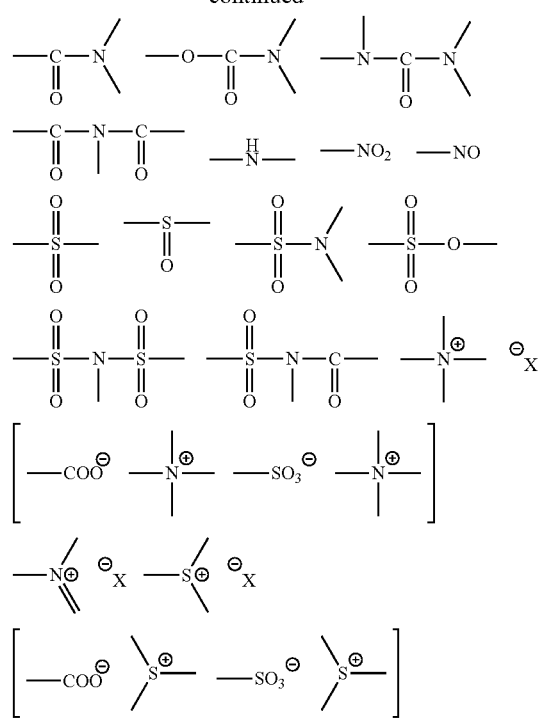

As preferred repeating units (A), there can be mentioned, for example, repeating units (P) as mentioned above wherein the "group capable of producing the group that is decomposed when acted on by an acid to thereby produce an alcoholic hydroxyl group" is replaced by an "alcoholic hydroxyl group."

It is preferred for the repeating unit (A) to have any of the structures of general formulae (I-1) to (I-10) above wherein "OP" is replaced by "OH." Namely, it is preferred for the repeating unit (A) to be any of those of at least one selected from the group consisting of general formulae (I-1H) to (I-10H) below.

It is especially preferred for the repeating unit (A) to be any of those of at least one selected from the group consisting of general formulae (I-1H) to (I-3H) below. The repeating units of general formula (I-1H) below are furthermore preferred.

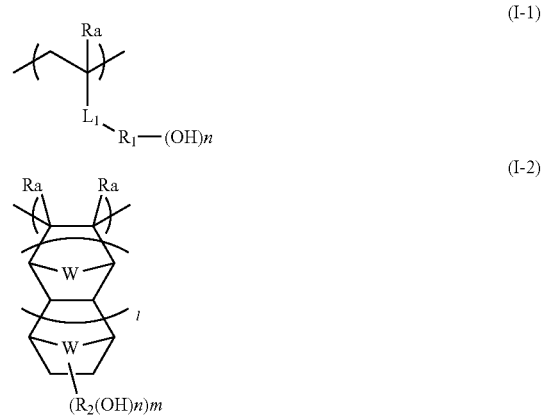

-continued (I-3)
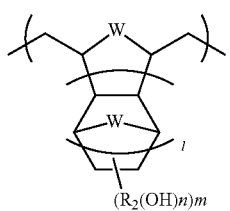

(I-4)
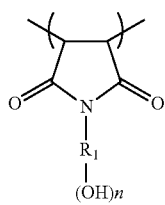

(I-5)
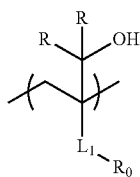

(I-6)
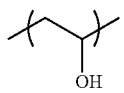

(I-7)
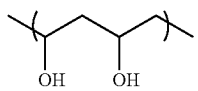

(I-8)
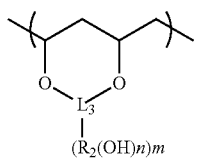

(I-9)
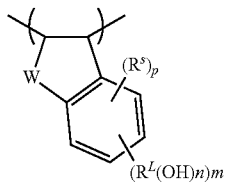

(I-10)
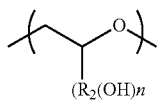

In the formulae, Ra, $R_1$, $R_2$, OP, W, n, m, l, $L_1$, R, $R_0$, $L_3$, $R^L$, $R^S$ and p are as defined above in general formulae (I-1) to (I-10).

When the repeating unit containing a group that is decomposed when acted on by an acid to thereby produce an alcoholic hydroxyl group is used in combination with any of the repeating units of at least one selected from the group consisting of general formulae (I-1H) to (I-10H) above, for example, the inhibition of acid diffusion by the alcoholic hydroxyl group cooperates with the sensitivity increase by the group that is decomposed when acted on by an acid to thereby produce an alcoholic hydroxyl group, thereby realizing an enhancement of exposure latitude (EL) without deterioration of other performances.

The content of repeating unit (A) resulting from replacement of the "group capable of producing the group that is decomposed when acted on by an acid to thereby produce an alcoholic hydroxyl group" by an "alcoholic hydroxyl group" in the above repeating units (P), based on all the repeating units of the acid-decomposable resin, is preferably in the range of 5 to 100 mol %, more preferably 10 to 90 mol % and further more preferably 20 to 80 mol %.

Specific examples of the repeating units (represented by any of general formulae (I-1H) to (I-10H) will be shown below. In the specific examples, Ra is as defined in general formulae (I-1H) to (I-10H) above.

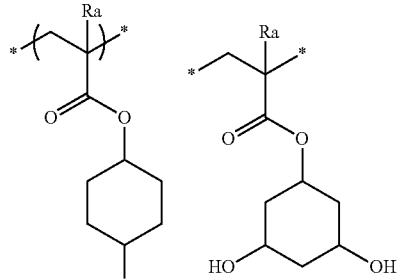

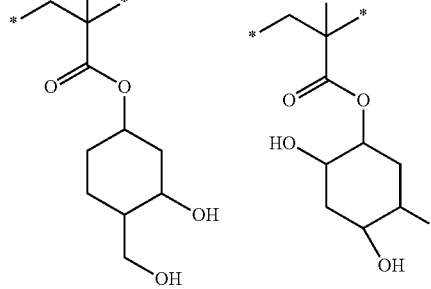

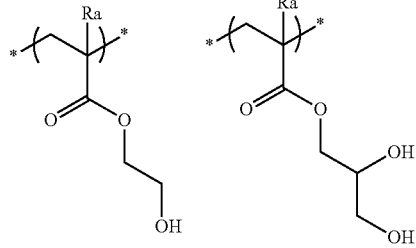

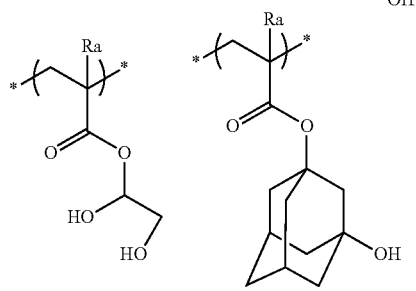

-continued

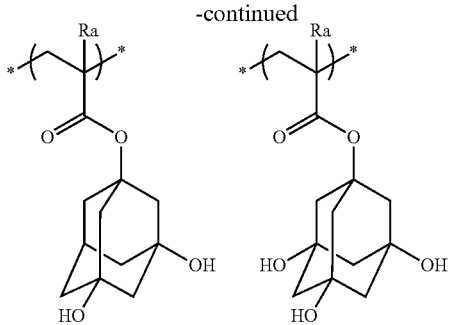
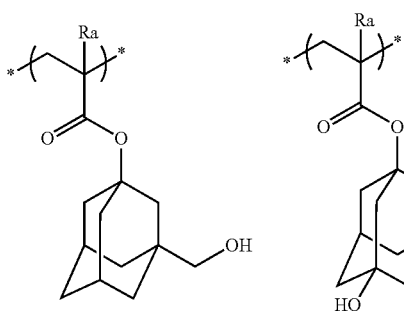
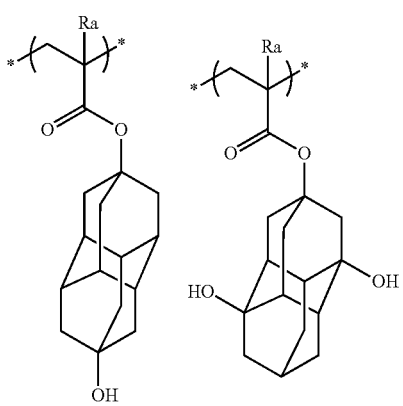
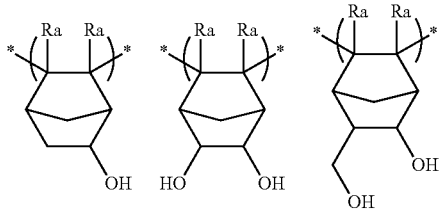
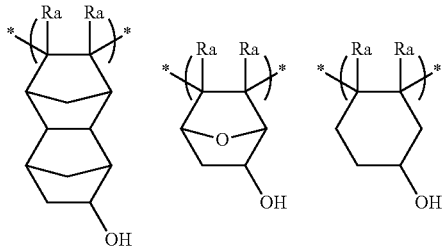

-continued

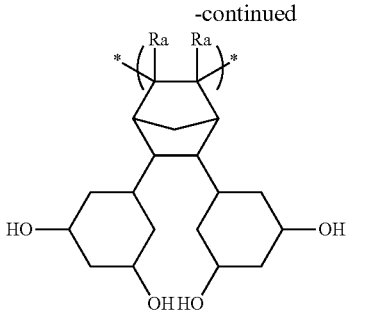
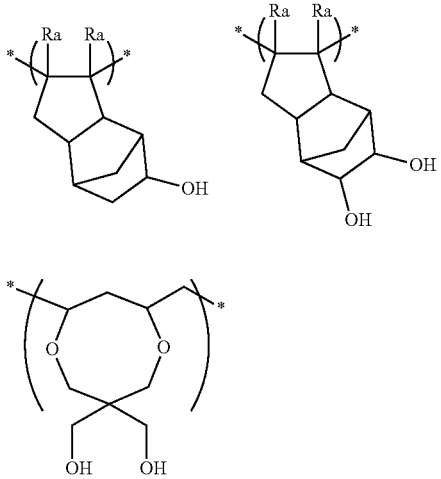

As other preferred repeating units (A), there can be mentioned, for example, a repeating unit containing a hydroxyl group or a cyano group. Introducing this repeating unit enhances the adherence to substrates and the affinity to developer.

A repeating unit containing a hydroxyl group or a cyano group is preferably a repeating unit having an alicyclic hydrocarbon structure substituted with a hydroxy group or a cyano group. Further, the repeating unit is preferably free from the acid-decomposable group. In the alicyclic hydrocarbon structure substituted with a hydroxy group or a cyano group, the alicyclic hydrocarbon structure preferably consists of an adamantyl group, a diamantyl group or a norbornane group. As preferred alicyclic hydrocarbon structures substituted with a hydroxy group or a cyano group, the partial structures represented by the following general formulae (VIIa) to (VIId) can be exemplified.

(VIIa)

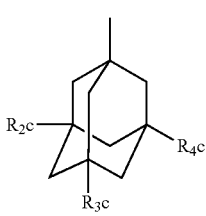

(VIIb)

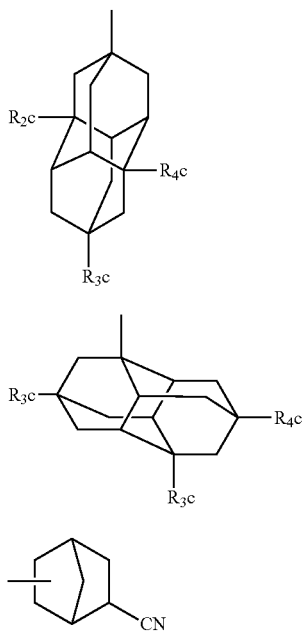

(VIIc)

(VIId)

In the general formulae (VIIa) to (VIIc), each of $R_2c$ to $R_4c$ independently represents a hydrogen atom, a hydroxy group or a cyano group, with the proviso that at least one of the $R_2c$ to $R_4c$ represents a hydroxy group or a cyano group. Preferably, one or two of the $R_2c$ to $R_4c$ are hydroxy groups and the remainder is a hydrogen atom. In the general formula (VIIa), more preferably, two of the $R_2c$ to $R_4c$ are hydroxy groups and the remainder is a hydrogen atom.

As the repeating units having any of the partial structures represented by the general formulae (VIIa) to (VIId), those of the following general formulae (AIIa) to (AIId) can be exemplified.

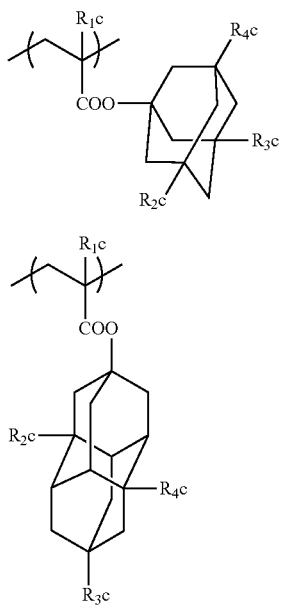

(AIIa)

(AIIb)

(AIIc)

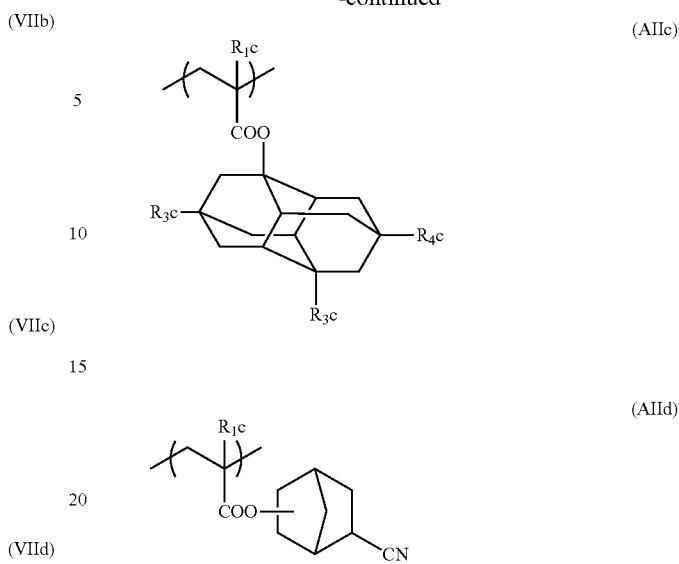

(AIId)

In the general formulae (AIIa) to (AIId), $R_1c$ represents a hydrogen atom, a methyl group, a trifluoromethyl group or a hydroxymethyl group.

$R_2c$ to $R_4c$ have the same meaning as those of the general formulae (VIIa) to (VIIc).

The content of the repeating unit containing a hydroxyl group or a cyano group based on all the repeating units of the acid-composable resin is preferably in the range of 5 to 70 mol %, more preferably 5 to 60 mol % and further more preferably 10 to 50 mol %.

Specific examples of the repeating units containing a hydroxyl group or a cyano group will be shown below, which however in no way limit the scope of the present invention.

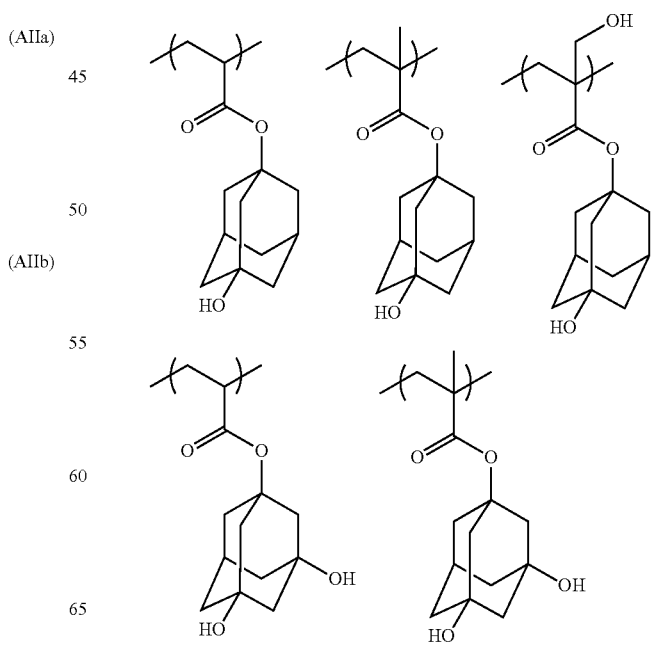

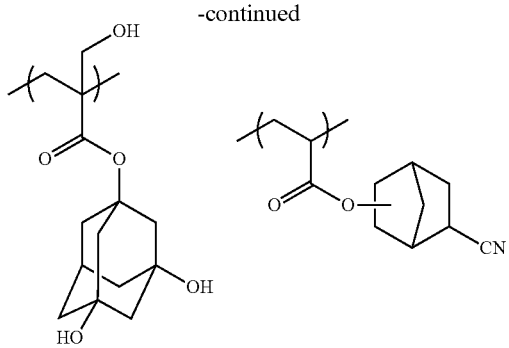

As a further other preferred repeating unit (A), there can be mentioned, for example, a repeating unit containing a lactone structure.

A repeating unit containing a lactone structure preferably contains the lactone structure having a 5 to 7-membered ring. More preferably, a lactone structure in which another cyclic structure is condensed with this lactone structure having a 5 to 7-membered ring in a fashion to form a bicyclo structure or spiro structure.

More specifically, lactone structures represented by any of general formulae (LC1-1) to (LC1-17) below can be exemplified. Of these, more preferred are those of formulae (LC1-1), (LC1-4), (LC1-5), (LC1-6), (LC1-13), (LC1-14), and (LC1-17). The use of these specified lactone structures would realize improvement in the line edge roughness and development defect.

LC1-1

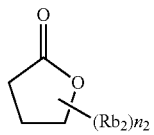

LC1-2

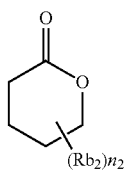

LC1-3

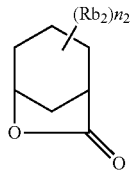

LC1-4

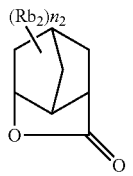

LC1-5

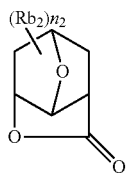

LC1-6

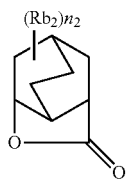

LC1-7

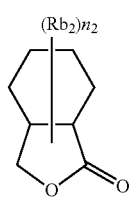

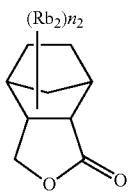
LC1-8

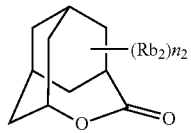
LC1-9

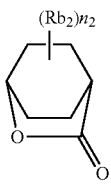

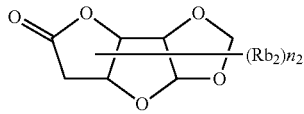
LC1-10

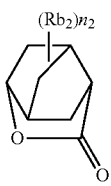
LC1-11

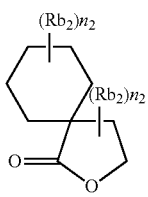
LC1-12

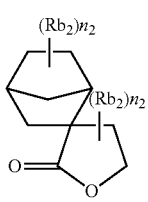
LC1-13

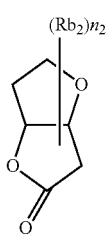
LC1-14

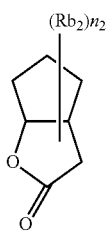
LC1-15

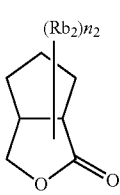

LC1-16

LC1-17

In the formulae, $Rb_2$ represents a substituent, and $n_2$ represents an integer of 0 to 4. Preferably, $n_2$ is an integer of 0 to 2.

As preferred $Rb_2$, there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group which will be described below, and the like. Of these, an alkyl group having 1 to 4 carbon atoms, a cyano group or an acid-decomposable group is particularly preferable. When $n_2 \geq 2$, the plurality of $Rb_2$ may be identical to or different from each other. Further, the plurality of $Rb_2$ may be bonded to each other to thereby form a ring.

As the repeating unit containing a lactone structure, for example, a repeating unit represented by the general formula (AII') below can be exemplified.

In general formula (AII'), $Rb_0$ represents a hydrogen atom, a halogen atom or an alkyl group having 1 to 4 carbon atoms. As preferred substituents that may be introduced in the alkyl group represented by $Rb_0$, there can be mentioned a hydroxyl group and a halogen atom. As the halogen atom, there can be mentioned a fluorine atom, a chlorine atom, a bromine atom or an iodine atom. Preferably, $Rb_0$ represents a hydrogen atom, a methyl group, a hydroxymethyl group, or a trifluoromethyl group, and more preferably a hydrogen atom or a methyl group.

V represents any of the groups of the general formulae (LC1-1) to (LC1-17).

Specific examples of repeating unit containing a lactone structure will be shown below, which in no way limit the scope of the present invention. In the formulae, Rx represents H, $CH_3$, $CH_2OH$, or $CF_3$.

-continued
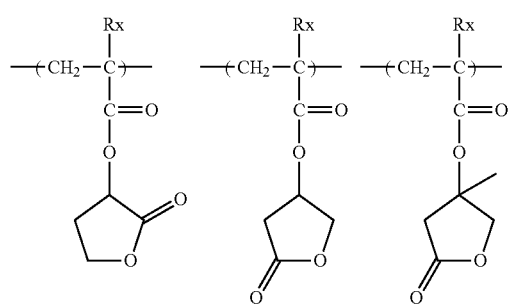
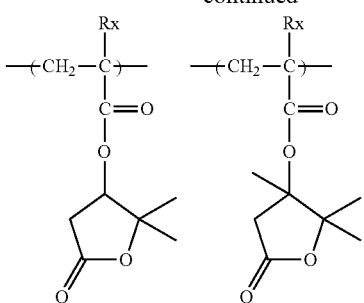
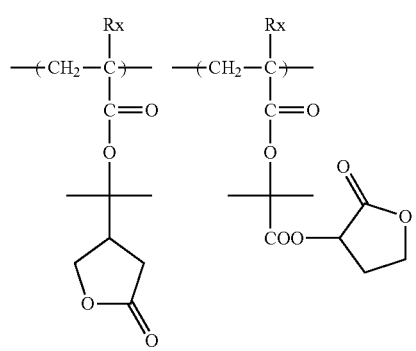
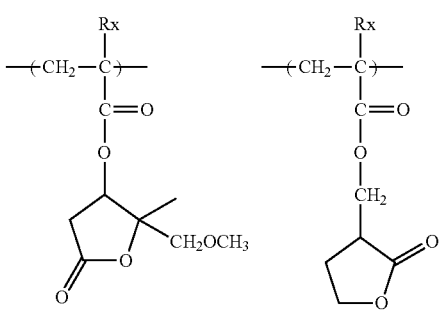
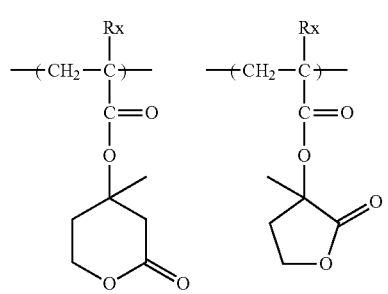
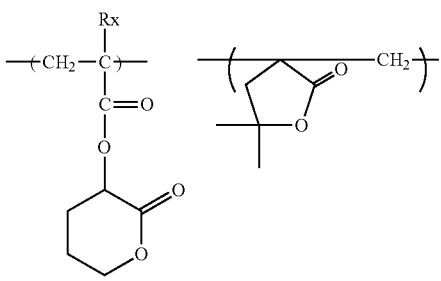
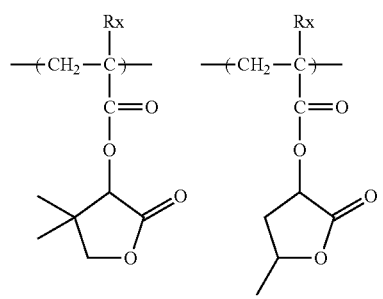
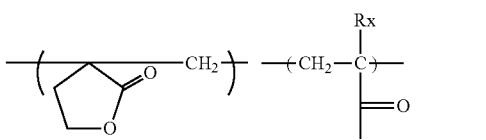
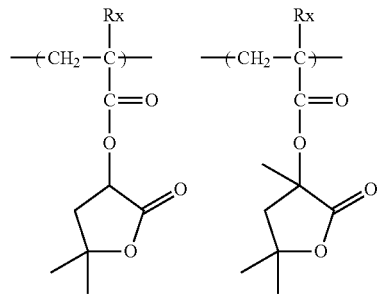
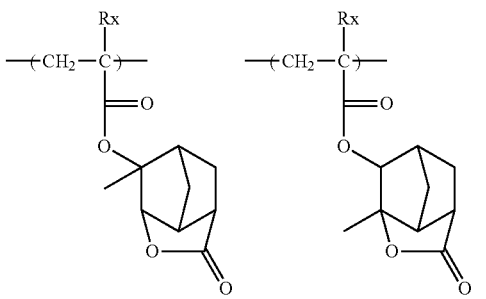

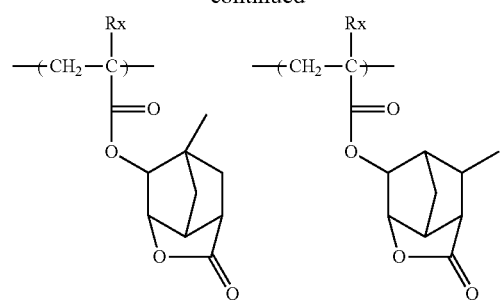
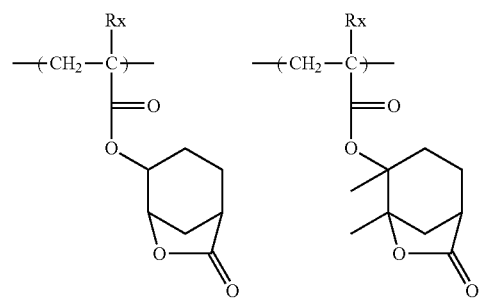
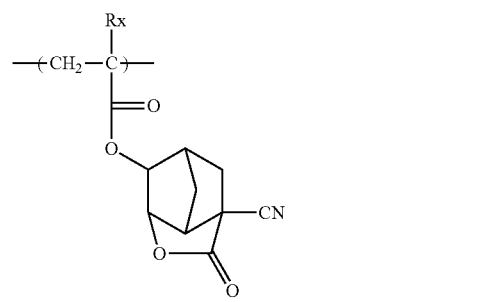
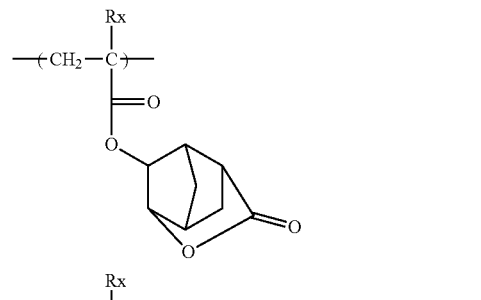
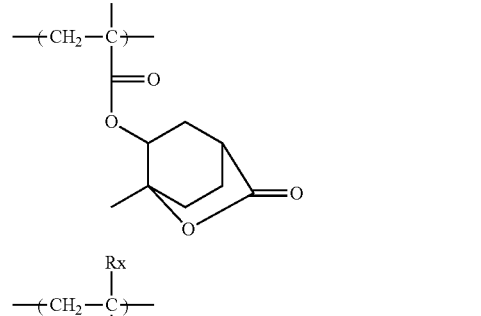
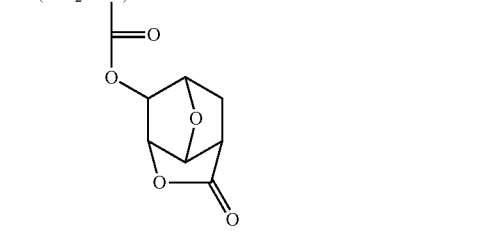
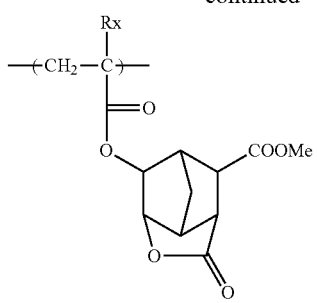
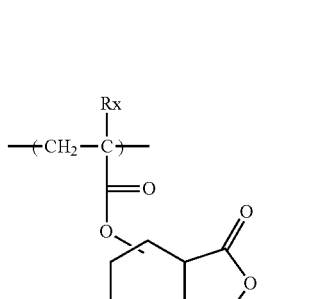
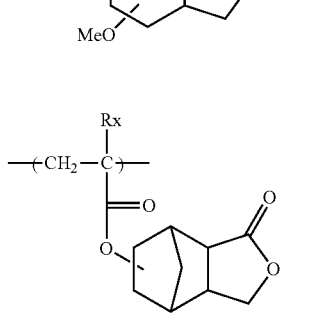
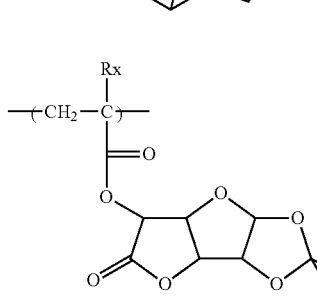
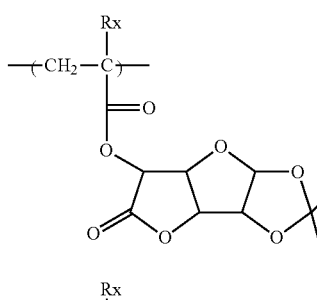
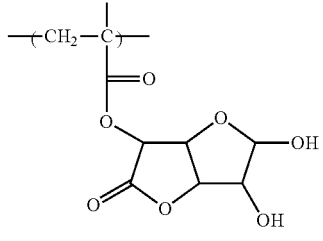

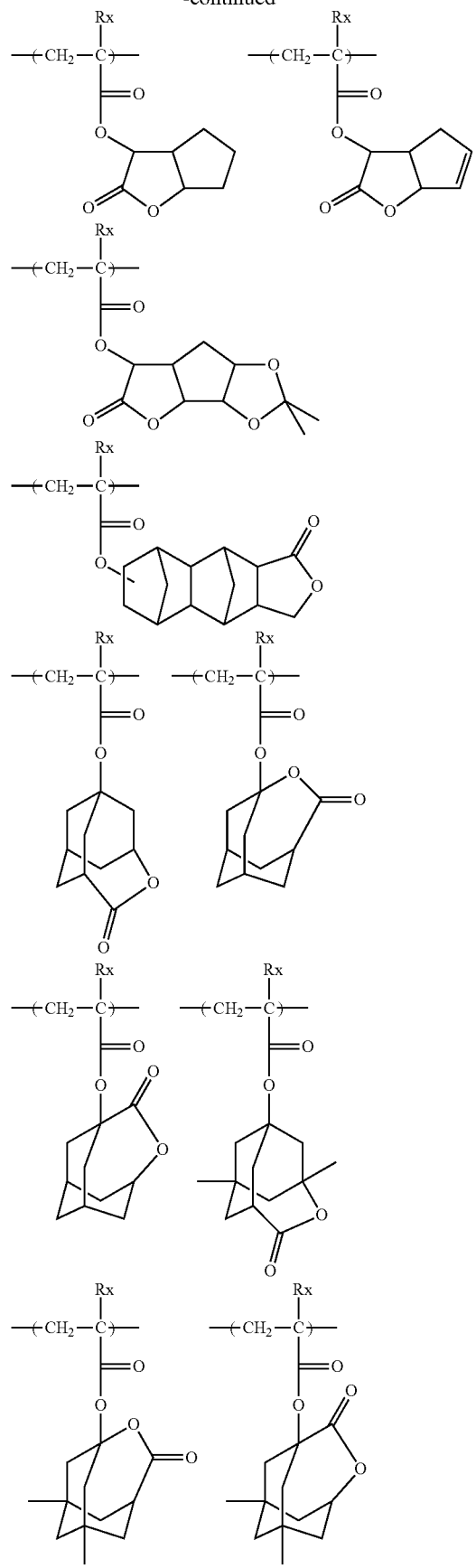
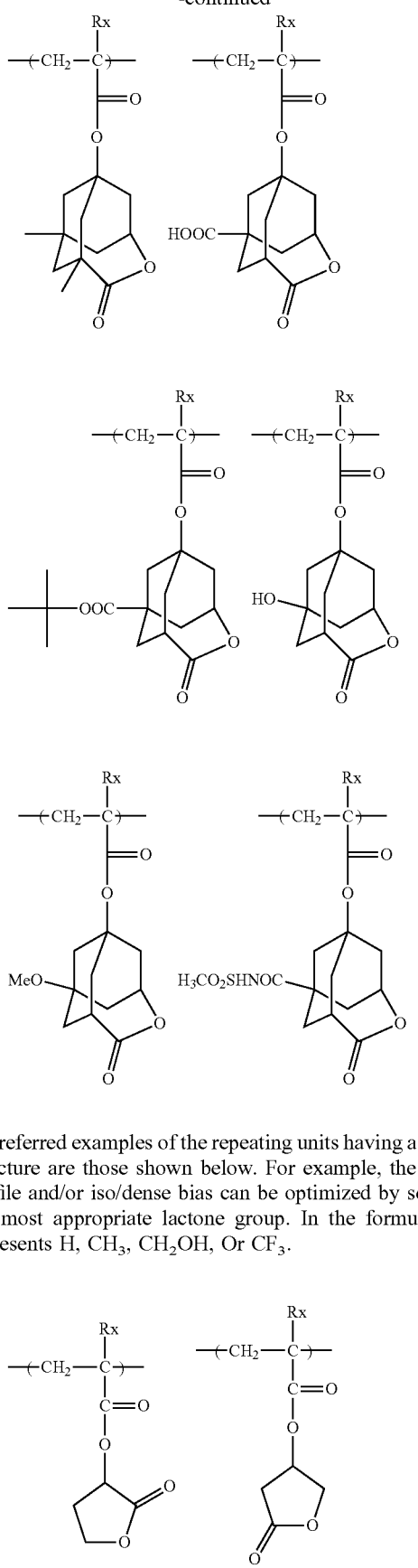
Preferred examples of the repeating units having a lactone structure are those shown below. For example, the pattern profile and/or iso/dense bias can be optimized by selecting the most appropriate lactone group. In the formulae, Rx represents H, CH₃, CH₂OH, Or CF₃.

-continued

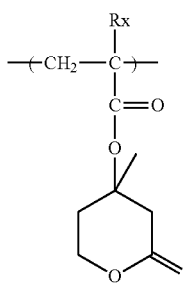

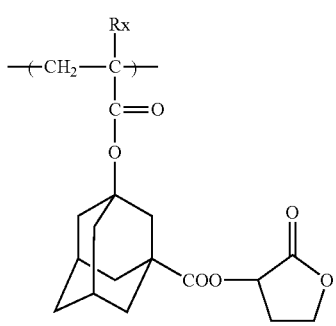

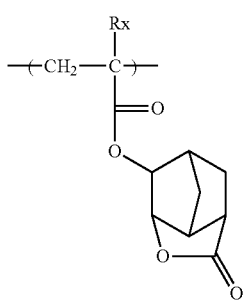

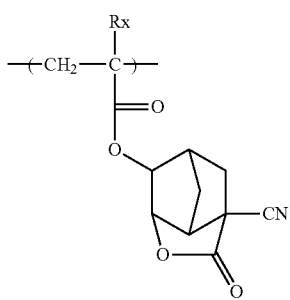

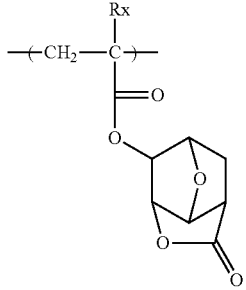

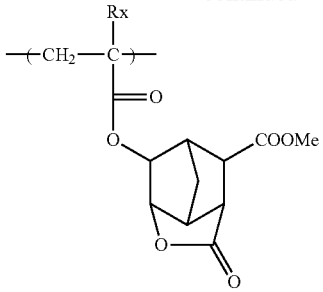

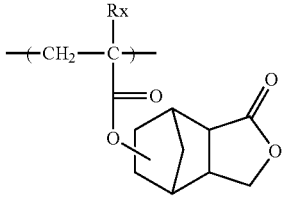

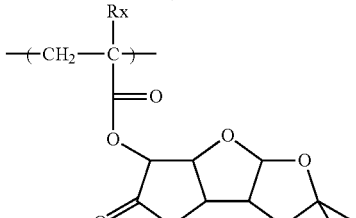

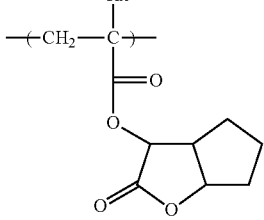

The repeating unit containing a lactone structure is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

The repeating unit containing a lactone group may be any of those of general formula (1) below.

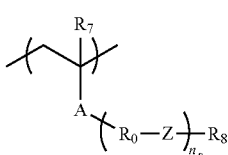

(1)

In general formula (1),

A represents an ester bond or an amido bond.

$R_0$, when $n_s \geq 2$ each of $R_0$s independently, represents an alkylene group, a cycloalkylene group or a combination thereof.

Z, when $n_s \geq 2$ each of Zs independently, represents an ether bond, an ester bond, an amido bond, any of urethane bonds of the formula:

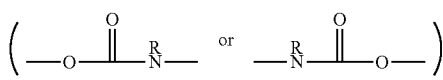

or any of urea bonds of the formula:

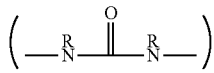

in which R represents, for example, a hydrogen atom, an alkyl group, a cycloalkyl group or an aryl group.

$R_8$ represents a monovalent organic group with a lactone structure.

In the general formula, $n_s$ is an integer of 1 to 5, preferably 1.

$R_7$ represents a hydrogen atom, an alkyl group or a halogen atom. One or more substituents may be introduced in the alkyl group. $R_7$ is preferably a hydrogen atom, a methyl group, a hydroxymethyl group or an acetoxymethyl group.

As mentioned above, $R_0$ represents an alkylene group, a cycloalkylene group or a combination thereof.

The alkylene group represented by $R_0$ may be in the form of a linear chain or a branched chain. The alkylene group preferably has 1 to 6 carbon atoms, more preferably 1 to 3 carbon atoms. As the alkylene group, there can be mentioned, for example, a methylene group, an ethylene group or a propylene group.

The cycloalkylene group represented by $R_0$ preferably has 3 to 10 carbon atoms, more preferably 5 to 7 carbon atoms. As the cycloalkylene group, there can be mentioned, for example, a cyclopropylene group, a cyclobutylene group, a cyclopentylene group or a cyclohexylene group.

One or more substituents may be introduced in these alkylene and cycloalkylene groups. As such substituents, there can be mentioned, for example, a halogen atom, such as a fluorine atom, a chlorine atom or a bromine atom; a mercapto group; a hydroxyl group; an alkoxy group, such as a methoxy group, an ethoxy group, an isopropoxy group, a t-butoxy or a benzyloxy group; a cycloalkyl group, such as a cyclopropyl group, a cyclobutyl group, a cyclopentyl group, a cyclohexyl group or a cycloheptyl group; a cyano group; a nitro group; a sulfonyl group; a silyl group; an ester group; an acyl group; a vinyl group; and an aryl group.

As mentioned above, Z represents an ether bond, an ester bond, an amido bond, a urethane bond or a urea bond. Z is preferably an ether bond or an ester bond. An ester bond is especially preferred.

As mentioned above, $R_8$ is a monovalent organic group with a lactone structure. This organic group has, for example, any of the lactone structures of general formulae (LC1-1) to (LC1-17) above. Of these, the structures of general formulae (LC1-4), (LC1-5) and (LC1-17) are preferred. The structure of general formula (LC1-4) is especially preferred.

It is preferred for $R_8$ to have an unsubstituted lactone structure or a lactone structure in which a methyl group, a cyano group or an alkoxycarbonyl group is introduced as a substituent. Most preferably, $R_8$ is a monovalent organic group with a lactone structure in which one or more cyano groups are introduced as substituents (namely, a cyanolactone structure).

Specific examples of the repeating units of general formula (1) will be shown below. In the specific examples, R represents a hydrogen atom, an alkyl group or a halogen atom. A substituent may be introduced in the alkyl group. R is preferably a hydrogen atom, a methyl group, a hydroxymethyl group or an acetoxymethyl group.

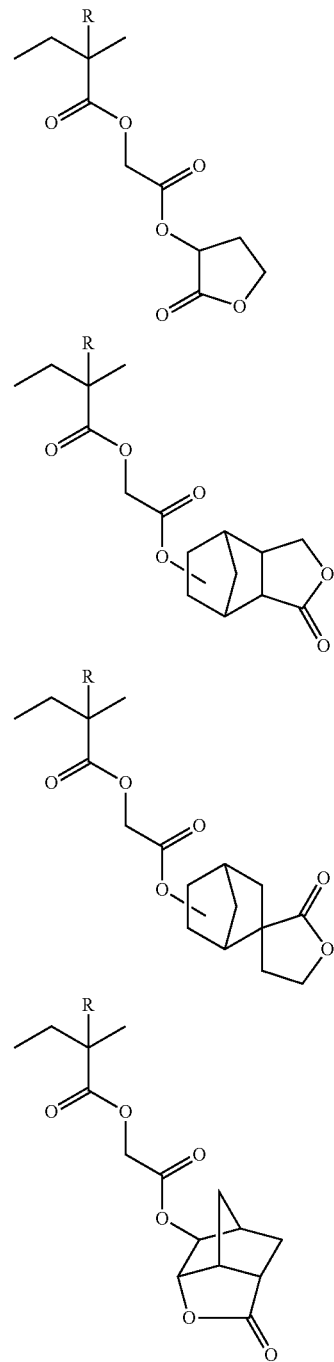

The repeating units of general formula (1) are preferably those of general formula (2) below.

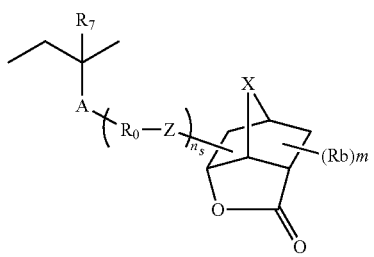

(2)

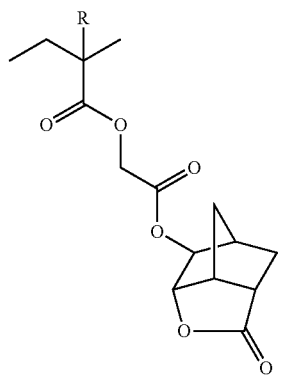

In general formula (2), $R_7$, A, $R_0$, Z and $n_s$ are as defined in general formula (1) above.

Rb, when m≥2 each of Rb's independently, represents an alkyl group, a cycloalkyl group, an alkoxycarbonyl group, a cyano group, a hydroxyl group or an alkoxy group. When m≥2, two or more Rb's may be bonded to each other to thereby form a ring.

X represents an alkylene group, an oxygen atom or a sulfur atom, and m is an integer of 0 to 5. Preferably, m is 0 or 1.

The alkyl group represented by Rb is preferably an alkyl group having 1 to 4 carbon atoms, more preferably a methyl group or an ethyl group, and most preferably a methyl group. As the cycloalkyl group, there can be mentioned, for example, a cyclopropyl group, a cyclobutyl group, a cyclopentyl group or a cyclohexyl group. As the alkoxycarbonyl group, there can be mentioned, for example, a methoxycarbonyl group, an ethoxycarbonyl group, an n-butoxycarbonyl group or a t-butoxycarbonyl group. As the alkoxy group, there can be mentioned, for example, a methoxy group, an ethoxy group, an n-butoxy group or a t-butoxy group. One or more substituents may be introduced in the alkyl group, cycloalkyl group, alkoxycarbonyl group and alkoxy group represented by Rb. As such substituents, there can be mentioned, for example, a hydroxyl group; an alkoxy group such as a methoxy group or an ethoxy group; a cyano group; and a halogen atom such as a fluorine atom. More preferably, Rb is a methyl group, a cyano group or an alkoxycarbonyl group, further more preferably a cyano group.

When m≥1, it is preferred for the substitution with at least one Rb to take place at the α- or β-position of the carbonyl group of the lactone. The substitution with Rb at the α-position of the carbonyl group of the lactone is especially preferred.

As the alkylene group represented by X, there can be mentioned, for example, a methylene group or an ethylene group. X is preferably an oxygen atom or a methylene group, more preferably a methylene group.

Specific examples of the repeating units of general formula (2) will be shown below. In the specific examples, R represents a hydrogen atom, an alkyl group or a halogen atom. A substituent may be introduced in the alkyl group. R is preferably a hydrogen atom, a methyl group, a hydroxymethyl group or an acetoxymethyl group.

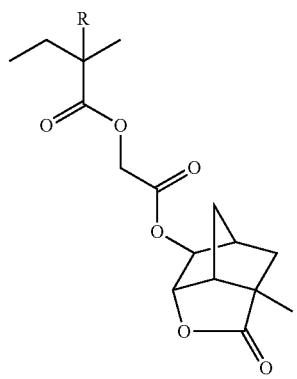

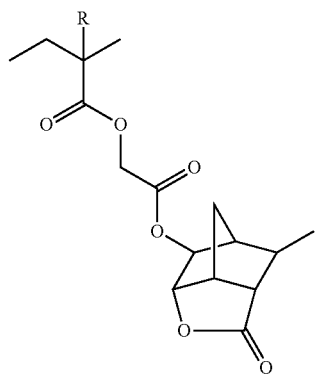

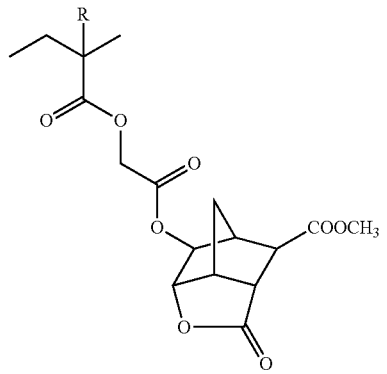

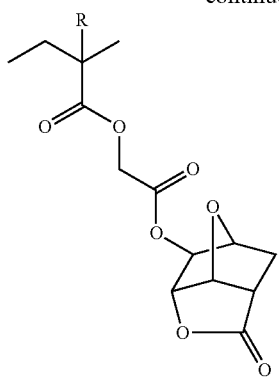
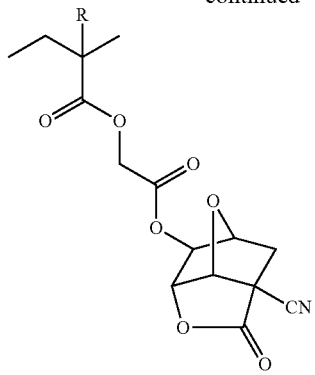
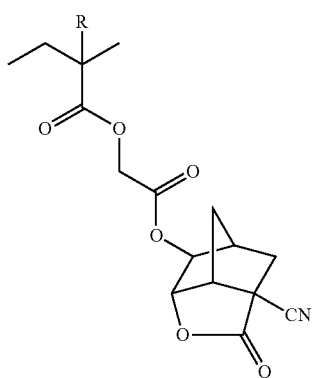
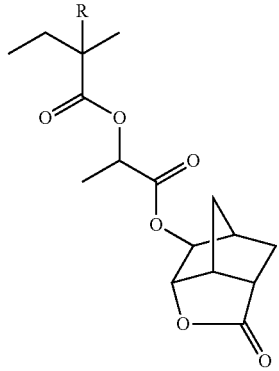
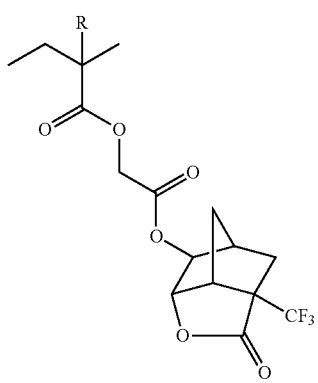
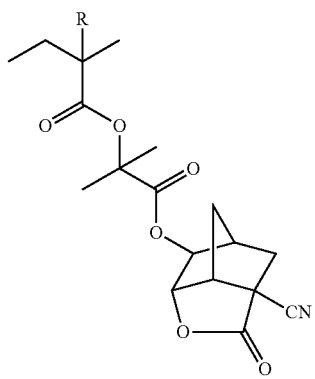
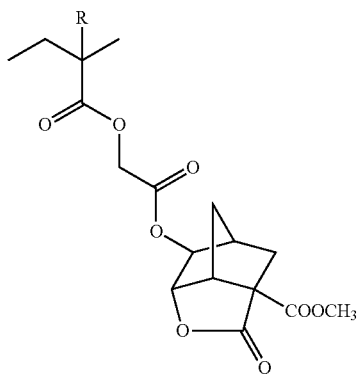
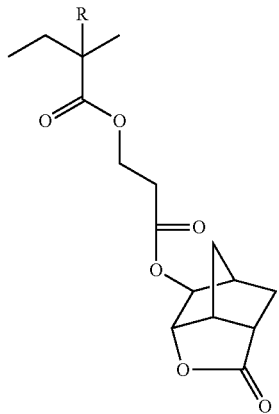

47
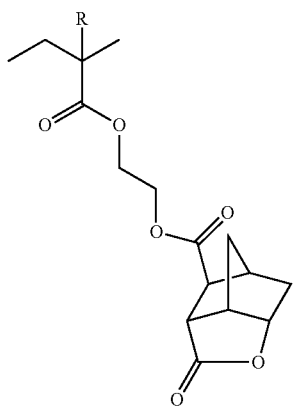
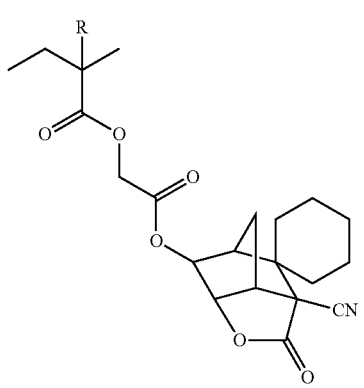
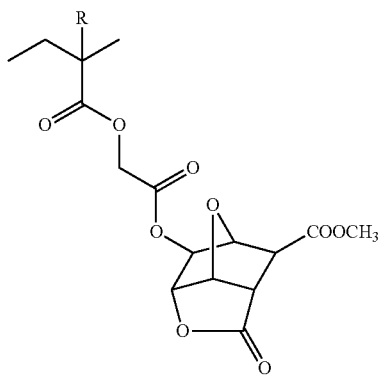
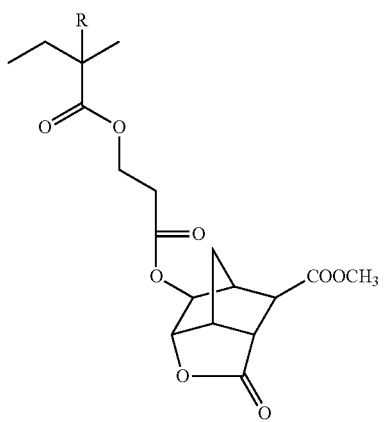
48
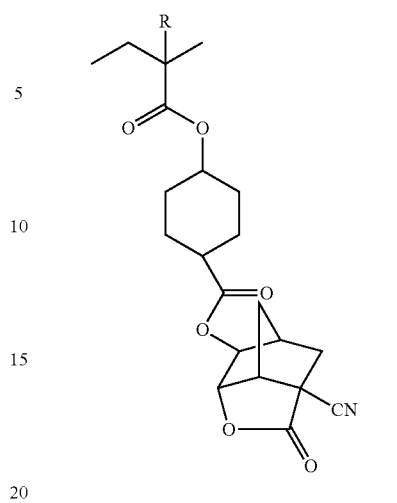
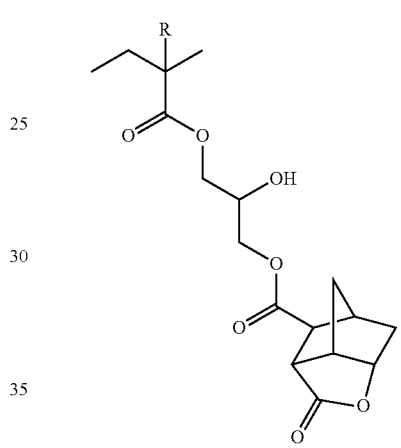
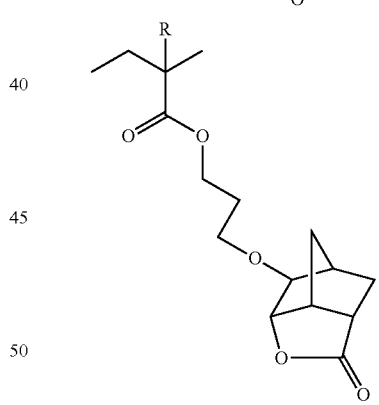
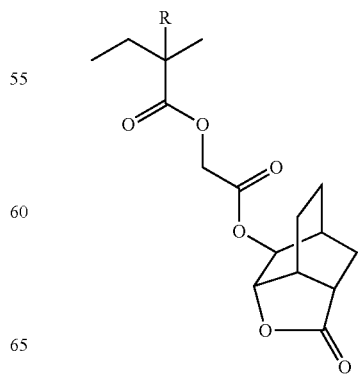

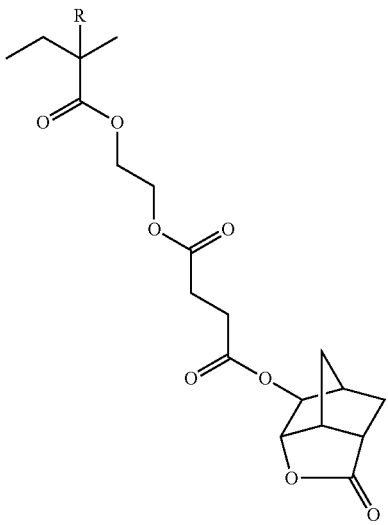
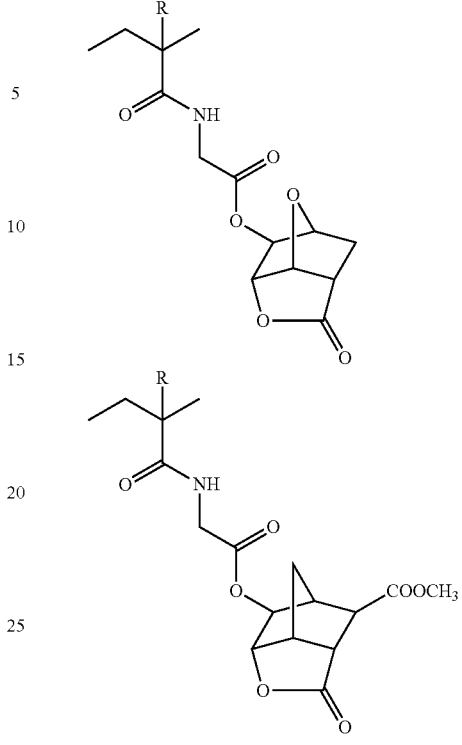
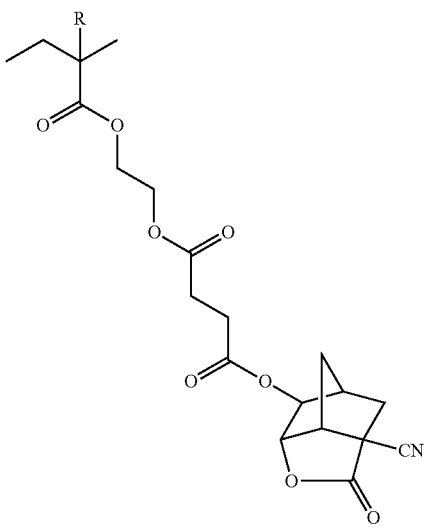
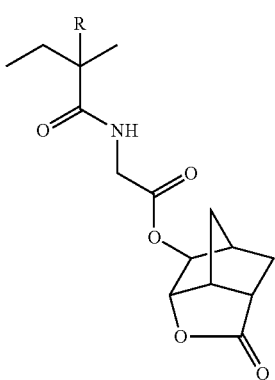

Two or more types of lactone repeating units selected from among those of general formula (1) can be simultaneously used in order to increase the effects of the present invention. In the simultaneous use, it is preferred to select two or more types of repeating units from among those of general formula (1) in which $n_s$ is 1 and simultaneously use the selected repeating units.

The content of the repeating unit containing a lactone structure based on all the repeating units of the resin is preferably in the range of 10 to 80 mol %, more preferably 15 to 70 mol % and further more preferably 20 to 60 mol %.

As other preferred repeating units (A), there can be mentioned, for example, those containing any of a carboxyl group, a sulfonamido group, a sulfonylimido group, a bis-sulfonylimido group and an aliphatic alcohol group substituted at its α-position with an electron withdrawing group (e.g., a hexafluoroisopropanol group). Of these, the repeating unit (A) containing a carboxyl group is more preferred.

The incorporation of the repeating unit containing any of these groups increases the resolution in contact hole usage. The repeating unit (A) is preferably any of a repeating unit wherein any of these groups is directly bonded to the principal chain of a resin such as a repeating unit of acrylic acid or methacrylic acid, a repeating unit wherein any of these groups is bonded via a connecting group to the principal chain of a resin and a repeating unit wherein any of these groups is introduced in a terminal of a polymer chain by the use of a chain transfer agent or polymerization initiator containing any of these groups in the stage of polymerization. The connecting group may have a mono- or polycyclohydrocarbon structure. The repeating unit of acrylic acid or methacrylic acid is especially preferred.

The content of the repeating unit (A) containing the above group based on all the repeating units of the acid-decomposable resin is preferably in the range of 0 to 20 mol %, more preferably 3 to 15 mol % and further more preferably 5 to 10 mol %.

Specific examples of the repeating unit (A) containing the above group will be shown below, which however in no way limit the scope of the present invention.

In the specific examples, Rx represents H, $CH_3$, $CH_2OH$ or $CF_3$.

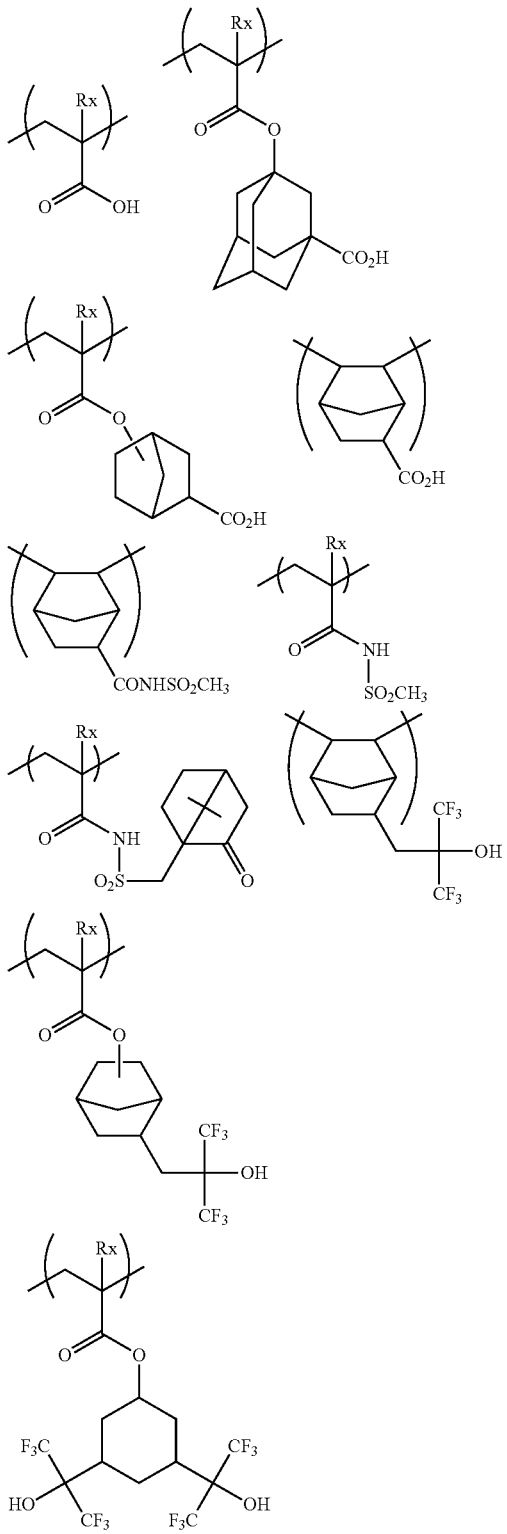

(B) Repeating unit containing a group that is decomposed when acted on by an acid to thereby produce a polar group other than the alcoholic hydroxyl group It is preferred for the acid-decomposable resin to further contain a repeating unit (B) containing a group that is decomposed when acted on by an acid to thereby produce a polar group other than the alcoholic hydroxyl group. It is especially preferred for the acid-decomposable resin to further contain a repeating unit containing a group that is decomposed when acted on by an acid to thereby produce a carboxyl group. If so, the focus latitude (depth of focus DOF) of the composition comprising the acid-decomposable resin can be enhanced.

It is preferred for the repeating unit (B) to have a structure in which the polar group is protected by a group that is decomposed when acted on by an acid to thereby be cleaved. As this polar group, there can be mentioned, for example, a phenolic hydroxyl group, a carboxyl group, a sulfonate group, a sulfonamido group, a sulfonylimido group, a (alkylsulfonyl)(alkylcarbonyl)methylene group, a (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like. As preferred polar groups, there can be mentioned a carboxyl group and a sulfonate group.

The acid-decomposable group is preferably a group as obtained by substituting the hydrogen atom of any of these polar groups with a group that is cleaved by the action of an acid.

As a group that is cleaved by the action of an acid, there can be mentioned, for example, a group represented by —$C(R_{36})(R_{37})(R_{38})$, —$C(R_{36})(R_{37})(OR_{39})$ or —$C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like. Particularly preferred is a tertiary alkyl ester group.

It is preferred for the repeating unit containing an acid-decomposable group that can be contained in the acid-decomposable resin to be any of those of general formula (AI) below.

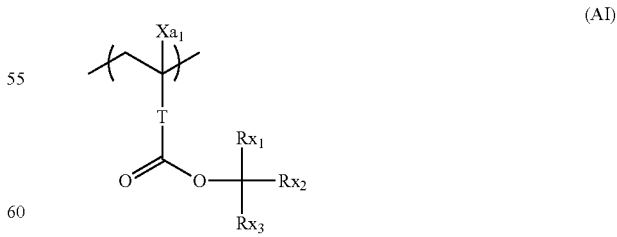

(AI)

In general formula (AI), $Xa_1$ represents a hydrogen atom, an optionally substituted methyl group, or a group represented by —$CH_2$—$R_9$. $R_9$ represents a hydroxyl group or a monovalent organic group. $R_9$ preferably represents an alkyl or an acyl group having 5 or less carbon atoms, more preferably an alkyl group having 3 or less carbon atoms, and further more preferably a methyl group. $Xa_1$ preferably represents a hydrogen atom, a methyl group, a trifluoromethyl group or a hydroxymethyl group.

T represents a single bond or a bivalent connecting group.

Each of $Rx_1$ to $Rx_3$ independently represents a linear or branched alkyl group or a mono- or polycycloalkyl group.

At least two of $Rx_1$ to $Rx_3$ may be bonded to each other to thereby form a mono- or polycycloalkyl group.

As the bivalent connecting group represented by T, there can be mentioned, for example, an alkylene group, a group of the formula —(COO-Rt)- or a group of the formula —(O-Rt)- . In the formulae, Rt represents an alkylene group or a cycloalkylene group.

T is preferably a single bond or a group of the formula —(COO-Rt)- . Rt is preferably an alkylene group having 1 to 5 carbon atoms, more preferably a —$CH_2$— group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group.

The cycloalkyl group formed by bonding at least two of $Rx_1$ to $Rx_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group.

Of these, cycloalkyl groups having 5 or 6 carbon atoms are especially preferred.

In an especially preferred mode, $Rx_1$ is a methyl group or an ethyl group, and $Rx_2$ and $Rx_3$ are bonded to each other to thereby form any of the above-mentioned cycloalkyl groups.

One or more substituents may further be introduced in each of the groups above. As the substituents, there can be mentioned, for example, an alkyl group (preferably having 1 to 4 carbon atoms), a halogen atom, a hydroxy group, an alkoxy group (preferably having 1 to 4 carbon atoms), a carboxyl group, an alkoxycarbonyl group (preferably having 2 to 6 carbon atoms). Preferably, each of the substituents has 8 or less carbon atoms.

It is more preferred for the acid-decomposable resin to contain, as the repeating units of general formula (AI), any of the repeating units of general formula (1) below and/or any of the repeating units of general formula (II) below.

(I)

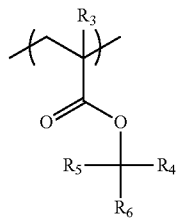

(II)

In general formulae (1) and (II),
each of $R_1$ and $R_3$ independently represents a hydrogen atom, an optionally substituted methyl group or any of the groups of the formula —$CH_2$—$R_9$. $R_9$ represents a monovalent organic group.

Each of $R_2$, $R_4$, $R_5$ and $R_6$ independently represents an alkyl group or a cycloalkyl group.

R represents an atomic group required for forming an alicyclic structure in cooperation with a carbon atom.

$R_1$ preferably represents a hydrogen atom, a methyl group, a trifluoromethyl group or a hydroxymethyl group.

The alkyl group represented by $R_2$ may be linear or branched, and one or more substituents may be introduced therein.

The cycloalkyl group represented by $R_2$ may be monocyclic or polycyclic, and a substituent may be introduced therein.

$R_2$ preferably represents an alkyl group, more preferably an alkyl group having 1 to 10 carbon atoms, further more preferably 1 to 5 carbon atoms. As examples thereof, there can be mentioned a methyl group and an ethyl group.

R represents an atomic group required for forming an alicyclic structure in cooperation with a carbon atom. The alicyclic structure formed by R is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and one or more substituents may be introduced therein. The alkyl groups are preferably those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and a substituent may be introduced therein. The cycloalkyl groups are preferably a monocycloalkyl group, such as a cyclopentyl group or a cyclohexyl group, and a polycycloalkyl group, such as a norbornyl group, a tetracyclodecanyl group, a tetracyclododecanyl group or an adamantyl group.

As the repeating units of general formula (1), there can be mentioned, for example, those of general formula (I-a) below.

(1-a)

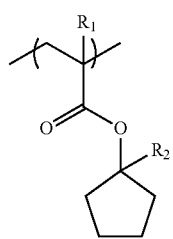

In the formula, $R_1$ and $R_2$ have the same meaning as in general formula (1).

The repeating units of general formula (II) are preferably those of general formula (II-1) below.

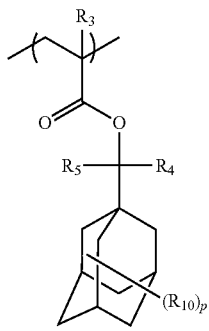

(II-1)

In general formula (II-1), $R_3$ to $R_5$ have the same meaning as in general formula (II).

$R_{10}$ represents a substituent containing a polar group. When a plurality of $R_{10}$s exist, they may be identical to or different from each other. As the substituent containing a polar group, there can be mentioned, for example, a linear or branched alkyl group, or cycloalkyl group, in which a hydroxyl group, a cyano group, an amino group, an alkylamido group or a sulfonamido group is introduced. An alkyl group in which a hydroxyl group is introduced is preferred. An isopropyl group is especially preferred as the branched alkyl group.

In the formula, p is an integer of 0 to 15, preferably in the range of 0 to 2, and more preferably 0 or 1.

It is more preferred for the acid-decomposable resin to be a resin containing, as the repeating units of general formula (AI), at least either any of the repeating units of general formula (1) or any of the repeating units of general formula (II). In another form, it is more preferred for the acid-decomposable resin to be a resin containing, as the repeating units of general formula (AI), at least two types selected from among the repeating units of general formula (1).

When the resin contains the repeating unit (B), the sum of contents of which based on all the repeating units of the resin is preferably in the range of 3 to 50 mol %, more preferably 5 to 40 mol % and further more preferably 7 to 30 mol %.

The content of the repeating unit (P) based on the sum of that of repeating unit (P) and that of repeating unit (B) [i.e. the total amount of the repeating units containing acid-decomposable group] is preferably in the range of 70 mol % to 100 mol %, more preferably in the range of 80 mol % to 100 mol %, and further more preferably in the range of 85 mol % to 100 mol %.

When the resin contains the repeating unit (B), the content of the repeating unit (P) based on the sum of that of repeating unit (P) and that of repeating unit (B) is preferably in the range of 70 mol % to 97 mol %, more preferably in the range of 80 mol % to 95 mol %, and further more preferably in the range of 85 mol % to 93 mol %.

Specific examples of the preferred repeating units (B) will be shown below, which however in no way limit the scope of the present invention.

In the specific examples, Rx and Xa1 each represents a hydrogen atom, $CH_3$, $CF_3$ or $CH_2OH$. Each of Rxa and Rxb represents an alkyl group having 1 to 4 carbon atoms. Z or each of Zs independently represents a substituent containing one or more polar groups. P represents 0 or a positive integer.

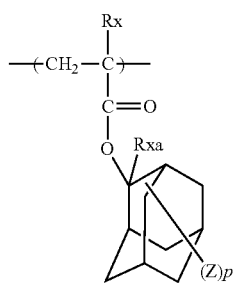

1

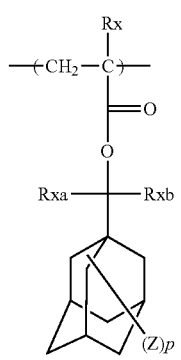

2

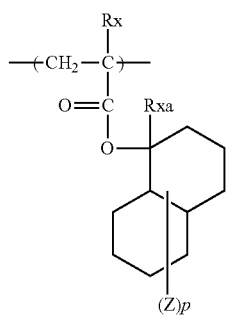

3

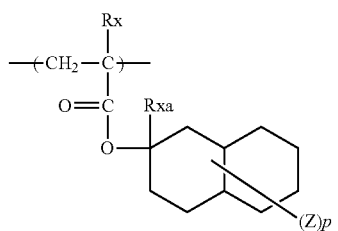

4

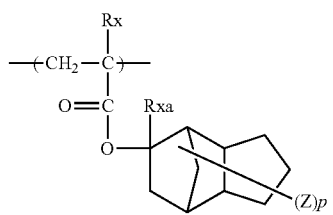

5

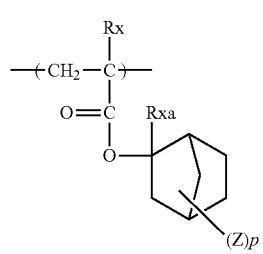
6
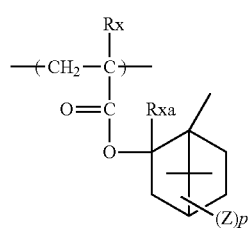
7
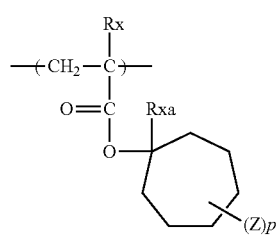
8
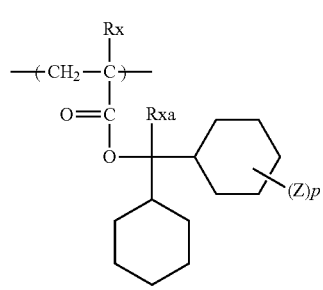
9
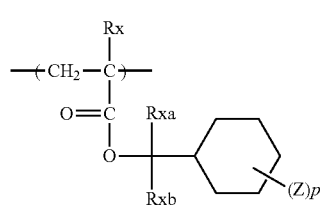
10
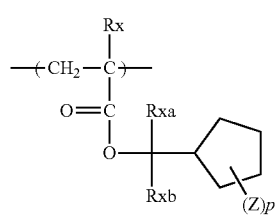
11
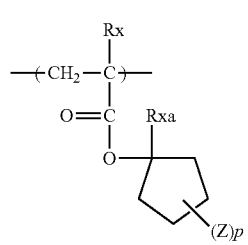
12
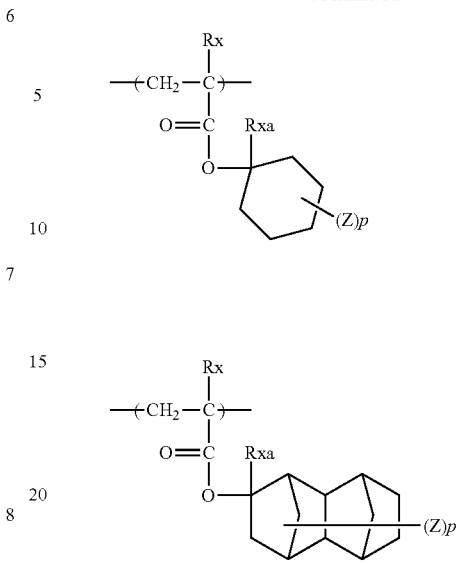
13
14
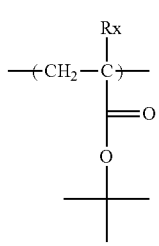
15
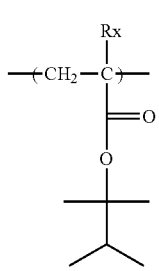
16
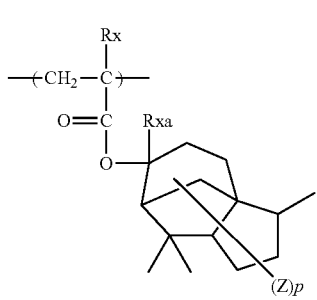
17
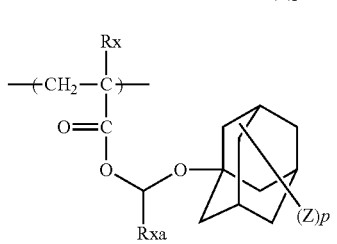
18

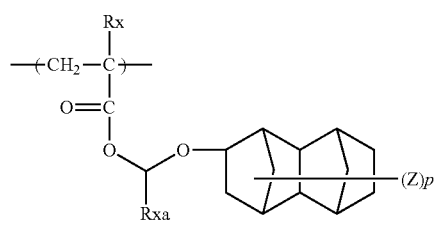
19
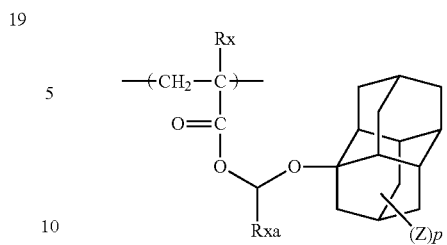
25
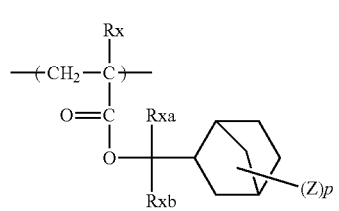
20
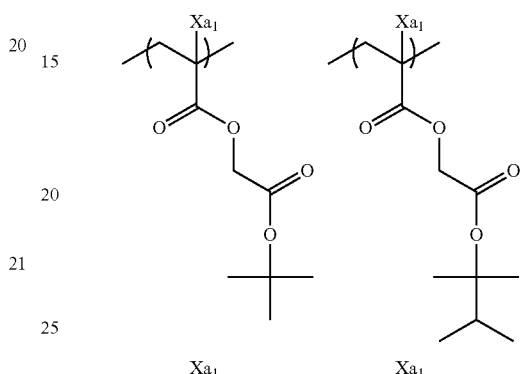
21
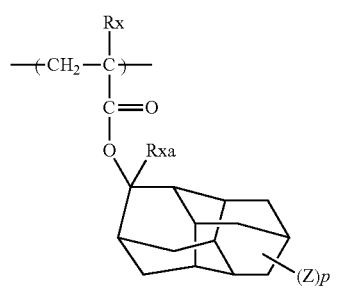
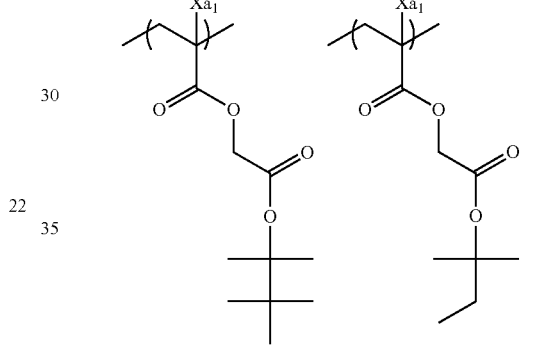
22
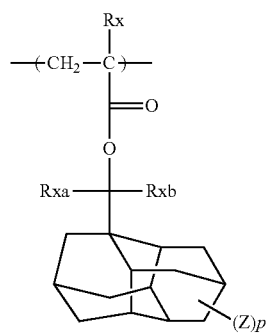
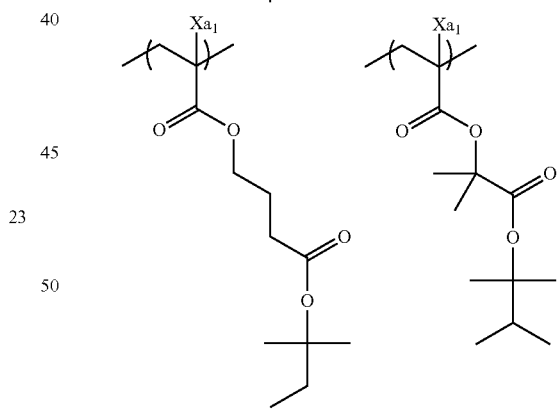
23
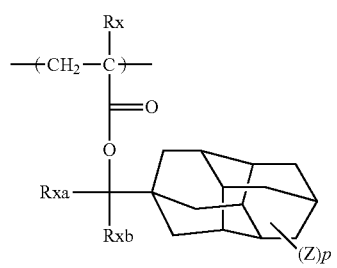
24
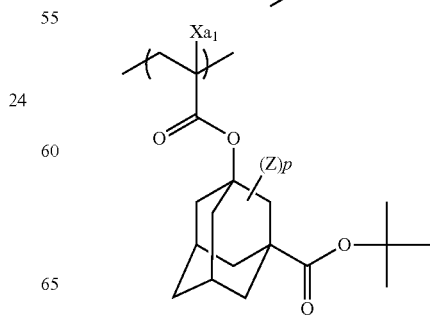
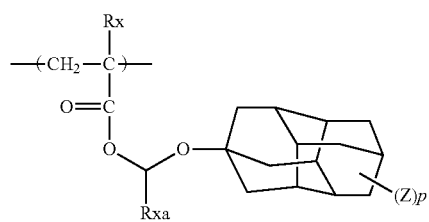

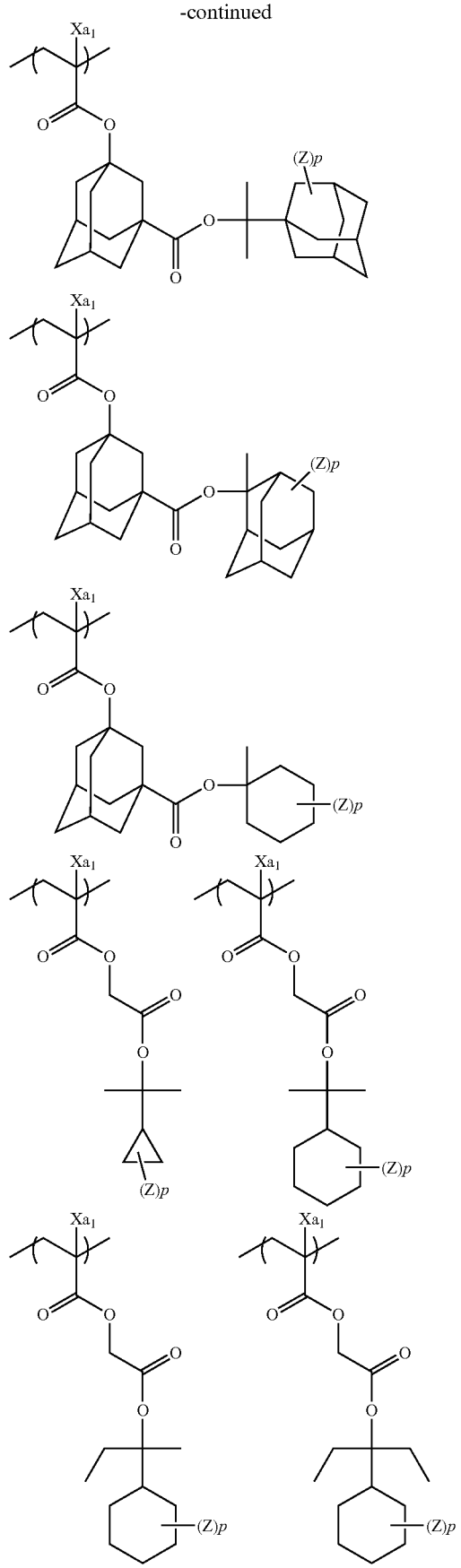
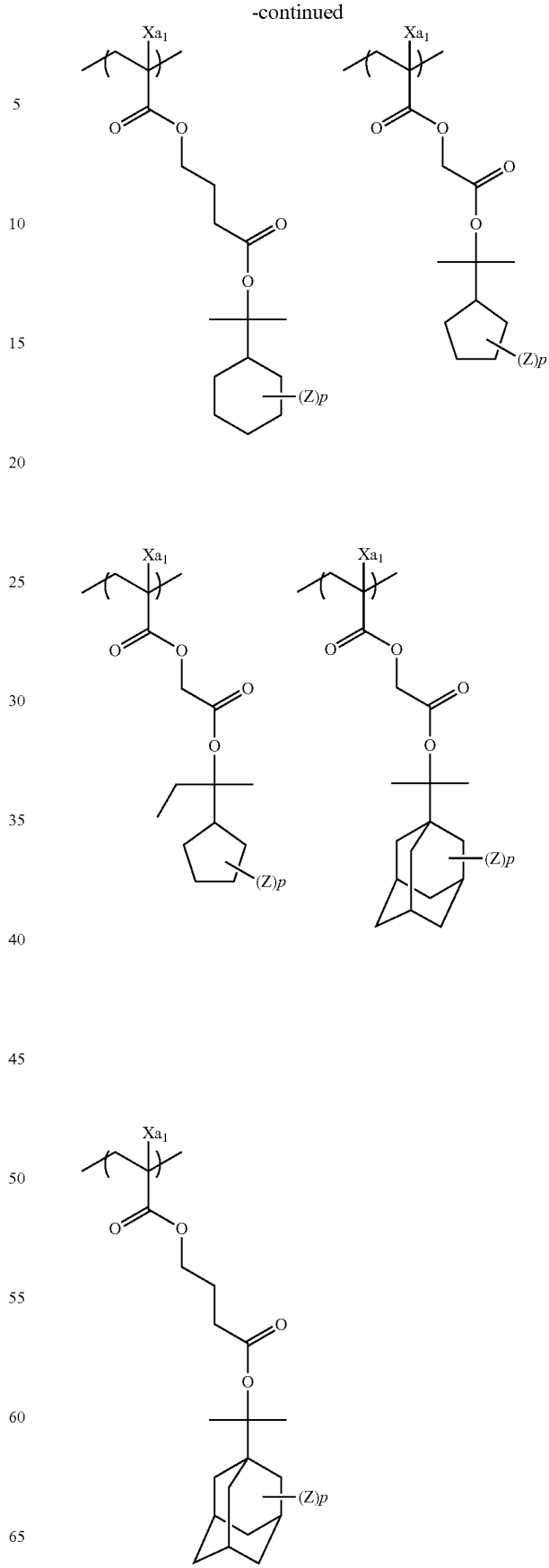

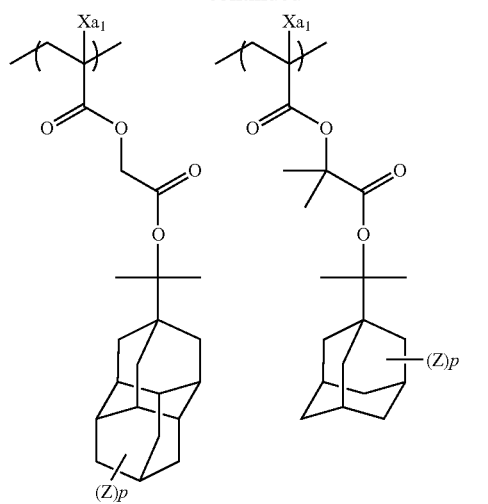
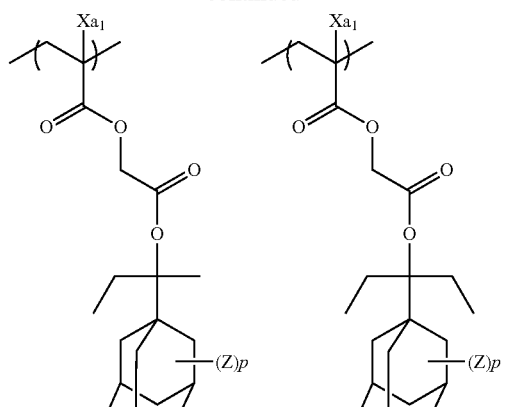
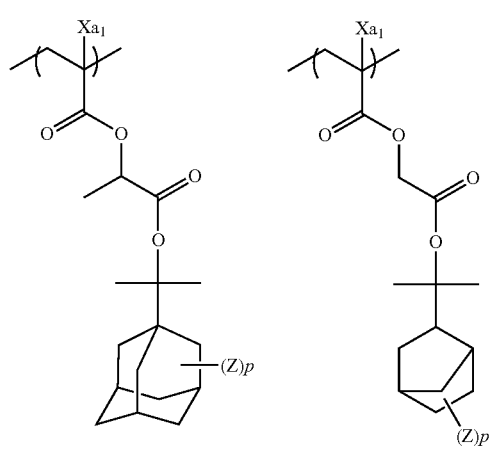
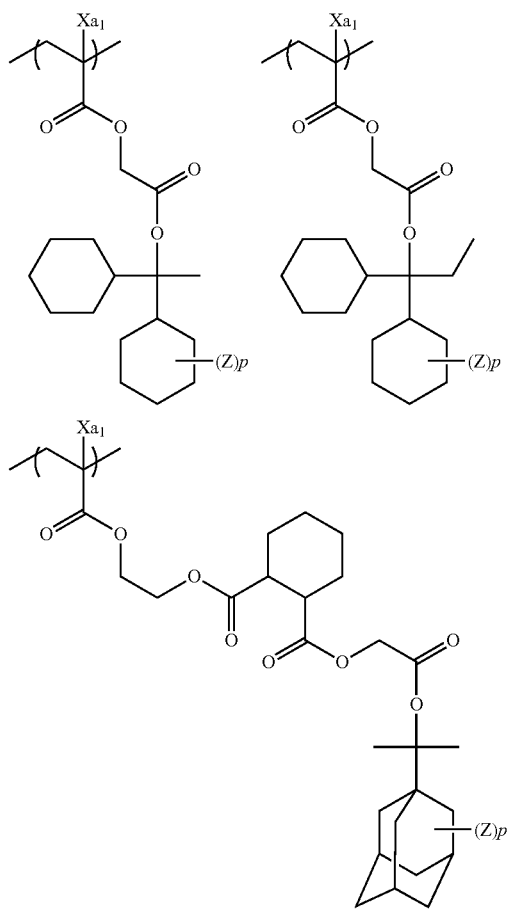
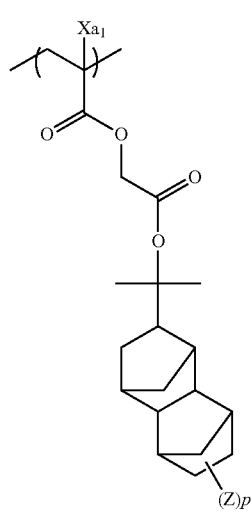

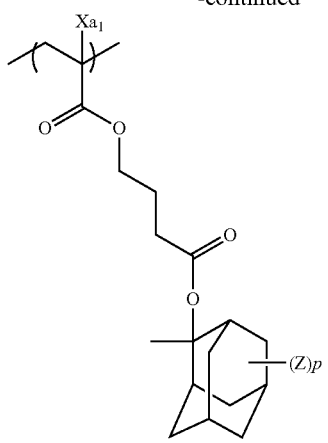
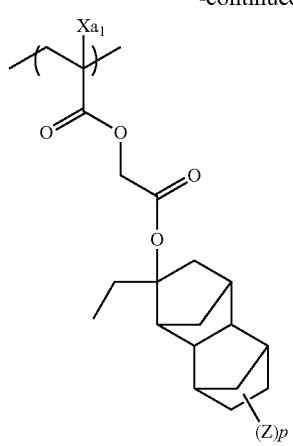
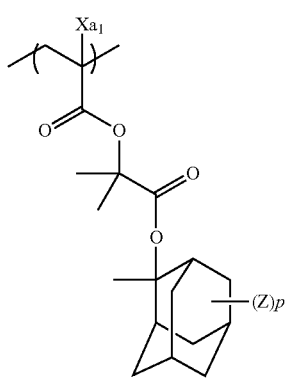
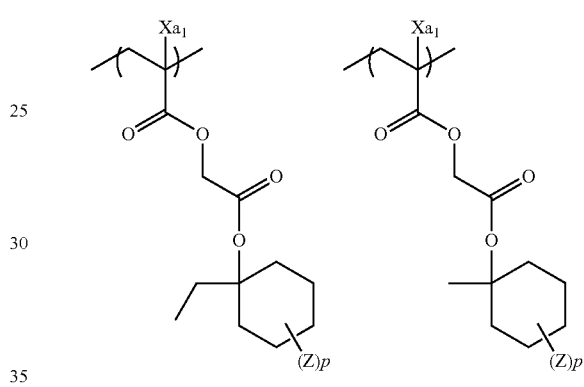
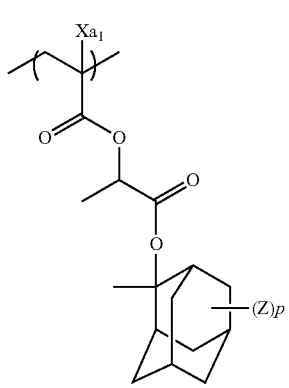
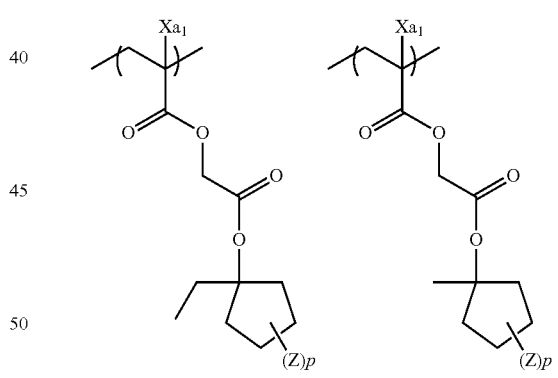
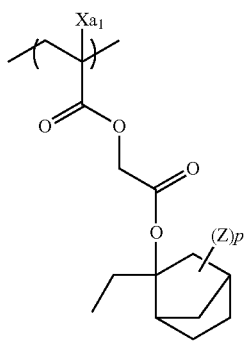
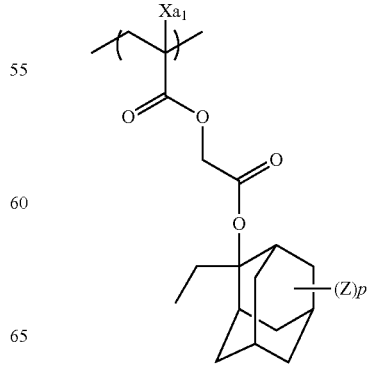

-continued
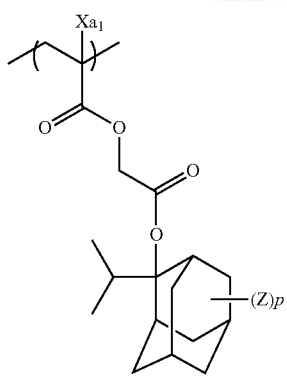
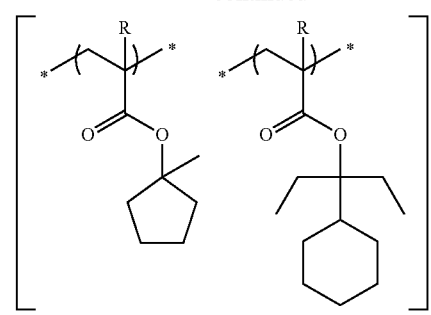
When the acid-decomposable resin contains a plurality of repeating units (B), the following combinations are preferred. In the following formulae, R each independently represents a hydrogen atom or a methyl group.
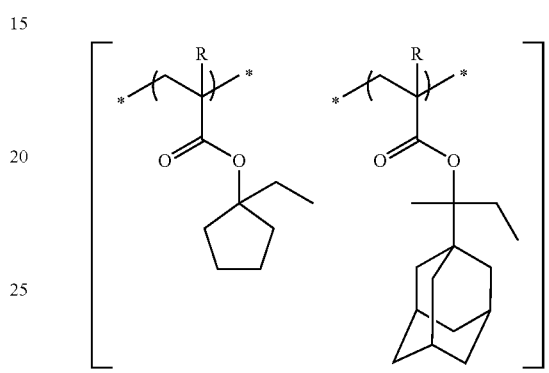
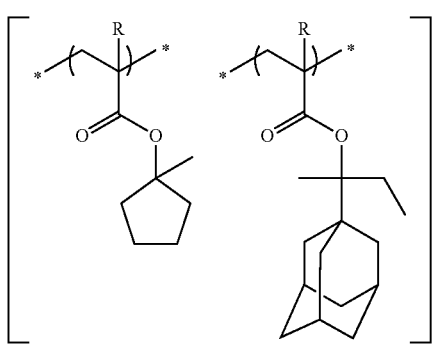
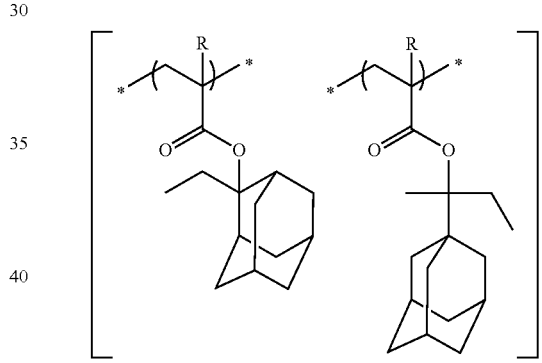
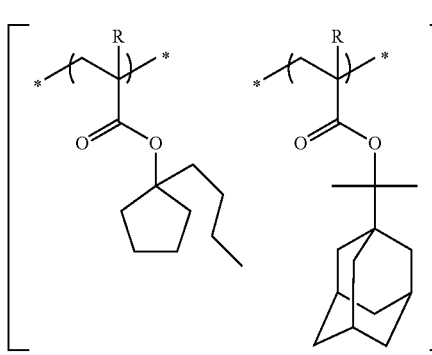
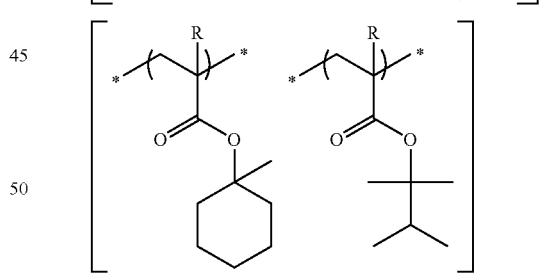
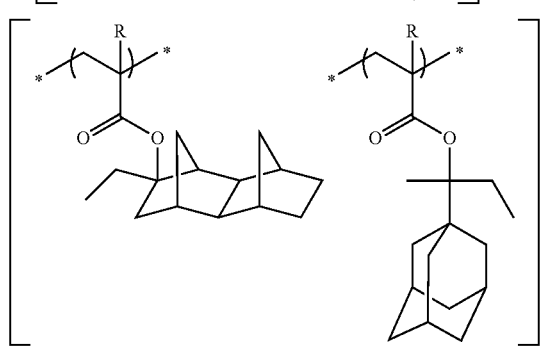

-continued
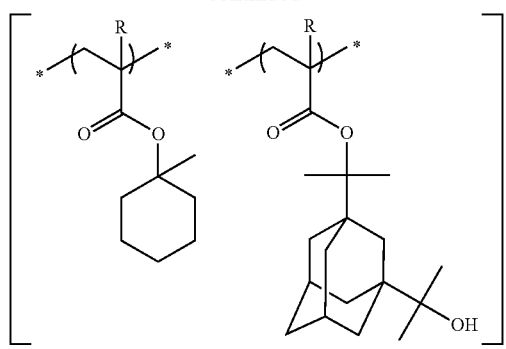
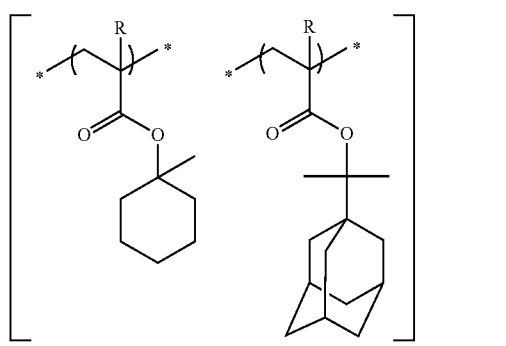
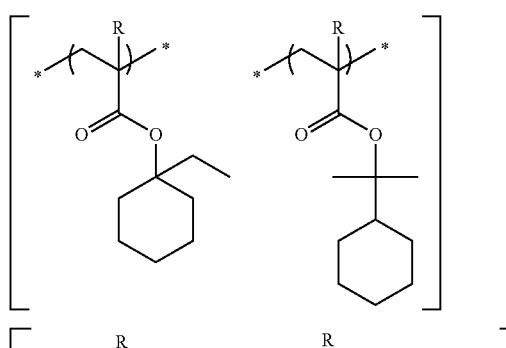
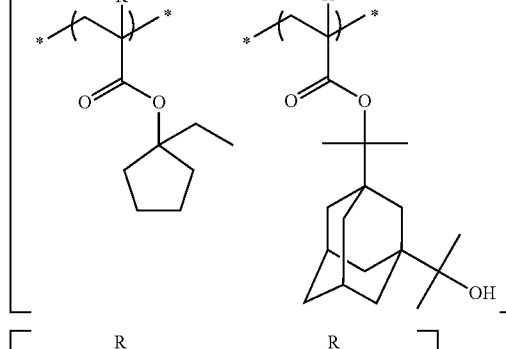
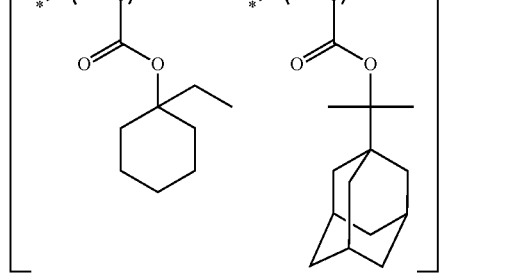
-continued
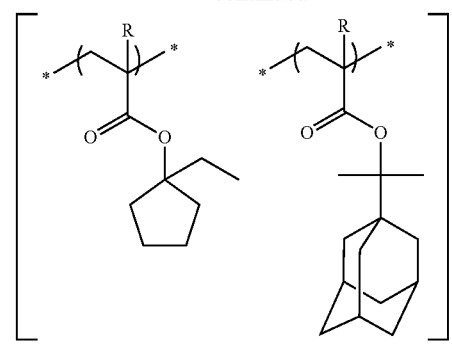
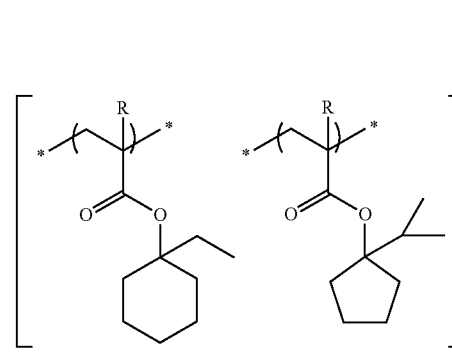
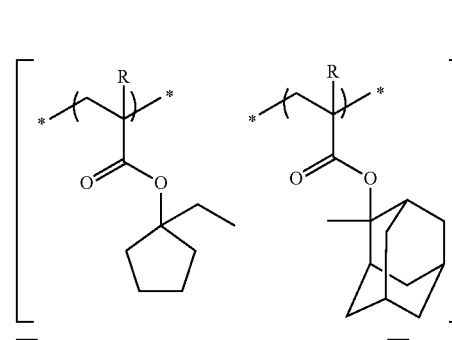
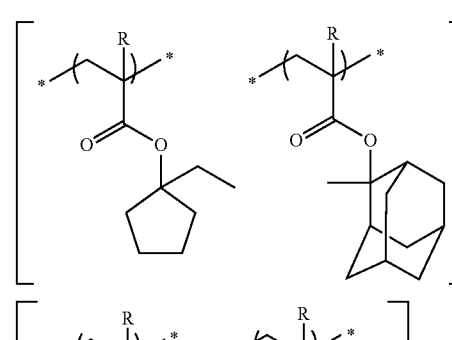
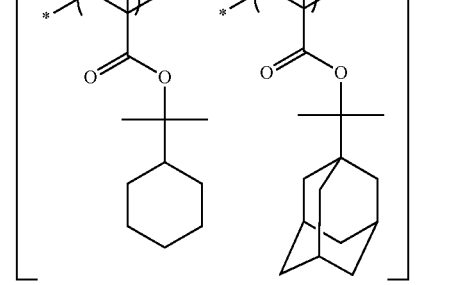

-continued

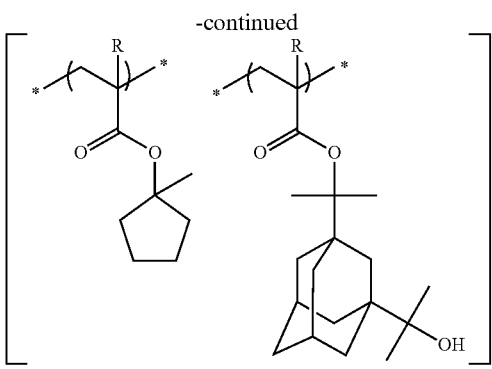

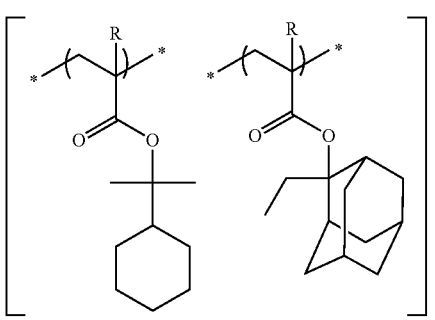

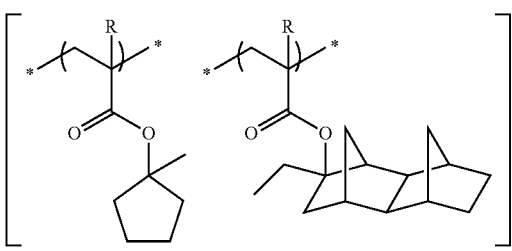

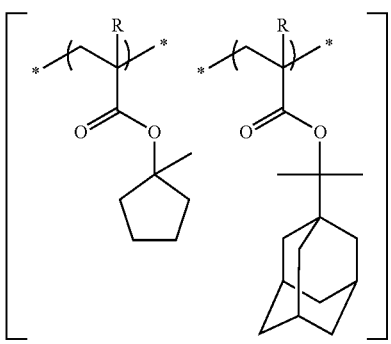

(C) Repeating unit having an alicyclic hydrocarbon structure containing no polar group, which repeating unit exhibits no acid decomposability The acid-decomposable resin may further contain a repeating unit (C) having an alicyclic hydrocarbon structure containing no polar group, which repeating unit exhibits no acid decomposability. As the repeating unit (C), there can be mentioned, for example, any of those of general formula (IV) below.

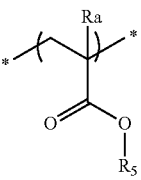

(IV)

In the general formula (IV), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. Ra is preferably a hydrogen atom, a methyl group, a hydroxymethyl group or a trifluoromethyl group, further preferably a hydrogen atom or a methyl group.

The cyclic structures contained in $R_5$ include a monocyclic hydrocarbon group and a polycyclic hydrocarbon group. As the monocyclic hydrocarbon group, a cycloalkyl group having 3 to 12 carbon atoms and a cycloalkenyl group having 3 to 12 carbon atoms can be exemplified. Preferably, the monocyclic hydrocarbon group is a monocyclic hydrocarbon group having 3 to 7 carbon atoms. As such, a cyclopentyl group and a cyclohexyl group can be exemplified.

The polycyclic hydrocarbon groups include ring-assembly hydrocarbon groups and crosslinked-ring hydrocarbon groups.

As the ring-assembly hydrocarbon groups, for example, a bicyclohexyl group and a perhydronaphthalenyl group can be exemplified.

As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as homobledane, adamantane, tricyclo[5.2.1.0$^{2,6}$]decane and tricyclo[4.3.1.1$^{2,5}$]undecane rings; and tetracyclic hydrocarbon rings, such as tetracyclo[4.4.0.1$^{2,5}$.1$^{7,10}$]dodecane and perhydro-1,4-methano-5,8-methanonaphthalene rings.

Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenalene rings.

As preferred crosslinked-ring hydrocarbon rings, there can be mentioned a norbornyl group, an adamantyl group, a bicyclooctanyl group, a tricyclo[5.2.1.0$^{2,6}$]decanyl group and the like. As more preferred crosslinked-ring hydrocarbon rings, there can be mentioned a norbornyl group and an adamantyl group.

These alicyclic hydrocarbon groups may have one or more substituents. As preferred substituents, a halogen atom, an alkyl group, a hydroxyl group protected by a protective group, and an amino group protected by a protective group can be exemplified. The halogen atom is preferably a bromine, chlorine or fluorine atom. The alkyl group is preferably a methyl, ethyl, butyl or t-butyl group. The alkyl group may further have one or more substituents. As the optional substituent, a halogen atom, an alkyl group, a hydroxyl group protected by a protective group, and an amino group protected by a protective group can be exemplified.

As the protective group, an alkyl group, a cycloalkyl group, an aralkyl group, a substituted methyl group, a substituted ethyl group, an alkoxycarbonyl group and an aralkyloxycarbonyl group can be exemplified. Preferred alkyl groups include alkyl groups having 1 to 4 carbon atoms. Preferred substituted methyl groups include methoxymethyl, methoxythiomethyl, benzyloxymethyl, t-butoxymethyl and 2-methoxyethoxymethyl groups. Preferred substituted ethyl groups include 1-ethoxyethyl and 1 methyl 1 methoxyethyl groups. Preferred acyl groups include aliphatic acyl groups having 1 to 6 carbon atoms, such as formyl, acetyl, propionyl, butyryl, isobutyryl, valeryl and pivaloyl groups. Preferred alkoxycarbonyl groups include alkoxycarbonyl groups having 1 to 4 carbon atoms and the like.

When the acid-decomposable resin contains the repeating unit (C), the content thereof based on all the repeating units of the acid-composable resin is preferably in the range of 1 to 40 mol %, more preferably 1 to 20 mol %.

Specific examples of the repeating unit (C) will be shown below, which however in no way limit the scope of the present invention. In the formulae, Ra represents H, CH$_3$, CH$_2$OH or CF$_3$.

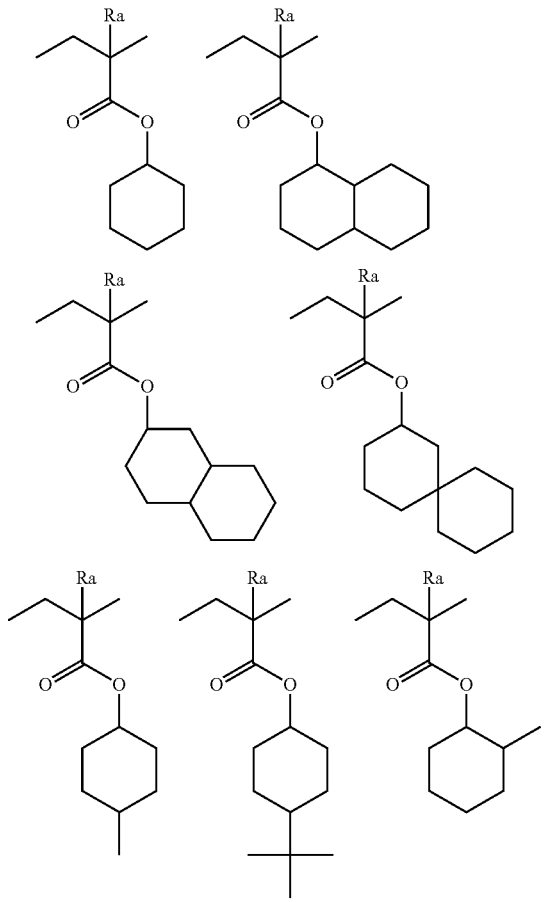

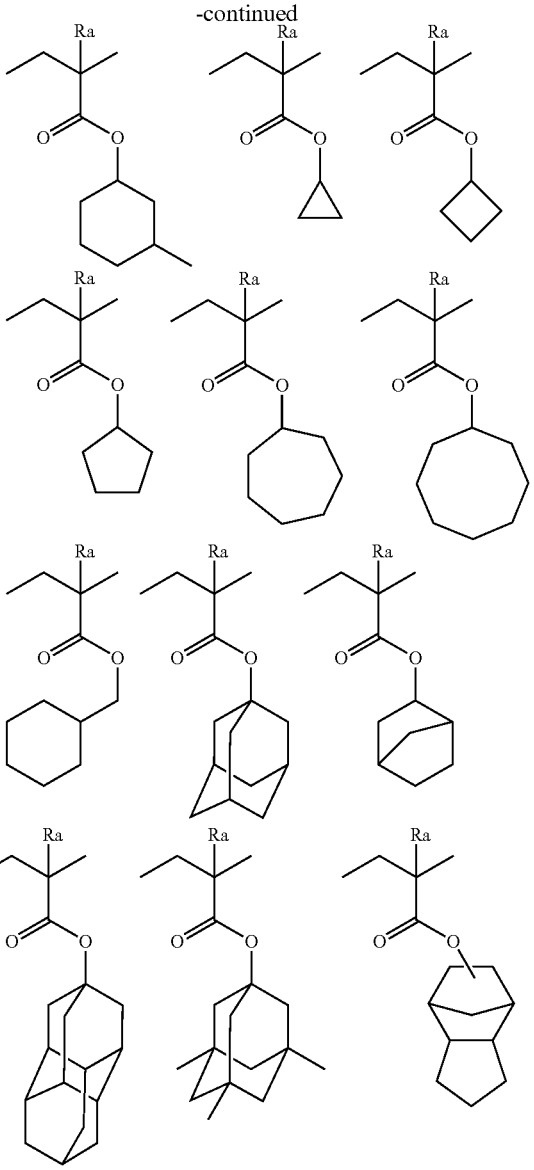

(D) Other Repeating Unit

Various repeating structural units other than those mentioned hereinbefore can be introduced in the acid-decomposable resin in order to regulate the dry etching resistance, standard developer adaptability, adherence to substrates, resist profile, and generally required properties for resist, such as resolving power, heat resistance, sensitivity, and the like.

As such other repeating structural units, those corresponding to the following monomers can be exemplified, which however are nonlimiting.

Such other repeating structural units would permit fine regulation of the properties required to have by the resin for use in the composition of the present invention, especially, (1) solubility in applied solvents, (2) film forming easiness (glass transition temperature), (3) alkali developability, (4) film thinning (selection of hydrophilicity/hydrophobicity and polar group), (5) adhesion of unexposed areas to substrate, and (6) dry etching resistance, etc.

As the above-mentioned monomers, compounds having an unsaturated bond capable of addition polymerization, selected from among acrylic esters, methacrylic esters, acrylamides, methacrylamides, allyl compounds, vinyl ethers, vinyl esters and the like can be exemplified.

The monomers are not limited to the above, and unsaturated compounds capable of addition polymerization that are copolymerizable with the monomers corresponding to the above various repeating structural units can be used in the copolymerization.

The molar ratios of individual repeating structural units contained in the resin for use in the composition of the present invention are appropriately determined from the viewpoint of regulation of not only the resist dry etching resistance but also the standard developer adaptability, substrate adhesion, resist profile and generally required properties of resists such as resolving power, heat resistance and sensitivity.

When the composition of the present invention is used in ArF exposure, it is preferred for the acid-decomposable resin to contain no aromatic group from the viewpoint of transparency to ArF light. It is especially preferred for the acid-decomposable resin to contain an alicyclic hydrocarbon structure of a single ring or multiple rings.

Further, it is preferred for the acid-decomposable resin to contain neither a fluorine atom nor a silicon atom from the viewpoint of compatibility with hydrophobic resins to be described hereinafter.

Preferred acid-decomposable resin is that whose repeating units consisting of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units.

In the event of exposing the actinic-ray- or radiation-sensitive resin composition of the present invention to KrF excimer laser beams, electron beams, X-rays or high-energy light rays of wavelength 50 nm or less (EUV, etc.), it is preferred for resin (B) to further have hydroxystyrene repeating units. More preferably, resin (B) has hydroxystyrene repeating units, hydroxystyrene repeating units protected by an acid-decomposable group and acid-decomposable repeating units of a (meth)acrylic acid tertiary alkyl ester, etc.

As preferred hydroxystyrene repeating units having an acid-decomposable group, there can be mentioned, for example, repeating units derived from t-butoxycarbonyloxystyrene, a 1-alkoxyethoxystyrene and a (meth)acrylic acid tertiary alkyl ester. Repeating units derived from a 2-alkyl-2-adamantyl (meth)acrylate and a dialkyl(1-adamantyl) methyl (meth)acrylate are more preferred.

The acid-decomposable resin of the present invention can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the solvent capable of dissolving the composition of the present invention, such as propylene glycol monomethyl ether acetate, propylene glycol monomethyl ether or cyclohexanone, to be described hereinafter. It is preferred to perform the polymerization with the use of the same solvent as employed in the actinic-ray- or radiation-sensitive resin composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis (2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 60° to 100° C.

The weight average molecular weight of the acid-decomposable resin in terms of polystyrene molecular weight as measured by GPC is preferably in the range of 1000 to 200,000, more preferably 2000 to 20,000, still more preferably 3000 to 15,000 and further preferably 5000 to 13,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose dispersity (molecular weight distribution) is usually in the range of 1 to 3, preferably 1 to 2.6, more preferably 1 to 2 and most preferably 1.4 to 2.0. The lower the molecular weight distribution, the more excellent the resolving power and resist profile and the smoother the side wall of the resist pattern to thereby attain an excellence in roughness.

In the present invention, the content ratio of the acid-decomposable resin based on the total solid content of the whole composition is preferably in the range of 30 to 99 mass %, and more preferably 60 to 95 mass %.

The acid-decomposable resin may be used either individually or in combination. Moreover, the acid-decomposable resin may be used in combination with resins other than the foregoing acid-decomposable resins to an extent not detrimental to the effects of the present invention.

Specific examples of the acid-decomposable resin will be shown below. Further, in Table 1 below is specified weight average molecular weight (Mw), dispersity (Mw/Mn), and molar ratio of the repeating units (corresponding to individual repeating units in order from the left).

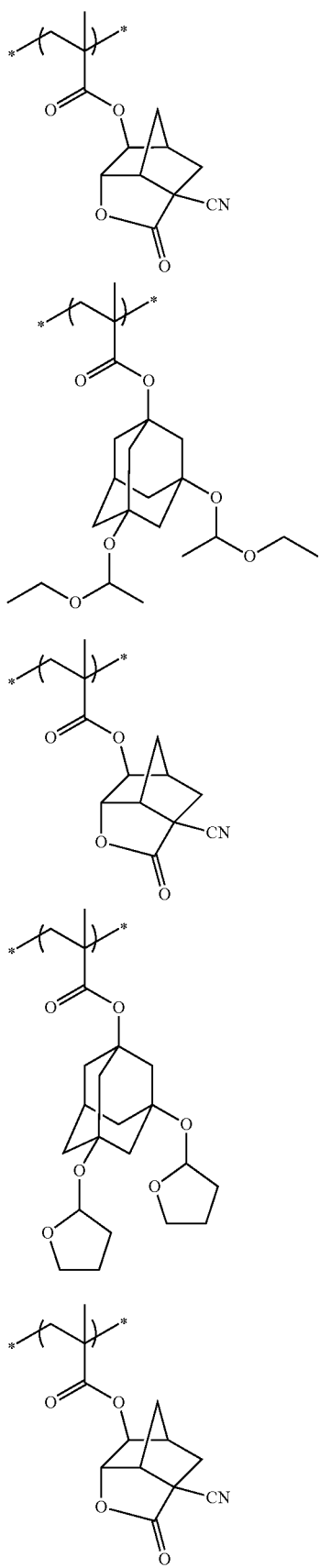
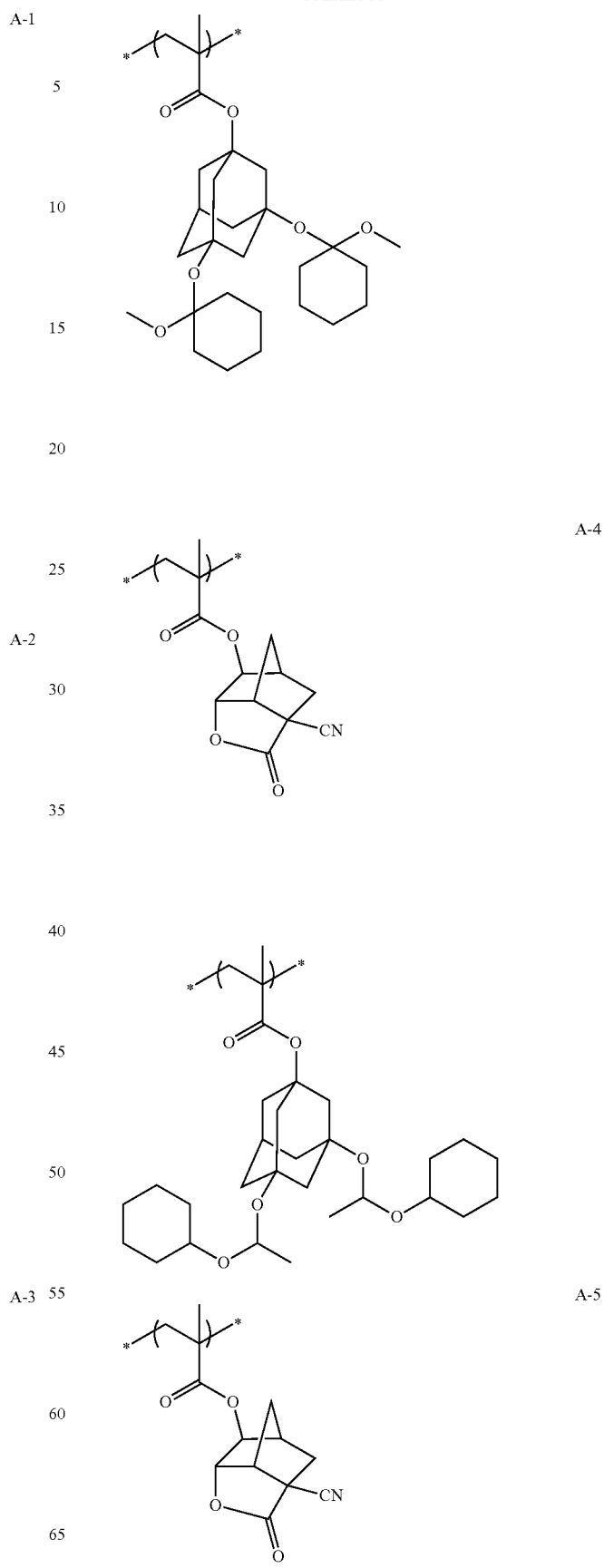

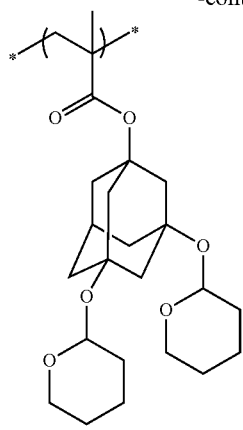
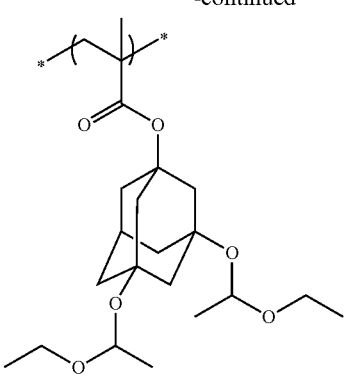
A-6
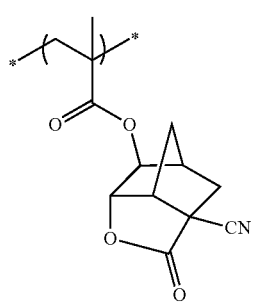
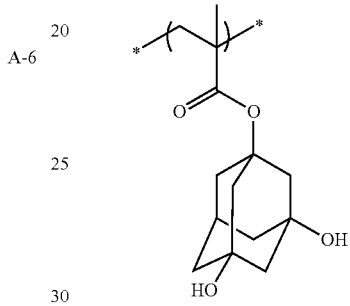
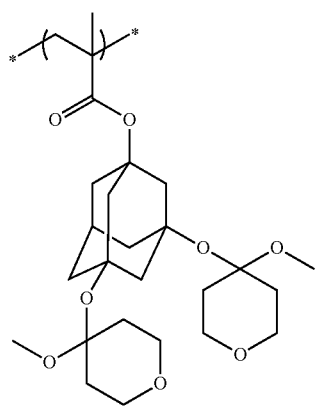
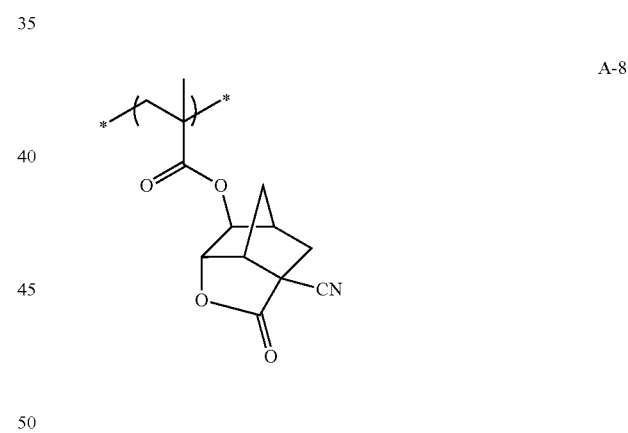
A-8
A-7
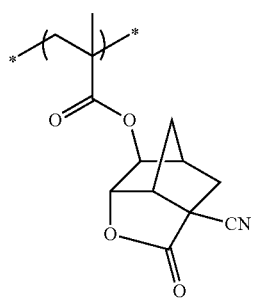
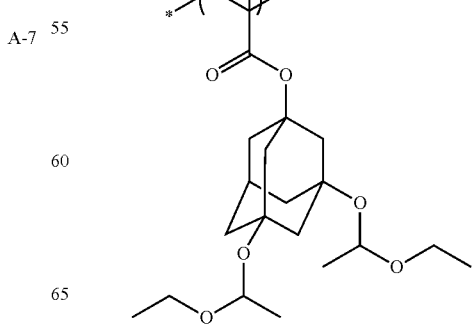

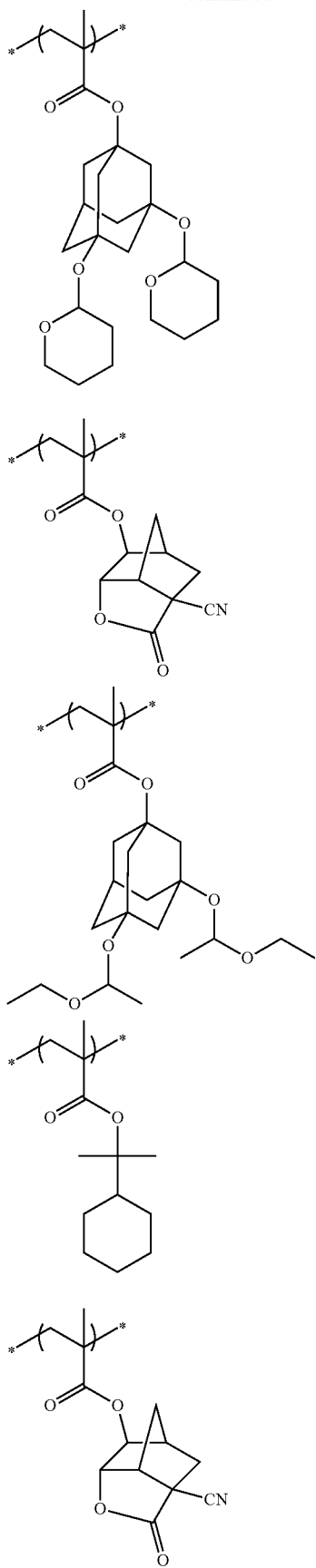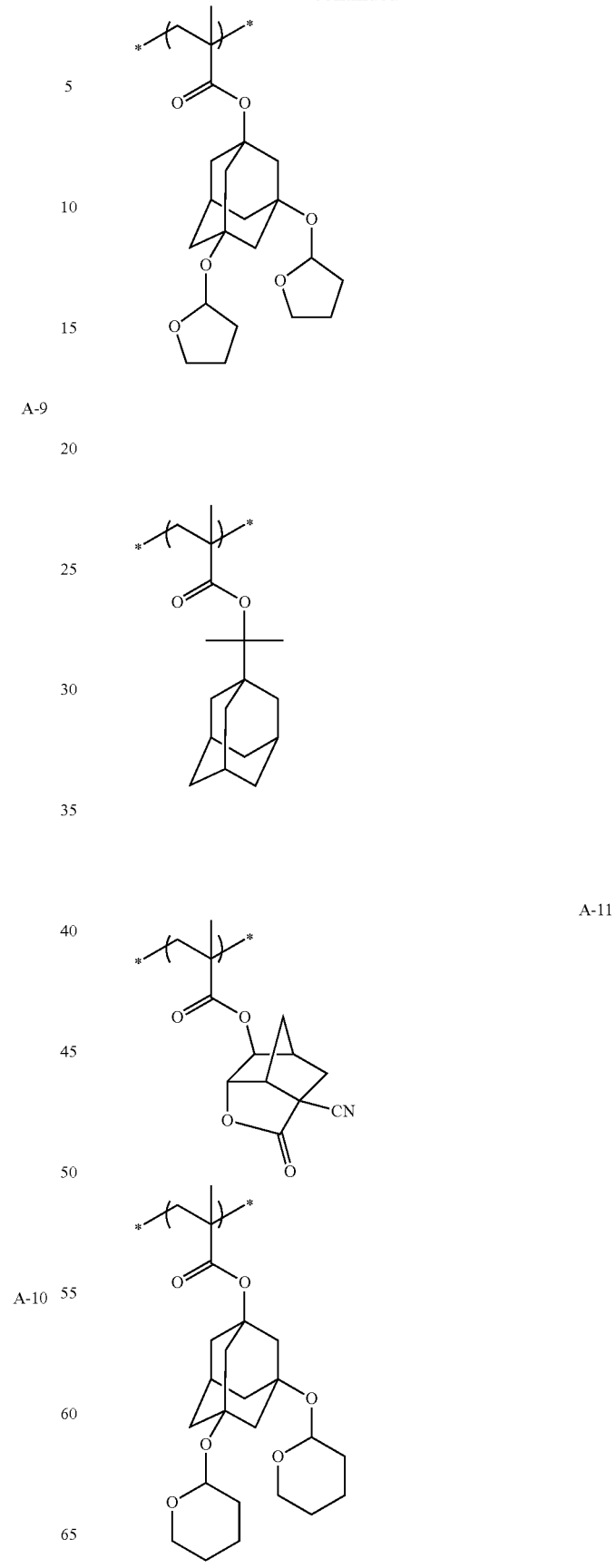

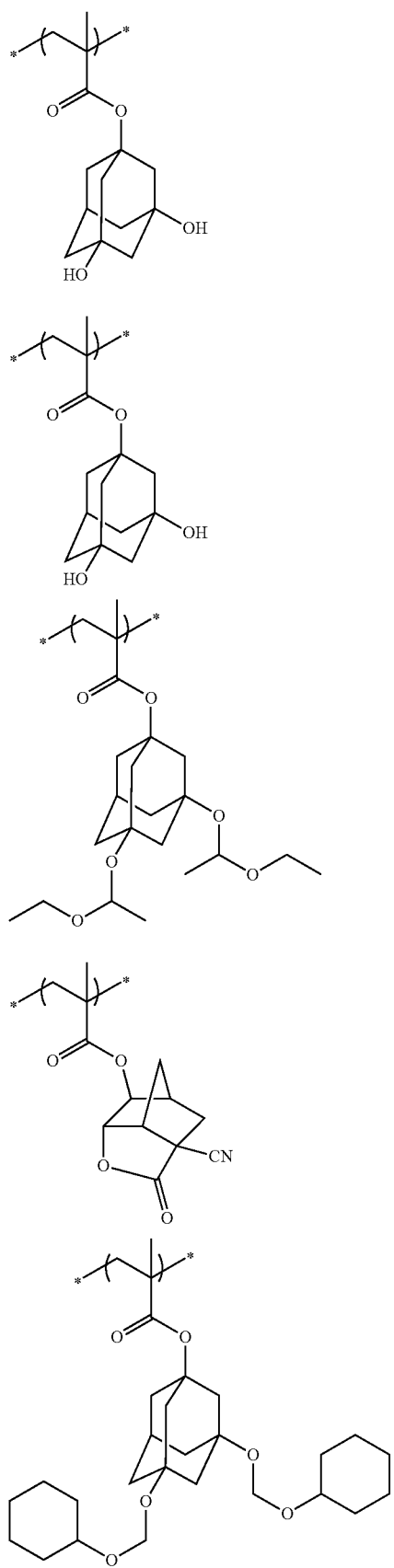
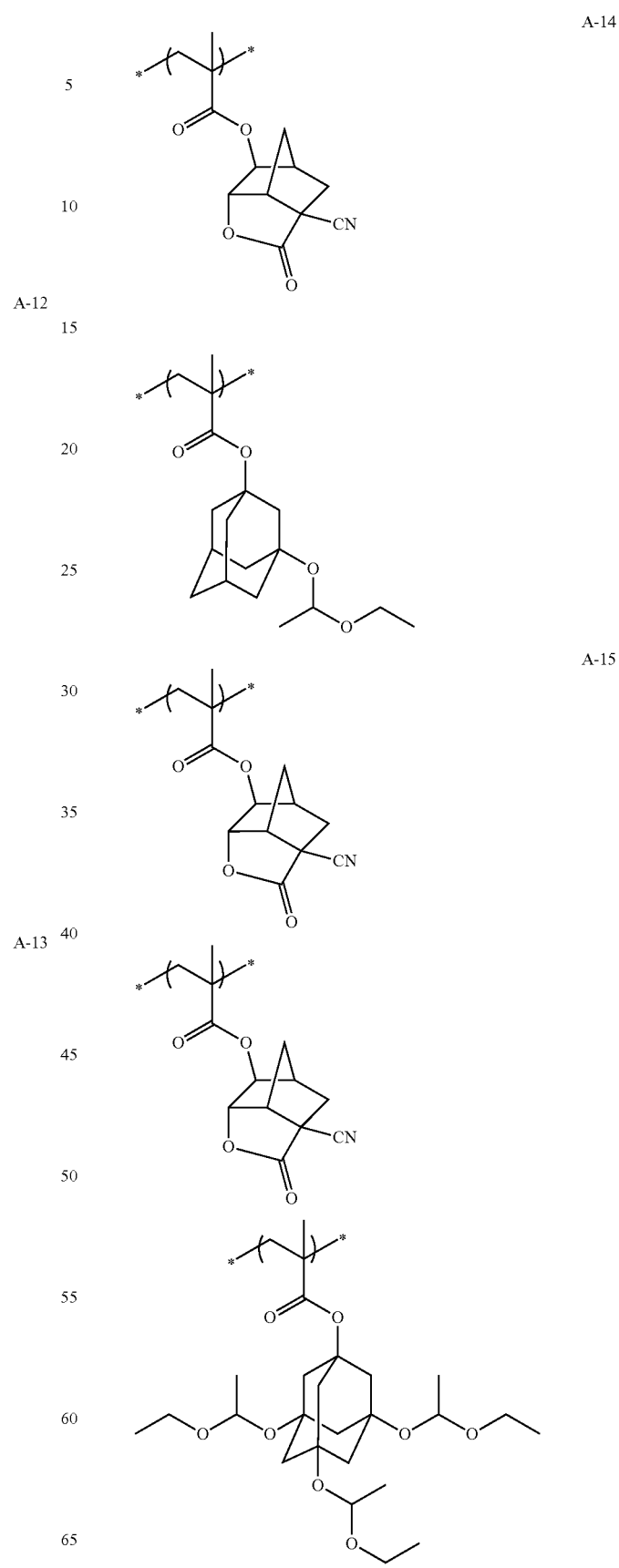

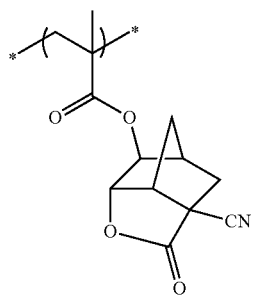
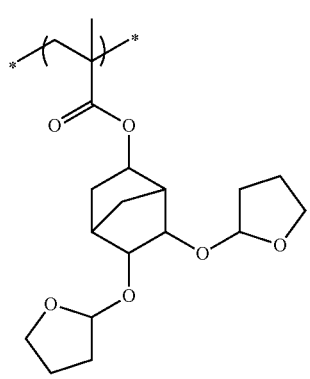
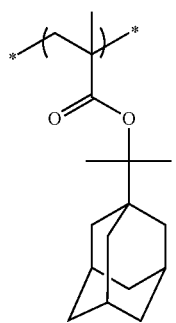
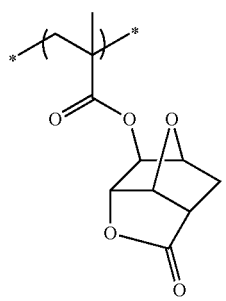
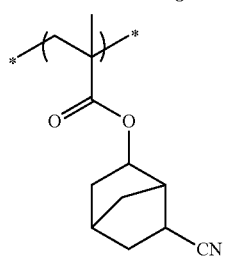
A-16
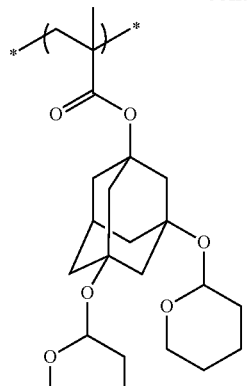
A-17
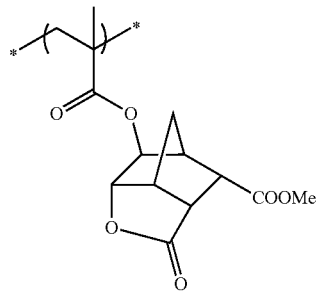
A-18
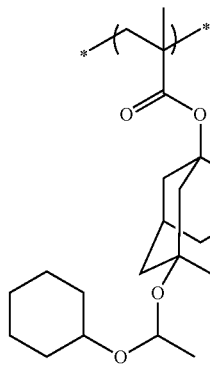
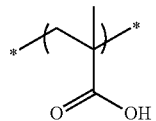
A-19
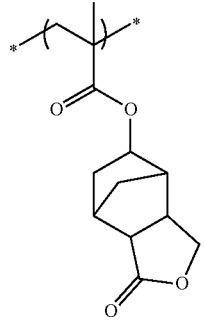

-continued
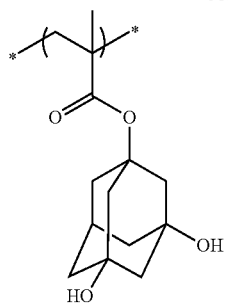
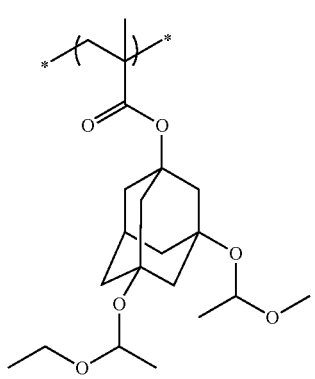
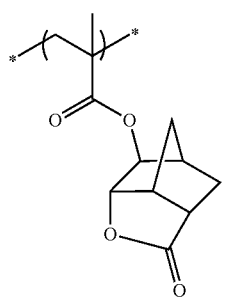
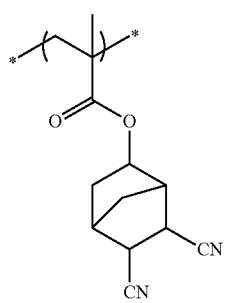
A-20
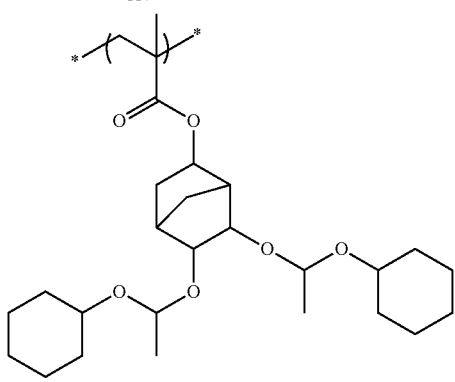
-continued
A-21
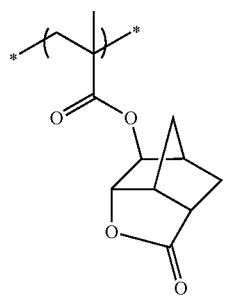
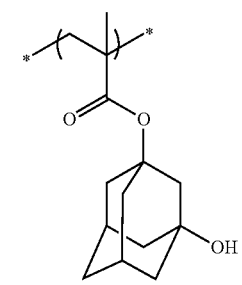
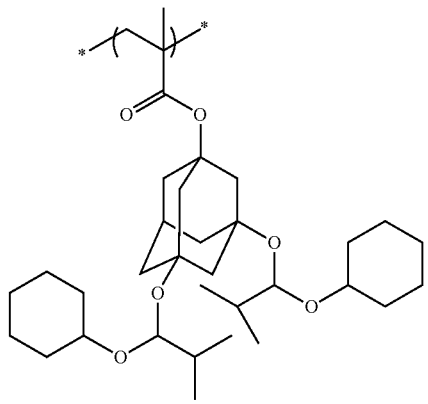
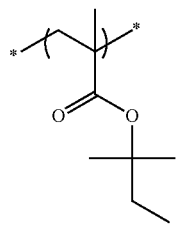
A-22
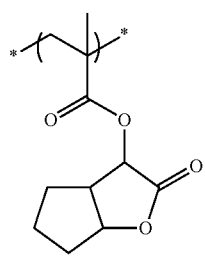

89
-continued
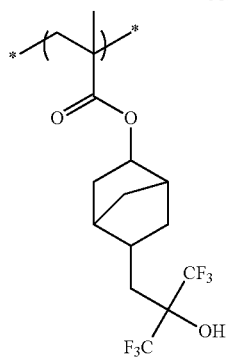
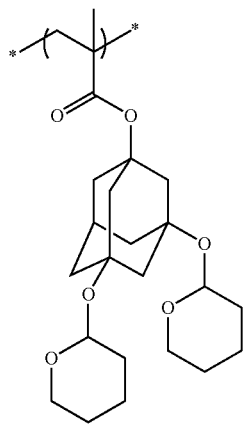
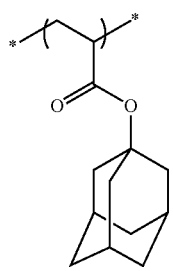
A-23
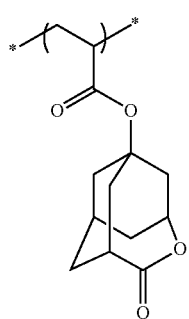
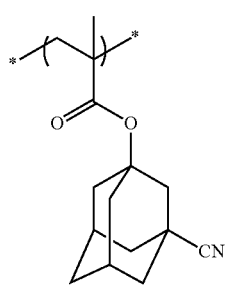
90
-continued
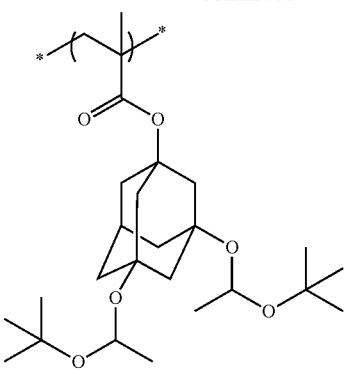
A-24
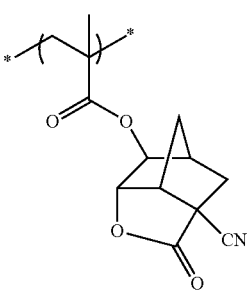
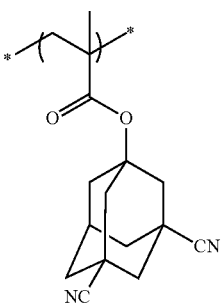
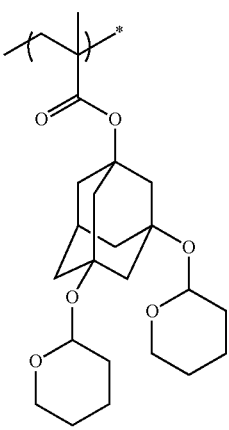

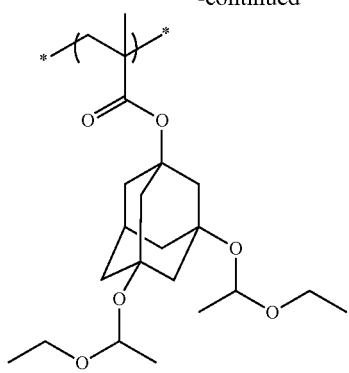
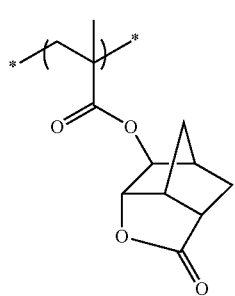
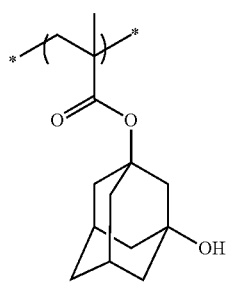
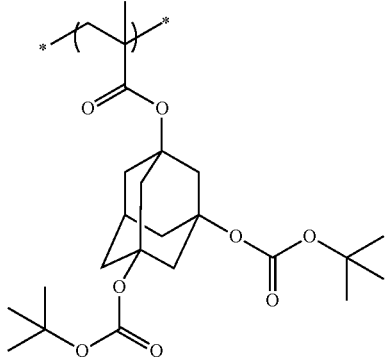
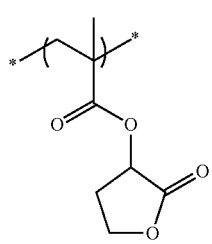
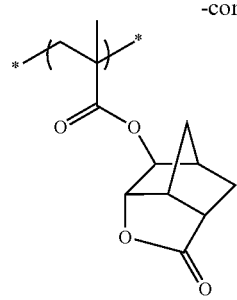
A-25
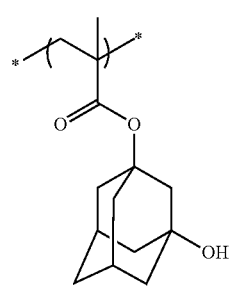
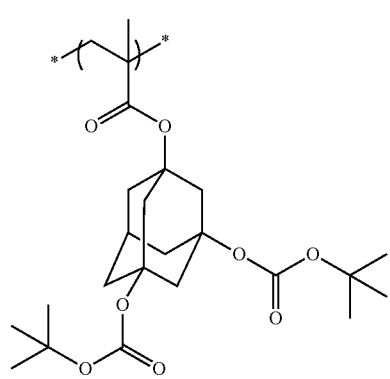
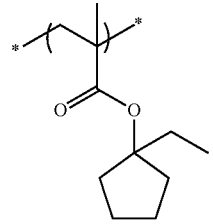
A-26
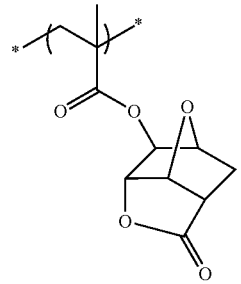
A-27

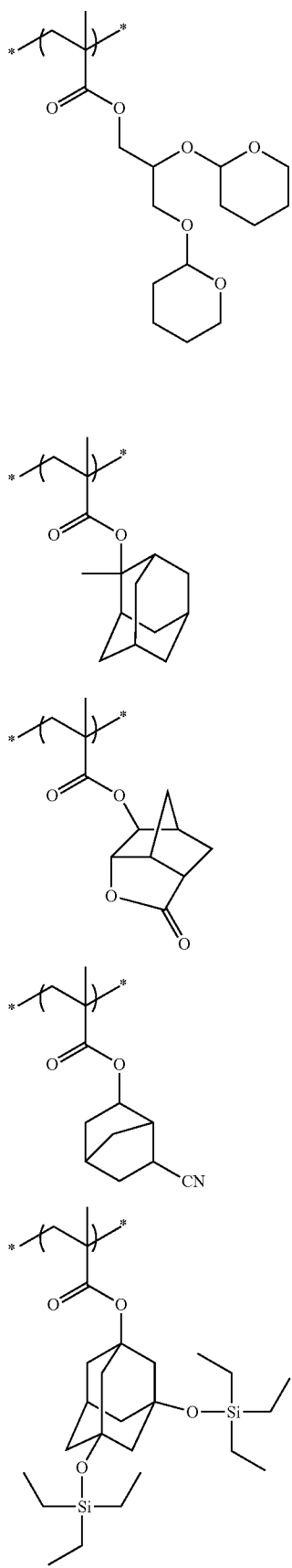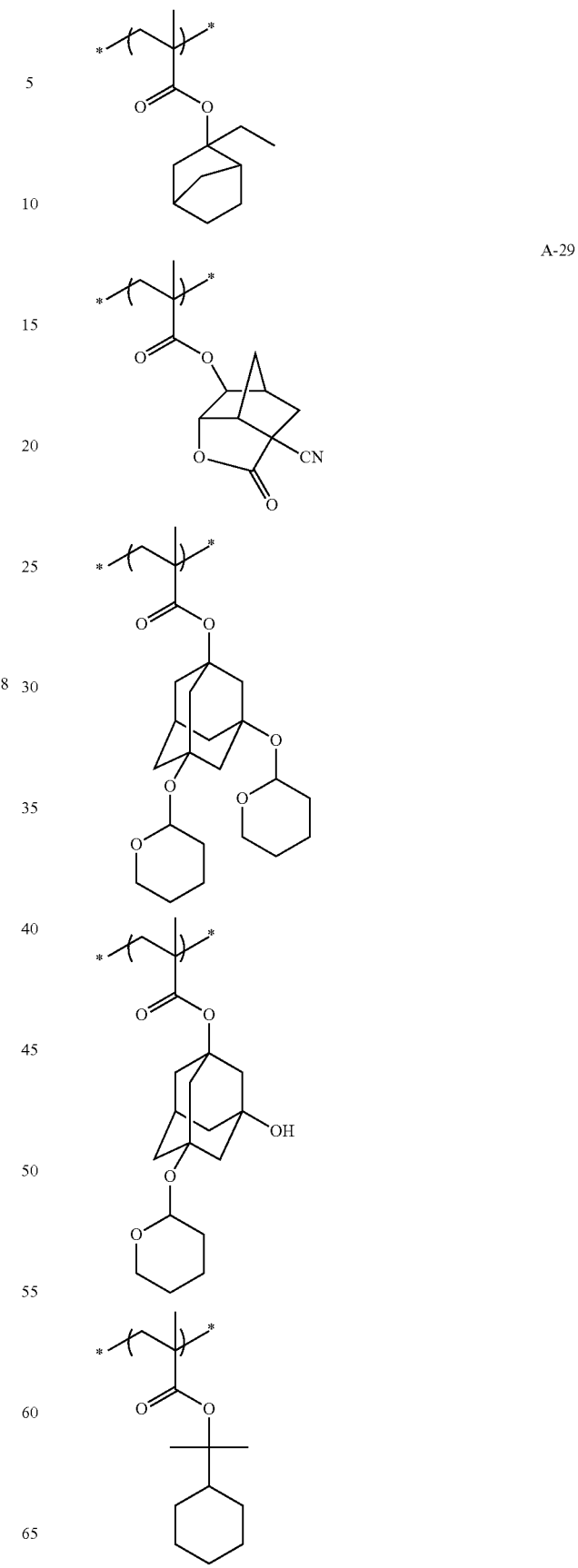

-continued
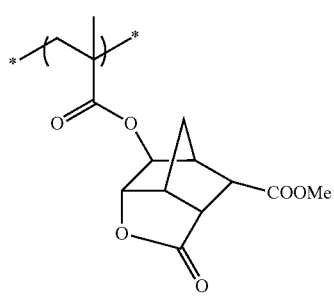
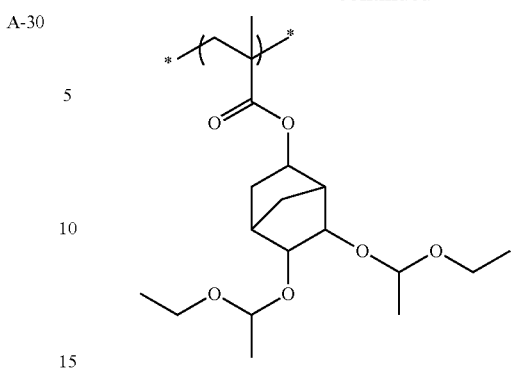
A-30
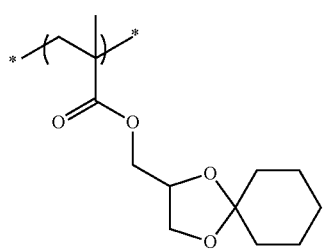
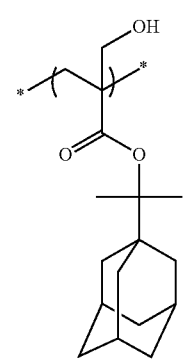
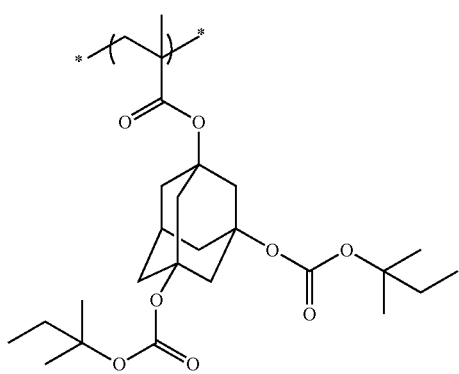
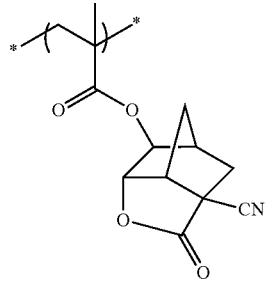
A-32
A-31
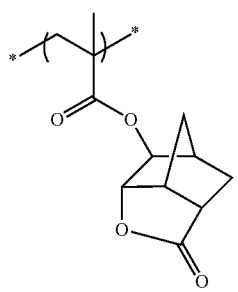
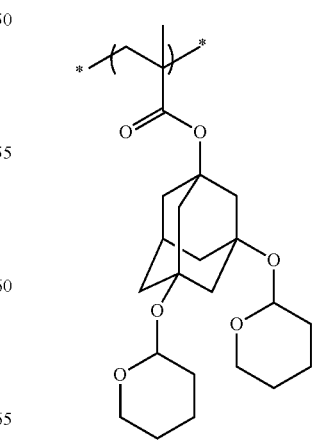
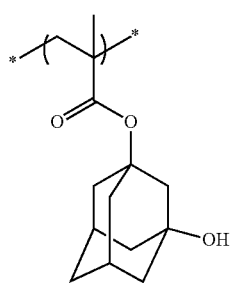

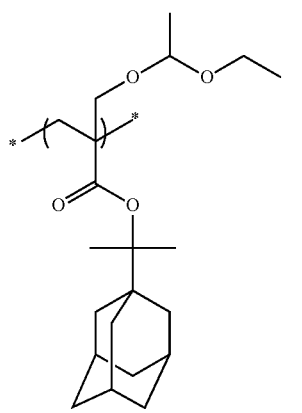
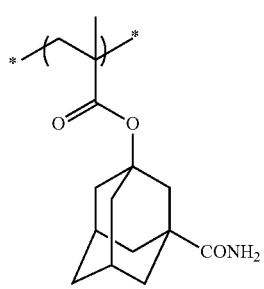
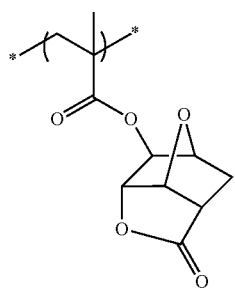
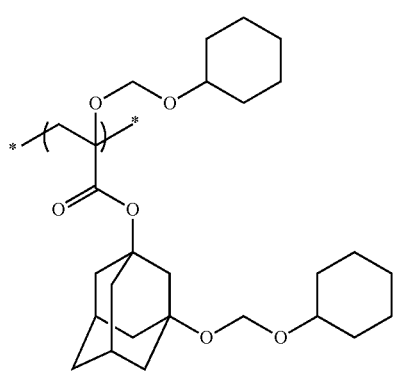
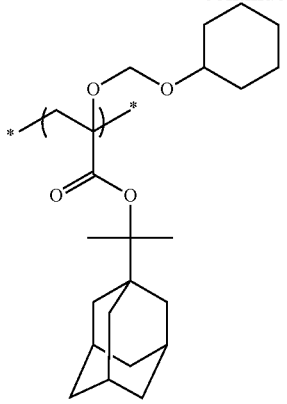
A-34
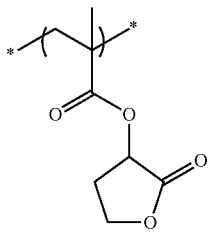
A-33
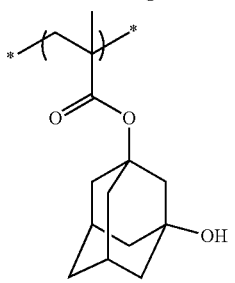
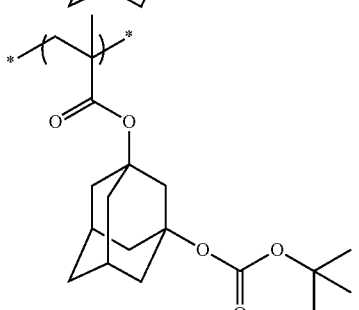
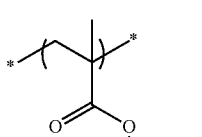
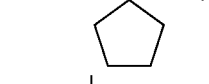
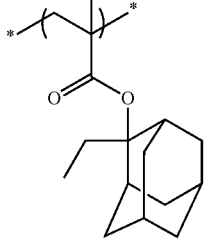

-continued
A-35
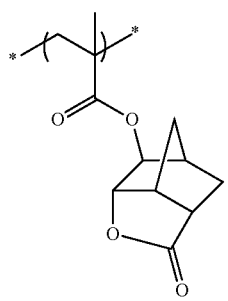
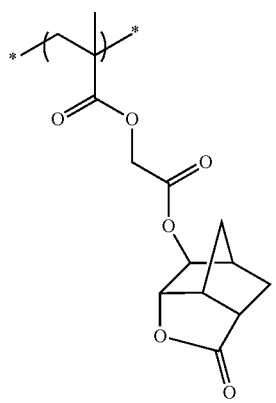
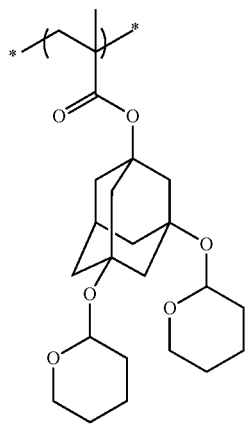
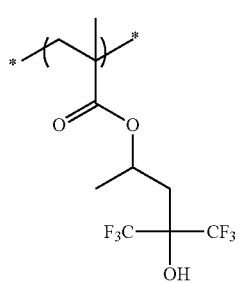
-continued
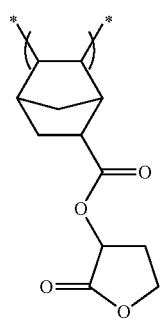
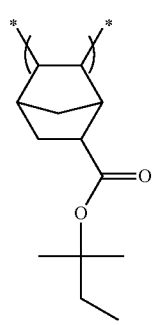
A-36
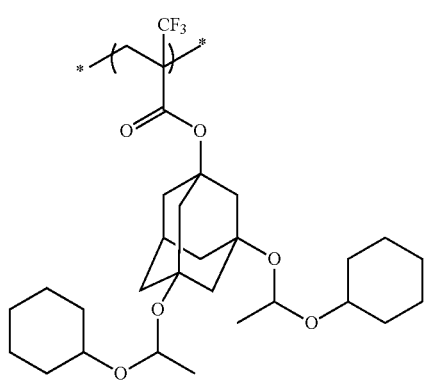
A-37
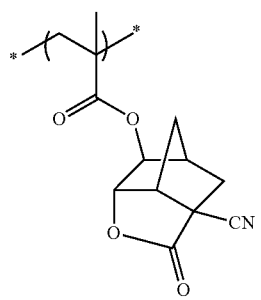
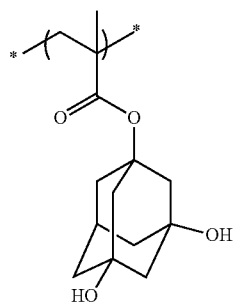

101
-continued
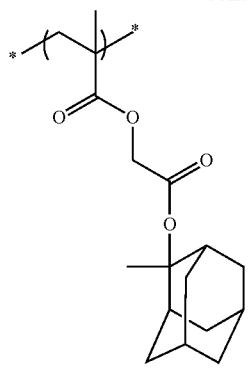
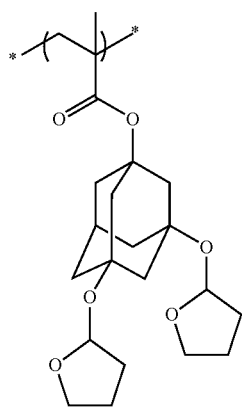
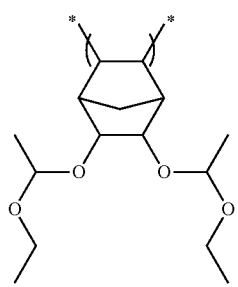
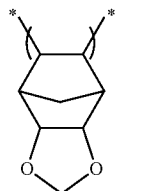
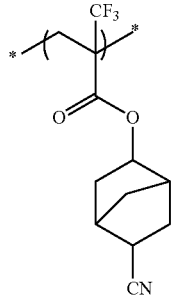
102
-continued
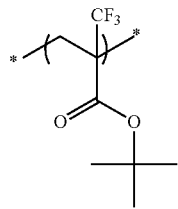
A-38
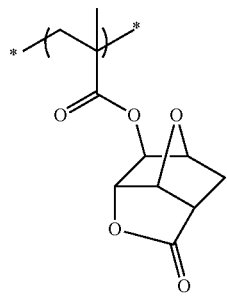
A-39
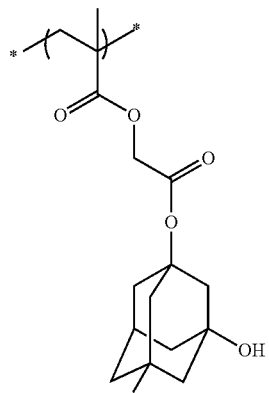
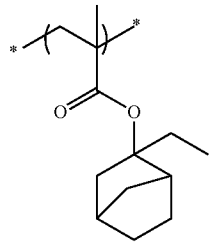
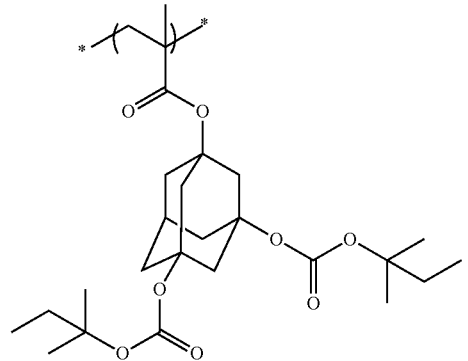

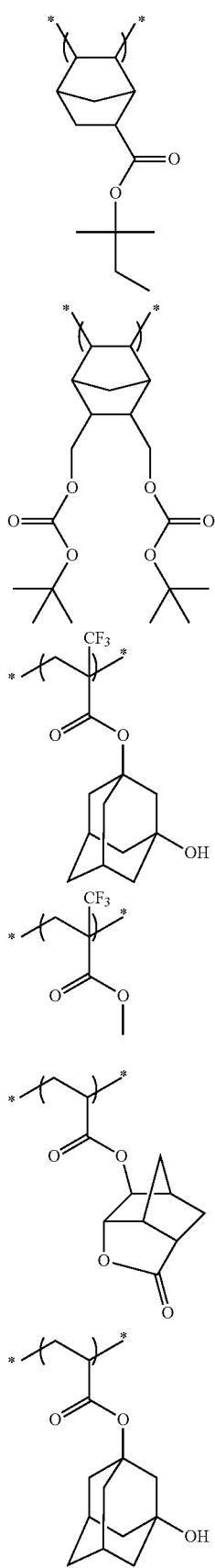
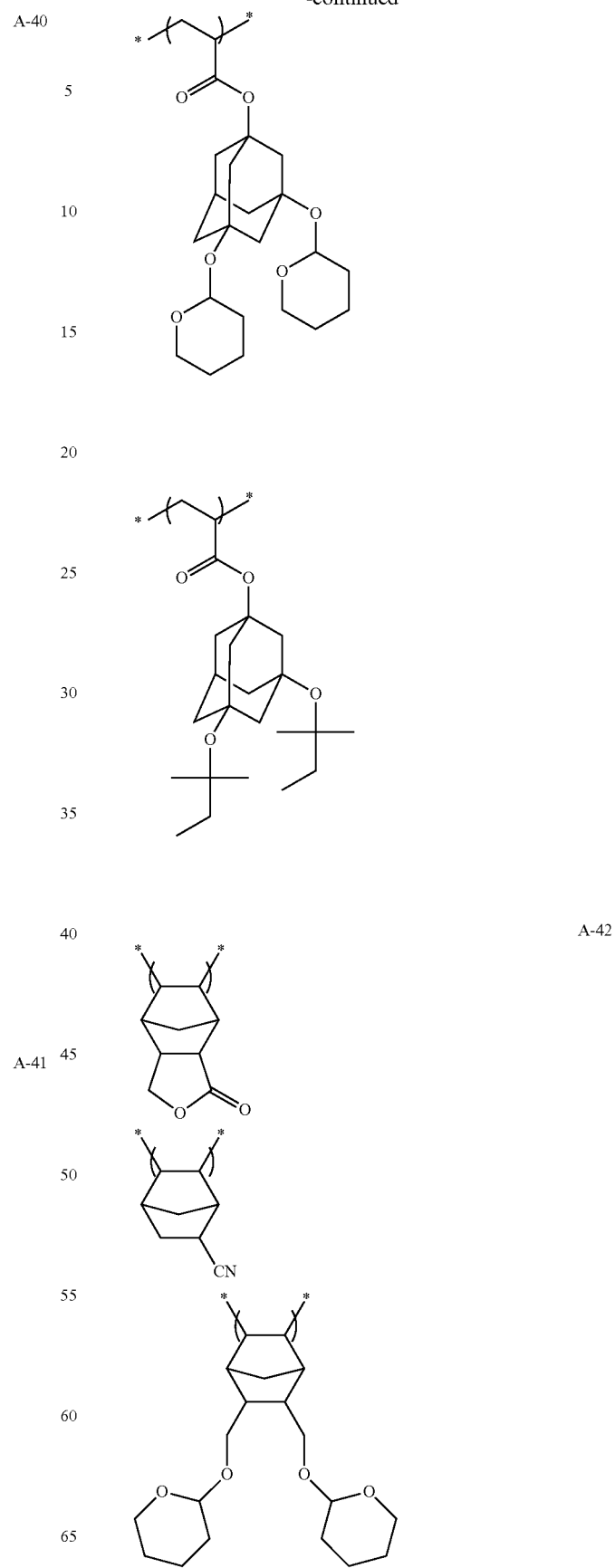

-continued
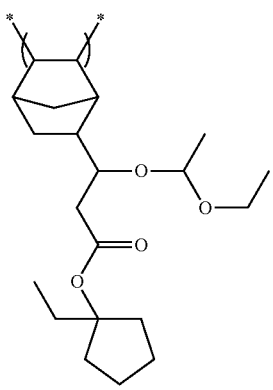
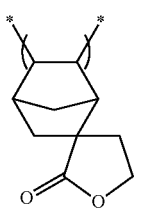
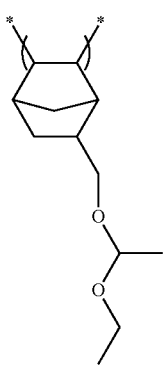
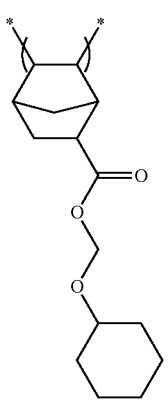
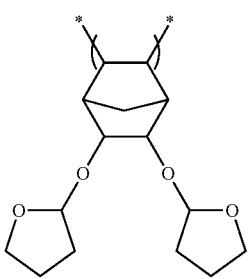
-continued
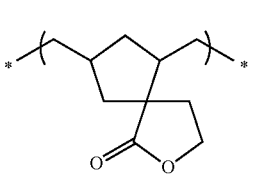
A-47
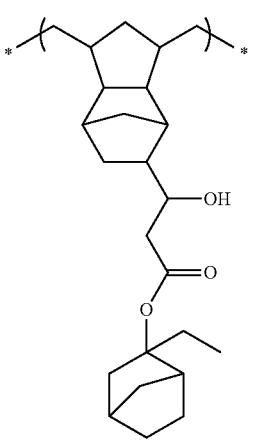
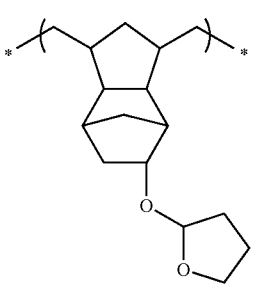
A-48
A-49
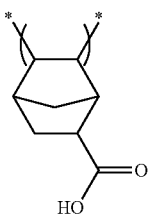
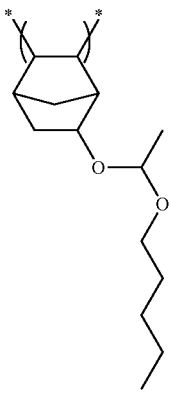

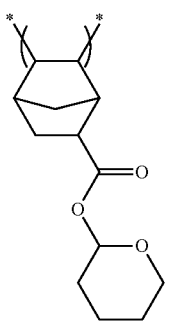
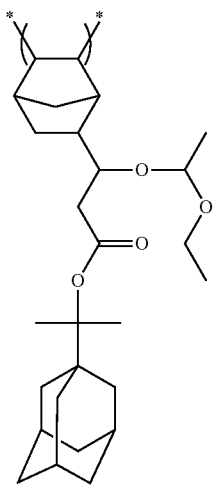
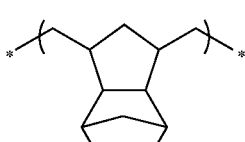
A-50
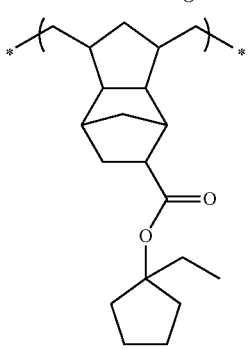
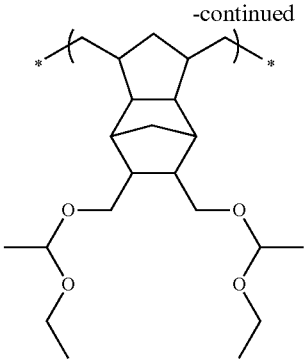
TABLE 1
| No. | Mw | Mw/Mn | Molar Ratio | | | | |
|---|---|---|---|---|---|---|---|
| A-1 | 9800 | 1.76 | 40 | 60 | | | |
| A-2 | 7700 | 1.80 | 45 | 55 | | | |
| A-3 | 7900 | 1.81 | 50 | 50 | | | |
| A-4 | 8400 | 1.79 | 50 | 50 | | | |
| A-5 | 9000 | 1.84 | 30 | 70 | | | |
| A-6 | 10500 | 1.77 | 50 | 50 | | | |
| A-7 | 9400 | 1.83 | 40 | 50 | 10 | | |
| A-8 | 9500 | 1.86 | 50 | 20 | 30 | | |
| A-9 | 7300 | 1.79 | 50 | 40 | 10 | | |
| A-10 | 9900 | 1.82 | 40 | 40 | 20 | | |
| A-11 | 10400 | 1.81 | 30 | 50 | 20 | | |
| A-12 | 7900 | 1.76 | 20 | 80 | | | |
| A-13 | 7900 | 1.76 | 40 | 60 | | | |
| A-14 | 7900 | 1.76 | 25 | 75 | | | |
| A-15 | 12000 | 1.81 | 25 | 25 | 50 | | |
| A-16 | 8100 | 1.66 | 40 | 50 | 10 | | |
| A-17 | 10500 | 1.71 | 30 | 20 | 50 | | |
| A-18 | 14200 | 1.81 | 55 | 40 | 5 | | |
| A-19 | 11000 | 1.88 | 35 | 10 | 55 | | |
| A-20 | 8500 | 1.68 | 40 | 10 | 50 | | |
| A-21 | 10200 | 1.69 | 30 | 15 | 40 | 15 | |
| A-22 | 6900 | 1.85 | 30 | 10 | 50 | 10 | |
| A-23 | 10000 | 1.71 | 30 | 10 | 60 | | |
| A-24 | 9500 | 1.61 | 30 | 10 | 30 | 30 | |
| A-25 | 15000 | 1.81 | 40 | 10 | 50 | | |
| A-26 | 12000 | 1.63 | 15 | 30 | 5 | 40 | 10 |
| A-27 | 12500 | 1.88 | 40 | 30 | 30 | | |
| A-28 | 8100 | 1.55 | 35 | 15 | 40 | 10 | |
| A-29 | 11000 | 1.61 | 40 | 40 | 5 | 15 | |
| A-30 | 9000 | 1.72 | 40 | 20 | 40 | | |
| A-31 | 12500 | 1.72 | 30 | 10 | 40 | 20 | |
| A-32 | 7200 | 1.66 | 40 | 40 | 5 | 15 | |
| A-33 | 5500 | 1.58 | 60 | 20 | 20 | | |
| A-34 | 10000 | 1.65 | 10 | 15 | 25 | 25 | 25 |
| A-35 | 16000 | 1.81 | 30 | 10 | 50 | 10 | |
| A-36 | 5100 | 1.54 | 15 | 20 | 65 | | |
| A-37 | 12000 | 1.65 | 40 | 10 | 20 | 30 | |
| A-38 | 6000 | 1.55 | 15 | 15 | 60 | 10 | |
| A-39 | 8000 | 1.77 | 40 | 10 | 30 | 20 | |
| A-40 | 4200 | 1.61 | 35 | 15 | 20 | 30 | |
| A-41 | 11500 | 1.66 | 30 | 20 | 40 | 10 | |
| A-42 | 4000 | 1.91 | 30 | 10 | 30 | 30 | |
| A-43 | 6000 | 1.71 | 10 | 10 | 40 | 40 | |
| A-44 | 12000 | 1.24 | 20 | 20 | 50 | 10 | |
| A-45 | 5500 | 1.55 | 50 | 10 | 40 | | |
| A-46 | 24000 | 3.68 | 30 | 10 | 40 | 20 | |
| A-47 | 8000 | 2.05 | 30 | 10 | 50 | 10 | |
| A-48 | 15000 | 1.25 | 30 | 20 | 50 | | |
| A-49 | 14500 | 1.95 | 3 | 30 | 27 | 40 | |
| A-50 | 11000 | 1.21 | 33 | 33 | 34 | | |
(b) Acid Generator
The composition of the present invention contains an acid generator(s). At least one of the acid generators is a compound that when exposed to actinic rays or radiation, generates an acid of pKa≥−1.5.

The inventors have found that with respect to the composition comprising the above resin containing a repeating unit (P) containing a group that when acted on by an acid, is decomposed to thereby produce an alcoholic hydroxyl group, using a large amount of compound that when exposed to actinic rays or radiation, generates an acid of pKa<−1.5 is likely to deteriorate the etching resistance and the stability during a post-exposure delay (PED) period from exposure to post-bake.

The reason for the deterioration is not necessarily apparent. However, the inventors presume the following. Namely, the group that when acted on by an acid, is decomposed to thereby produce an alcoholic hydroxyl group exhibits a relatively low activation energy with respect to an acidolytic reaction. Accordingly, using a large amount of compound that when exposed to actinic rays or radiation, generates an acid of pKa<−1.5 is likely to accelerate the acidolytic reaction at room temperature. As a result, the stability during a PED period would be deteriorated.

In this connection, the acidolytic reaction at room temperature might invite the decrease of surface contact angle and outgassing during exposure, thereby causing water residue defects, lens staining and the like.

The value of pKa of the acid generated by the acid generator preferably satisfies the relationship 3>pKa>−1, more preferably 2>pKa>−1 and further more preferably 1>pKa>−1. Herein, the term "pKa" means the value calculated using "ACD/pKa DB" available from Fujitsu Limited under a noncustomized initial setting.

It is preferred for the acid generated by the acid generator to be a sulfonic acid, a carboxylic acid, an imidic acid or a methide acid. The acid is more preferably a compound expressed by any of general formulae (B-1) to (B-3) below.

 (B-1)

 (B-2)

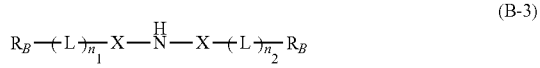 (B-3)

in which $R_B$, or each of $R_B$s independently, represents a monovalent organic group, provided that in general formula (B-3), two $R_B$s may be bonded to each other to thereby form a ring;

each of X's independently represents —CO—, —SO$_2$— or —SO—;

L, or each of L's independently, represents a bivalent connecting group; and each of $n_1$ and $n_2$ independently is 0 or 1.

$R_B$ in the general formula (B-1) preferably represents a group represented by general formula (B-8) below.

Preferably, X represents —CO— or —SO$_2$—. This can enhance a stability of the acid generator during storage.

As the bivalent connecting group represented by L, for example, —O— and —NR$_1$— can be exemplified. Here, R$_1$ represents a hydrogen atom or a monovalent organic group. As the organic group, an alkyl group and a cycloalkyl group can be exemplified.

Further more preferably, the acid generated by the acid generator is a compound expressed by any of general formulae (B-4) to (B-7) below.

 (B-4)

 (B-5)

 (B-6)

 (B-7)

In the formulae, $R_{B1}$, or each of $R_{B1}$s independently, represents a cycloalkyl group, $OR_{B2}$, $N(R_{B2})_2$, an aryl group, or any of the groups of general formula (B-8) below. In general formula (B-6), two $R_{B1}$s may be bonded to each other to thereby form a ring.

 (B-8)

$R_{B2}$, or each of $R_{B2}$s independently, represents a monovalent organic group. When two or more $R_{B2}$s exist in a single molecule, at least two thereof may be bonded to each other to thereby form a ring.

Each of $R_{B3}$s independently represents a hydrogen atom, $C(R_{B4})_3$, $N(R_{B4})_2$, $OR_{B4}$, $SR_{B4}$, $C(R_{B4})=C(R_{B4})_2$, $C\equiv CR_{B4}$, $C(=NR_{B4})R_{B4}$, $C(=O)R_{B4}$, $C(=S)R_{B4}$, $C\equiv N$, $NO_2$, NO, NCO or $N=C(R_{B4})_2$. When two or more $R_{B3}$s exist in a single molecule, at least two thereof may be bonded to each other to thereby form a ring.

$R_{B4}$ represents a monovalent organic group. When two or more $R_{B4}$s exist in a single molecule, at least two thereof may be bonded to each other to thereby form a ring.

A substituent may be introduced in the cycloalkyl group represented by $R_{B1}$. The cycloalkyl group preferably has 3 to 20 carbon atoms. The cycloalkyl group in its ring may contain an oxygen atom or a nitrogen atom. As examples thereof, there can be mentioned a cyclopropyl group, a cyclopentyl group, a cyclohexyl group, a norbornyl group, an adamantyl group and the like.

A substituent may be introduced in the aryl group represented by $R_{B1}$. The aryl group may be a heteroaryl group.

The heteroaryl group represented by $R_{B1}$ preferably has 2 to 20 carbon atoms. The heteroatom contained in the ring is preferably an oxygen atom, a nitrogen atom or a sulfur atom. As examples of the heteroaryl groups, there can be mentioned an indole group, a carbazole group, an oxazole group, a thiophenyl group and the like.

A substituent may optionally be introduced in the heteroaryl group represented by $R_{B1}$. When a substituent is introduced, the substituent is preferably any of the groups represented by $R_{B3}$.

The aryl group represented by $R_{B1}$ is, for example, a phenyl group or a naphthyl group.

The aryl group represented by $R_{B1}$ may be any of the groups of general formula (B-9) below.

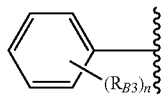
(B-9)

In the formula, $R_{B3}$ is as defined above in general formulae (B-4) to (B-7), and n is an integer of 0 to 5.

$R_{B3}$ is preferably a hydrogen atom, $C(R_{B4})_3$, $N(R_{B4})_2$, $OR_{B4}$, $SR_{B4}$, $C(=NR_{B4})R_{B4}$, $C(=O)R_{B4}$, $C\equiv N$ or $NO_2$, more preferably a hydrogen atom, $C(R_{B4})_3$, $N(R_{B4})_2$, $OR_{B4}$, $C(=O)R_{B4}$, $C\equiv N$ or $NO_2$.

Each of the organic groups represented by $R_{B2}$ and $R_{B4}$ preferably has 1 to 40 carbon atoms. As such, there can be mentioned, for example, an alkyl group, a cycloalkyl group, an aryl group, an aralkyl group, an alkenyl group and the like.

Substituents may be introduced in the alkyl groups represented by $R_{B2}$ and $R_{B4}$. Each of the alkyl groups is preferably a linear or branched alkyl group having 1 to 30 carbon atoms. Each of the alkyl groups in its chain may contain an oxygen atom, a sulfur atom and/or a nitrogen atom. For example, there can be mentioned a linear alkyl group, such as a methyl group, an ethyl group, an n-propyl group, an n-butyl group, an n-pentyl group, an n-hexyl group, an n-octyl group, an n-dodecyl group, an n-tetradecyl group or an n-octadecyl group, and a branched alkyl group, such as an isopropyl group, an isobutyl group, a t-butyl group, a neopentyl group or a 2-ethylhexyl group.

The cycloalkyl groups represented by $R_{B2}$ and $R_{B4}$ are as mentioned above.

Substituents may be introduced in the aryl groups represented by $R_{B2}$ and $R_{B4}$. Aryl groups each having 6 to 14 carbon atoms are preferred. For example, there can be mentioned a phenyl group and a naphthyl group.

Substituents may be introduced in the aralkyl groups represented by $R_{B2}$ and $R_{B4}$. Aralkyl groups each having 7 to 20 carbon atoms are preferred. For example, there can be mentioned a benzyl group, a phenethyl group, a naphthylmethyl group and a naphthylethyl group.

Substituents may be introduced in the alkenyl groups represented by $R_{B2}$ and $R_{B4}$. There can be mentioned groups resulting from the introduction of a double bond at an arbitrary position of any of the above alkyl groups.

As substituents that may be introduced in the above groups, there can be mentioned, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably 2 to 10 carbon atoms) and the like. In the groups with a ring structure, such as the aryl group and cycloalkyl group, an alkyl group (preferably 1 to 10 carbon atoms) may be introduced as a further substituent. In the aminoacyl group, also, an alkyl group (preferably 1 to 10 carbon atoms) may be introduced as a further substituent. As substituted alkyl groups, there can be mentioned, for example, perfluoroalkyl groups, such as a perfluoromethyl group, a perfluoroethyl group, a perfluoropropyl group and a perfluorobutyl group.

As an acid generated by the acid generator, those represented by the following formula (BI) can be exemplified.

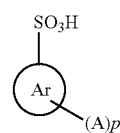
(BI)

In the formula (BI),

Ar represents an aromatic ring optionally further other substituents than group represented by A.

p is an integer of 0 or greater.

A represents a group containing one or more hydrocarbon groups each having 3 or more carbon atoms.

When p is 2 or greater, each of As may be the same or different from each other.

The general formula (BI) will be further explained.

The aromatic ring represented by Ar is preferably an aromatic ring having 6 to 30 carbon atoms.

As the aromatic ring, there can be mentioned, for example, a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an iodolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, a phenazine ring or the like. Of these, a benzene ring, a naphthalene ring and an anthracene ring are preferred, and a benzene ring is more preferred.

As substituents other than group represented by A, a group containing one or more hydrocarbon group each having 1 or more carbon atoms, a halogen atom (such as a fluorine atom, a chlorine atom, a bromine atom, and an iodine atom), a hydroxyl group, a cyano group, a nitro group, and a carboxyl group can be exemplified. As the group containing one or more hydrocarbon group each having 1 or more carbon atoms, for example, an alkoxy group such as a methoxy group, an ethoxy group, a tert-butyl group; an aryloxy group such as a phenoxy group and a p-tryloxy group; an alkyl thioxy group such as a methylthioxy group, an ethylthioxy group, and a tert-butylthioxy group; an arylthioxy group such as a phenylthioxy group and a p-tolylthioxy group; an alkoxycarbonyl group such as a methoxycarbonyl group, a butoxycarbonyl group, and a phenoxycarbonyl group; an acetoxy group; a linear or branched alkyl group such as a methyl group, an ethyl group, a propyl group, a butyl group, a heptyl group, a hexyl group, a dodecyl group, a 2-ethylhexyl group; an alkenyl group such as a vinyl group, a propenyl group, and a hexenyl group; an alkynyl group such as an acethylene group, a propynyl group, and a hexynyl group; an aryl group such as a phenyl group and a tolyl group; and an acyl group such as a benzoyl group, an acetyl group, and a toluoyl group. When two or more substituents are present, at least two of them may bond to each other to form a ring.

As the hydrocarbon group in the group represented by A containing one or more hydrocarbon groups each having 3 or more carbon atoms, a noncyclic hydrocarbon group and a cyclic aliphatic group can be exemplified.

As the group represented by A, a group in which the atom adjacent to Ar is tertiary or quaternary carbon atom.

As the noncyclic hydrocarbon group represented by A, an isopropyl group, a t-butyl group, a t-pentyl group, a neopentyl group, a s-butyl group, an isobutyl group, an isohexyl group, a 3,3-jimethylpentyl group, and a 2-ethylhexyl group can be exemplified. The noncyclic hydrocarbon group has preferably 12 or less, more preferably 10 or less carbon atoms.

As the cyclic aliphatic group represented by A, a cycloalkyl group such as a cyclobutyl group, a cyclopentyl group, a cyclohexyl group, a cycloheptyl group, and a cyclooctyl group; an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group can be exemplified. Each of these groups may have one or more substituents. The cyclic aliphatic group has preferably 15 or less, more preferably 12 or less carbon atoms.

When the noncyclic hydrocarbon group or the cyclic aliphatic group has one or more substituents, the followings can be exemplified as the substituents. That is, as the substituents, a halogen atom such as a fluorine atom, a chlorine atom, a bromine atom, or an iodine atom; an alkoxy group such as a methoxy group, an ethoxy group, or a tert-butyl group; an aryloxy group such as phenoxy group or a p-tolyloxy group; an alkylthioxy group such as a methylthioxy group, an ethylthioxy group, or a tert-butylthioxy group; an arylthioxy group such as a phenylthioxy group or a p-tolylthioxy group; an alkoxycarbonyl group such as a methoxycarbonyl group, a butoxycarbonyl group, or a phenoxycarbonyl group; an acetoxy group; a linear or branched alkyl group such as a methyl group, an ethyl group, a propyl group, a butyl group, a heptyl group, a hexyl group, a dodecyl group, or a 2-ethylhexyl group; a cycloalkyl group such as a cyclohexyl group; an alkenyl group such as a vinyl group, a propenyl group, or a hexenyl group; an aryl group such as a phenyl group or a tolyl group; a hydroxy group; a carboxy group; a sulfonic group; a carbonyl group; and a cyano group can be exemplified.

Specific examples of the noncyclic hydrocarbon group or the cyclic aliphatic group represented by A will be shown below.

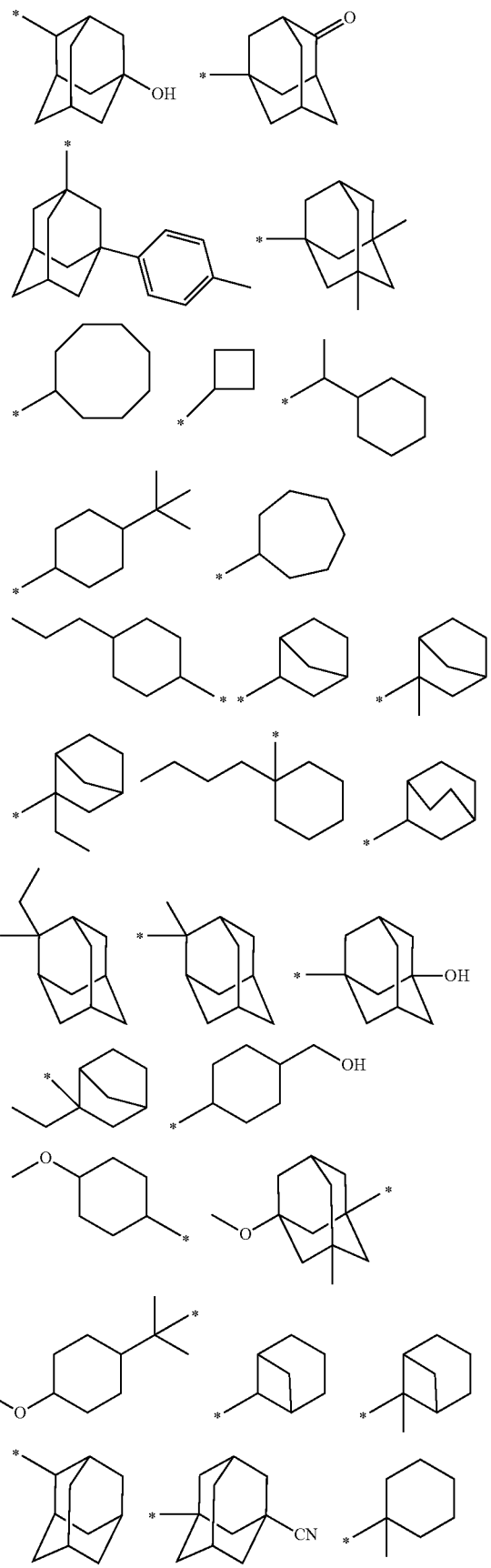

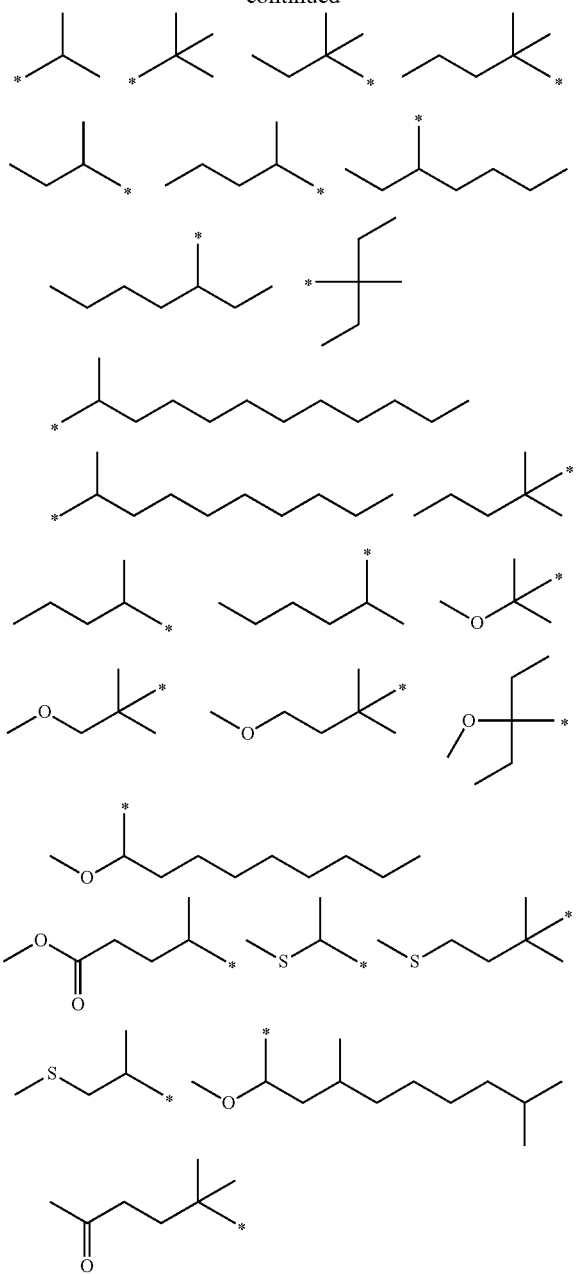

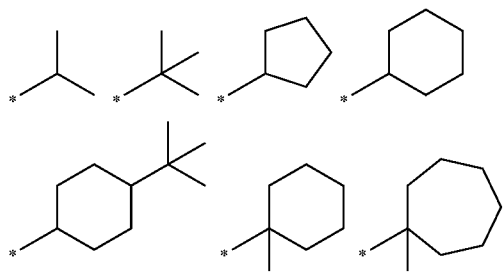

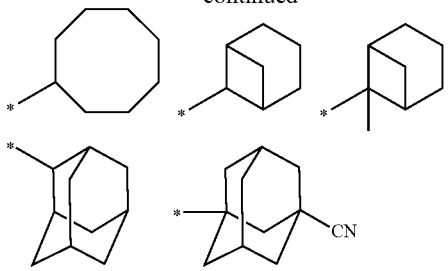

Among the above structures, those shown below are preferred from the viewpoint of suppressing the diffusion of acids.

In the formula, p is an integer of 0 or greater. There is no particular upper limit thereof as long as the number is chemically practicable. From the viewpoint of inhibiting the diffusion of acids, p is usually in the range of 0 to 5, preferably 1 to 4, further preferably 2 or 3, and most preferably 3.

From the viewpoint of inhibiting the diffusion of acids, it is preferred for the substitution with the A-group to occur at least one ortho position (o-position) of the sulfonate group. In a more preferred structure, the substitution with the A-group occurs at two ortho positions (o-positions).

The acid generated by the acid generator may be any of compounds of general formula (BII) below.

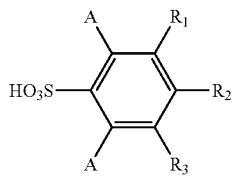

(BII)

In the formula, $A$ has the same meaning as $A$ of general formula (BI). Two A's may be identical to or different from each other. Each of $R_1$ to $R_3$ independently represents a hydrogen atom, a group containing a hydrocarbon group having 1 or more carbon atoms, or a hydroxyl group. Examples of the hydrocarbon groups each having 1 or more carbon atoms are the same as set forth above.

As preferred acids generated by the acid generators, there can be mentioned those of general formulae (I-A) and (I-B) below.

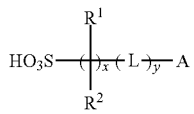

(I-A)

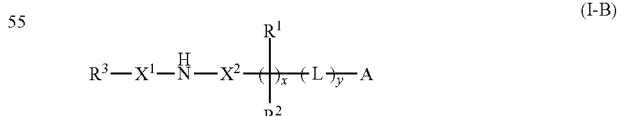

(I-B)

In the formulae, each of $R^1$ and $R^2$ independently represents a hydrogen atom or an alkyl group. A plurality of $R^1$s, and also a plurality of $R^2$s, may be identical to or different from each other. $R^3$ represents a monovalent organic group. Each of $X^1$ and $X^2$ independently represents —CO—, —SO$_2$— or —SO—. L represents a single bond or a bivalent connecting group. A plurality of L's may be identical to or different from each other. A represents a group with a cyclic structure, x is an integer of 1 to 20, and y is an integer of 1 to 10.

General formulae (I-A) and (I-B) will be described in detail below.

Substituents may be introduced in the alkyl groups represented by $R^1$ and $R^2$. Alkyl groups each having 1 to 4 carbon atoms are preferred.

The monovalent organic group represented by $R^3$ preferably has 1 to 10 carbon atoms, more preferably 1 to 4 carbon atoms.

Each of $X^1$ and $X^2$ is preferably —CO— or —SO$_2$—. If so, the storage stability of the acid generator can be enhanced.

In the formulae, y is preferably 0 to 4, more preferably 0 or 1, and x is preferably 1 to 8, more preferably 1 to 4. The bivalent connecting group represented by L is not particularly limited. As the bivalent connecting group, there can be mentioned —COO—, —OCO—, —CO—, —O—, —S—, —SO—, —SO$_2$—, an alkylene group, a cycloalkylene group, an alkenylene group or the like. Of these, —COO—, —OCO—, —CO—, —O— and —SO$_2$— are preferred. —COO—, —OCO— and —SO$_2$— are more preferred.

The group with a cyclic structure represented by A is not particularly limited as long as a cyclic structure is realized. As the group with a cyclic structure, there can be mentioned an alicyclic group, an aryl group, a group with a heterocyclic structure (including not only a group with aromatic properties but also a group without any aromatic properties) or the like.

The alicyclic group may be monocyclic or polycyclic. Preferred use is made of a monocycloalkyl group, such as a cyclopentyl group, a cyclohexyl group or a cyclooctyl group, and a polycycloalkyl group, such as a norbornyl group, a tricyclodecanyl group, a tetracyclodecanyl group, a tetracyclododecanyl group or an adamantyl group. In particular, an alicyclic group with a bulky structure having 7 or more carbon atoms, such as a norbornyl group, a tricyclodecanyl group, a tetracyclodecanyl group, a tetracyclododecanyl group or an adamantyl group, is preferred from the viewpoint of inhibiting the in-film diffusion in the operation of post-exposure bake (PEB) and the viewpoint of improving the mask error enhancement factor (MEEF).

As the aryl group, there can be mentioned a phenyl group, a naphthyl group, a phenanthryl group or an anthryl group. In particular, a naphthalene structure exhibiting a low absorbance is preferred from the viewpoint of light absorption at 193 nm.

The group with a heterocyclic structure may have a monocyclic structure or a polycyclic structure. As particular examples thereof, there can be mentioned a furan ring, a thiophene ring, a benzofuran ring, a benzothiophene ring, a dibenzofuran ring, a dibenzothiophene ring, a pyridine ring, a piperidine ring, a decahydroisoquinoline ring and the like. Of these, a furan ring, a thiophene ring, a pyridine ring and a piperidine ring are preferred. Further, the heterocyclic structure may be a cyclic structure with a lactone structure.

A substituent may be introduced in the above group with a cyclic structure. As the substituent, there can be mentioned an alkyl group (may be linear, branched or cyclic, preferably having 1 to 12 carbon atoms), an aryl group (preferably having 6 to 14 carbon atoms), a hydroxyl group, an alkoxy group, an ester group, an amido group, a urethane group, a ureido group, a thioether group, a sulfonamido group, a sulfonic ester group or the like.

It is preferred for the acid generators to be compatible with the above acid-decomposable resins. Accordingly, the fluorine atom content of the acid generated by each of these acid generators is preferably 50 mass % or below, more preferably 30 mass % or below.

As such an acid generator, a diazonium salt, a phosphonium salt, a sulfonium salt, an iodonium salt, an imide sulfonate, an oxime sulfonate, diazosulfone, disulfone and o-nitrobenzyl sulfonate can be exemplified.

Further, use can be made of compounds obtained by introducing any of the above groups or compounds that generate an acid when exposed to actinic rays or radiation in a polymer principal chain or side chain, for example, compounds described in U.S. Pat. No. 3,849,137, DE 3914407, JP-A's-63-26653, 55-164824, 62-69263, 63-146038, 63-163452, 62-153853, 63-146029, etc.

Furthermore, use can be made of compounds that generate an acid when exposed to light described in U.S. Pat. No. 3,779,778, EP 126,712, etc.

As preferred compounds among the acid generators, those represented by the following general formulae (ZI) and (ZII) can be exemplified.

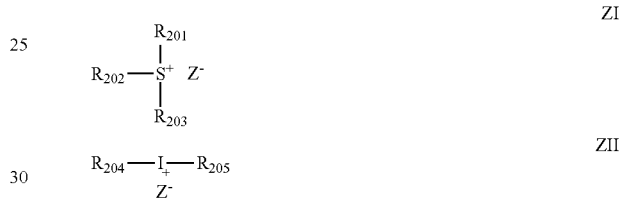

In the above general formula (ZI), each of $R_{201}$, $R_{202}$ and $R_{203}$ independently represents an organic group.

The number of carbon atoms in the organic group represented by $R_{201}$, $R_{202}$ and $R_{203}$ is generally in the range of 1 to 30, preferably 1 to 20.

Two of $R_{201}$ to $R_{203}$ may be bonded to each other via a single bond or a connecting group to thereby form a ring structure. As the connecting group, there can be mentioned, for example, an ether bond, a thioether bond, an ester bond, an amido bond, a carbonyl group, a methylene group or an ethylene group. As the group formed by the mutual bonding of two of $R_{201}$ to $R_{203}$, there can be mentioned, for example, an alkylene group, such as a butylene group or a pentylene group.

$Z^-$ represents a normucleophilic anion. The normucleophilic anion means an anion whose capability of inducing a nucleophilic reaction is extremely low. Any decomposition over time attributed to an intramolecular nucleophilic reaction can be suppressed by the use of this anion. Therefore, when this anion is used, the stability over time of the relevant composition and the film formed therefrom can be enhanced.

The compounds of general formula (ZI) when exposed to actinic rays or radiation generate acids of the formula $Z^-H^+$. As aforementioned, these acids satisfy the relationship pKa≥−1.5.

$Z^-$ is preferably an anion resulting from the removal of a proton from any of the compounds mentioned above as the acids generated by the acid generators. More preferably, $Z^-$ is an anion resulting from the removal of a proton from a compound expressed by any of general formulae (B-1) to (B-3) above. Further more preferably, $Z^-$ is an anion resulting from the removal of a proton from a compound expressed by any of general formulae (B-4) to (B-7) above.

As the organic groups represented by $R_{201}$, $R_{202}$ and $R_{203}$, there can be mentioned, for example, the corresponding groups of compounds (ZI-1), (ZI-2), (ZI-3) or (ZI-4) to be described hereinafter.

Compounds having two or more of the structures of the general formula (ZI) may be used as the acid generator. For example, use may be made of a compound having a structure in which at least one of the $R_{201}$ to $R_{203}$ of one of the compounds of the general formula (ZI) is bonded to at least one of the $R_{201}$ to $R_{203}$ of another of the compounds of the general formula (ZI).

As preferred (ZI) components, the following compounds (ZI-1) to (ZI-4) can be exemplified.

The compounds (ZI-1) are arylsulfonium compounds of the general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonyl compound, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the aryl group having a heterocyclic structure, a pyrrole residue, a furan residue, a thiophene residue, an indole residue, a benzofuran residue, and a benzothiophene residue can be exemplified. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, a methyl group, an ethyl group, a propyl group, an n-butyl group, a sec-butyl group, a t-butyl group, a cyclopropyl group, a cyclobutyl group, and a cyclohexyl group can be exemplified.

The aryl group, alkyl group or cycloalkyl group represented by $R_{201}$ to $R_{203}$ may have one or more substituents. As the substituent, an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxy group, and a phenylthio group can be exemplified. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 6 carbon atoms and an alkoxy group having 1 to 6 carbon atoms. The substituents may be contained in any one of the three $R_{201}$ to $R_{203}$, or alternatively may be contained in all three of $R_{201}$ to $R_{203}$. When $R_{201}$ to $R_{203}$ represent a phenyl group, the substituent preferably lies at the p-position of the phenyl group.

Now, the compounds (ZI-2) will be described.

The compounds (ZI-2) are compounds represented by the formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a 2-oxoalkyl group, an alkoxycarbonylmethyl group, an allyl group, and a vinyl group. More preferred groups include a linear or branched 2-oxoalkyl group and an alkoxycarbonylmethyl group. Especially preferred is a linear or branched 2-oxoalkyl group.

As preferred alkyl groups and cycloalkyl groups represented by $R_{201}$ to $R_{203}$, a linear or branched alkyl group having 1 to 10 carbon atoms (for example, a methyl group, an ethyl group, a propyl group, a butyl group or a pentyl group) and a cycloalkyl group having 3 to 10 carbon atoms (for example, a cyclopentyl group, a cyclohexyl group or a norbornyl group) can be exemplified. As more preferred alkyl groups, a 2-oxoalkyl group and an alkoxycarbonylmethyl group can be exemplified. As more preferred cycloalkyl group, a 2-oxocycloalkyl group can be exemplified.

The 2-oxoalkyl group may be linear or branched. A group having >C=O at the 2-position of the above-described alkyl group can be preferably exemplified.

The 2-oxocycloalkyl group is preferably a group having >C=O at the 2-position of the above-described cycloalkyl group.

As preferred alkoxy groups of the alkoxycarbonylmethyl group, alkoxy groups having 1 to 5 carbon atoms can be exemplified. As such, there can be mentioned, for example, a methoxy group, an ethoxy group, a propoxy group, a butoxy group and a pentoxy group.

The organic groups containing no aromatic ring represented by $R_{201}$ to $R_{203}$ may further have one or more substituents. As the substituents, a halogen atom, an alkoxy group (having, for example, 1 to 5 carbon atoms), a hydroxy group, a cyano group and a nitro group can be exemplified.

Now the compounds (ZI-3) will be described. The compounds (ZI-3) are those represented by the following general formula (ZI-3) which have a phenacylsulfonium salt structure.

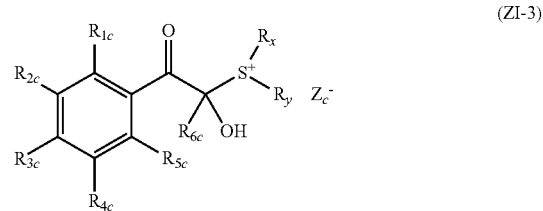

(ZI-3)

In the formula (ZI-3), each of $R_{1c}$ to $R_{5c}$ independently represents a hydrogen atom, an alkyl group, a cycloalkyl group, an alkoxy group, a halogen atom, or a phenylthio group.

Each of $R_{6c}$ and $R_{7c}$ independently represents a hydrogen atom, an alkyl group, a cycloalkyl group, halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a normucleophilic anion. There can be mentioned the same normucleophilic anions as mentioned with respect to the $Z^-$ of the general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

Each of the aryl groups represented by $R_{6c}$ and $R_{7c}$ preferably has 5 to 15 carbon atoms. As such, there can be mentioned, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms. As such, there can be mentioned, for example, an ethylene group, a propylene group, a butylene group, a pentylene group, a hexylene group or the like. Further, the ring formed by the bonding of $R_{6c}$ and $R_{7c}$ may have a heteroatom, such as an oxygen atom, in the ring.

As the alkyl groups and cycloalkyl groups represented by $R_x$ and $R_y$, there can be mentioned the same alkyl groups and cycloalkyl groups as set forth above with respect to $R_{1c}$ to $R_{7c}$.

As the 2-oxoalkyl group and 2-oxocycloalkyl group, there can be mentioned the alkyl group and cycloalkyl group represented by $R_{1c}$ to $R_{7c}$ having $>C=O$ at the 2-position thereof.

With respect to the alkoxy group of the alkoxycarbonylalkyl group, there can be mentioned the same alkoxy groups as mentioned above with respect to $R_{1c}$ to $R_{5c}$. As the alkyl group thereof, there can be mentioned, for example, an alkyl group having 1 to 12 carbon atoms, preferably a linear alkyl group having 1 to 5 carbon atoms (e.g., a methyl group or an ethyl group).

The allyl groups are not particularly limited. However, preferred use is made of an unsubstituted allyl group or an allyl group substituted with a cycloalkyl group of a single ring or multiple rings.

The vinyl groups are not particularly limited. However, preferred use is made of an unsubstituted vinyl group or a vinyl group substituted with a cycloalkyl group of a single ring or multiple rings.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

Specific examples of the cation part in the compound (ZI-3) will be described below.

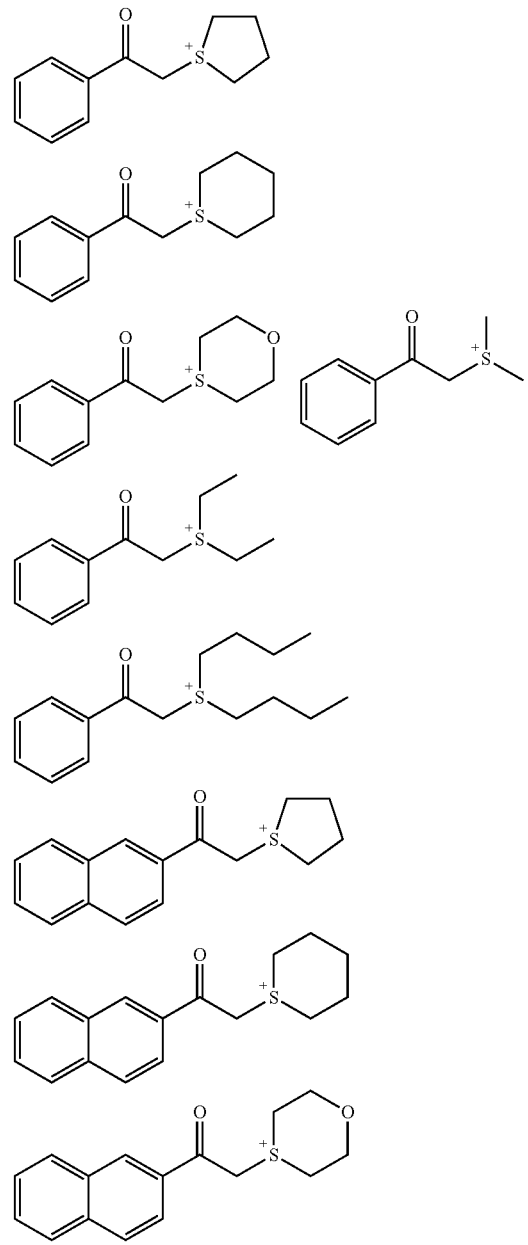

123
-continued
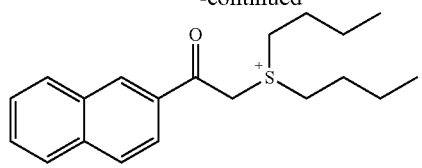
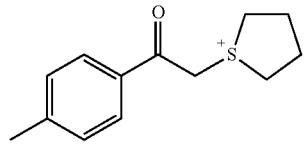
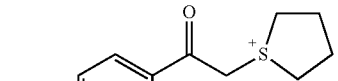
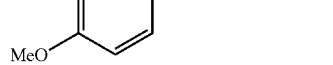
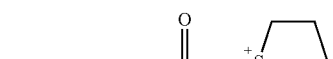
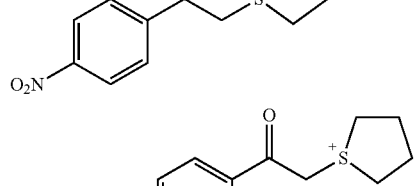
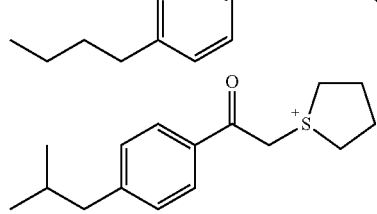
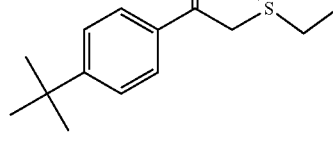
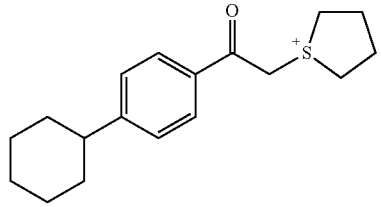
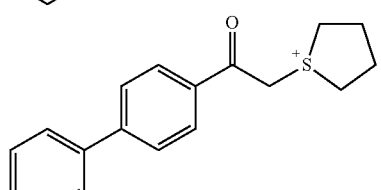
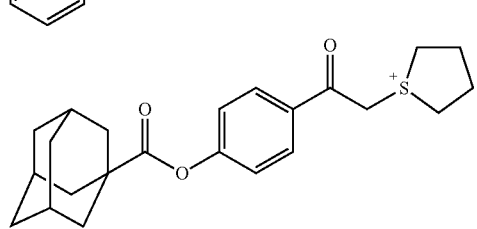
124
-continued
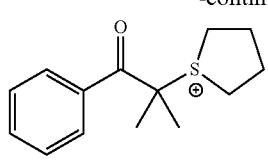
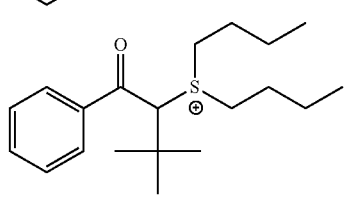
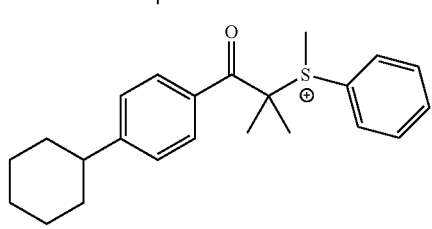
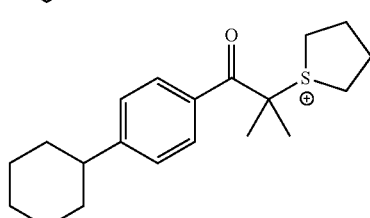
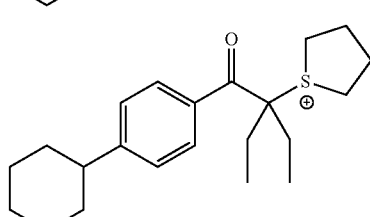
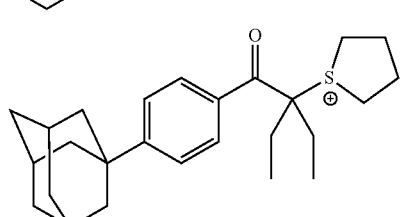
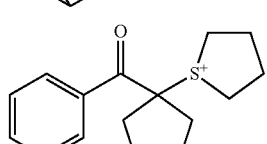
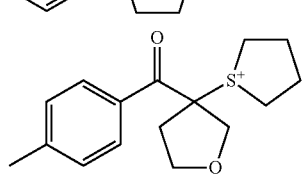
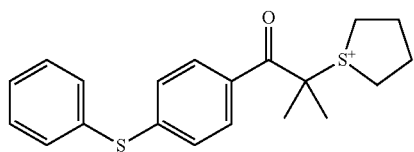

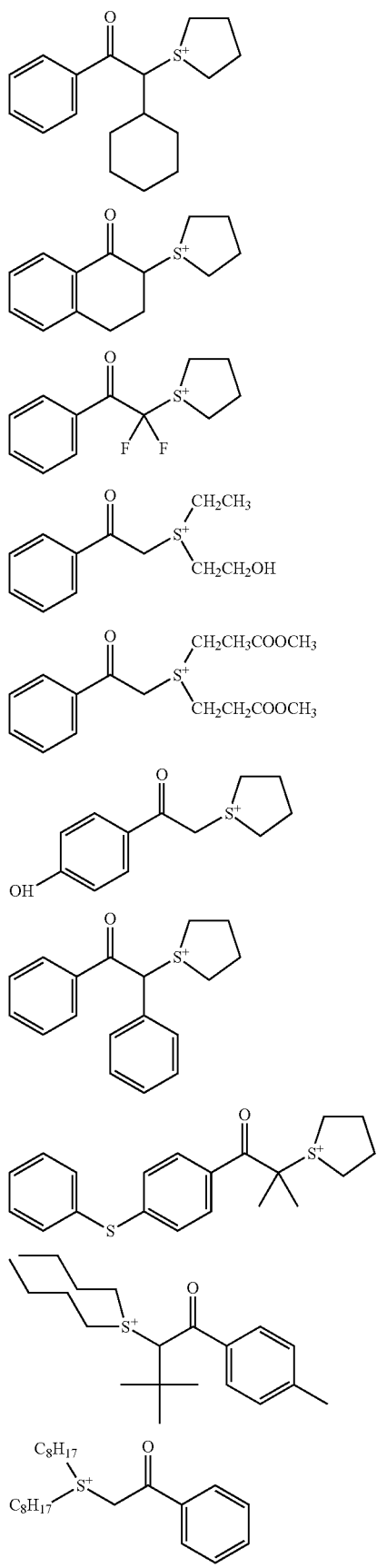
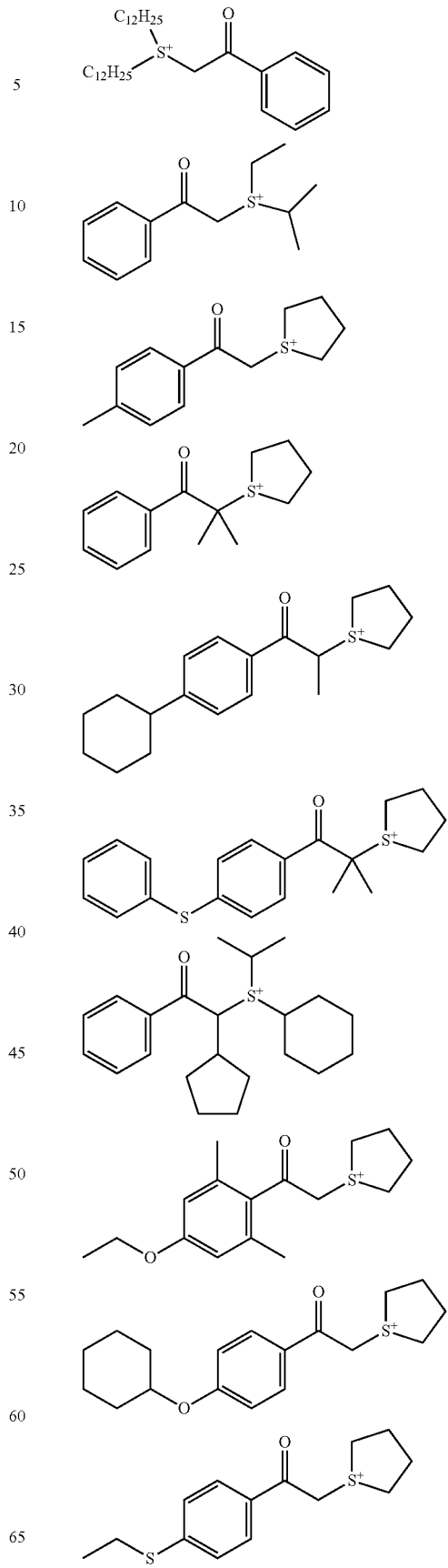

-continued

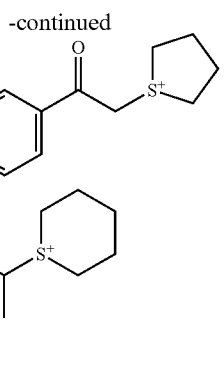

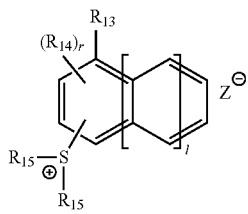

The compounds (ZI-4) are those of general formula (ZI-4) below.

(ZI-4)

In general formula (ZI-4), $R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings. These groups may have one or more substituents.

$R_{14}$, each independently in the instance of $R_{14}$s, represents any of an alkyl group, a cycloalkyl group, an alkoxy group, an alkoxycarbonyl group, an alkylcarbonyl group, an alkylsulfonyl group, a cycloalkylsulfonyl group and a group with a cycloalkyl skeleton of a single ring or multiple rings. These groups may have one or more substituents.

Each of $R_{15}$s independently represents an alkyl group, a cycloalkyl group or a naphthyl group, provided that the two $R_{15}$s may be bonded to each other to thereby form a ring. These groups may have one or more substituents.

In the formula, l is an integer of 0 to 2, and r is an integer of 0 to 8.

$Z^-$ represents a nornucleophilic anion. As such, there can be mentioned any of the same nornucleophilic anions as mentioned with respect to the $Z^-$ of the general formula (ZI).

In general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

As the cycloalkyl groups represented by $R_{13}$, $R_{14}$ and $R_{15}$, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ and $R_{14}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have one or more substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group or the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

With respect to the alkyl group of the alkylcarbonyl group represented by $R_{14}$, there can be mentioned the same specific examples as mentioned above with respect to the alkyl groups represented by $R_{13}$ to $R_{15}$.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

Each of the groups may have one or more substituents. As such substituents, there can be mentioned, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-4). The cyclic structure may condense with an aryl group or a cycloalkyl group. The bivalent $R_{15}$s may have substituents. As such substituents, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like as mentioned above. It is especially preferred for the $R_{15}$ of general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

Each of $R_{13}$ and $R_{14}$ may have one or more substituents. As such substituents, there can be mentioned, for example, a hydroxyl group, an alkoxy group, an alkoxycarbonyl group, a halogen atom (especially, a fluorine atom) or the like.

In the formula, l is preferably 0 or 1, more preferably 1, and r is preferably 0 to 2.

Specific examples of the cation part in the compound (ZI-4) will be shown below.

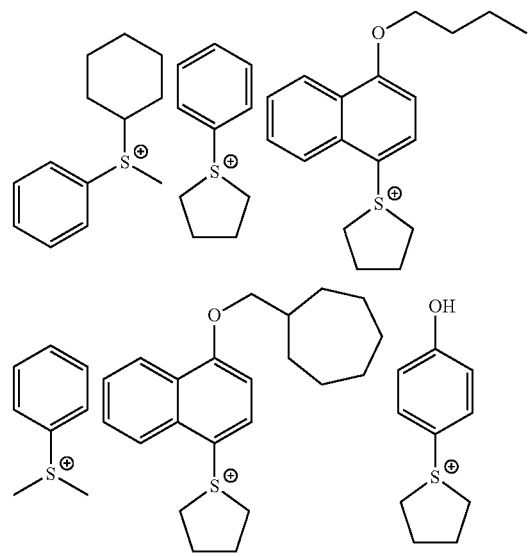

131
-continued
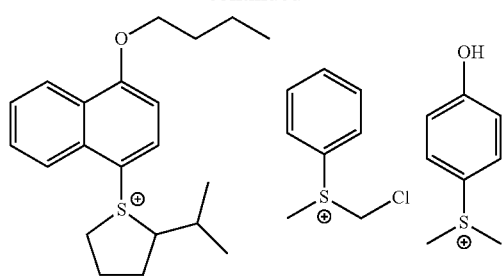
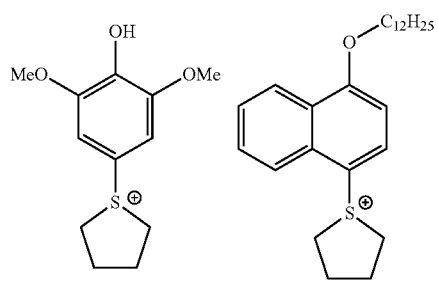
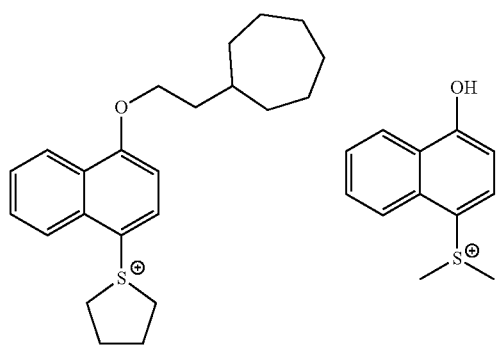
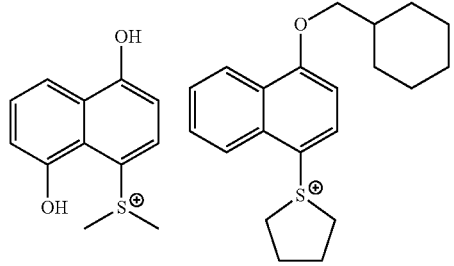
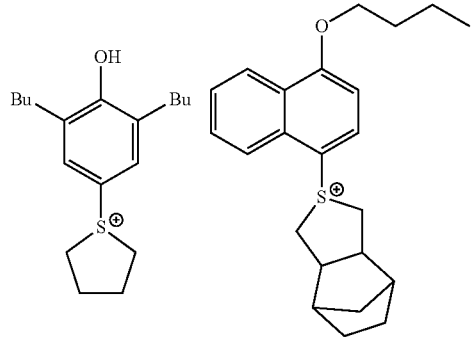
132
-continued
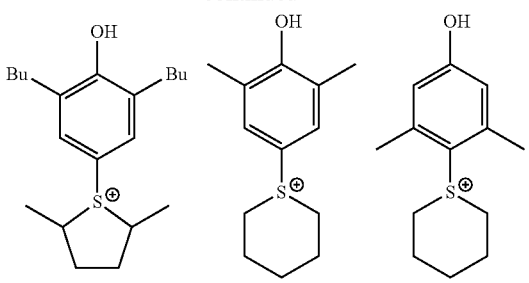
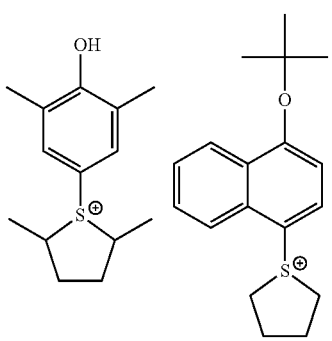
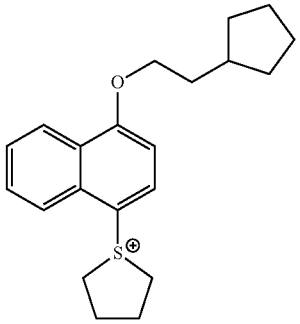
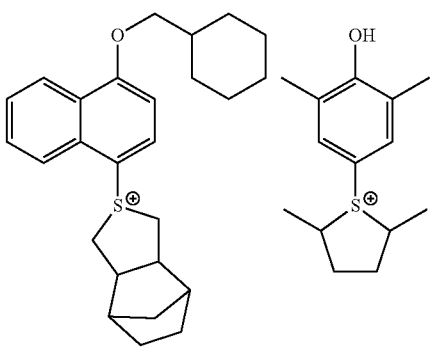
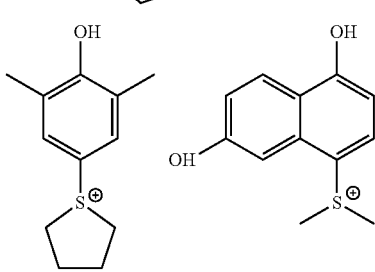

133
-continued
134
-continued
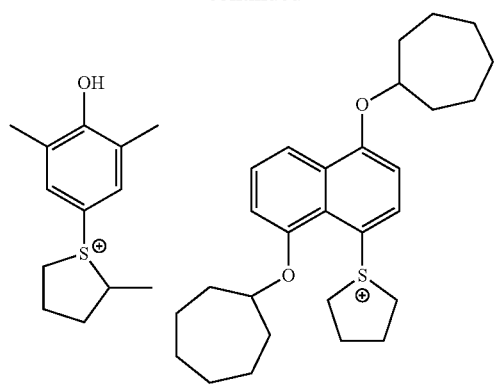
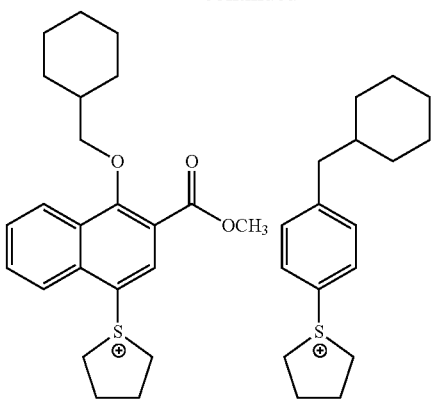
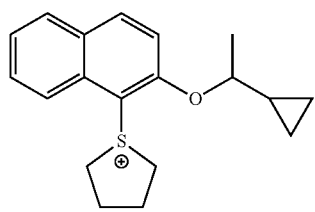
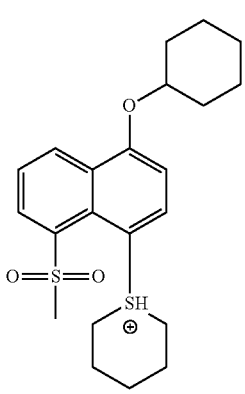
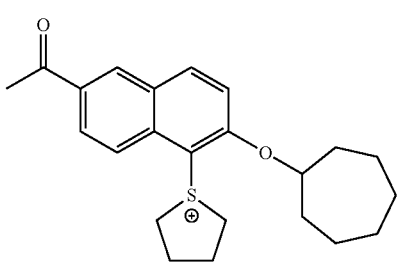
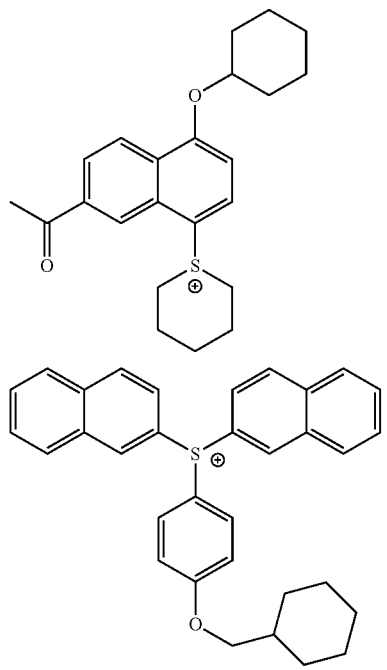
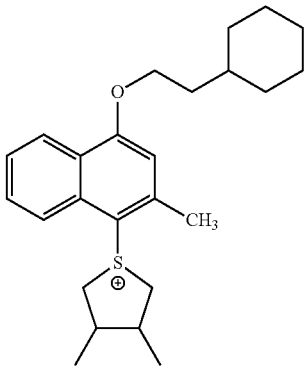

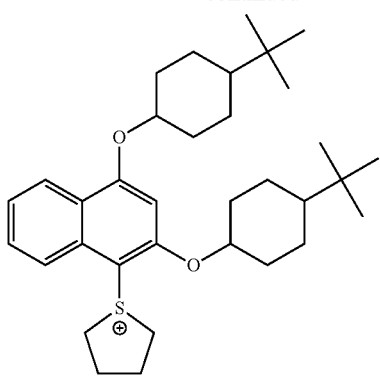
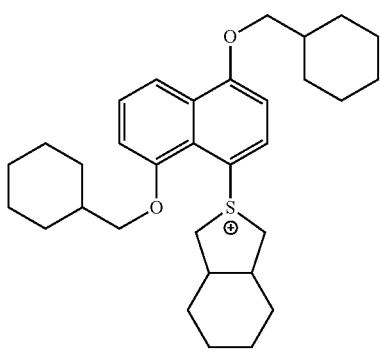
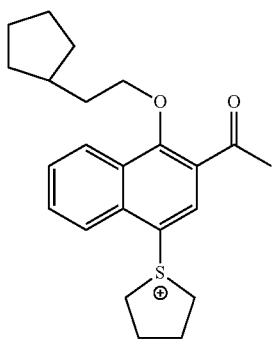
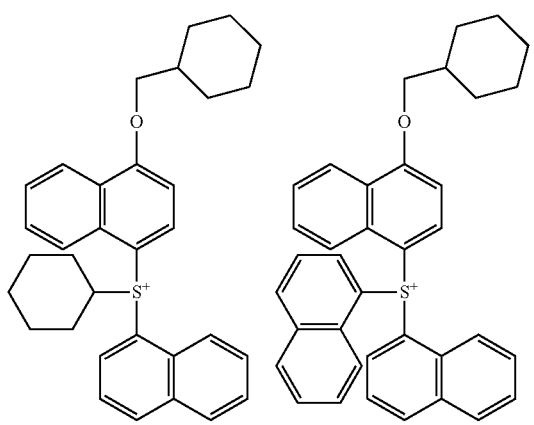
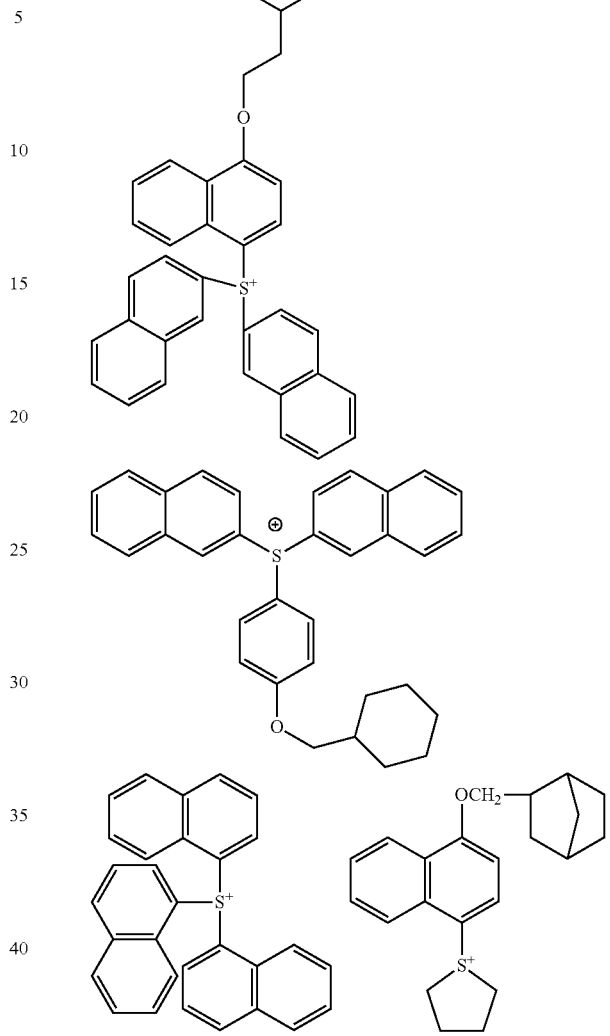

Now, general formulae (ZII) will be described.

In general formulae (ZII), each of $R_{204}$ to $R_{207}$ independently represents an aryl group, an alkyl group or a cycloalkyl group.

The aryl group represented by each of $R_{204}$ to $R_{207}$ is preferably a phenyl group or a naphthyl group, more preferably a phenyl group. The aryl group may be one having a heterocyclic structure containing an oxygen atom, nitrogen atom, sulfur atom, etc. As the aryl group having a heterocyclic structure, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), and a benzothiophene residue (group formed by loss of one hydrogen atom from benzothiophene) can be exemplified.

As preferred alkyl groups and cycloalkyl groups represented by $R_{204}$ to $R_{207}$, a linear or branched alkyl group having 1 to 10 carbon atoms and a cycloalkyl group having 3 to 10 carbon atoms can be exemplified. As the alkyl group, for example, a methyl group, an ethyl group, a propyl group, a butyl group and a pentyl group can be exemplified. As the cycloalkyl group, for example, a cyclopentyl group, a cyclohexyl group and a norbornyl group can be exemplified.

The aryl group, alkyl group and cycloalkyl group represented by $R_{204}$ to $R_{207}$ may have one or more substituents. As a possible substituent on the aryl group, alkyl group and cycloalkyl group represented by $R_{204}$ to $R_{207}$, an alkyl group (having, for example, 1 to 15 carbon atoms), a cycloalkyl group (having, for example, 3 to 15 carbon atoms), an aryl group (having, for example, 6 to 15 carbon atoms), an alkoxy group (having, for example, 1 to 15 carbon atoms), a halogen atom, a hydroxy group, and a phenylthio group can be exemplified.

$Z^-$ represents a normucleophilic anion. As such, the same normucleophilic anions as mentioned with respect to the $Z^-$ in the general formula (ZI) can be exemplified.

The compounds of general formula (ZII) when exposed to actinic rays or radiation generate acids of the formula $Z^-H^+$ in the same manner as the compounds of general formula (ZI). As mentioned above, these acids satisfy the relationship pKa≥-1.5.

As further acid generators, there can be mentioned the compounds of general formula (ZIII) below.

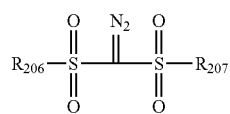

ZIII

In general formula (ZIII), $R_{206}$ and $R_{207}$ have the same meaning as $R_B$ described above, preferably having the same meaning as $R_{B1}$ described above.

The compounds of general formula (ZIII) when exposed to actinic rays or radiation generate acids of the formula $R_{206}$—$SO_3H$ and acids of the formula $R_{207}$—$SO_3H$. At least one of these sulfonic acids satisfies the relationship pKa≥-1.5. As examples of these sulfonic acids, there can be mentioned those set forth above with respect to the sulfonic acids generated by the compounds of general formulae (ZI) and (ZII).

As still further acid generators, there can be mentioned the compounds of general formulae (ZV) and (ZVI) below.

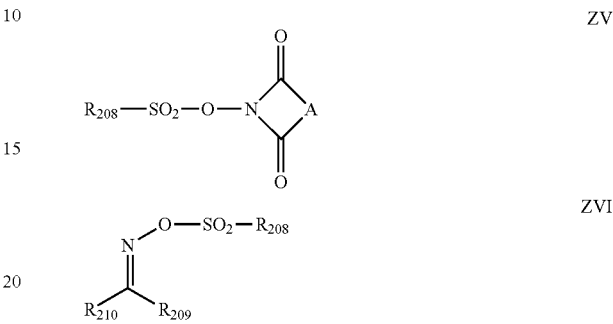

In general formulae (ZV) and (ZVI), $R_{208}$ has the same meaning as $R_B$ described above, preferably having the same meaning as $R_{B1}$ described above. Each of $R_{209}$ and $R_{210}$ independently represents an alkyl group, a cycloalkyl group or an aryl group. A represents an alkylene group, an alkenylene group or an arylene group.

The compounds of general formulae (ZV) and (ZVI) when exposed to actinic rays or radiation generate acids of the formula $R_{208}$—$SO_3H$ satisfying the relationship pKa≥-1.5. As examples of these sulfonic acids, there can be mentioned those set forth above with respect to the sulfonic acids generated by the compounds of general formulae (ZI) and (ZII).

Particular examples of the acid generators capable of generating acids satisfying the relationship pKa≥-1.5 are shown below. The pKa values indicated below are values obtained by calculating the pKa of each of generated acids by the method described hereinbefore.

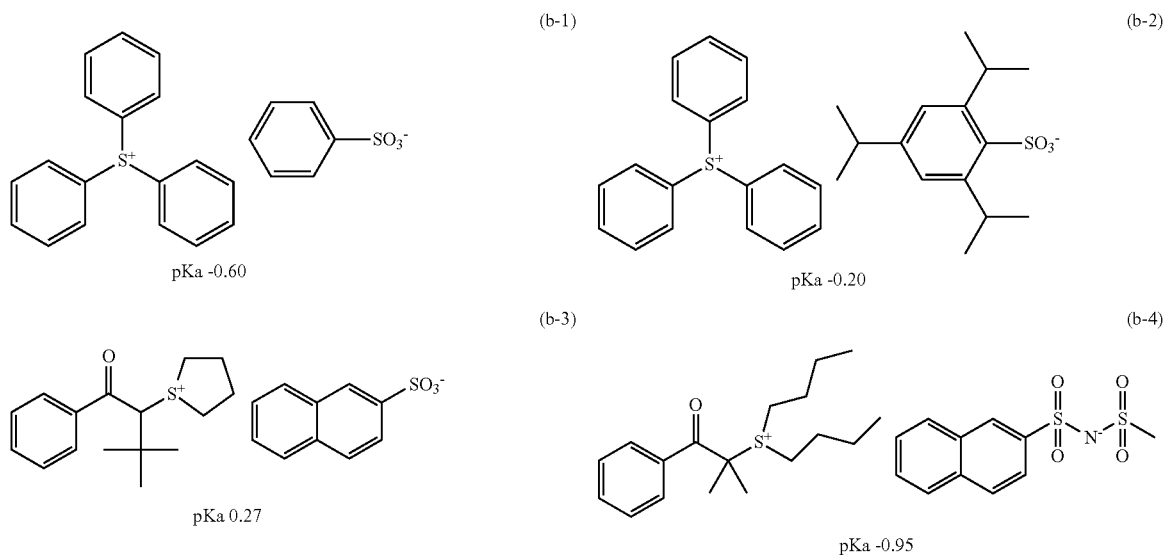

-continued
(b-5)
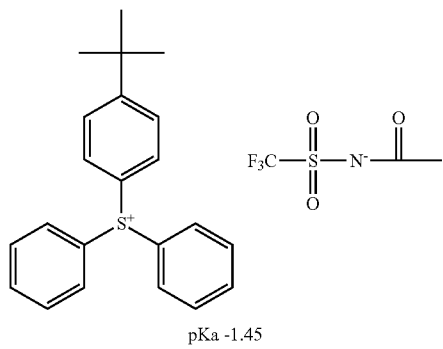
pKa -1.45
(b-6)
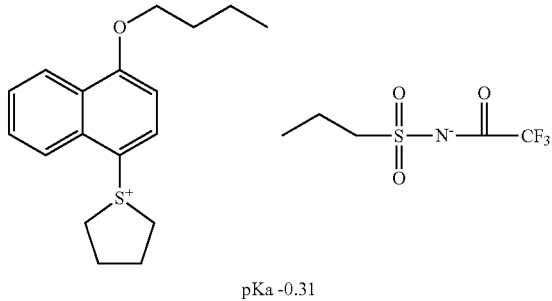
pKa -0.31
(b-7)
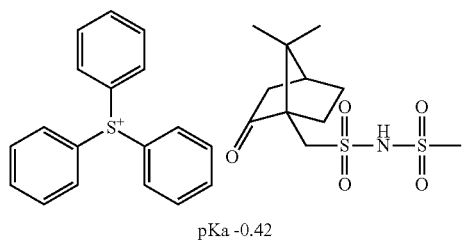
pKa -0.42
(b-8)
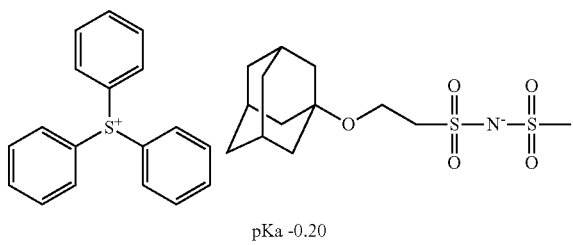
pKa -0.20
(b-9)
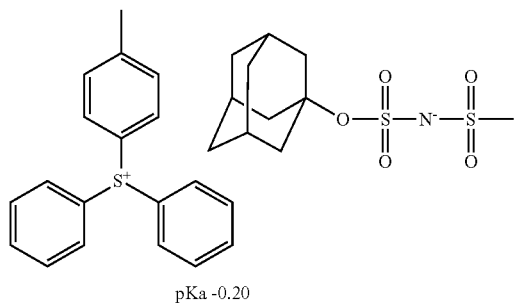
pKa -0.20
(b-10)
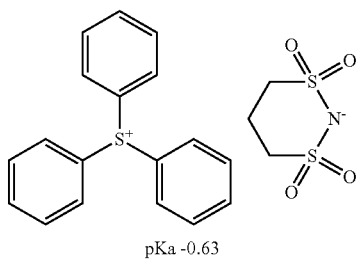
pKa -0.63
(b-11)
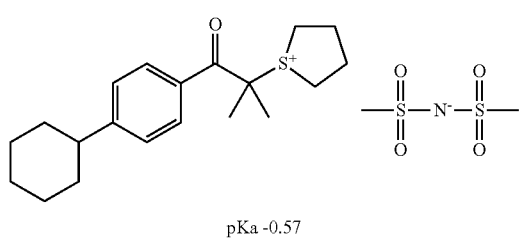
pKa -0.57
(b-12)
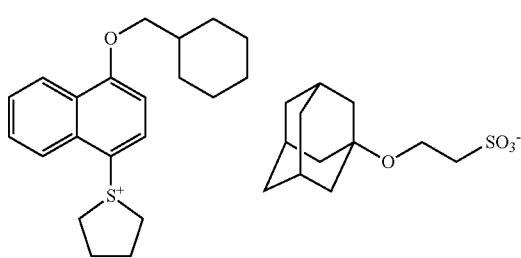
pKa 1.36
(b-13)
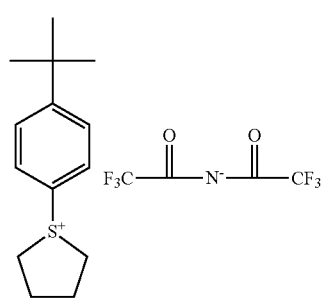
pKa 3.04
(b-14)
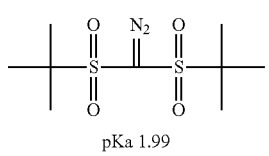
pKa 1.99

(b-15)
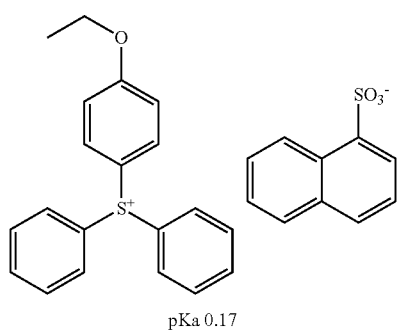
pKa 0.17
(b-16)
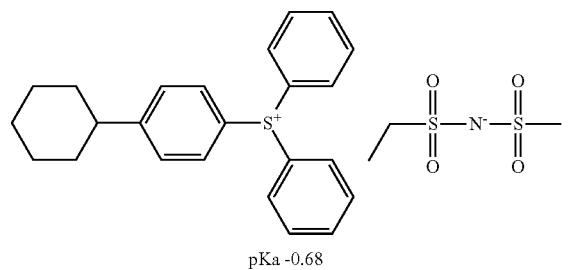
pKa -0.68
(b-17)
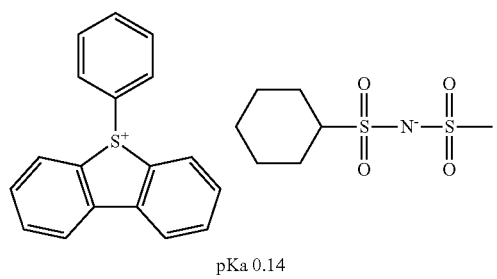
pKa 0.14
(b-18)
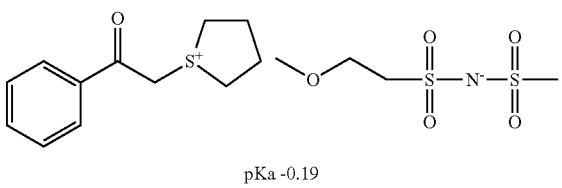
pKa -0.19
(b-19)
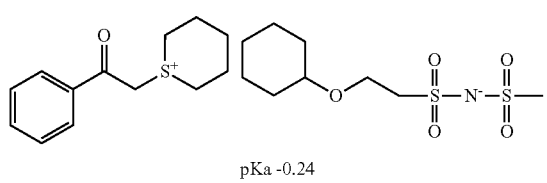
pKa -0.24
(b-20)
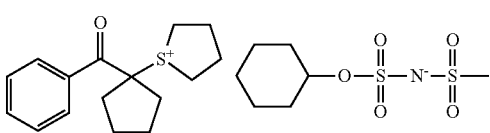
pKa -0.17
(b-21)
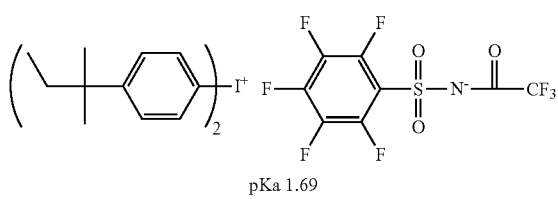
pKa 1.69
(b-22)
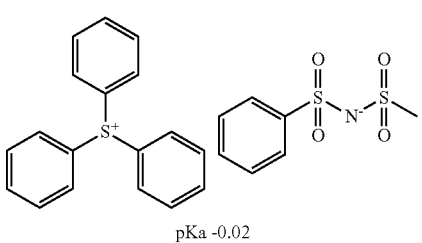
pKa -0.02
(b-23)
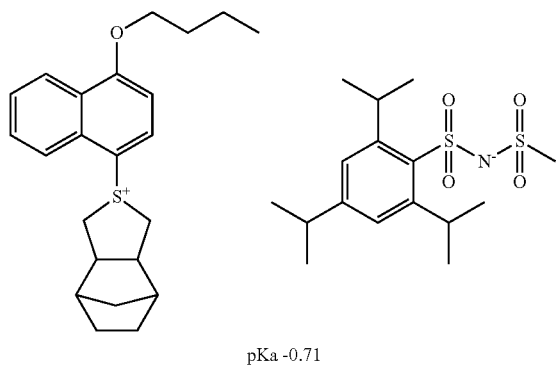
pKa -0.71
(b-24)
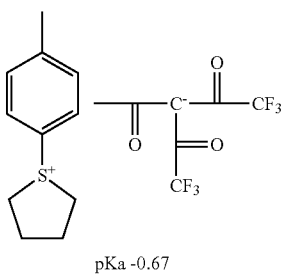
pKa -0.67

-continued
(b-25)
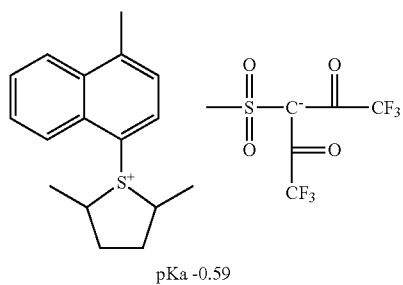
pKa -0.59
(b-26)
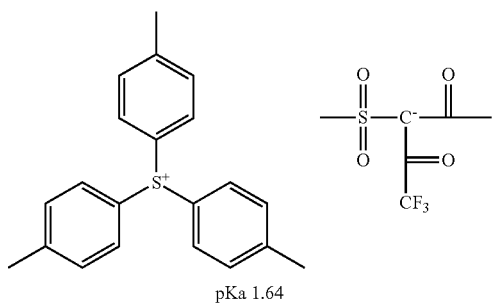
pKa 1.64
(b-27)
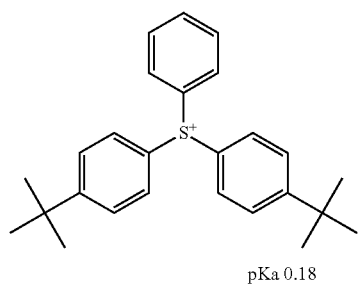
pKa 0.18
(b-28)
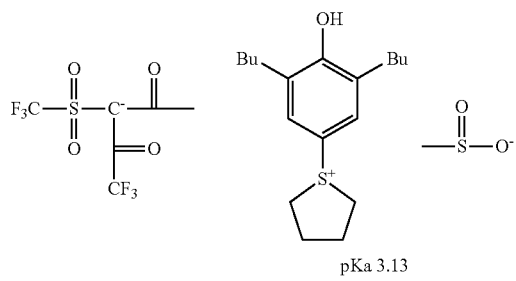
pKa 3.13
(b-29)
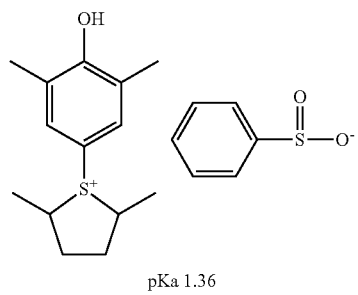
pKa 1.36
(b-30)
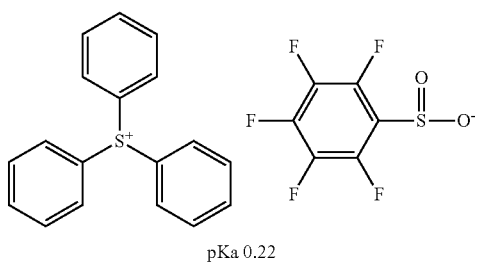
pKa 0.22
(b-31)
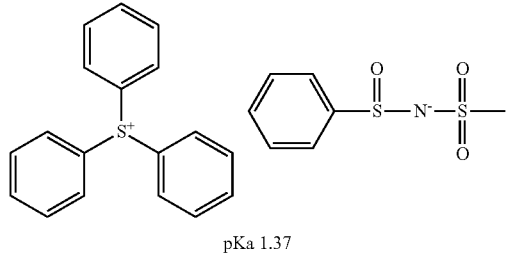
pKa 1.37
(b-32)
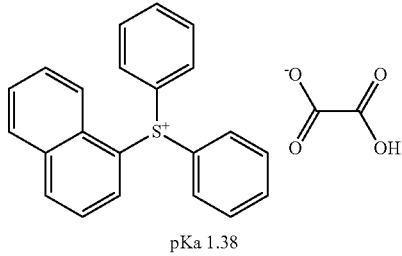
pKa 1.38
(b-33)
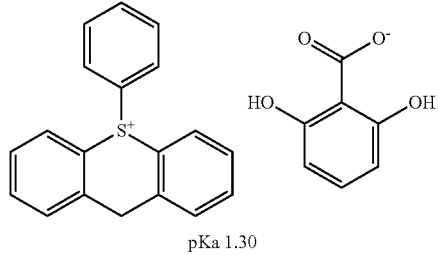
pKa 1.30
(b-34)
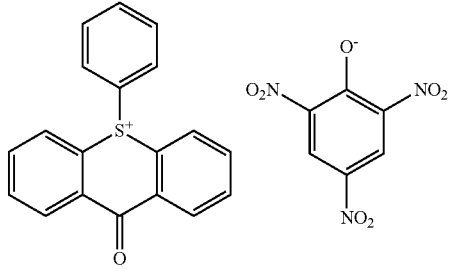
pKa 0.53

-continued
(b-35)
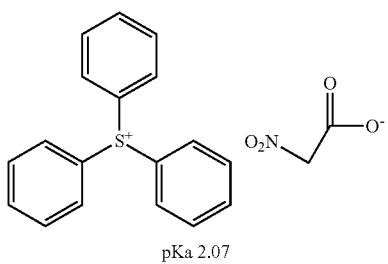
pKa 2.07
(b-36)
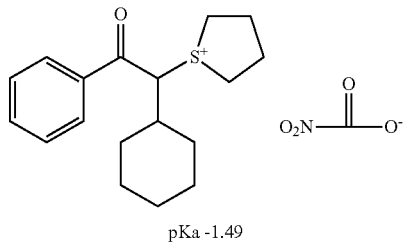
pKa -1.49
(b-37)
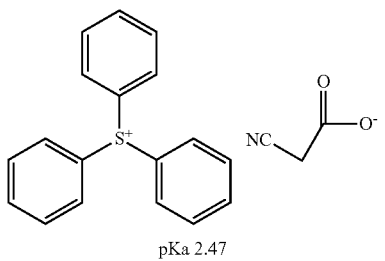
pKa 2.47
(b-38)
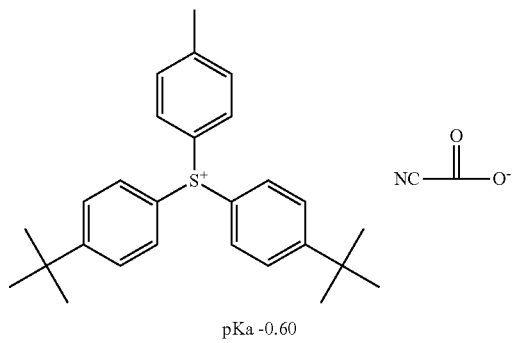
pKa -0.60
(b-39)
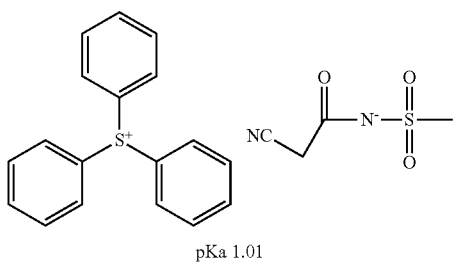
pKa 1.01
(b-40)
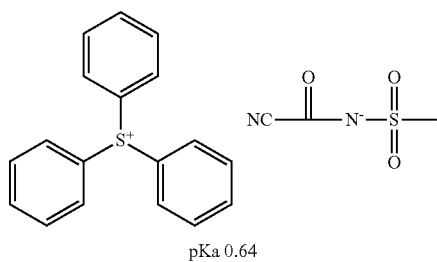
pKa 0.64
(b-41)
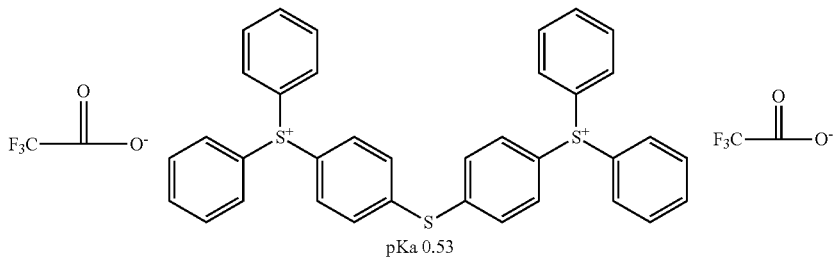
pKa 0.53
(b-42)
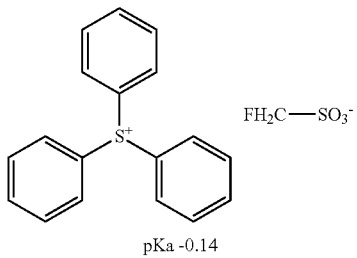
pKa -0.14
(b-43)
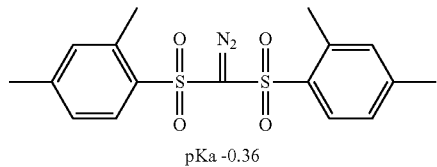
pKa -0.36
(b-44)
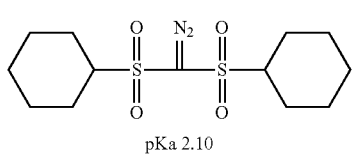
pKa 2.10

-continued

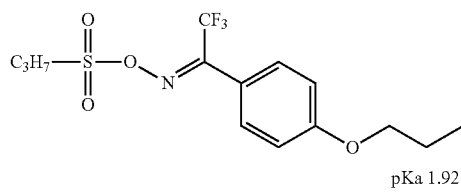

pKa 1.92

(b-45)

As the acid generator, each of the compounds capable of generating acids satisfying the relationship pKa≥−1.5 when exposed to actinic rays or radiation may be used alone. Alternatively, two or more types of these compounds may be used in combination. The content of the total amount of compounds capable of generating acids satisfying the relationship pKa≥−1.5 when exposed to actinic rays or radiation, based on the total solids of the composition, is preferably in the range of 0.1 to 20 mass %, more preferably 0.5 to 15 mass % and further more preferably 3 to 15 mass %.

Still alternatively, as the acid generator, at least one of the compounds capable of generating acids satisfying the relationship pKa≥−1.5 when exposed to actinic rays or radiation may be used in combination with at least one of the compounds capable of generating acids satisfying the relationship pKa<−1.5 when exposed to actinic rays or radiation. If so, the mass ratio of the total amount of the former compounds to the total amount of the latter compounds is, for example, in the range of 40:60 to 99:1, typically 60:40 to 99:1.

The content of the total amount of acid generators, based on the total solids of the composition, is preferably in the range of 0.1 to 20 mass %, more preferably 0.5 to 15 mass % and further more preferably 3 to 15 mass %.

(c) Basic Compound

The composition according to the present invention may further contain one or more basic compounds. As preferred basic compounds, the compounds having the structures represented by the following formulae (A) to (E) can be exemplified.

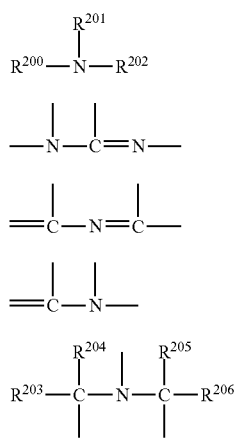

In the general formulae (A) and (E),
$R^{200}$, $R^{201}$ and $R^{202}$ each independently represents a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded to each other to form a ring.

$R^{203}$, $R^{204}$, $R^{205}$ and $R^{206}$ each independently represents an alkyl group having 1 to 20 carbon atoms.

With respect to the above alkyl group, as a preferred substituted alkyl group, an aminoalkyl group having 1 to 20 carbon atoms, a hydroxyalkyl group having 1 to 20 carbon atoms, and a cyanoalkyl group having 1 to 20 carbon atoms can be exemplified. More preferably, the alkyl groups are unsubstituted.

As preferred basic compounds, guanidine, aminopyrrolidine, pyrazole, pyrazoline, piperazine, aminomorpholine, aminoalkylmorpholine and piperidine can be exemplified. As more preferred compounds, those with an imidazole structure, a diazabicyclo structure, an onium hydroxide structure, an onium carboxylate structure, a trialkylamine structure, an aniline structure or a pyridine structure, alkylamine derivatives having a hydroxy group and/or an ether bond, and aniline derivatives having a hydroxy group and/or an ether bond can be exemplified.

As the compounds with an imidazole structure, imidazole, 2,4,5-triphenylimidazole, benzimidazole, and 2-phenylbenzoimidazole can be exemplified.

As the compounds with a diazabicyclo structure, 1,4-diazabicyclo[2,2,2]octane, 1,5-diazabicyclo[4,3,0]non-5-ene, and 1,8-diazabicyclo[5,4,0]undec-7-ene can be exemplified.

As the compounds with an onium hydroxide structure, tetrabutylammonium hydroxide, triarylsulfonium hydroxide, phenacylsulfonium hydroxide, and sulfonium hydroxides having a 2-oxoalkyl group, such as triphenylsulfonium hydroxide, tris(t-butylphenyl )sulfonium hydroxide, bis(t-butylphenyl) iodonium hydroxide, phenacylthiophenium hydroxide, and 2-oxopropylthiophenium hydroxide can be exemplified.

As the compounds with an onium carboxylate structure, those having a carboxylate at the anion moiety of the compounds with an onium hydroxide structure, such as acetate, adamantane-1-carboxylate, and perfluoroalkyl carboxylate can be exemplified.

As the compounds with a trialkylamine structure, tri(n-butyl)amine and tri(n-octyl)amine can be exemplified.

As the aniline compounds, 2,6-diisopropylaniline, N,N-dimethylaniline, N,N-dibutylaniline, and N,N-dihexylaniline can be exemplified.

As the alkylamine derivatives having a hydroxy group and/or an ether bond, ethanolamine, diethanolamine, triethanolamine, N-phenyldiethanolamine, and tris(methoxyethoxyethyl)amine can be exemplified.

As the aniline derivatives having a hydroxy group and/or an ether bond, N,N-bis(hydroxyethyl)aniline can be exemplified.

As preferred basic compounds, an amine compound having a phenoxy group, an ammonium salt compound having a phenoxy group, an amine compound having a sulfonic ester group, and an ammonium salt compound having a sulfonic ester group can further be exemplified.

In these compounds, it is preferred for at least one alkyl group to be bonded to a nitrogen atom. More preferably, an oxygen atom is contained in the chain of the alkyl group, thereby forming an oxyalkylene group. With respect to the number of oxyalkylene groups in each molecule, one or more is preferred, three to nine more preferred, and four to six further more preferred. Of these oxyalkylene groups, the groups of the formulae —CH$_2$CH$_2$O—, —CH(CH$_3$)CH$_2$O— and —CH$_2$CH$_2$CH$_2$O— are especially preferred.

As specific examples of these compounds, there can be mentioned, for example, the compounds (C1-1) to (C3-3) given as examples in section [0066] of US Patent Application Publication No. 2007/0224539 A.

The composition of the present invention may contain a low-molecular compound containing a nitrogen atom and a group that is cleaved when acted on by an acid [hereinafter also referred to as a "low-molecular compound (D)" or "compound (D)".]

The group that is cleaved when acted on by an acid is not particularly limited. However, an acetal group, a carbonate group, a carbamate group, a tertiary ester group, a tertiary hydroxyl group and a hemiaminal ether group are preferably used. A carbamate group and a hemiaminal ether group are especially preferred.

The molecular weight of the compound (D) is preferably in the range of 100 to 1000, more preferably 100 to 700 and most preferably 100 to 500.

As the compound (D), an amine derivative containing a group that is cleaved when acted on by an acid being connected to a nitrogen atom.

The compound (D) may contain a carbamate group with a protective group, the carbamate group being connected to a nitrogen atom. The protective group contained in the carbamate group can be represented, for example, by the following formula (d-1).

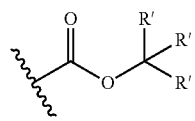
(d-1)

In the formula (d-1),

Each of R's independently represents a hydrogen atom, a linear or branched alkyl group, a cycloalkyl group, an aryl group, an aralkyl group, or an alkoxyalkyl group. At least two of R's may be connected to each other to form a ring.

Preferably, R' represents a linear or branched alkyl group, a cycloalkyl group, or an aryl group. More preferably, R' represents a linear or branched alkyl group, or a cycloalkyl group.

Specific examples of such groups will be shown below.

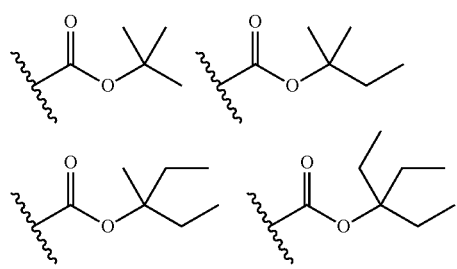

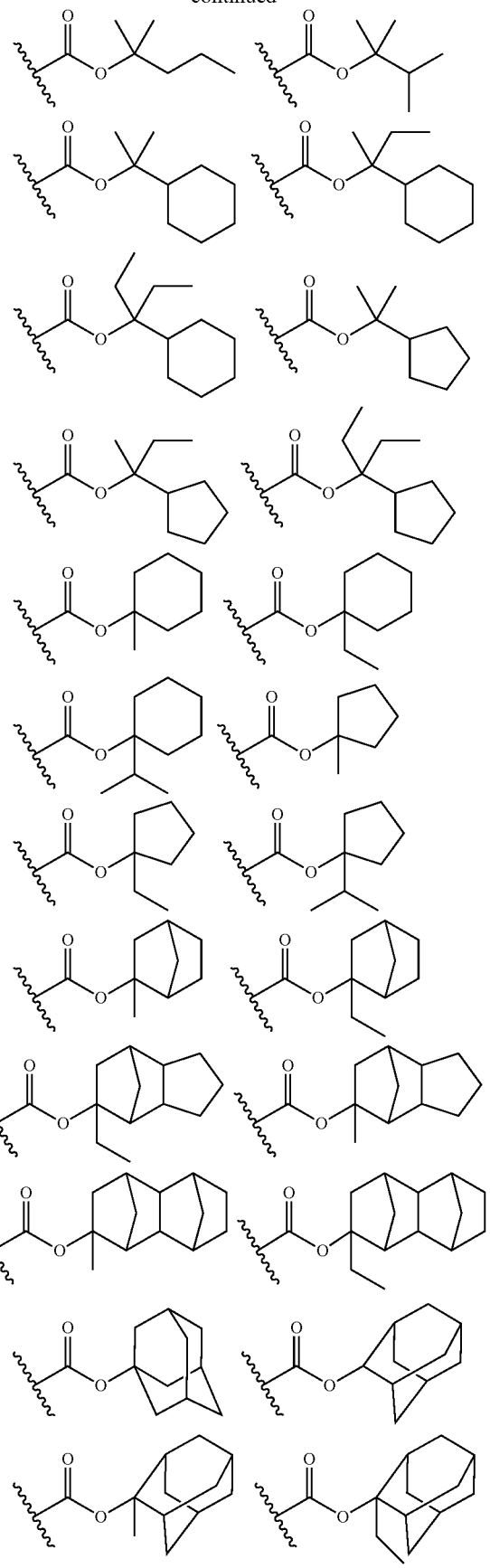

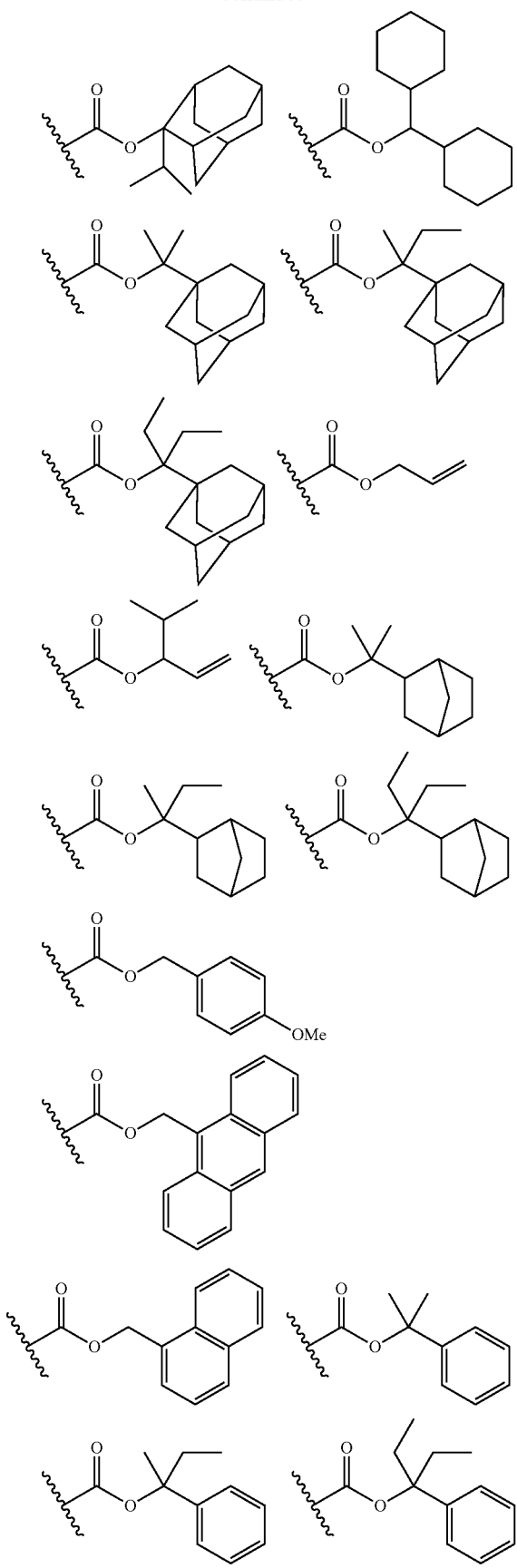

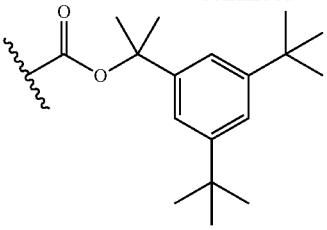

The compound (D) may have a structure in which any of the above-mentioned basic compounds are combined with the structure represented by general formula (d-1).

The compound (D) is especially preferred to be the one represented by general formula (F) below. Note that, the compound (D) may be any of the basic compounds described above as long as it is a low-molecular compound containing a group that is cleaved when acted on by an acid.

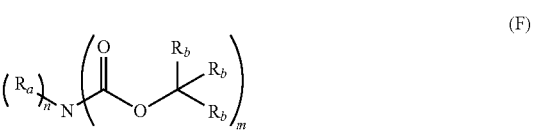

(F)

In the general formula (F), Ra represents a hydrogen atom, an alkyl group, a cycloalkyl group, an aryl group, or an aralkyl group. When n=2, two Ra's may be the same or different from each other, and may be connected to each other to form a bivalent heterocyclic hydrocarbon group (preferably having 20 or less carbon atoms) or its derivatives.

Each of Rb's independently represents a hydrogen atom, an alkyl group, a cycloalkyl group, an aryl group, an aralkyl group, or an alkoxyalkyl group, with the proviso that when at least one of Rb's are hydrogen atoms, at least one of the remainder represents a cyclopropyl group, 1-alkoxyalkyl group, or an aryl group.

At least two of Rb's may be connected to each other to form a alicyclic hydrocarbon group, an aromatic hydrocarbon group, a heterocyclic hydrocarbon group, or their derivatives.

In the formula (F), n represents an integer of 0 to 2, m represents an integer of 1 to 3, and n+m=3.

In the formula (F), the alkyl group, the cycloalkyl group, the aryl group, and the aralkyl group represented by Ra and Rb may be substituted with a functional group such as a hydroxyl group, a cyano group, an amino group, a pyrrolidino group, a piperidino group, a morpholino group, and an oxo group; an alkoxy group; or a halogen atom. The same applies to the alkoxyalkyl group represented by Rb.

As the alkyl group, the cycloalkyl group, the aryl group, and the aralkyl group (these groups may be substituted with the above functional group, an alkoxy group, or a halogen atom) represented by Ra and/or Rb, the following groups can be exemplified:

a group derived from a linear or branched alkane such as methane, ethane, propane, butane, pentane, hexane, heptane, octane, nonane, decane, undecane, or dodecane; and the group derived from the alkane and substituted with one or more cycloalkyl groups such as a cyclobutyl group, a cyclopentyl group, or a cyclohexyl group;

a group derived from cycloalkane such as cyclobutane, cyclopentane, cyclohexane, cycloheptane, cyclooctane, norbornane, adamantane, or noradamantane; and the group derived from the cycloalkane and substituted with one or more linear or branched alkyl group such as a methyl group, an ethyl group, a n-propyl group, an i-propyl group, a n-butyl group, a 2-methylpropyl group, a 1-methylpropyl group, or a t-butyl group;

a group derived from aromatic compound such as benzene, naphthalene, or anthracene; and the group derived from the atomatic compound and substituted with one or more linear or branched alkyl group such as a methyl group, an ethyl group, a n-propyl group, an i-propyl group, a n-butyl group, a 2-methylpropyl group, a 1-methylpropyl group, or a t-butyl group;

a group derived from heterocyclic compound such as pyrrolidine, piperidine, morpholine, tetrahydrofuran, tetrahydropyrane, indole, indoline, quinoline, perhydroquinoline, indazole, or benzimidazole; the group derived from heterocyclic compound and substituted with one or more linear or branched alkyl group or a group derived from the aromatic compound;

a group derived from linear or branched alkane and substituted with a group derived from aromatic compound such as a phenyl group, a naphthyl group, or an anthracenyl group;

a group derived from cycloalkane and substituted with a group derived from aromatic compound such as a phenyl group, a naphthyl group, or an anthracenyl group; or each of these groups substituted with a functional group such as a hydroxyl group, a cyano group, an amino group, a pyrrolidino group, a piperidino group, a morpholino group, or an oxo group.

Further, as the bivalent heterocyclic hydrocarbon group (preferably having 1 to 20 carbon atoms) or its derivative, formed by mutual binding of Ra's, for example, the followings can be exemplified:

a group derived from heterocyclic compound such as pyrrolidine, piperidine, morpholine, 1,4,5,6-tetrahydropyrimidine, 1,2,3,4-tetrahydroquinoline, 1,2,3,6-tetrahydroquinoline, homopiperadine, 4-azabenzimidazole, benztriazole, 5-azabenztriazole, 1H-1,2,3-triazole, 1,4,7-triazacyclononane, tetrazole, 7-azaindole, indazole, benzimidazole, imidazo[1,2-a]pyridine, (1S,4S)-(+)2,5-azabicyclo[2.2.1]heptane, 1,5,7-triazabicyclo[4.4.0]dec-5-en, indole, indoline, 1,2,3,4-tetrahydroquinoxaline, perhydroquinoline, or 1,5,9-triazacyclododecane; or the group derived from heterocyclic compound and substituted with at least one of a group derived from linear or branched alkane, a group derived from cycloalkane, a group derived from aromatic compound, a group derived from heterocyclic compound, or a functional group such as a hydroxyl group, a cyano group, an amino group, a pyrrolidino group, a piperidino group, a morpholino group, or an oxo group.

Particularly preferred examples of the compound (D) will be shown below, which however in no way limit the scope of the present invention.

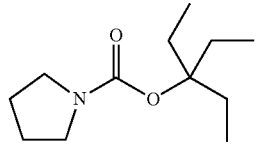
(D-1)

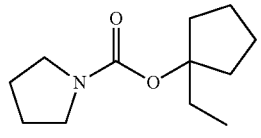
(D-2)

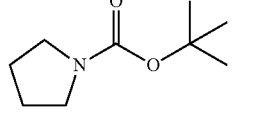
(D-3)

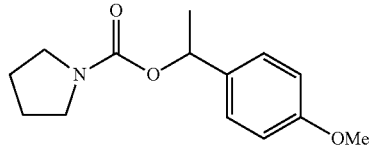
(D-4)

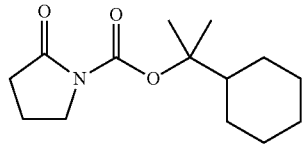
(D-5)

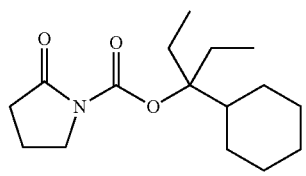
(D-6)

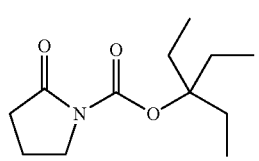
(D-7)

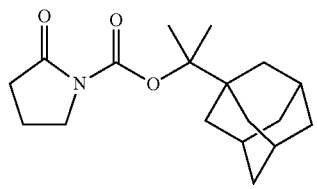
(D-8)

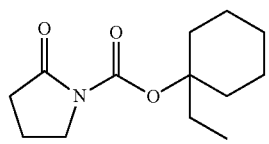
(D-9)

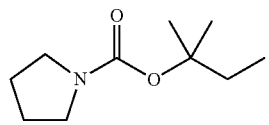
(D-10)

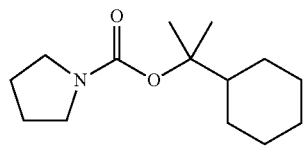
(D-11)

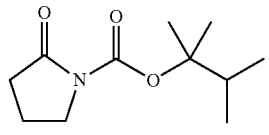
(D-12)

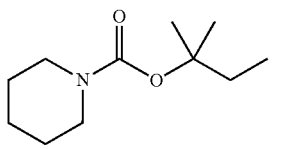
(D-13)
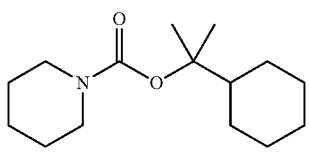
(D-14)
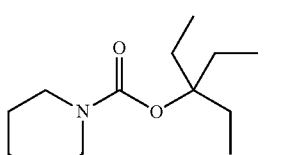
(D-15)
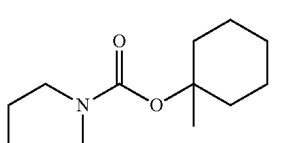
(D-16)
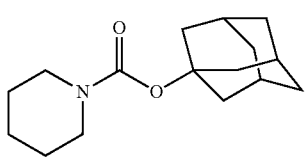
(D-17)
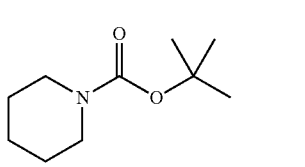
(D-18)
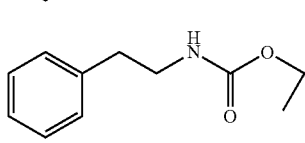
(D-19)
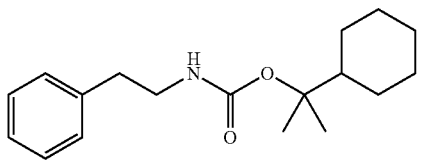
(D-20)
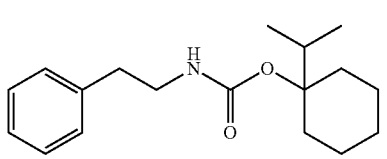
(D-21)
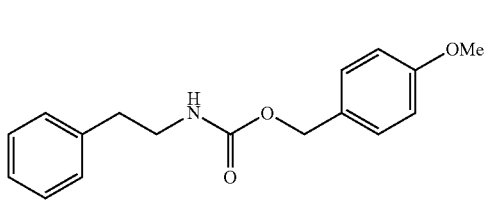
(D-22)
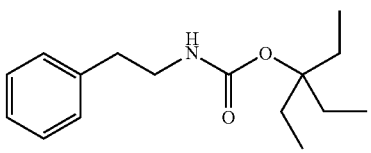
(D-23)
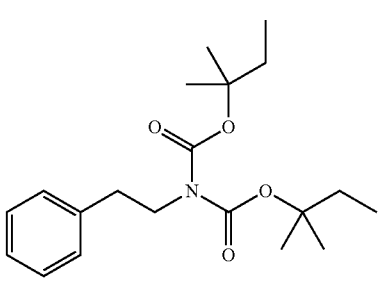
(D-24)
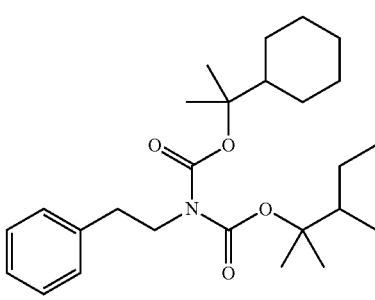
(D-25)
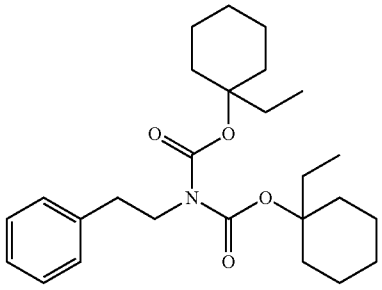
(D-26)
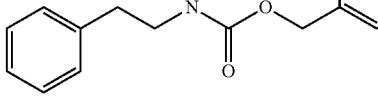
(D-27)
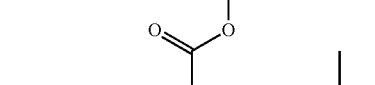
(D-28)

(D-29) 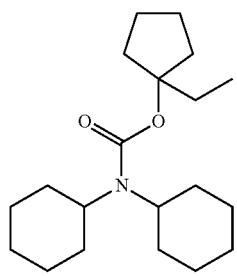
(D-30) 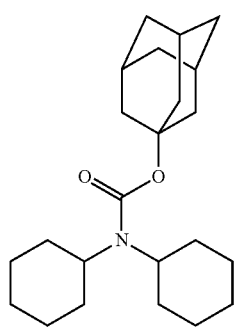
(D-31) 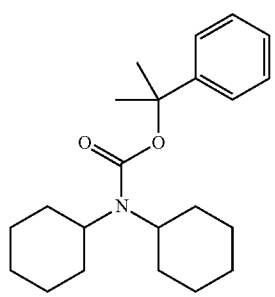
(D-32) 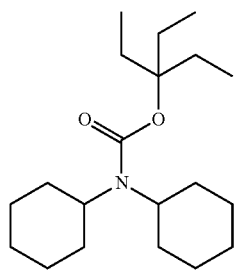
(D-33) 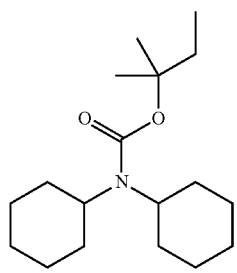
(D-34) 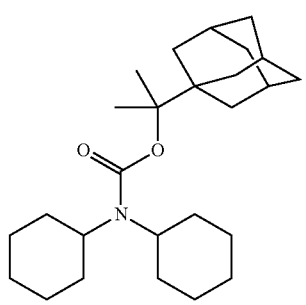
(D-35) 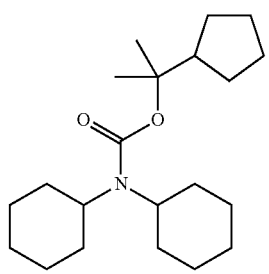
(D-36) 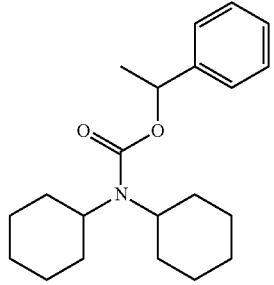
(D-37) 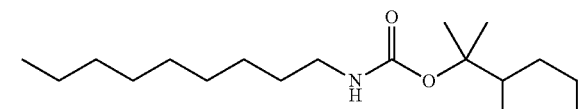
(D-38) 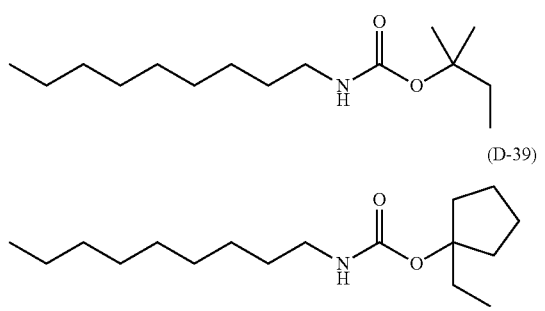
(D-39) 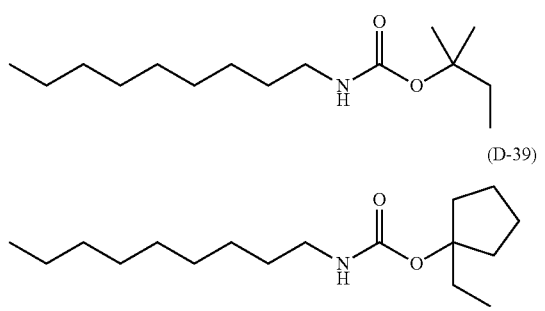
(D-40) 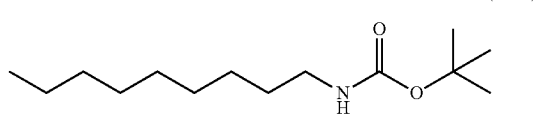

(D-41)
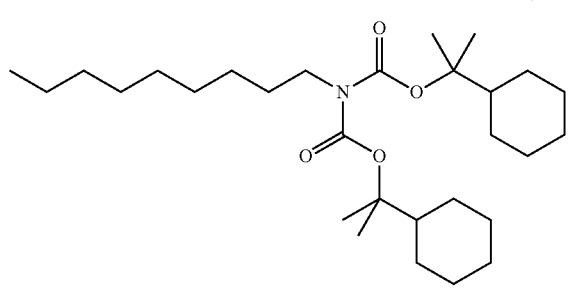
(D-42)
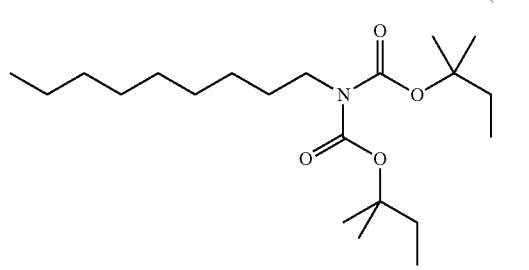
(D-43)
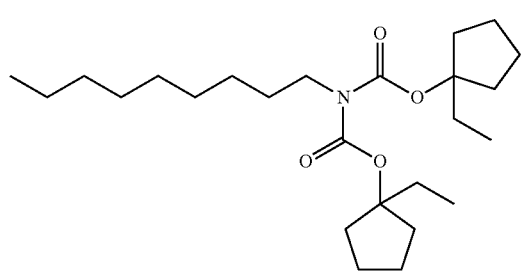
(D-44)
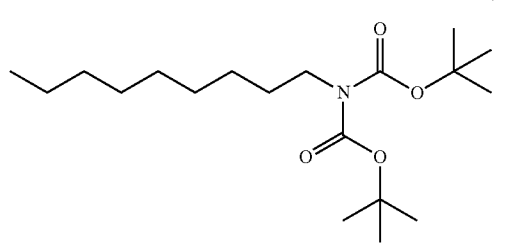
(D-45)
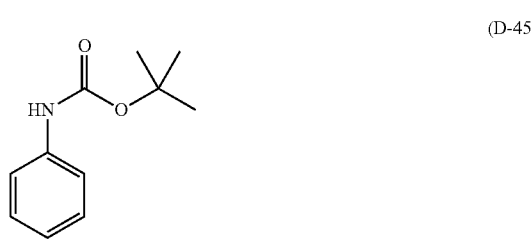
(D-46)
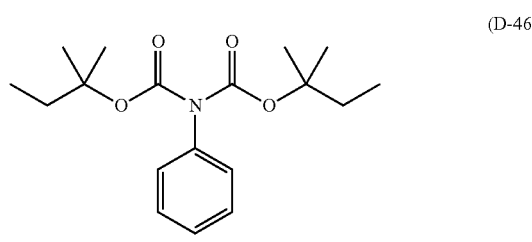
(D-47)
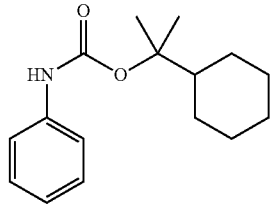
(D-48)
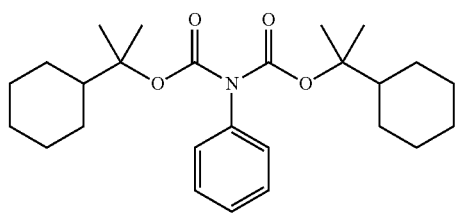
(D-49)
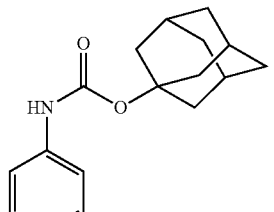
(D-50)
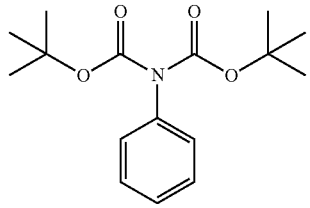
(D-51)
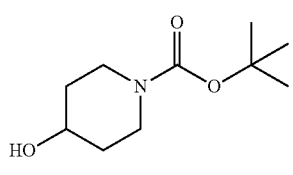
(D-52)
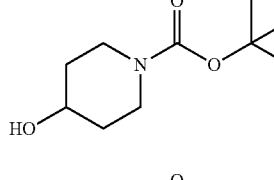
(D-53)
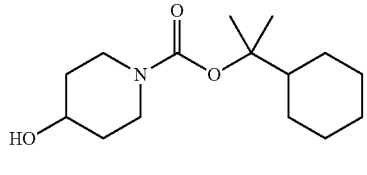
(D-54)
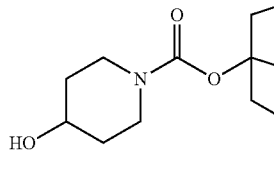

-continued

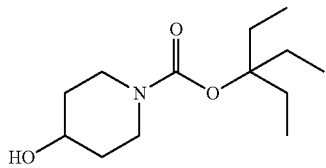

(D-55)

The compound represented by general formula (F-1) can be easily synthesized by the method described in, for example, Protective Groups om Organic Synthesis, 4th edition. The most common method is to react a commercially available amine with a dicarbonic acid ester or a haloformic acid ester. In the formulae below, X represents a halogen atom. Definitions and specific examples of Ra and Rb is the same as described for general formula (F).

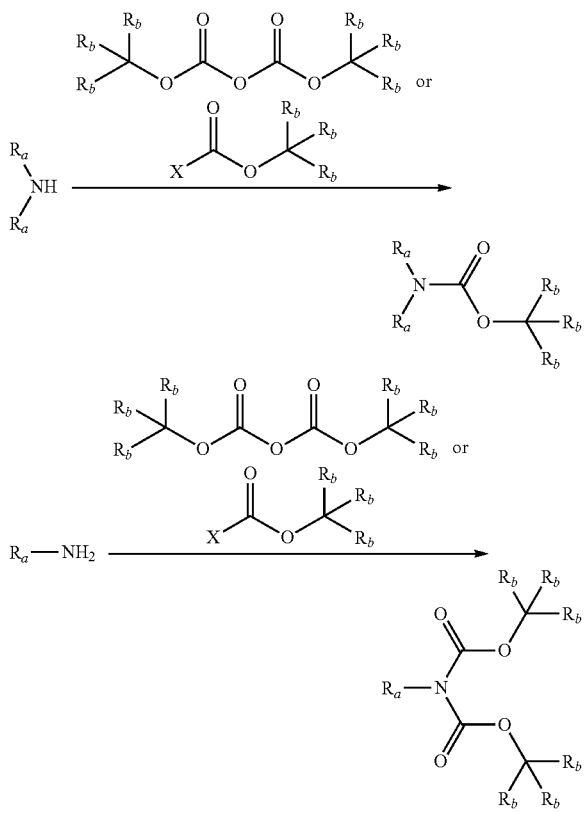

The basic compound [including compound (D)] can be used individually or in combination.

The total amount of the basic compound based on the total solids of the composition is preferably 0.001 to 20 mass %, more preferably 0.001 to 10 mass %, and further more preferably 0.01 to 5 mass %.

The molar ratio of the total amount of acid generators to the total amount of basic compounds is preferably in the range of 2.5 to 300, more preferably 5.0 to 200 and further more preferably 7.0 to 150. When this molar ratio is extremely lowered, the possibility of sensitivity and/or resolution deterioration is invited. On the other hand, when the molar ratio is extremely raised, any pattern thickening might occur during the period between exposure and postbake.

(d) Solvent

The composition according to the present invention may further contain solvent. As the solvent, an organic solvent such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate and an alkyl pyruvate can be exemplified.

As alkylene glycol monoalkyl ether carboxylates, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate can be exemplified.

As alkylene glycol monoalkyl ethers, propylene glycol monomethyl ether, propylene glycol monoethyl ether, propylene glycol monopropyl ether, propylene glycol monobutyl ether, ethylene glycol monomethyl ether, and ethylene glycol monoethyl ether can be exemplified.

As alkyl lactates, methyl lactate, ethyl lactate, propyl lactate and butyl lactate can be exemplified.

As alkyl alkoxypropionates, ethyl 3-ethoxypropionate, methyl 3-methoxypropionate, methyl 3-ethoxypropionate, and ethyl 3-methoxypropionate can be exemplified.

As cyclolactones, β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone can be exemplified.

As optionally cyclized monoketone compounds, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone can be exemplified.

As alkylene carbonates, propylene carbonate, vinylene carbonate, ethylene carbonate, and butylene carbonate can be exemplified.

As alkyl alkoxyacetates, acetic acid 2-methoxyethyl ester, acetic acid 2-ethoxyethyl ester, acetic acid 2-(2-ethoxyethoxy)ethyl ester, acetic acid 3-methoxy-3-methylbutyl ester, and acetic acid 1-methoxy-2-propyl ester can be exemplified.

As alkyl pyruvates, methyl pyruvate, ethyl pyruvate and propyl pyruvate can be exemplified.

As a preferably employable solvent, a solvent having a boiling point measured at ordinary temperature under ordinary pressure of 130° C. or above can be mentioned. As the solvent, cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester, and propylene carbonate can be exemplified.

These solvents may be used either individually or in combination. When in the latter case, a mixed solvent consisting of a mixture of a solvent having a hydroxy group in its structure and a solvent having no hydroxy group may be used as the organic solvent.

As the solvent having a hydroxy group, an alkylene glycol monoalkyl ether and ethyl lactate can be exemplified. Of these, propylene glycol monomethyl ether, and ethyl lactate are especially preferred.

As the solvent having no hydroxy group, an alkylene glycol monoalkyl ether acetate, an alkylalkoxypropionate, a monoketone compound optionally with a ring structure, a cyclic lactone, and an alkyl acetate can be exemplified. Of these, a propylene glycol monomethyl ether acetate, an ethylehoxypropionate, a 2-heptanone, a γ-butyl lactone, a cyclohexanone, or a butyl acetate is more preferred, and a propylene glycol monomethyl ether acetate, an ethylehoxypropionate, or a 2-heptanone is especially preferred.

When employing a mixed solvent consisting of a mixture of a solvent having a hydroxy group in its structure and a solvent having no hydroxy group, the mass ratio between them is preferably in the range of 1/99 to 99/1, more preferably 10/90 to 90/10, and further more preferably 20/80 to 60/40.

The mixed solvent containing 50 mass % or more of a solvent having no hydroxy group is especially preferred from the viewpoint of uniform applicability.

It is preferred for the solvent to be a mixed solvent consisting of two or more solvents and to contain propylene glycol monomethyl ether acetate.

(e) Hydrophobic Resin

The composition of the present invention may further contain a hydrophobic resin. When the hydrophobic resin is contained, the hydrophobic resin is localized in a surface layer of resist film, so that in the use of water as an immersion medium, the receding contact angle of the film with the immersion liquid can be increased to thereby enhance the immersion liquid tracking property of the film.

The receding contact angle of a film after baking and before exposing is preferably in the range of 60° to 90°, more preferably 65° or higher, further more preferably 70° or higher, and particularly preferably 75° or higher as measured under the conditions of temperature 23±3° C. and humidity 45±5%.

Although the hydrophobic resin is unevenly localized on any interface, as different from the surfactant, the hydrophobic resin does not necessarily have to have a hydrophilic group in its molecule and does not need to contribute toward uniform mixing of polar/nonpolar substances.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the film in dynamic condition is important, and it is required for the actinic ray-sensitive or radiation-sensitive resin composition to be capable of tracking the high-speed scanning of the exposure head without leaving droplets.

The hydrophobic resin (HR) is preferably a resin containing at least one of fluorine atom and silicon atom. The fluorine atom or the silicon atom in the hydrophobic resin (HR) may present either in the principal chain or in the side chain. The hydrophobicity (water following property) of the film surface can be increased and the amount of development residue (scum) can be reduced by the containment of the fluorine atom or the silicon atom in the hydrophobic resin.

When the hydrophobic resin (HR) contains fluorine atom, the resin preferably has, as a partial structure containing one or more fluorine atoms, an alkyl group containing one or more fluorine atoms, a cycloalkyl group containing one or more fluorine atoms, or an aryl group containing one or more fluorine atoms.

The alkyl group containing one or more fluorine atoms is a linear or branched alkyl group having at least one hydrogen atom thereof substituted with one or more fluorine atoms. The group preferably has 1 to 10 carbon atoms, more preferably 1 to 4 carbon atoms. Further, other substituents than fluorine atom may also be contained.

The cycloalkyl group containing one or more fluorine atoms is a monocyclic or polycyclic alkyl group having at least one hydrogen atom thereof substituted with one or more fluorine atoms. Further, other substituents than fluorine atom may also be contained.

The aryl group containing one or more fluorine atoms is an aryl group having at least one hydrogen atom of an aryl group substituted with one or more fluorine atoms. As the aryl group, a phenyl or a naphthyl group can be exemplified. Further, other substituents than fluorine atom may also be contained.

As preferred alkyl groups containing one or more fluorine atoms, cycloalkyl groups containing one or more fluorine atoms and aryl groups containing one or more fluorine atoms, groups of the following general formulae (F2) to (F4) can be exemplified.

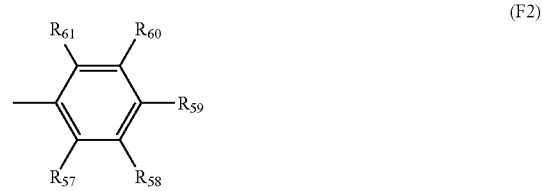

(F2)

(F3)

(F4)

In the general formulae (F2) to (F4), each of $R_{57}$ to $R_{68}$ independently represents a hydrogen atom, a fluorine atom or an alkyl group in condition that: at least one of $R_{57}$-$R_{61}$ represents a fluorine atom or an alkyl group having at least one hydrogen atom thereof substituted with one or more fluorine atoms; at least one of $R_{62}$-$R_{64}$ represents a fluorine atom or an alkyl group having at least one hydrogen atom thereof substituted with one or more fluorine atoms; and at least one of $R_{65}$-$R_{68}$ represents a fluorine atom or an alkyl group having at least one hydrogen atom thereof substituted with one or more fluorine atoms. These alkyl groups preferably are those having 1 to 4 carbon atoms. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group having at least one hydrogen atom thereof substituted with one or more fluorine atoms, more preferably a perfluoroalkyl group having 1 to 4 carbon atoms. $R_{62}$ and $R_{63}$ may be bonded to each other to form a ring.

Specific examples of the groups represented by the general formula (F2) include a p-fluorophenyl group, a pentafluorophenyl group, and a 3,5-di(trifluoromethyl)phenyl group.

Specific examples of the groups represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups represented by the general formula (F4) include —C(CF$_3$)$_2$OH, —C(C$_2$F$_5$)$_2$OH, —C(CF$_3$)(CH$_3$)OH, —CH(CF$_3$)OH and the like. Of these, —C(CF$_3$)$_2$OH is particularly preferred.

Preferred repeating units containing one or more fluorine atoms are as follows.

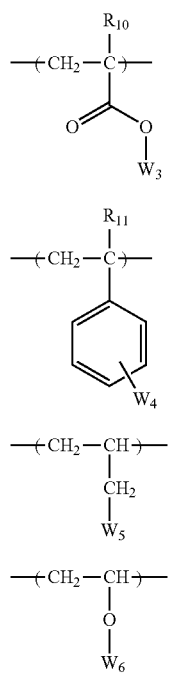

In the formulae, $R_{10}$ and $R_{11}$ each independently represents a hydrogen atom, a fluorine atom, and an alkyl group. As the alkyl group, a linear or branched alkyl group having 1 to 4 carbon atoms is preferred. As an alkyl group with one or more substituents, a fluorinated alkyl group can especially be exemplified.

Each of $W_3$ to $W_6$ independently represents an organic group containing one or more fluorine atoms. Specifically, groups represented by the general formulae (F2) to (F4) can be exemplified.

The following units may also be employed as the repeating unit containing one or more fluorine atoms.

In the formulae, each of $R_4$ to $R_7$ independently represents a hydrogen atom, a fluorine atom, and an alkyl group with the proviso that at least one of $R_4$ to $R_7$ represents a fluorine atom and $R_4$ and $R_5$ or $R_6$ and $R_7$ may form a ring. As the alkyl group, a linear or branched alkyl group having 1 to 4 carbon atoms is preferred. As an alkyl group with one or more substituents, a fluorinated alkyl group can especially be exemplified.

W2 represents an organic group containing one or more fluorine atoms. Specifically, groups represented by the general formulae (F2) to (F4) can be exemplified.

Q represents an alicyclic structure. The alicyclic structure may contain one or more substituents, and may either be monocyclic or polycyclic. When the alicyclic structure contains a polycyclic structure, it may be a bridged type. As the monocyclic one, a cycloalkyl group having 3 to 8 carbon atoms such as a cyclopenryl group, a cyclohexyl group, a cyclobutyl group, or a cyclobutyl group is preferred. As the polycyclic one, a group containing bicyclo-, tricyclo-, or tetracyclo-structure having 5 or more carbon atoms can be exemplified. The polycyclic one preferably is a cycloalkyl group having 6 to 20 carbon atoms such as an adamantyl group, a norbornyl group, a dicyclopentyl group, a tricyclodecanyl group, or a tetracyclododecyl group. At least a part of carbon atoms in the cycloalkyl group may be substituted with one or more heteroatoms such as oxygen atoms.

$L_2$ represents a single bond or divalent connecting group. As the divalent connecting group, a substituted or nonsubstituted arylene group, a substituted or nonsubstituted alkylene group, —O—, —SO$_2$—, —CO—, —N(R)— (R represents a hydrogen atom or an alkyl group), —NHSO$_2$—, or a combination of two or more of these groups.

The hydrophobic resin (HR) may contain one or more silicon atoms. As partial structure containing one or more silicon atoms, an alkylsilyl structure or a cyclosiloxane structure can be exemplified. Preferred alkylsilyl structure is the one containing one or more trialkylsilyl groups.

As the alkylsilyl structure and cyclosiloxane structure, any of the groups represented by the following general formulae (CS-1) to (CS-3) can be exemplified.

-continued

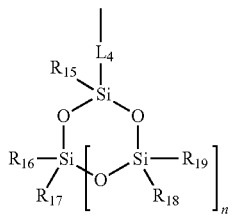
(CS-2)

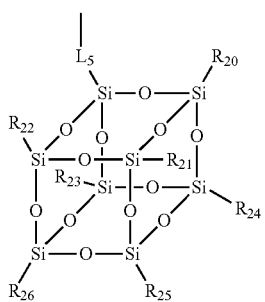
(CS-3)

In the general formulae (CS-1) to (CS-3), each of $R_{12}$ to $R_{26}$ independently represents a linear or branched alkyl group or a cycloalkyl group. The alkyl group preferably has 1 to 20 carbon atoms. The cycloalkyl group preferably has 3 to 20 carbon atoms.

Each of $L_3$ to $L_5$ represents a single bond or a bivalent connecting group. As the bivalent connecting group, any one or a combination of two or more groups selected from the group consisting of an alkylene group, a phenylene group, an ether group, a thioether group, a carbonyl group, an ester group, an amido group, a urethane group and a urea group can be exemplified.

In the formulae, n is an integer of 1 to 5, and preferably an integer of 2 to 4.

Specific examples of the repeating units containing a fluorine atom or a silicon atom will be shown below. In the specific examples, $X_1$ represents a hydrogen atom, —$CH_3$, —F or —$CF_3$, and $X_2$ represents —F or —$CF_3$.

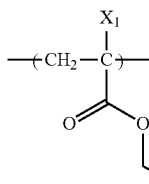

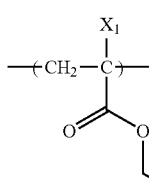

-continued

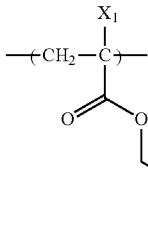

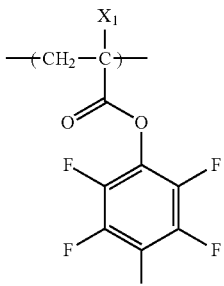

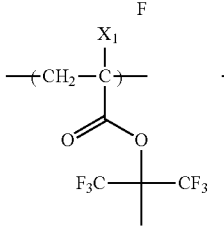

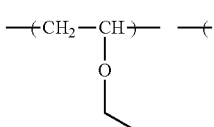

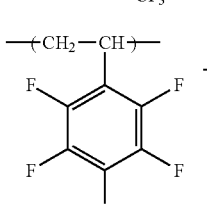

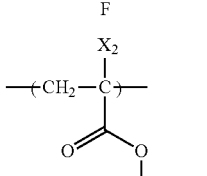

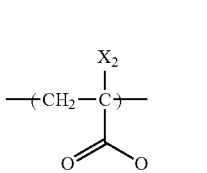

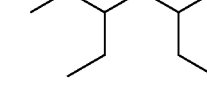

169
-continued
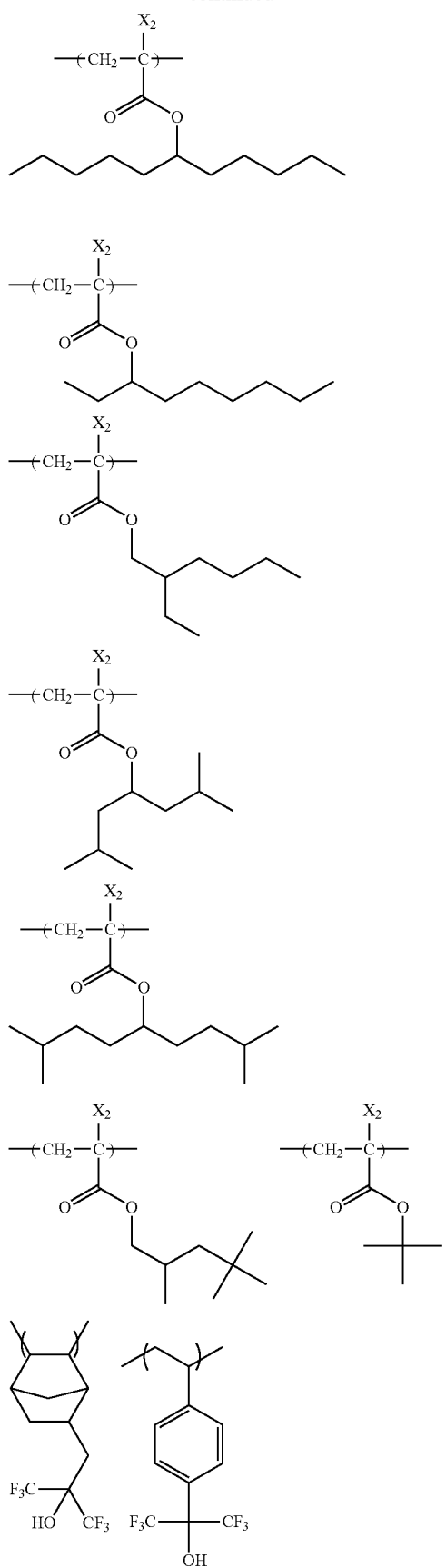
170
-continued
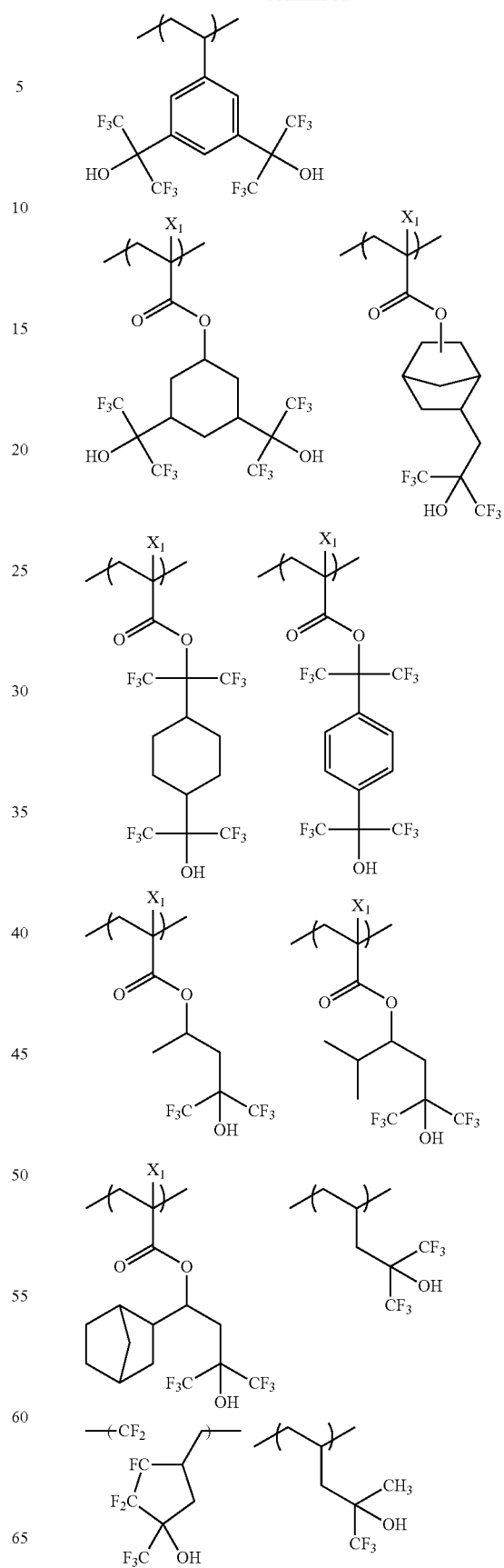

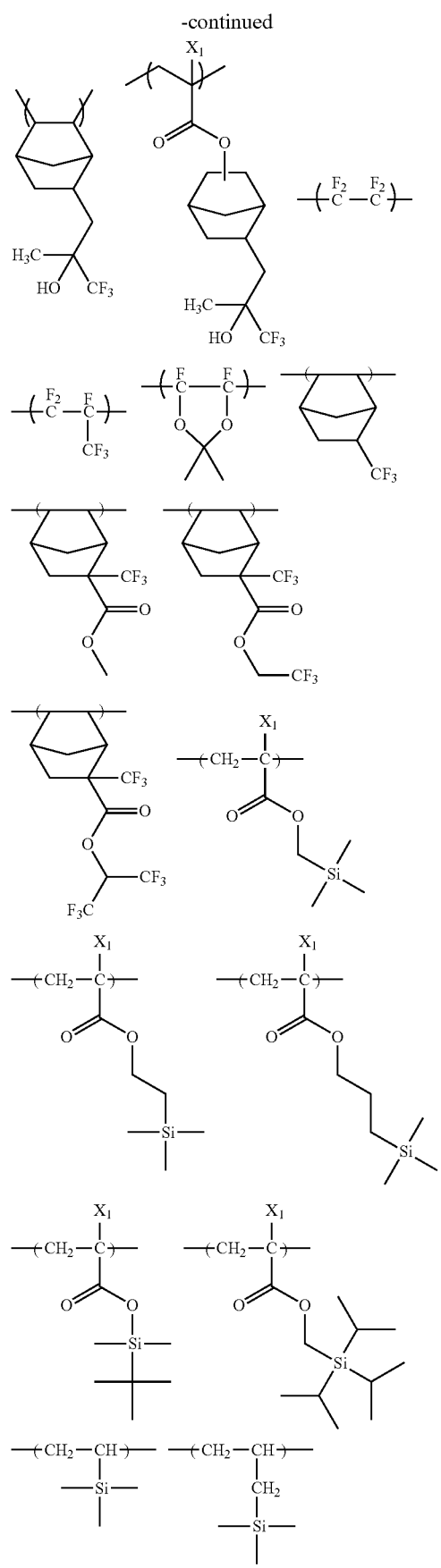
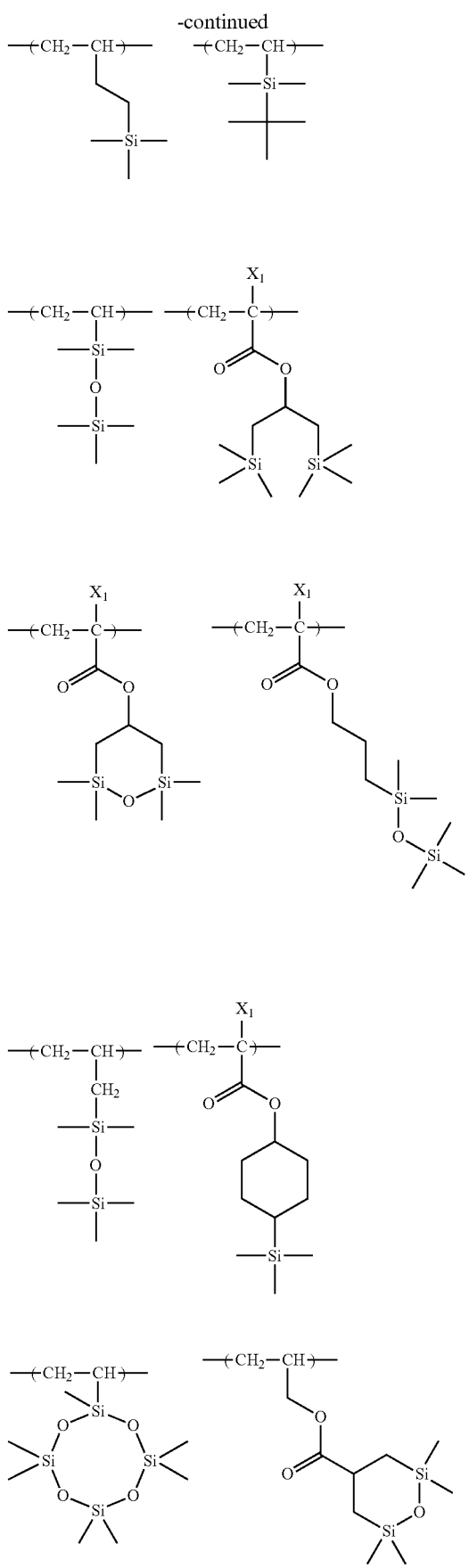

-continued

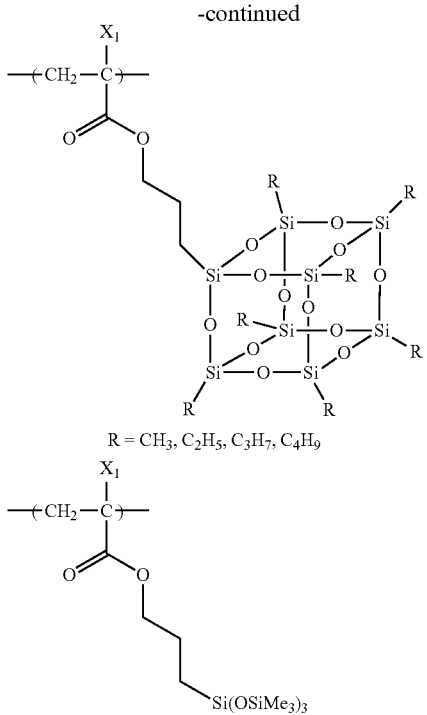

R = CH$_3$, C$_2$H$_5$, C$_3$H$_7$, C$_4$H$_9$

Further, the hydrophobic resin (HR) may contain at least one group selected from among the following groups (x) to (z). The resin (HR) containing the following group (y) is especially useful in the case where the development with an alkali developer is performed.

(x) a polar group or an alkali-soluble group;
(y) a group that is decomposed by the action of an alkali developer, resulting in an increase of solubility in the alkali developer (a polarlity conversion group);
(z) a group that is decomposed by the action of an acid.

As the polar group or the alkali-soluble group (x), a phenolic hydroxy group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl) imido group, a bis(alkylsulfonyl)methylene group, a bis(alkylsulfonyl)imido group, a tris(alkylcarbonyl)methylene group, and a tris(alkylsulfonyl)methylene group can be exemplified.

As preferred polar groups or alkali-soluble groups, a fluoroalcohol group, a sulfonimido group, and a bis(carbonyl)methylene group can be exemplified. As preferred fluoroalcohol group, a hexafluoroisopropanol group can be exemplified.

As the repeating unit containing a polar group or an alkali-soluble group (x), use can be made of any of a repeating unit resulting from direct bonding of an polar group an alkali-soluble group to the principal chain of a resin like a repeating unit of acrylic acid or methacrylic acid; a repeating unit resulting from bonding, via a connecting group, of a polar group to the principal chain of a resin; and a repeating unit resulting from polymerization with the use of a chain transfer agent or polymerization initiator having a polar group or an alkali-soluble group to introduce the same in a polymer chain terminal.

The content of repeating units containing a polar group or an alkali-soluble group (x) based on all the repeating units of the polymer is preferably in the range of 1 to 50 mol %, more preferably 3 to 35 mol %, and still more preferably 5 to 20 mol %.

Specific examples of the repeating units containing a polar group or an alkali-soluble group will be shown below. In the formulae, Rx represents H, CH$_3$, CH$_2$OH, or CF$_3$.

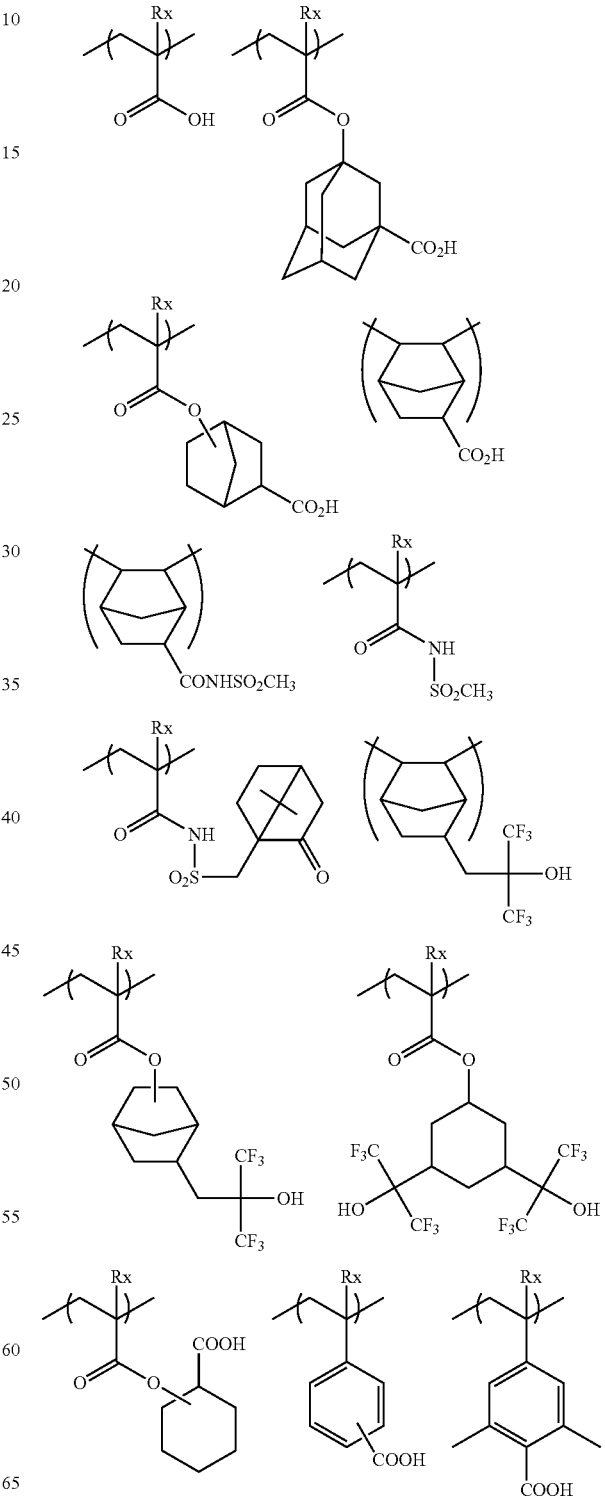

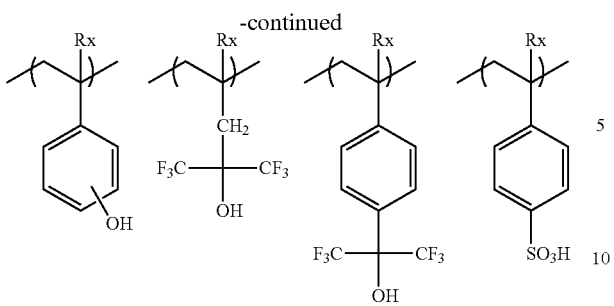
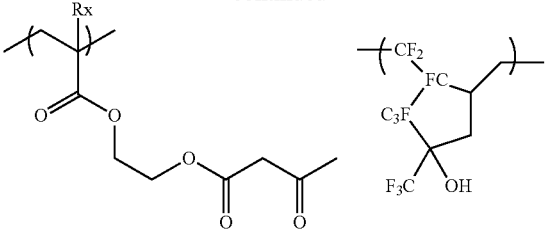
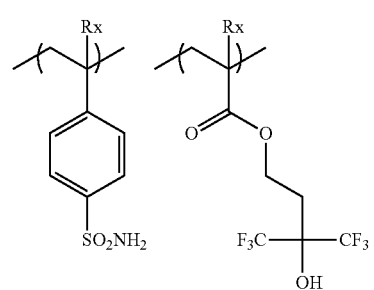
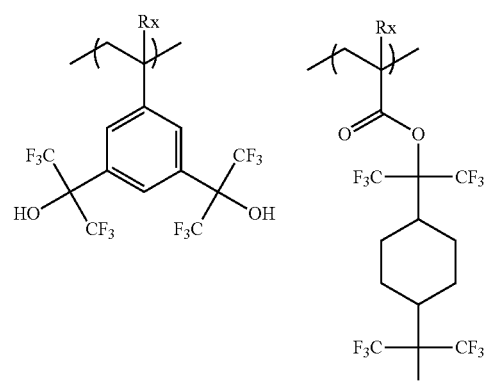
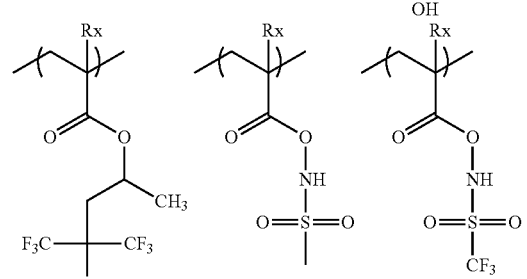
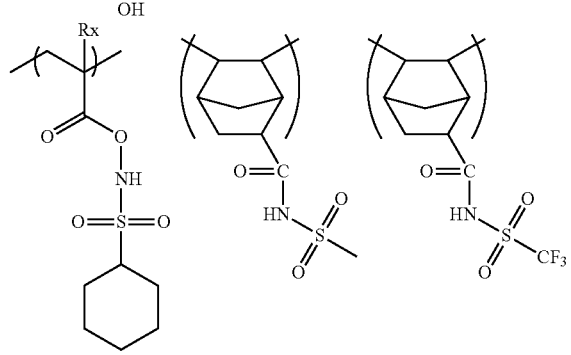

As the polarity conversion group (y), there can be mentioned, for example, a lactone group, a caroboxylic acid ester group (—COO—), an acid anhydride group [—C(O)OC(O)—], an acid imide group (—NHCONH—), a carboxylic acid thioether group (—COS—), a carbonic acid ester group [—OC(O)O—], and a sulfonic acid ester group (—SO$_2$O—). A lactone group is particularly preferred.

The polarity conversion group (y) is contained in, for example, two modes which are both preferred. In one mode, the polarity conversion group (y) is contained in a repeating unit of an acrylic ester or methacrylic ester and introduced in a side chain of a resin. In the other mode, the polarity conversion group is introduced in a terminal of a polymer chain by using a polymerization initiator or chain transfer agent containing the polarity conversion group (y) in the stage of polymerization.

As particular examples of the repeating units (by) containing the polarity conversion group (y), there can be mentioned a repeating unit containing a lactone structure represented by formulae (KA-1-1) to (KA-1-17) shown later.

Further, the repeating unit (by) containing the polarity conversion group (y) is preferred to contain at least one of a fluorine atom and a silicone atom. Resins containing such a repeating unit (by) possesses hydrophobicity and particularly preferred from the standpoint of suppressing development defects.

As the repeating unit (by), there can be mentioned, for example, any of the repeating units of formula (K0) below.

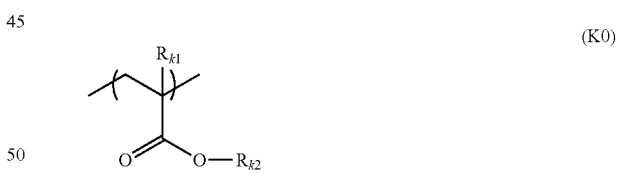

(K0)

In the formula, $R_{k1}$ represents a hydrogen atom, a halogen atom, a hydroxyl group, an alkyl group, a cycloalkyl group, an aryl group or a group containing a polarity conversion group.

$R_{k2}$ represents an alkyl group, a cycloalkyl group, an aryl group or a group containing a polarity conversion group.

Here, at least one of $R_{k1}$ and $R_{k2}$ is a group containing a polarity conversion group.

The polarity conversion group, as mentioned above, refers to a group that is decomposed by the action of an alkali developer to thereby increase its solubility in the alkali developer. It is preferred for the polarity conversion group to be a group represented by X in the partial structures of general formulae (KA-1) and (KB-1) below.

(KA-1)

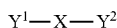
(KB-1)

In general formulae (KA-1) and (KB-1), X represents a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—OSO₂O—) or a sulfonic ester group (—SO₂O—).

$Y^1$ and $Y^2$ may be identical to or different from each other, and each thereof represents an electron withdrawing group.

The repeating unit (by) contains a preferred group whose solubility in an alkali developer is increased by containing a group with the partial structure of general formula (KA-1) or (KB-1). When the partial structure has no bonding hand as in the case of the partial structure of general formula (KA-1) or the partial structure of general formula (KB-1) in which $Y^1$ and $Y^2$ are monovalent, the above group with the partial structure refers to a group containing a monovalent or higher-valent group resulting from the deletion of at least one arbitrary hydrogen atom from the partial structure.

The partial structure of general formula (KA-1) or (KB-1) is linked at its arbitrary position to the principal chain of the hydrophobic resin via a substituent.

The partial structure of general formula (KA-1) is a structure in which a ring structure is formed in cooperation with a group represented by X.

In general formula (KA-1), X is preferably a carboxylic ester group (namely, in the case of the formation of a lactone ring structure as KA-1), an acid anhydride group or a carbonic ester group. More preferably, X is a carboxylic ester group.

A substituent may be introduced in the ring structure of general formula (KA-1). For example, when $Z_{ka1}$ is a substituent, nka substituents may be introduced.

$Z_{ka1}$, or each of a plurality of $Z_{ka1}$s independently, represents a halogen atom, an alkyl group, a cycloalkyl group, an ether group, a hydroxyl group, an amido group, an aryl group, a lactone ring group or an electron withdrawing group.

$Z_{ka1}$s may be linked to each other to thereby form a ring. As the ring formed by the mutual linkage of $Z_{ka1}$s, there can be mentioned, for example, a cycloalkyl ring or a heterocycle (for example, a cycloether ring or a lactone ring).

The above nka is an integer of 0 to 10, preferably 0 to 8, more preferably 0 to 5, further more preferably 1 to 4 and most preferably 1 to 3.

The electron withdrawing groups represented by $Z_{ka1}$ are the same as those represented by $Y^1$ and $Y^2$ to be described hereinafter. These electron withdrawing groups may be substituted with other electron withdrawing groups.

$Z_{ka1}$ is preferably an alkyl group, a cycloalkyl group, an ether group, a hydroxyl group or an electron withdrawing group. $Z_{ka1}$ is more preferably an alkyl group, a cycloalkyl group or an electron withdrawing group. It is preferred for the ether group to be one substituted with, for example, an alkyl group or a cycloalkyl group, namely, to be an alkyl ether group or the like. The electron withdrawing group is as mentioned above.

As the halogen atom represented by $Z_{ka1}$, there can be mentioned a fluorine atom, a chlorine atom, a bromine atom, an iodine atom or the like. Among these, a fluorine atom is preferred.

The alkyl group represented by $Z_{ka1}$ may contain a substituent, and may be linear or branched. The linear alkyl group preferably has 1 to 30 carbon atoms, more preferably 1 to 20 carbon atoms. As the linear alkyl group, there can be mentioned, for example, a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, an n-decanyl group or the like. The branched alkyl group preferably has 3 to 30 carbon atoms, more preferably 3 to 20 carbon atoms. As the branched alkyl group, there can be mentioned, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decanyl (t-decanoyl) group or the like. It is preferred for the alkyl group represented by $Z_{ka1}$ to be one having 1 to 4 carbon atoms, such as a methyl group, an ethyl group, an n-propyl group, an i-propyl group, an n-butyl group, an i-butyl group or a t-butyl group.

The cycloalkyl group represented by $Z_{ka1}$ may contain a substituent and may be monocyclic or polycyclic. When polycyclic, the cycloalkyl group may be a bridged one. Namely, in that case, the cycloalkyl group may have a bridged structure. The monocycloalkyl group is preferably a cycloalkyl group having 3 to 8 carbon atoms. As such a cycloalkyl group, there can be mentioned, for example, a cyclopropyl group, a cyclopentyl group, a cyclohexyl group, a cyclobutyl group, a cyclooctyl group or the like. As the polycycloalkyl group, there can be mentioned a group with, for example, a bicyclo, tricyclo or tetracyclo structure having 5 or more carbon atoms. This polycycloalkyl group is preferably a cycloalkyl group having 6 to 20 carbon atoms. As such, there can be mentioned, for example, an adamantyl group, a norbornyl group, an isobornyl group, a camphonyl group, a bicyclopentyl group, an α-pinel group, a tricyclodecanyl group, a tetracyclododecyl group, an androstanyl group, any of the following structures or the like. The carbon atoms of each of the cycloalkyl groups may be partially replaced with a heteroatom, such as an oxygen atom.

(1)

(2)

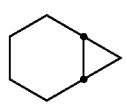
(3)

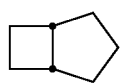
(4)

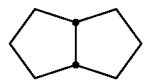
(5)

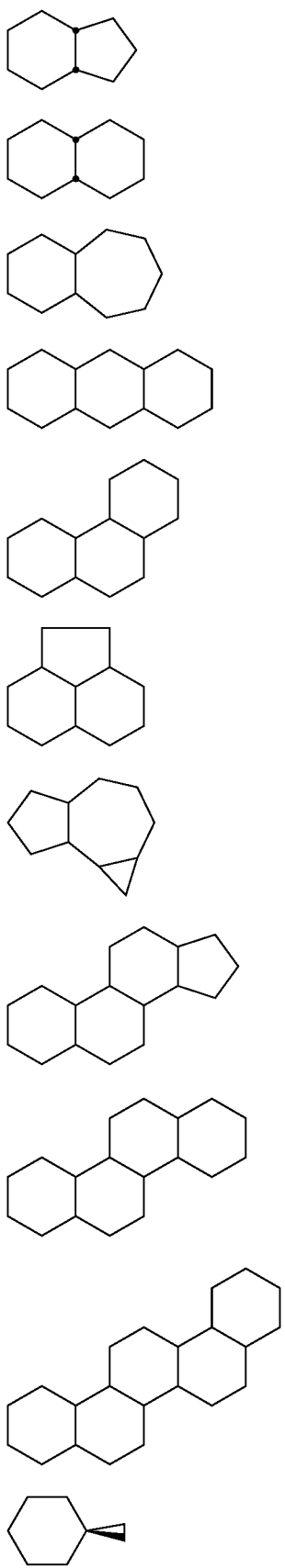
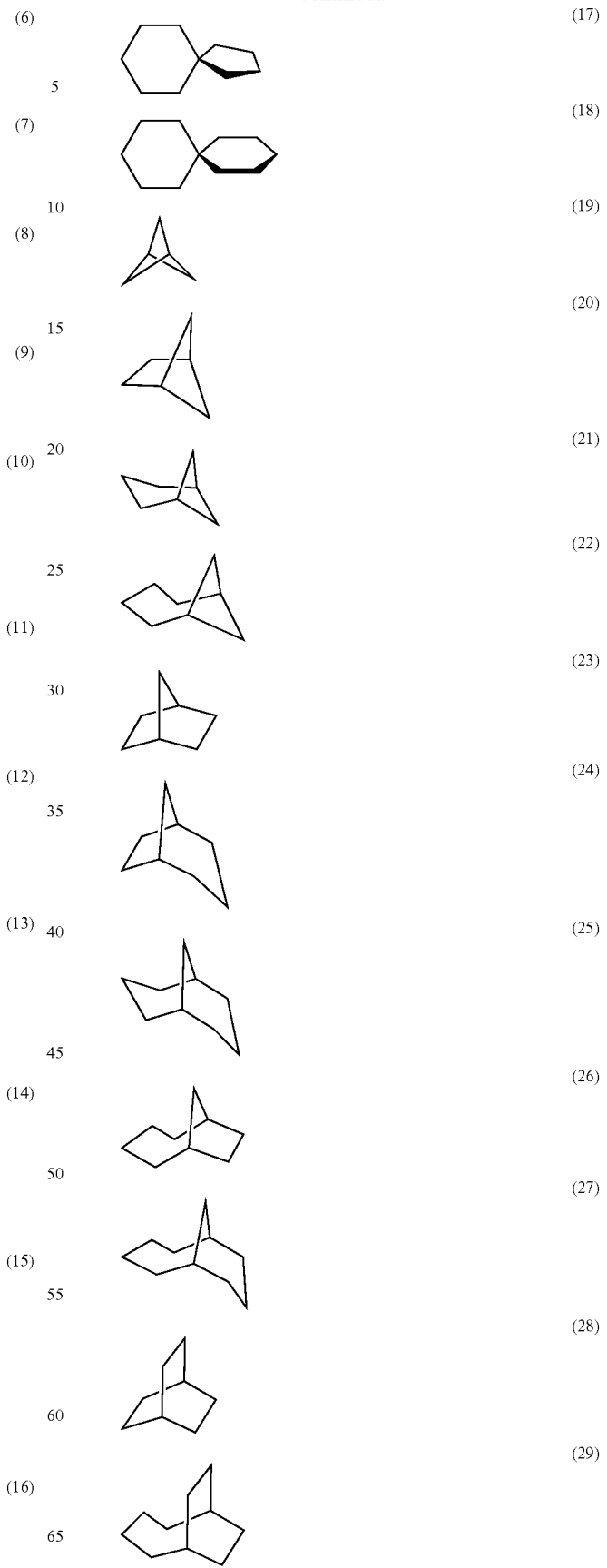

-continued

(30) 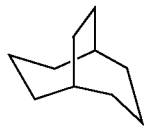

(31) 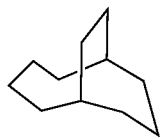

(32) 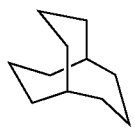

(33) 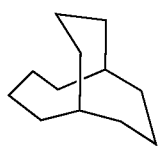

(34) 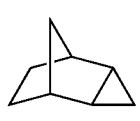

(35) 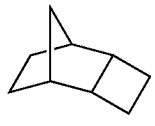

(36) 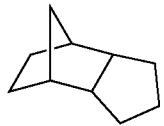

(37) 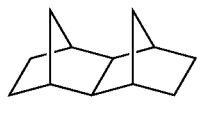

(38) 

(39) 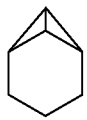

(40) 

(41) 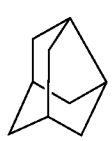

-continued

(42) 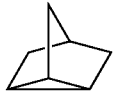

(43) 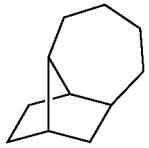

(44) 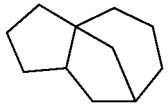

(45) 

(46) 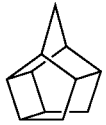

(47) 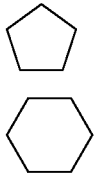

(48) 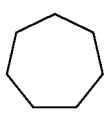

(49) 

(50) 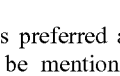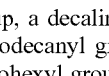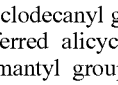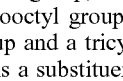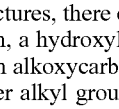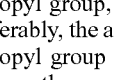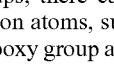

As preferred alicyclic moieties among the above, there can be mentioned an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. As more preferred alicyclic moieties, there can be mentioned an adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group.

As a substituent that can be introduced in these alicyclic structures, there can be mentioned an alkyl group, a halogen atom, a hydroxyl group, an alkoxy group, a carboxyl group or an alkoxycarbonyl group. The alkyl group is preferably a lower alkyl group, such as a methyl group, an ethyl group, a propyl group, an isopropyl group or a butyl group. More preferably, the alkyl group is a methyl group, an ethyl group, a propyl group or an isopropyl group. As preferred alkoxy groups, there can be mentioned those each having 1 to 4 carbon atoms, such as a methoxy group, an ethoxy group, a propoxy group and a butoxy group. As a substituent that may be introduced in these alkyl and alkoxy groups, there can be mentioned a hydroxyl group, a halogen atom, an alkoxy group (preferably having 1 to 4 carbon atoms) or the like.

Further substituents may be introduced in these groups. As further substituents, there can be mentioned a hydroxyl group; a halogen atom (fluorine, chlorine, bromine or iodine); a nitro group; a cyano group; the above alkyl groups; an alkoxy group, such as a methoxy group, an ethoxy group, a hydroxyethoxy group, a propoxy group, a hydroxypropoxy group, an n-butoxy group, an isobutoxy group, a sec-butoxy group or a t-butoxy group; an alkoxycarbonyl group, such as a methoxycarbonyl group or an ethoxycarbonyl group; an aralkyl group, such as a benzyl group, a phenethyl group or a cumyl group; an aralkyloxy group; an acyl group, such as a formyl group, an acetyl group, a butyryl group, a benzoyl group, a cyanamyl group or a valeryl group; an acyloxy group, such as a butyryloxy group; the above alkenyl groups; an alkenyloxy group, such as a vinyloxy group, a propenyloxy group, an allyloxy group or a butenyloxy group; the above aryl groups; an aryloxy group, such as a phenoxy group; an aryloxycarbonyl group, such as a benzoyloxy group; and the like.

Preferably, X of general formula (KA-1) represents a carboxylic ester group and the partial structure of general formula (KA-1) is a lactone ring. A 5- to 7-membered lactone ring is preferred.

Further, as shown in formulae (KA-1-1) to (KA-1-17) below, the 5- to 7-membered lactone ring as the partial structure of general formula (KA-1) is preferably condensed with another ring structure in such a fashion that a bicyclo structure or a spiro structure is formed.

The peripheral ring structures to which the ring structure of general formula (KA-1) may be bonded can be, for example, those shown in formulae (KA-1-1) to (KA-1-17) below, or those similar to the same.

It is preferred for the structure containing the lactone ring structure of general formula (KA-1) to be the structure of any of formulae (KA-1-1) to (KA-1-17) below. The lactone structure may be directly bonded to the principal chain. As preferred structures, there can be mentioned those of formulae (KA-1-1), (KA-1-4), (KA-1-5), (KA-1-6), (KA-1-13), (KA-1-14) and (KA-1-17).

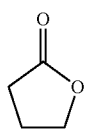

KA-1-1

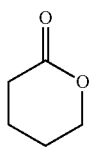

KA-1-2

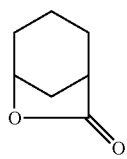

KA-1-3

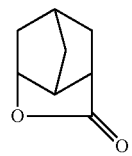

KA-1-4

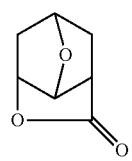

KA-1-5

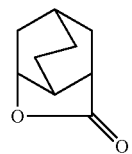

KA-1-6

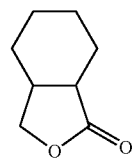

KA-1-7

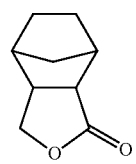

KA-1-8

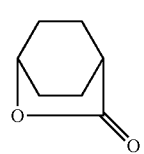

KA-1-9

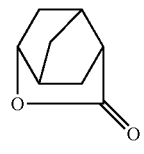

KA-1-10

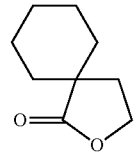

KA-1-11

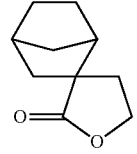

KA-1-12

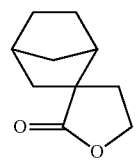

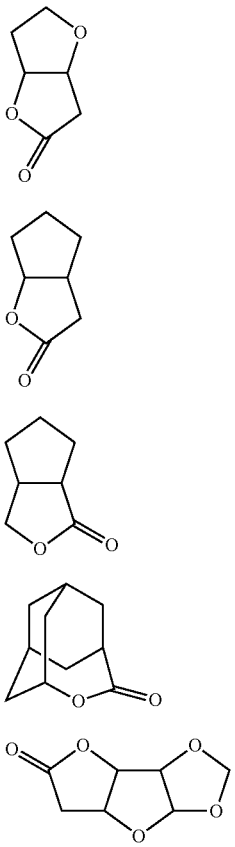

KA-1-13

KA-1-14

KA-1-15

KA-1-16

KA-1-17

A substituent may or may not be introduced in the above structures containing the lactone ring structure. As preferred substituents, there can be mentioned the same as the substituents $Z_{ka1}$ that may be introduced in the ring structure of general formula (KA-1) above.

In general formula (KB-1), X is preferably a carboxylic ester group (—COO—).

In general formula (KB-1), each of $Y^1$ and $Y^2$ independently represents an electron withdrawing group.

The electron withdrawing group has the partial structure of formula (EW) below. In formula (EW), * represents either a bonding hand directly bonded to the structure of general formula (KA-1) or a bonding hand directly bonded to X of general formula (KB-1).

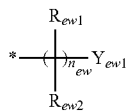

(EW)

In formula (EW), $n_{ew}$ is the number of repetitions of each of the connecting groups of the formula —C($R_{ew1}$)($R_{ew2}$)—, being an integer of 0 or 1. When $n_{ew}$ is 0, a single bond is represented, indicating the direct bonding of $Y_{ew1}$.

$Y_{ew1}$ can be any of a halogen atom, a cyano group, a nitrile group, a nitro group, any of the halo(cyclo)alkyl groups or haloaryl groups of the formula —C($R_{f1}$)($R_{f2}$)—$R_{f3}$ to be described hereinafter, an oxy group, a carbonyl group, a sulfonyl group, a sulfinyl group and a combination thereof. The electron withdrawing groups may have, for example, the following structures. Herein, the "halo(cyclo)alkyl group" refers to an at least partially halogenated alkyl group or cycloalkyl group. The "haloaryl group" refers to an at least partially halogenated aryl group. In the following structural formulae, each of $R_{ew3}$ and $R_{ew4}$ independently represents an arbitrary structure. Regardless of the types of the structures of $R_{ew}3$ and $R_{ew4}$, the partial structures of formula (EW) exhibit electron withdrawing properties, and may be linked to, for example, the principal chain of the resin. Preferably, each of $R_{ew3}$ and $R_{ew4}$ is an alkyl group, a cycloalkyl group or a fluoroalkyl group.

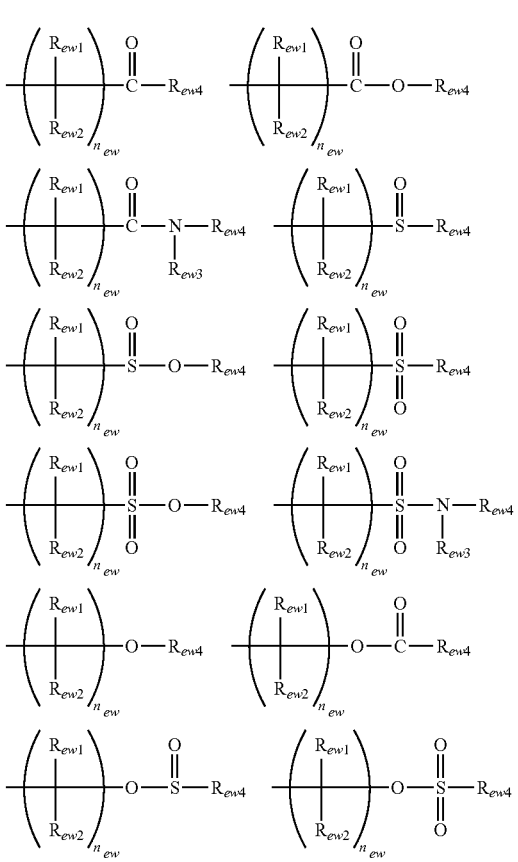

When $Y_{ew1}$ is a bivalent or higher-valent group, the remaining bonding hand or hands form a bond with an arbitrary atom or substituent. At least any of the groups represented by $Y_{ew1}$, $R_{ew1}$ and $R_{ew2}$ may be linked via a further substituent to the principal chain of the hydrophobic resin.

$Y_{ew1}$ is preferably a halogen atom or any of the halo (cyclo)alkyl groups or haloaryl groups of the formula —C($R_{f1}$)($R_{f2}$)—$R_{f3}$.

Each of $R_{ew1}$ and $R_{ew2}$ independently represents an arbitrary substituent, for example, a hydrogen atom, an alkyl group, a cycloalkyl group or an aryl group.

At least two of $R_{ew1}$, $R_{ew2}$ and $Y_{ew1}$ may be linked to each other to thereby form a ring.

In the above formula, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group. $R_{f2}$ and $R_{f3}$ may be linked to each other to thereby form a ring. As the organic group, there can be mentioned, for example, an alkyl group, a cycloalkyl group, an alkoxy group or the like. It is preferred for $R_{f2}$ to represent the same groups as $R_{f1}$ or to be linked to $R_{f3}$ to thereby form a ring.

$R_{f1}$ to $R_{f3}$ may be linked to each other to thereby form a ring. As the formed ring, there can be mentioned a (halo)cycloalkyl ring, a (halo)aryl ring or the like.

As the (halo)alkyl groups represented by $R_{f1}$ to $R_{f3}$, there can be mentioned, for example, the alkyl groups mentioned above as being represented by $Z_{ka1}$ and structures resulting from halogenation thereof.

As the (per)halocycloalkyl groups and (per)haloaryl groups represented by $R_{f1}$ to $R_{f3}$ or contained in the ring formed by the mutual linkage of $R_{f2}$ and $R_{f3}$, there can be mentioned, for example, structures resulting from halogenation of the cycloalkyl groups mentioned above as being represented by $Z_{ka1}$, preferably fluorocycloalkyl groups of the formula —$C_{(n)}F_{(2n-2)}H$ and perfluoroaryl groups of the formula —$C_{(n)}F_{(n-1)}$. The number of carbon atoms, n, is not particularly limited. Preferably, however, it is in the range of 5 to 13, more preferably 6.

As preferred rings that may be formed by the mutual linkage of at least two of $R_{ew1}$, $R_{ew2}$ and $Y_{ew1}$, there can be mentioned cycloalkyl groups and heterocyclic groups. Preferred heterocyclic groups are lactone ring groups. As the lactone rings, there can be mentioned, for example, the structures of formulae (KA-1-1) to (KA-1-17) above.

The repeating unit (by) may contain two or more of the partial structures of general formula (KA-1), or two or more of the partial structures of general formula (KB-1), or both any one of the partial structures of general formula (KA-1) and any one of the partial structures of general formula (KB-1).

A part or the whole of any of the partial structures of general formula (KA-1) may double as the electron withdrawing group represented by $Y^1$ or $Y^2$ of general formula (KB-1). For example, when X of general formula (KA-1) is a carboxylic ester group, the carboxylic ester group can function as the electron withdrawing group represented by $Y^1$ or $Y^2$ of general formula (KB-1).

When the repeating unit (by) contains a partial structure of general formula (KA-1), it is highly preferred for the polarity conversion group to be a partial structure expressed by —COO— in the structure of general formula (KA-1).

The repeating, unit (by) can be a repeating unit with the following partial structure.

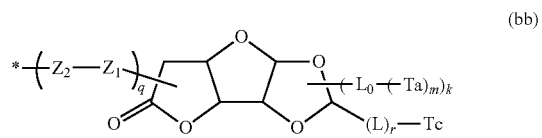

(bb)

In general formula (bb), $Z_1$ represents a single bond, an ether bond, an ester bond, an amido bond, a urethane bond or a urea bond. When there are a plurality of $Z_1$s, they may be identical to or different from each other. $Z_1$ is preferably an ester bond.

$Z_2$ represents a chain- or cycloalkylene group. When there are a plurality of $Z_2$s, they may be identical to or different from each other. $Z_2$ is preferably an alkylene group having 1 or 2 carbon atoms and a cycloalkylene group having 5 to 10 carbon atoms.

Ta, or each of Ta's independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1) above). An alkyl group, a cycloalkyl group and an electron withdrawing group are preferred. An electron withdrawing group is more preferred. Two or more Ta's may be bonded to each other to thereby form a ring.

$L_0$ represents a single bond or a hydrocarbon group with a valence of m+1 (preferably having 20 or less carbon atoms). A single bond is preferred. $L_0$ is a single bond when m is 1. The hydrocarbon group with a valence of (m+1) represented by $L_0$ is, for example, one resulting from the removal of any (m–1) hydrogen atoms from an alkylene group, a cycloalkylene group, a phenylene group or a combination thereof. When k is 2, two $L_0$s may be bonded to each other to thereby form a ring.

L, or each of L's independently, represents a carbonyl group, a carbonyloxy group or an ether group.

Tc represents a hydrogen atom, an alkyl group, a cycloalkyl group, a nitrile group, a hydroxyl group, an amido group, an aryl group or an electron withdrawing group (having the same meaning as that of the electron withdrawing group represented by $Y^1$ or $Y^2$ of general formula (KB-1)).

In the formula, * represents a bonding hand to the principal chain or a side chain of the resin. Specifically, any of the partial structures of formula (bb) may be directly bonded to the principal chain, or may be bonded to a side chain of the resin. The bonding hand to the principal chain is one to an atom contained in the bonds as constituents of the principal chain. The bonding hand to a side chain is one to an atom being present outside the bonds as constituents of the principal chain.

In the general formula, m is an integer of 1 to 28, preferably an integer of 1 to 3, more preferably 1;

k is an integer of 0 to 2, preferably 1;

q represents the number of repetitions of the group ($Z_2$-$Z_1$), being an integer of 0 to 5, preferably 0 to 2; and r is an integer of 0 to 5.

The moiety -(L)$_r$-Tc may be replaced with -$L_0$-(Ta)$_m$.

Among the lactone structures of general formula (bb), those in which a fluorine atom or a group containing a fluorine atom is introduced as a substituent in the location remotest from the above * (location at which the number of intervening atoms is the greatest) and those in which a fluorine atom is introduced in the side chain within the same repeating unit different from the side chain on the lactone side shown in general formula (bb) are also preferred.

The alkylene group represented by $Z_2$ when it is linear preferably has 1 to 30 carbon atoms, more preferably 1 to 20 carbon atoms. The alkylene group represented by $Z_2$ when it is branched preferably has 3 to 30 carbon atoms, more preferably 3 to 20 carbon atoms. As particular examples of the alkylene groups represented by $Z_2$, there can be mentioned the groups resulting from the removal of one arbitrary hydrogen atom from each of the particular examples of alkyl groups mentioned above as being represented by $Z_{ka1}$.

The cycloalkylene group represented by $Z_2$ preferably has 3 to 8 carbon atoms. As particular examples thereof, there can be mentioned the groups resulting from the removal of one arbitrary hydrogen atom from each of the cycloalkyl groups mentioned above as being represented $Z_{ka1}$.

With respect to the alkyl groups and cycloalkyl groups represented by Ta and Tc, the preferred number of carbon atoms and particular examples are as mentioned above in connection with the alkyl groups and cycloalkyl groups represented by $Z_{ka1}$.

The alkoxy group represented by Ta preferably has 1 to 8 carbon atoms. As such, there can be mentioned a methoxy group, an ethoxy group, a propoxy group, a butoxy group or the like.

Each of the aryl groups represented by Ta and Tc preferably has 6 to 12 carbon atoms. As such, there can be mentioned, for example, a phenyl group and a naphthyl group.

With respect to the alkylene group and cycloalkylene group represented by $L_0$, the preferred number of carbon atoms and particular examples are as mentioned above in connection with the alkylene group and cycloalkylene group represented by $Z_2$.

As further particular structures of the repeating units (bb), the repeating units with the following partial structures are preferred.

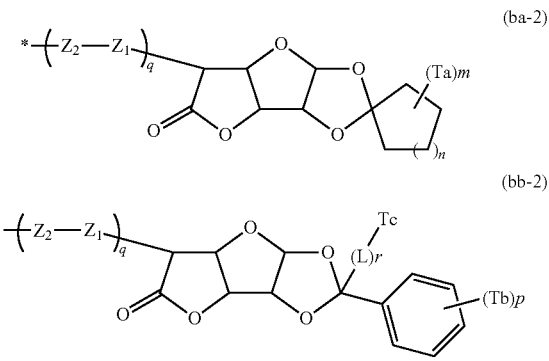

In general formulae (ba-2) and (bb-2), n is an integer of 0 to 11, preferably an integer of 0 to 5, more preferably 1 or 2; and p is an integer of 0 to 5, preferably an integer of 0 to 3, more preferably 1 or 2.

Tb, or each of Tbs independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1)). An alkyl group, a cycloalkyl group and an electron withdrawing group are preferred. When there are a plurality of Tbs, they may be bonded to each other to thereby form a ring.

In the formulae, * represents a bonding hand to the principal chain or a side chain of the resin. Specifically, any of the partial structures of general formulae (ba-2) and (bb-2) may be directly bonded to the principal chain, or may be bonded to a side chain of the resin.

$Z_1$, $Z_2$, Ta, Tc, L, *, m, q and r are as defined above in connection with general formula (bb). Preferred examples thereof are also the same.

The repeating unit (by) can be a repeating unit with the partial structure of general formula (KY-0) below.

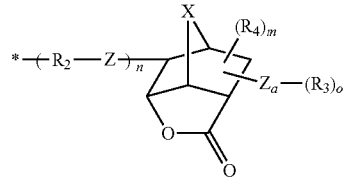

In general formula (KY-0), $R_2$ represents an alkylene group or a cycloalkylene group, provided that when there are a plurality of $R_2$s, they may be identical to or different from each other.

$R_3$ represents a linear, branched or cyclic hydrocarbon group whose hydrogen atoms on constituent carbons are partially or entirely substituted with fluorine atoms.

$R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of the formula R—C(=O)— or R—C(=O)O— in which R is an alkyl group or a cycloalkyl group. When there are a plurality of $R_4$s, they may be identical to or different from each other. Two or more $R_4$s may be bonded to each other to thereby form a ring.

X represents an alkylene group, a cycloalkylene group, an oxygen atom or a sulfur atom.

Each of Z and Za represents a single bond, an ether bond, an ester bond, an amido bond, a urethane bond or a urea bond. When there are a plurality thereof, they may be identical to or different from each other.

In the formula, * represents a bonding hand to the principal chain or a side chain of the resin;

o is the number of substituents, being an integer of 1 to 7;

m is the number of substituents, being an integer of 0 to 7; and n is the number of repetitions, being an integer of 0 to 5.

The structure —$R_2$—Z— is preferably the structure of formula —$(CH_2)_l$—COO— in which l is an integer of 1 to 5.

With respect to the alkylene group and cycloalkylene group represented by $R_2$, the preferred number of carbon atoms and particular examples are as mentioned above in connection with the alkylene group and cycloalkylene group represented by $Z_2$ of general formula (bb).

The number of carbon atoms of the linear, branched or cyclic hydrocarbon group represented by $R_3$ is preferably in the range of 1 to 30, more preferably 1 to 20 when the hydrocarbon group is linear; is preferably in the range of 3 to 30, more preferably 3 to 20 when the hydrocarbon group is branched; and is in the range of 6 to 20 when the hydrocarbon group is cyclic. As particular examples of the $R_3$ groups, there can be mentioned the above particular examples of the alkyl and cycloalkyl groups represented by $Z_{ka1}$.

With respect to the alkyl groups and cycloalkyl groups represented by $R_4$, the preferred number of carbon atoms and particular examples are as mentioned above in connection with the alkyl groups and cycloalkyl groups represented by $Z_{ka1}$.

The acyl group represented by $R_4$ preferably has 1 to 6 carbon atoms. As such, there can be mentioned, for example, a formyl group, an acetyl group, a propionyl group, a butyryl group, an isobutyryl group, a valeryl group, a pivaloyl group or the like.

As the alkyl moiety of the alkoxy group and alkoxycarbonyl group represented by $R_4$, there can be mentioned a linear, branched or cyclic alkyl moiety. With respect to the alkyl moiety, the preferred number of carbon atoms and particular examples are as mentioned above in connection with the alkyl groups and cycloalkyl groups represented by $Z_{ka1}$.

With respect to the alkylene group and cycloalkylene group represented by X, the preferred number of carbon atoms and particular examples are as mentioned above in connection with the alkylene group and cycloalkylene group represented by $R_2$.

Moreover, as particular structures of the repeating units (by), there can be mentioned the repeating units with the following partial structures.

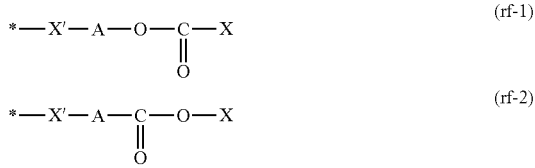

In general formulae (rf-1) and (rf-2),

X' represents an electron withdrawing substituent, preferably a carbonyloxy group, an oxycarbonyl group, an alkylene group substituted with a fluorine atom or a cycloalkylene group substituted with a fluorine atom.

A represents a single bond or a bivalent connecting group of the formula —C(Rx)(Ry)—. In the formula, each of Rx and Ry independently represents a hydrogen atom, a fluorine atom, an alkyl group (preferably having 1 to 6 carbon atoms, optionally substituted with a fluorine atom) or a cycloalkyl group (preferably having 5 to 12 carbon atoms, optionally substituted with a fluorine atom). Each of Rx and Ry is preferably a hydrogen atom, an alkyl group or an alkyl group substituted with a fluorine atom.

X represents an electron withdrawing group. As particular examples thereof, there can be mentioned the electron withdrawing groups set forth above as being represented by $Y^1$ and $Y^2$. X is preferably a fluoroalkyl group; a fluorocycloalkyl group; an aryl group substituted with fluorine or a fluoroalkyl group; an aralkyl group substituted with fluorine or a fluoroalkyl group; a cyano group; or a nitro group.

* represents a bonding hand to the principal chain or a side chain of the resin, namely, a bonding hand bonded to the principal chain of the resin through a single bond or a connecting group.

When X' is a carbonyloxy group or an oxycarbonyl group, A is not a single bond.

The receding contact angle with water of the resin composition film after alkali development can be decreased by the polarity conversion effected by the decomposition of the polarity conversion group by the action of an alkali developer. The decrease of the receding contact angle between water and the film after alkali development is preferred from the viewpoint of decreasing development defects.

The receding contact angle with water of the resin composition film after alkali development is preferably 50° or less, more preferably 40° or less, further more preferably 35° or less and most preferably 30° or less at 23±3° C. in a humidity of 45±5%.

The receding contact angle refers to a contact angle determined when the contact line at a droplet-substrate interface draws back. It is generally known that the receding contact angle is useful in the simulation of droplet mobility in a dynamic condition. In brief, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

The above receding contact angle of the film after alkali development refers to the contact angle obtained by measuring the following film by the dilation/contraction method. Namely, an organic antireflection film ARC29A (produced by Nissan Chemical Industries, Ltd.) was applied onto a silicon wafer (8-inch caliber) and baked at 205° C. for 60 seconds, thereby forming a 98 nm-thick antireflection film. Each of the compositions of the present invention was applied thereonto and baked at 120° C. for 60 seconds, thereby forming a 120 nm-thick film. The film was developed with an aqueous solution of tetramethylammonium hydroxide (2.38 mass %) for 30 seconds, rinsed with pure water and spin dried. The contact angle of the thus obtained film was measured in accordance with the dilation/contraction method.

The rate of hydrolysis of the hydrophobic resin in an alkali developer is preferably 0.001 nm/sec or greater, more preferably 0.01 nm/sec or greater, further more preferably 0.1 nm/sec or greater and most preferably 1 nm/sec or greater.

Herein, the rate of hydrolysis of the hydrophobic resin in an alkali developer refers to the rate of decrease of the thickness of a resin film formed from only the resin (Cy) in 23° C. TMAH (aqueous solution of tetramethylammonium hydroxide) (2.38 masse).

It is preferred for the repeating unit (by) to be a repeating unit containing at least two polarity conversion groups.

When the repeating unit (by) contains at least two polarity conversion groups, it is preferred for the repeating unit to contain a group with any of the partial structures having two polarity conversion groups of general formula (KY-1) below. When the structure of general formula (KY-1) has no bonding hand, a group with a mono- or higher-valent group resulting from the removal of at least any arbitrary one of the hydrogen atoms contained in the structure is referred to.

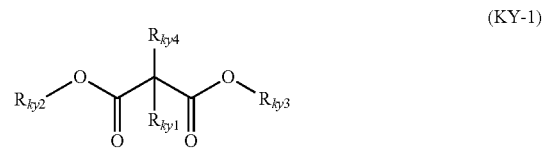

In general formula (KY-1), each of $R_{ky1}$ and $R_{ky4}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group. Alternatively, both $R_{ky1}$ and $R_{ky4}$ may be bonded to the same atom to thereby form a double bond. For example, both $R_{ky1}$ and $R_{ky4}$ may be bonded to the same oxygen atom to thereby form a part (=O) of a carbonyl group.

Each of $R_{ky2}$ and $R_{ky3}$ independently represents an electron withdrawing group. Alternatively, $R_{ky1}$ and $R_{ky2}$ are linked to each other to thereby form a lactone structure, while $R_{ky3}$ is an electron withdrawing group. The formed lactone structure is preferably any of the above-mentioned structures (KA-1-1) to (KA-1-17). As the electron withdrawing group, there can be mentioned any of the same groups as mentioned above with respect to $Y^1$ and $Y^2$ of general formula (KB-1). This electron withdrawing group is preferably a halogen atom, or any of the halo(cyclo)alkyl groups or haloaryl groups of the formula —C($R_{f1}$)($R_{f2}$)—$R_{f3}$ above. Preferably, $R_{ky3}$ is a halogen atom, or any of the halo(cyclo) alkyl groups or haloaryl groups of the formula —C($R_{f1}$) ($R_{f2}$)—$R_{f3}$ above, while $R_{ky2}$ is either linked to $R_{ky1}$ to thereby form a lactone ring, or an electron withdrawing group containing no halogen atom.

$R_{ky1}$, $R_{ky2}$ and $R_{ky4}$ may be linked to each other to thereby form a monocyclic or polycyclic structure.

As $R_{ky1}$ and $R_{ky4}$, there can be mentioned, for example, the same groups as set forth above with respect to $Z_{ka1}$ of general formula (KA-1).

The lactone rings formed by the mutual linkage of $R_{ky1}$ and $R_{ky2}$ preferably have the structures of formulae (KA-1-1) to (KA-1-17) above. As the electron withdrawing groups, there can be mentioned those mentioned above as being represented by $Y^1$ and $Y^2$ of general formula (KB-1) above.

It is more preferred for the structure of general formula (KY-1) to be the structure of general formula (KY-2) below. The structure of general formula (KY-2) refers to a group with a mono- or higher-valent group resulting from the removal of at least any arbitrary one of the hydrogen atoms contained in the structure.

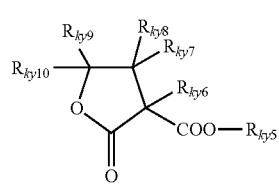

(KY-2)

In formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group.

At least two of $R_{ky6}$ to $R_{ky10}$ may be linked to each other to thereby form a monocyclic or polycyclic structure.

$R_{ky5}$ represents an electron withdrawing group. As the electron withdrawing group, there can be mentioned any of the same groups as set forth above with respect to $Y^1$ and $Y^2$. This electron withdrawing group is preferably a halogen atom, or any of the halo(cyclo)alkyl groups or haloaryl groups of the formula —C($R_{f1}$)($R_{f2}$)—$R_{f3}$ above.

As $R_{ky5}$ to $R_{ky10}$, there can be mentioned, for example, the same groups as set forth above with respect to $Z_{ka1}$ of formula (KA-1).

It is more preferred for the structure of formula (KY-2) to be the partial structure of general formula (KY-3) below.

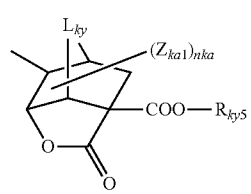

(KY-3)

In formula (KY-3), $Z_{ka1}$ and nka are as defined above in connection with general formula (KA-1). $R_{ky5}$ is as defined above in connection with formula (KY-2).

$L_{ky}$ represents an alkylene group, an oxygen atom or a sulfur atom. As the alkylene group represented by $L_{ky}$, there can be mentioned a methylene group, an ethylene group or the like. $L_{ky}$ is preferably an oxygen atom or a methylene group, more preferably a methylene group.

The repeating units (by) are not limited as long as they are derived by polymerization, such as addition polymerization, condensation polymerization or addition condensation. Preferred repeating units are those obtained by the addition polymerization of a carbon to carbon double bond. As such repeating units, there can be mentioned, for example, acrylate repeating units (including the family having a substituent at the α- and/or β-position), styrene repeating units (including the family having a substituent at the α- and/or β-position), vinyl ether repeating units, norbornene repeating units, repeating units of maleic acid derivatives (maleic anhydride, its derivatives, maleimide, etc.) and the like. Of these, acrylate repeating units, styrene repeating units, vinyl ether repeating units and norbornene repeating units are preferred. Acrylate repeating units, vinyl ether repeating units and norbornene repeating units are more preferred. Acrylate repeating units are most preferred.

When the repeating unit (by) is a repeating unit containing at least either a fluorine atom or a silicon atom, as the partial structure containing a fluorine atom within the repeating unit (by), there can be mentioned any of those set forth in connection with the repeating unit containing at least one of a fluorine atom and a silicone atom, preferably the groups of general formulae (F2) to (F4) above. As the partial structure containing a silicon atom within the repeating unit (by), there can be mentioned any of those set forth in connection with the repeating unit (c1) to be described hereinafter, preferably the groups of general formulae (CS-1) to (CS-3) above.

The content of repeating unit (by) in the hydrophobic resin, based on all the repeating units of the hydrophobic resin, is preferably in the range of 10 to 100 mol %, more preferably 20 to 99 mol %, further more preferably 30 to 97 mol % and most preferably 40 to 95 mol %.

Specific examples of the repeating units (by) containing a group whose solubility in an alkali developer is increased are shown below, which however in no way limit the scope of the repeating units. Here, Ra represents a hydrogen atom, a fluorine atom, a methyl group, or a trifluoromethyl group.

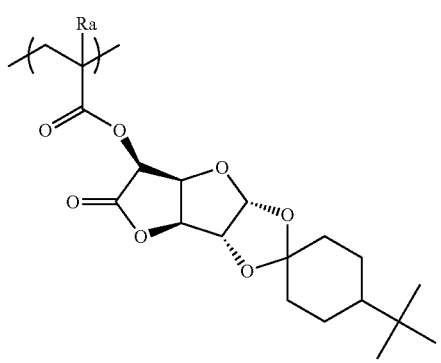

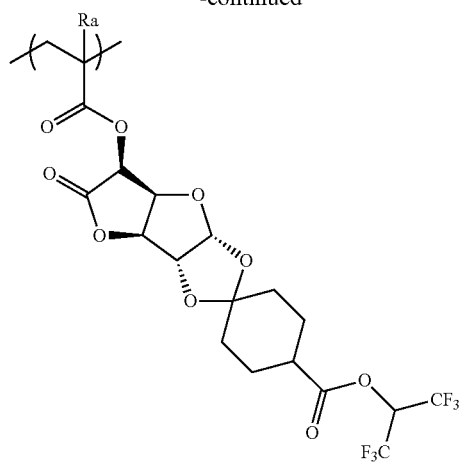
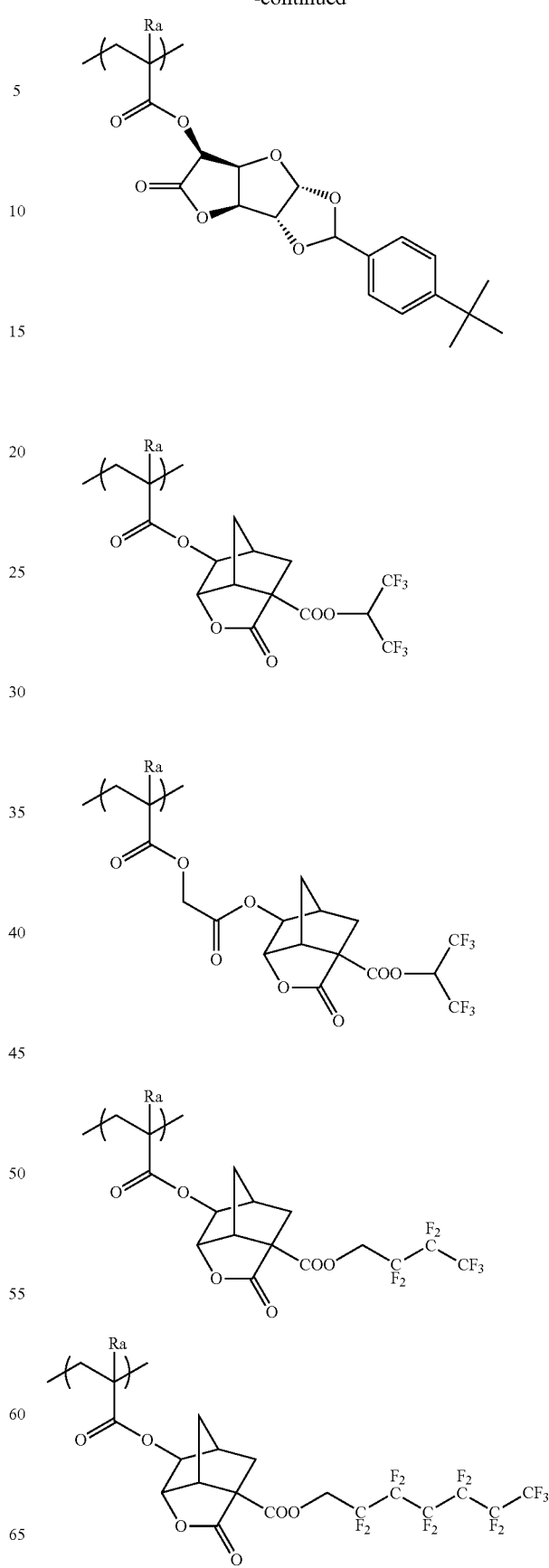

197
-continued
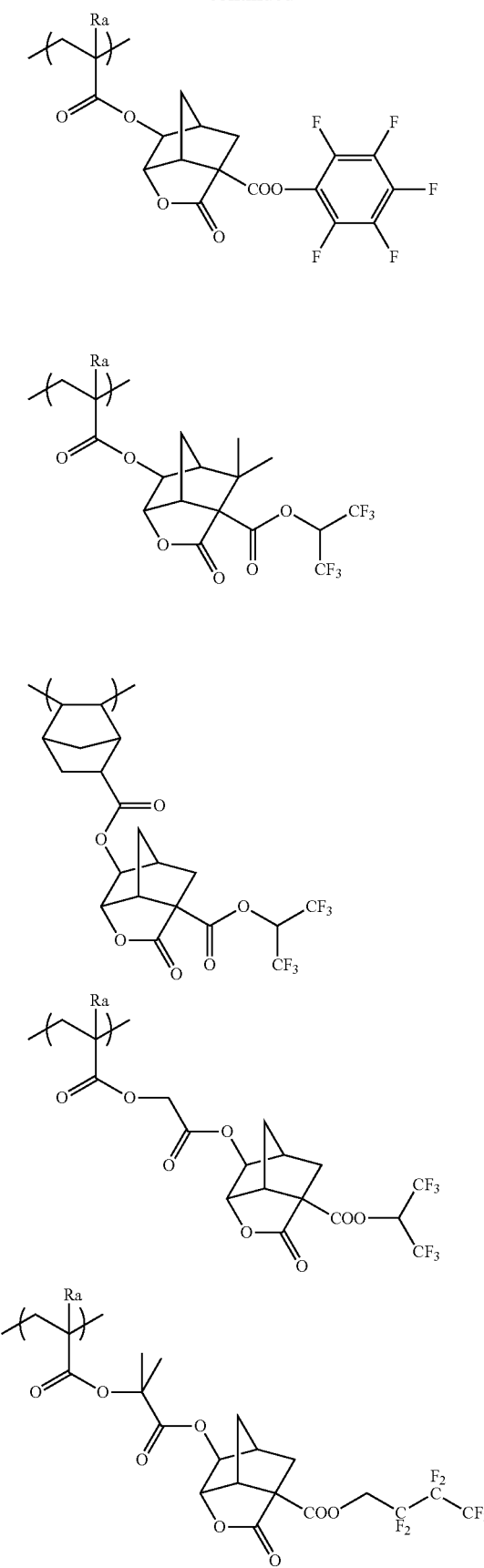
198
-continued
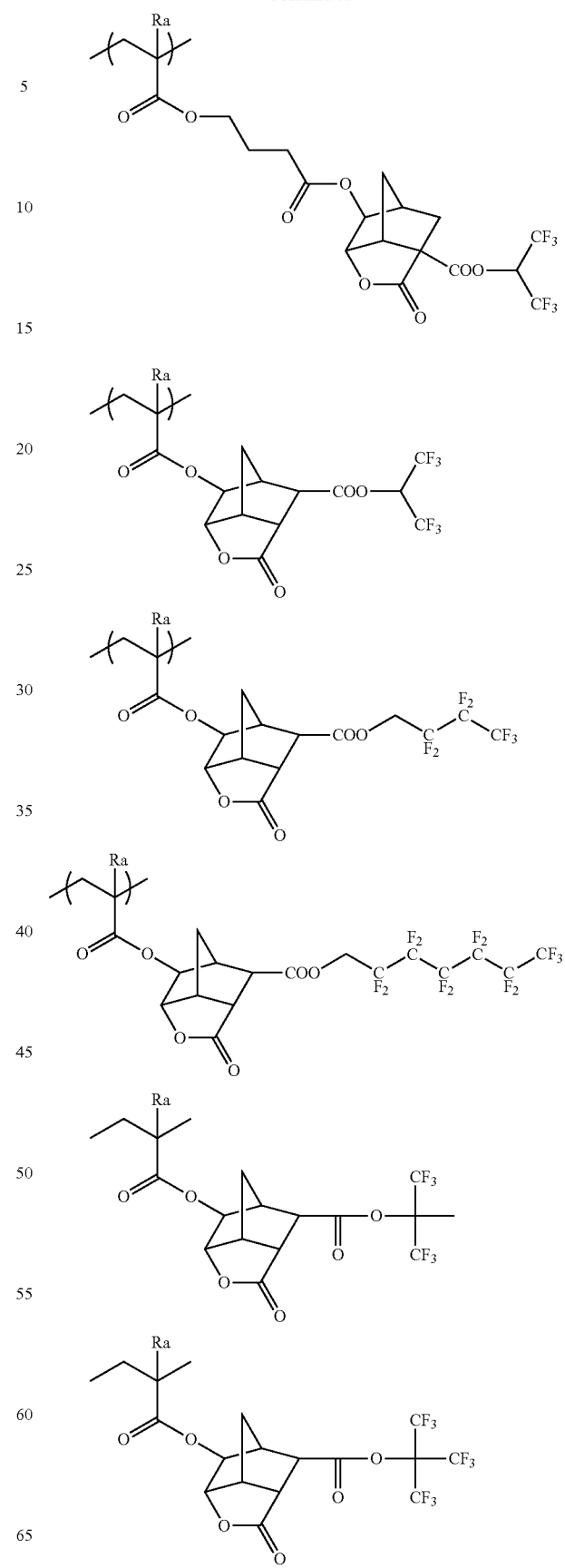

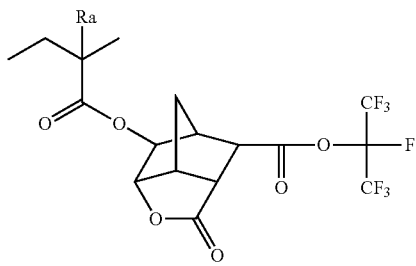
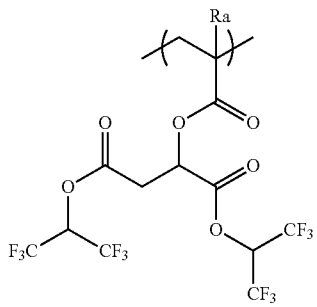
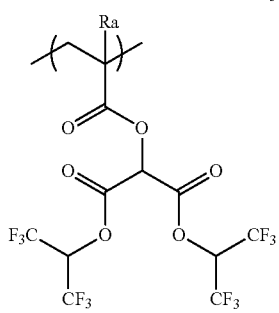
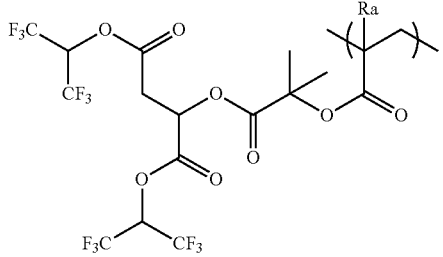
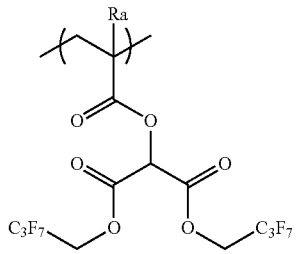
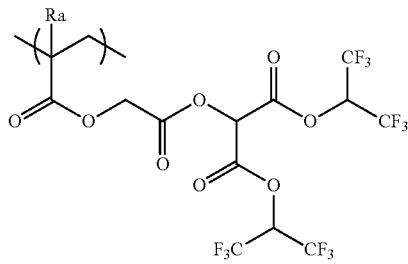

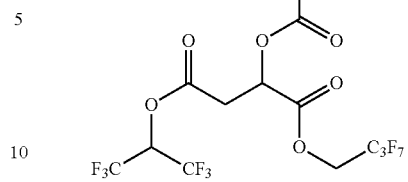

As the repeating unit containing a group (z) that is decomposed by the action of an acid, for example, those explained in connection with the acid-decomposable resin can be exemplified.

The content of repeating units containing such a group (z) based on all the repeating units of the hydrophobic resin is preferably in the range of 1 to 80 mol %, more preferably 10 to 80 mol %, and still more preferably 20 to 60 mol %.

The hydrophobic resin (HR) may further have any of the repeating units represented by the following general formula (VI).

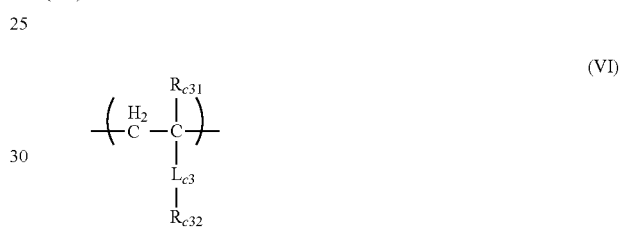

(VI)

In the formula (VI), $R_{c31}$ represents a hydrogen atom, an alkyl group, an alkyl group optionally substituted with one or more fluorine atoms, a cyano group or a group of the formula —$CH_2$—O—$R_{ac2}$ in which $R_{ac2}$ represents a hydrogen atom, an alkyl group or an acyl group. $R_{c31}$ is preferably a hydrogen atom, a methyl group, a hydroxymethyl group, or a trifluoromethyl group, more preferably a hydrogen atom or a methyl group.

$R_{c32}$ represents a group containing an alkyl group, a cycloalkyl group, an alkenyl group, a cycloalkenyl group, or an aryl group. These groups may be substituted with fluorine atom and/or silicon atom.

$L_{c3}$ represents a single bond or a bivalent connecting group.

The alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms such as a phenyl group or a naphthyl group.

These groups may have one or more substituents.

Preferably, $R_{c32}$ represents an unsubstituted alkyl group or an alkyl group substituted with one or more fluorine atoms.

$L_{c3}$ represents a single bond or a bivalent connecting group. As the bivalent connecting group represented by $L_{c3}$, an alkylene group (preferably having 1 to 5 carbon atoms), an oxy group, a phenylene group, or an ester bond (a group represented by —COO—) can be exemplified.

The hydrophobic resin (HR) may contain a repeating unit represented by the general formula (VII) or (VIII) as the one represented by the general formula (VI).

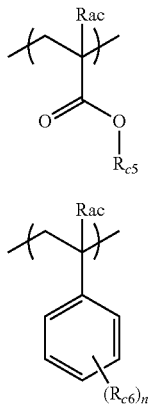

(VII)

(VIII)

In the general formula (VII), $R_{c5}$ represents a hydrocarbon group having at least one cyclic structure in which neither a hydroxyl group nor a cyano group is contained.

Rac represents a hydrogen atom, an alkyl group, an alkyl group that may be substituted with a fluorine atom, a cyano group or a group of the formula —$CH_2$—O—$Rac_2$ in which $Rac_2$ represents a hydrogen atom, an alkyl group or an acyl group. Rac is preferably a hydrogen atom, a methyl group, a hydroxymethyl group or a trifluoromethyl group, especially preferably a hydrogen atom or a methyl group.

The cyclic structures contained in $R_{c5}$ include a monocyclic hydrocarbon group and a polycyclic hydrocarbon group. As the monocyclic hydrocarbon group, there can be mentioned, for example, a cycloalkyl group having 3 to 12 carbon atoms or a cycloalkenyl group having 3 to 12 carbon atoms. Preferably, the monocyclic hydrocarbon group is a monocyclic hydrocarbon group having 3 to 7 carbon atoms.

The polycyclic hydrocarbon groups include ring-assembly hydrocarbon groups and crosslinked-ring hydrocarbon groups. As the crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed-ring hydrocarbon rings, for example, condensed rings resulting from condensation of multiple 5- to 8-membered cycloalkane rings. As preferred crosslinked-ring hydrocarbon rings, there can be mentioned, for example, a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

In the general formula (VIII), Rc6 represents an alkyl group, a cycloalkyl group, an alkenyl group, a cycloalkenyl group, an alkoxycarbonyl group or an alkylcarbonyloxy group. These groups may be substituted with a fluorine atom or a silicon atom.

The alkyl group represented by $R_{c6}$ is preferably a linear or branched alkyl group having 1 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The alkoxycarbonyl group is preferably an alkoxycarbonyl group having 2 to 20 carbon atoms.

The alkylcarbonyloxy group is preferably an alkylcarbonyloxy group having 2 to 20 carbon atoms.

In the formula, n is an integer of 0 to 5. When n is 2 or greater, the plurality of $R_{c6}$s may be identical to or different from each other.

It is preferred for $R_{c6}$ to represent an unsubstituted alkyl group or an alkyl group substituted with a fluorine atom. A trifluoromethyl group and a t-butyl group are especially preferred.

The hydrophobic resin (HR) may further contain any of the repeating units represented by general formula (CII-AB) below.

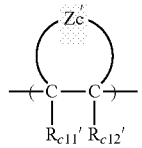

(CII-AB)

In the formula (CII-AB), each of $R_{c11}'$ and $R_{c12}'$ independently represents a hydrogen atom, a cyano group, a halogen atom or an alkyl group.

Zc' represents an atomic group required for forming an alicyclic structure in cooperation with two carbon atoms (C—C) to which $R_{c11}'$ and $R_{c12}'$ are respectively bonded.

Further, the general formula (CII-AB) is preferable to be one of the formulae (CII-AB1) or (CII-AB2) below.

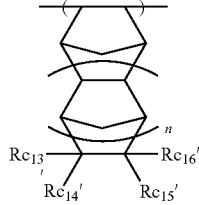

CII-AB1

-continued

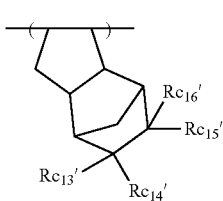

CII-AB2

In the formulae (CII-AB1) and (CII-AB2), each of $R_{c13}'$ to $R_{c16}'$ independently represents a hydrogen atom, a halogen atom, an alkyl group, or a cycloalkyl group.

At least two of $R_{c13}'$, to $R_{c16}'$ may bond to each other to form a ring.

In the formula (CII-AB), n represents 0 or 1.

Specific examples of the repeating units represented by the general formulae (VI) or (CII-AB) will be shown below. In the formulae, Ra represents H, $CH_3$, $CH_2OH$, $CF_3$ or CN.

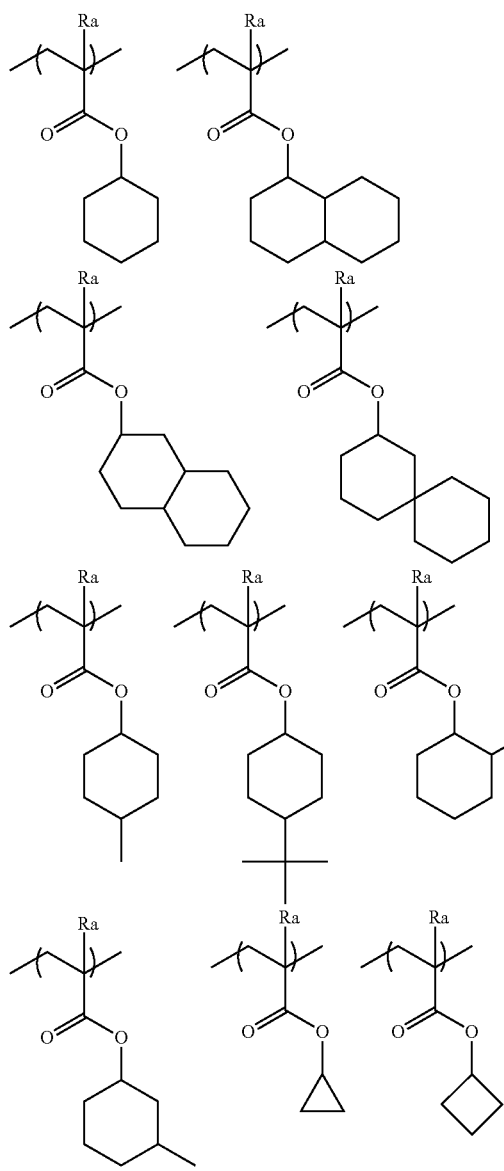

-continued

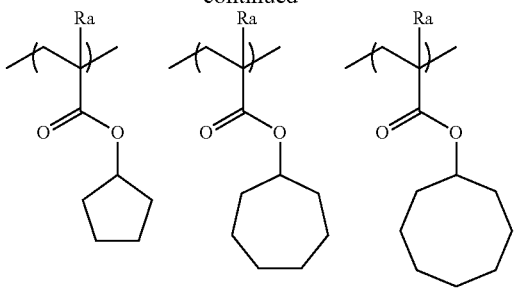

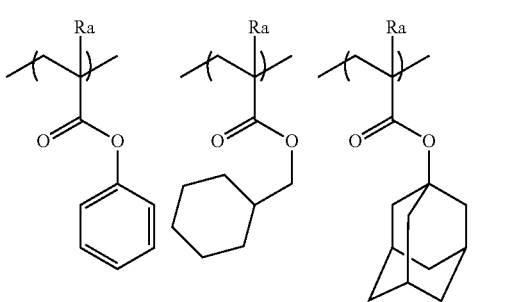

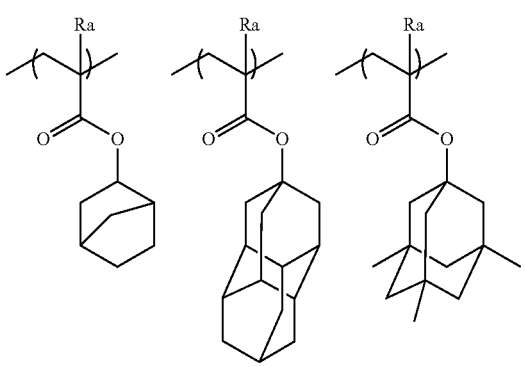

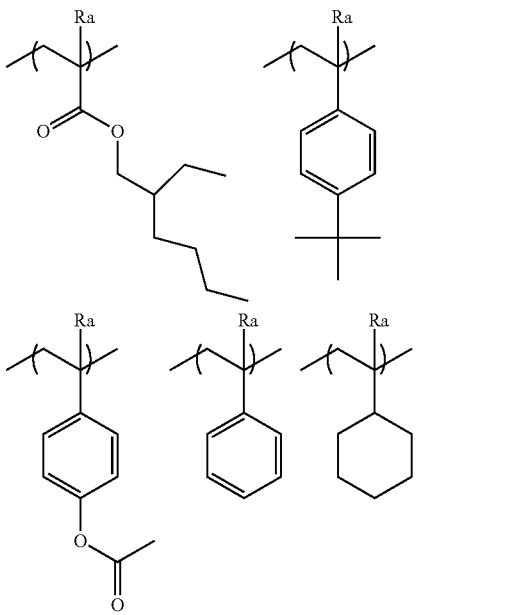

-continued
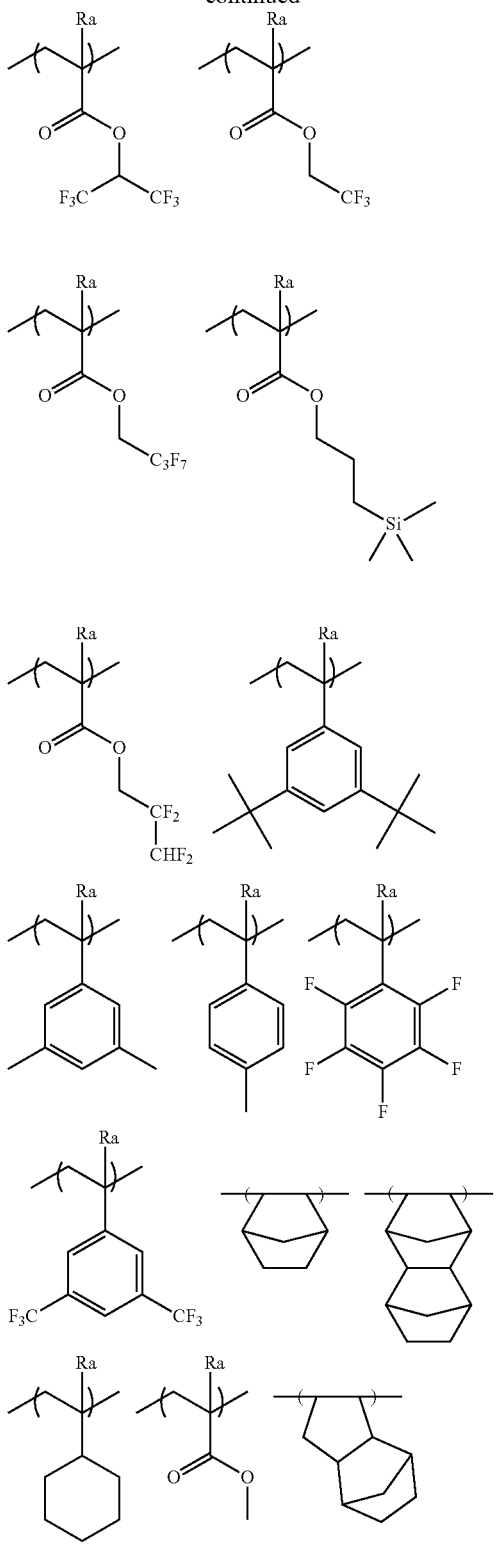
Specific examples of the hydrophobic resins (HR) will be shown below. The following Table 2 shows the molar ratio of individual repeating units (corresponding to individual repeating units in order from the left), weight average molecular weight, and degree of dispersal with respect to each of the resins.
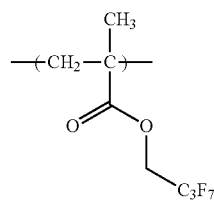 (HR-1)
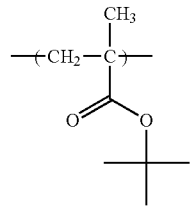
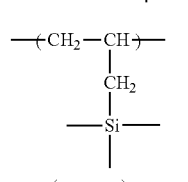 (HR-2)
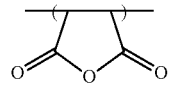
 (HR-3)
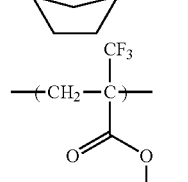
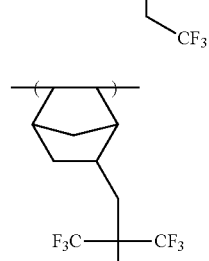 (HR-4)
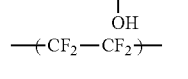
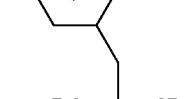 (HR-5)
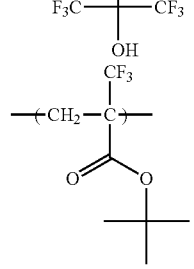

(HR-6)
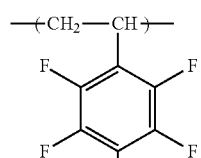
(HR-7)
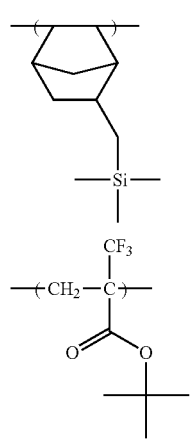
(HR-8)
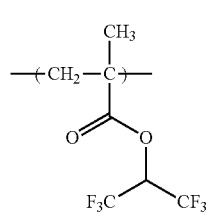
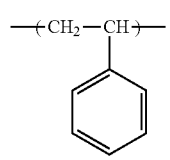
(HR-9)
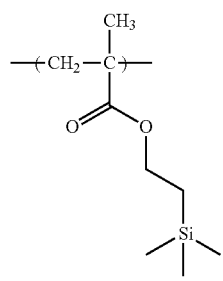
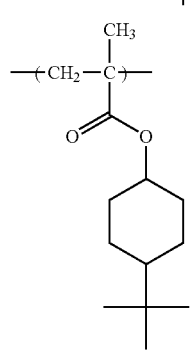
(HR-10)
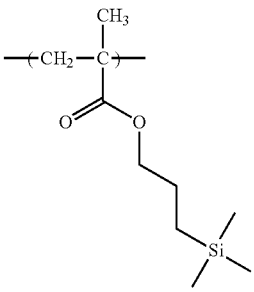
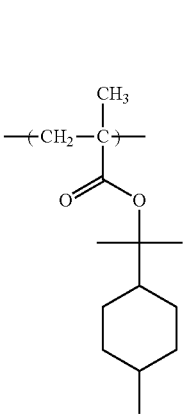
(HR-11)
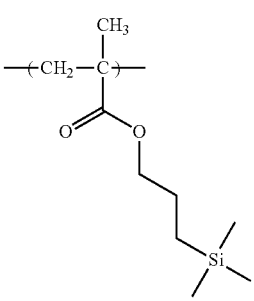
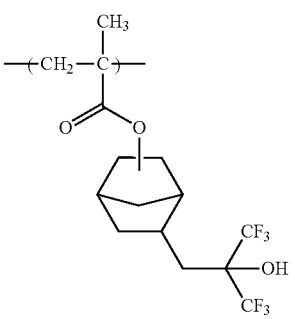
(HR-12)
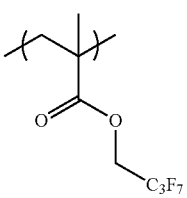

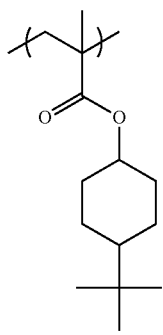
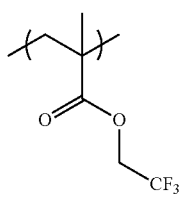
(HR-13)
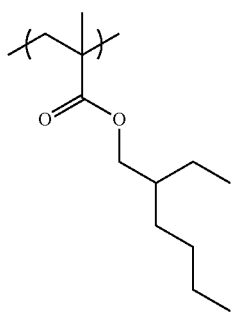
(HR-14)
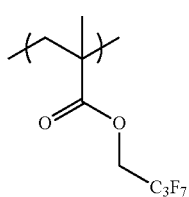
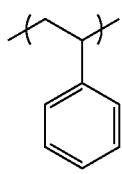
(HR-15)
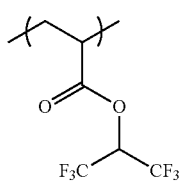
(HR-16)
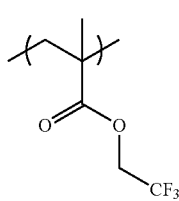
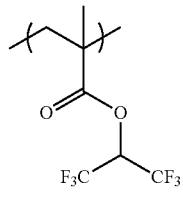
(HR-17)
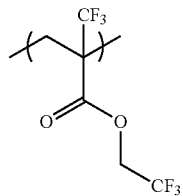
(HR-18)
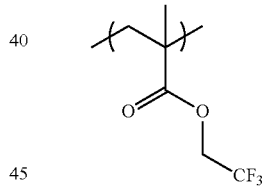
(HR-19)
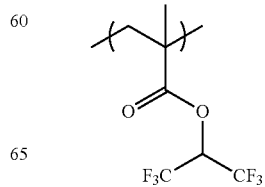
(HR-20)

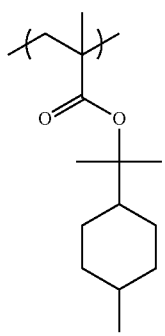
(HR-21)
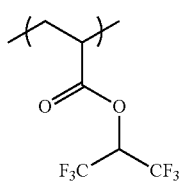
(HR-22)
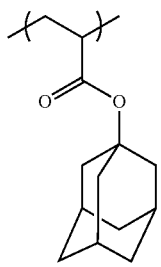
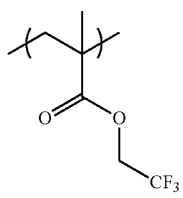
(HR-23)
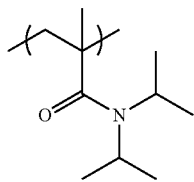
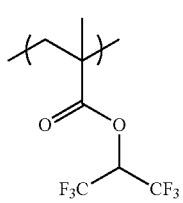
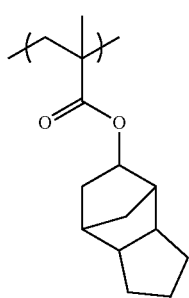
(HR-24)
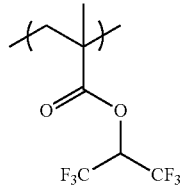
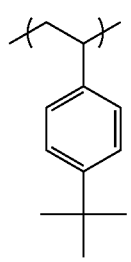
(HR-25)
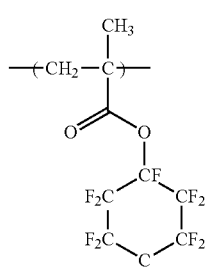
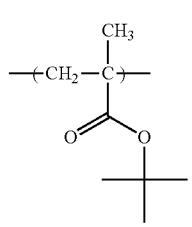
(HR-26)
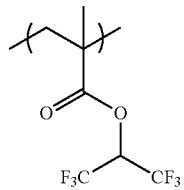
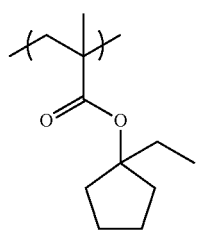
(HR-27)
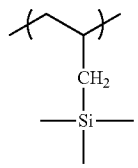

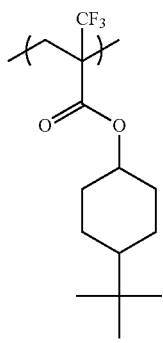
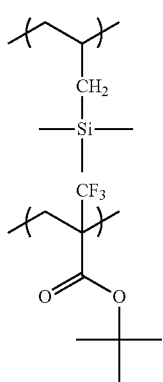
(HR-28)
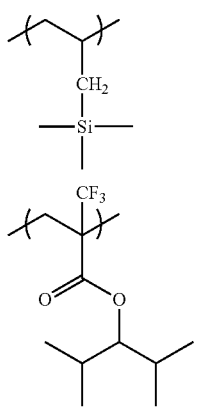
(HR-29)
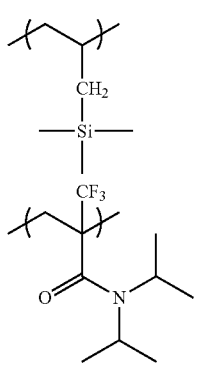
(HR-30)
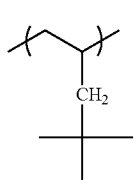
(HR-31)
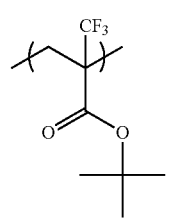
(HR-32)
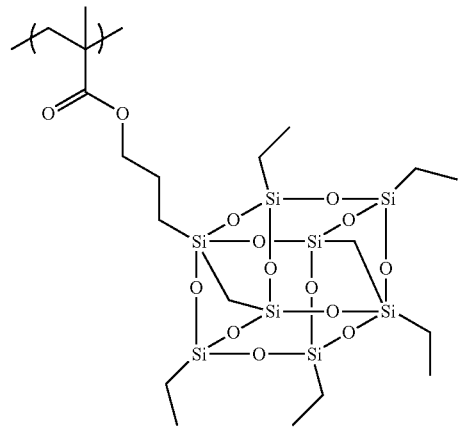
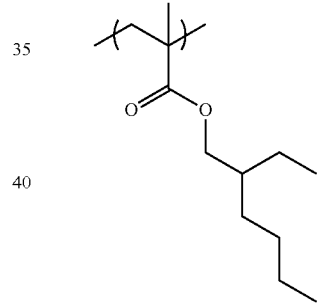
(HR-33)
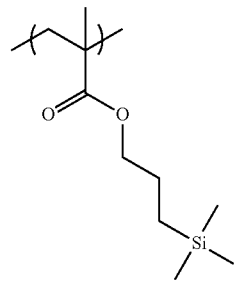
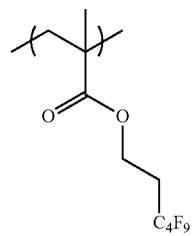

215
-continued
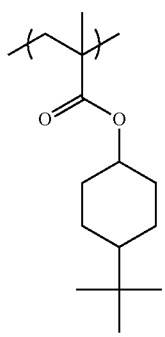
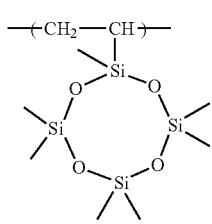
(HR-34)
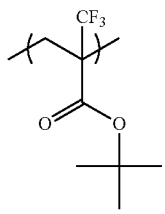
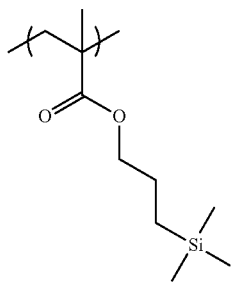
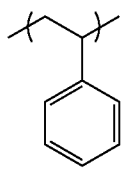
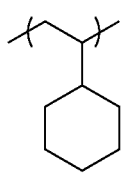
(HR-36)
216
-continued
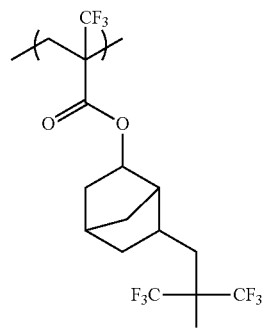
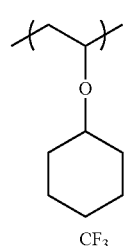
(HR-37)
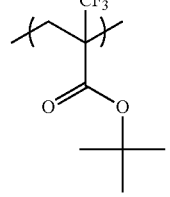
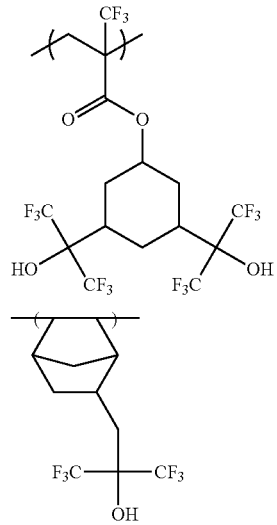
(HR-38)
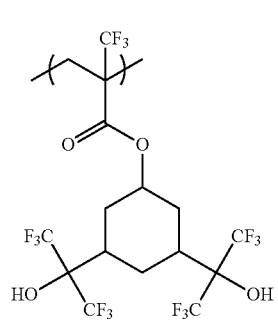
(HR-39)

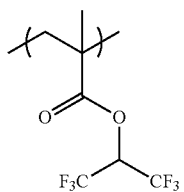
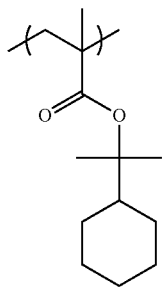 (HR-40)
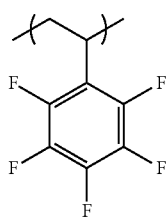
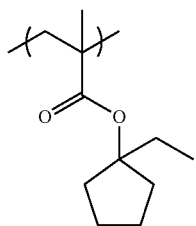 (HR-41)
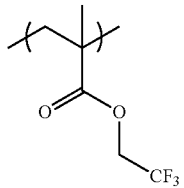
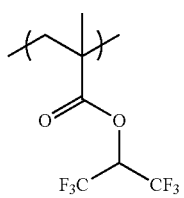 (HR-42)
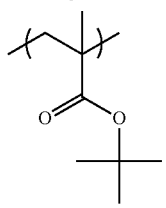
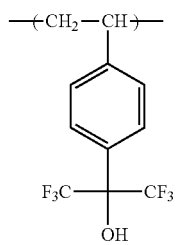 (HR-43)
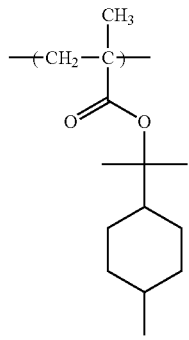
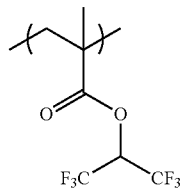 (HR-44)
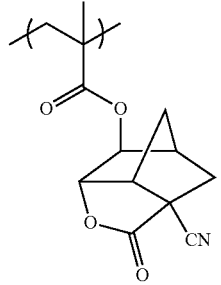
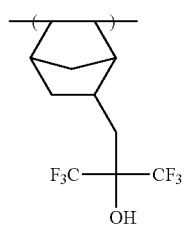 (HR-45)
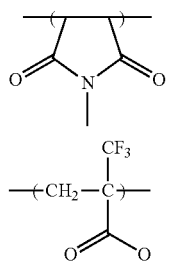

(HR-46) 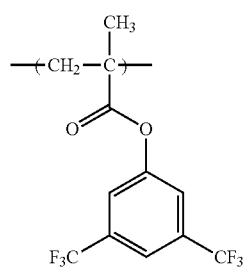
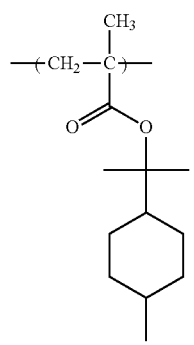
(HR-47) 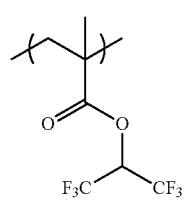
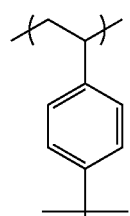
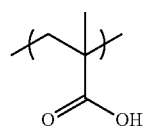
(HR-48) 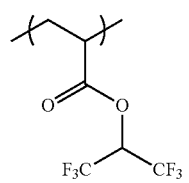
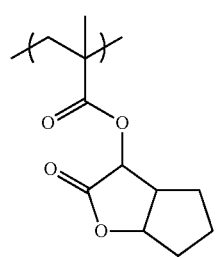
(HR-49) 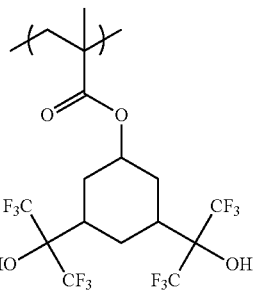
(HR-50) 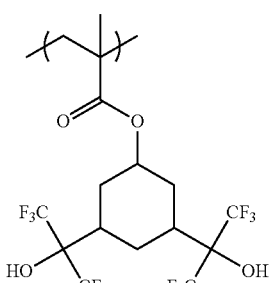
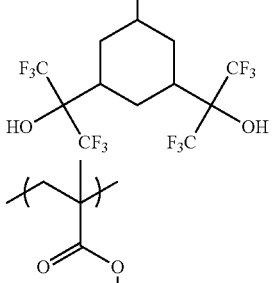
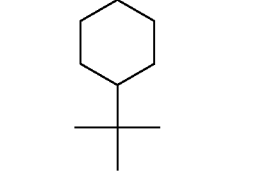
(HR-51) 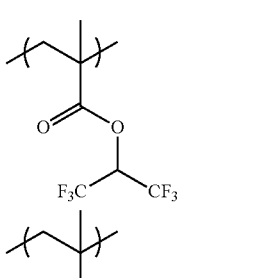
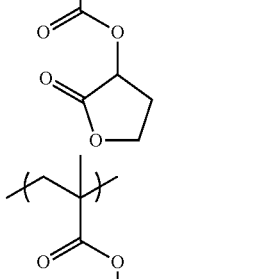
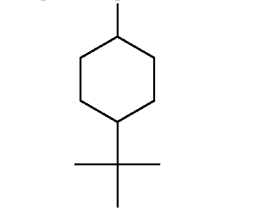

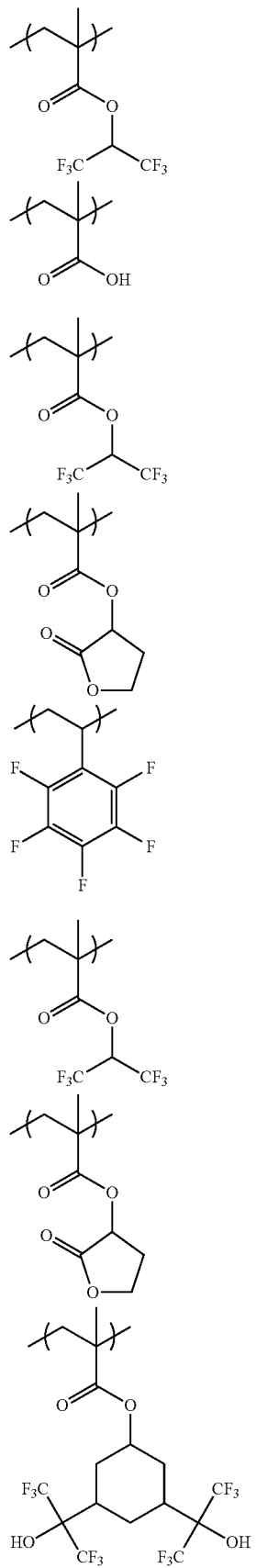
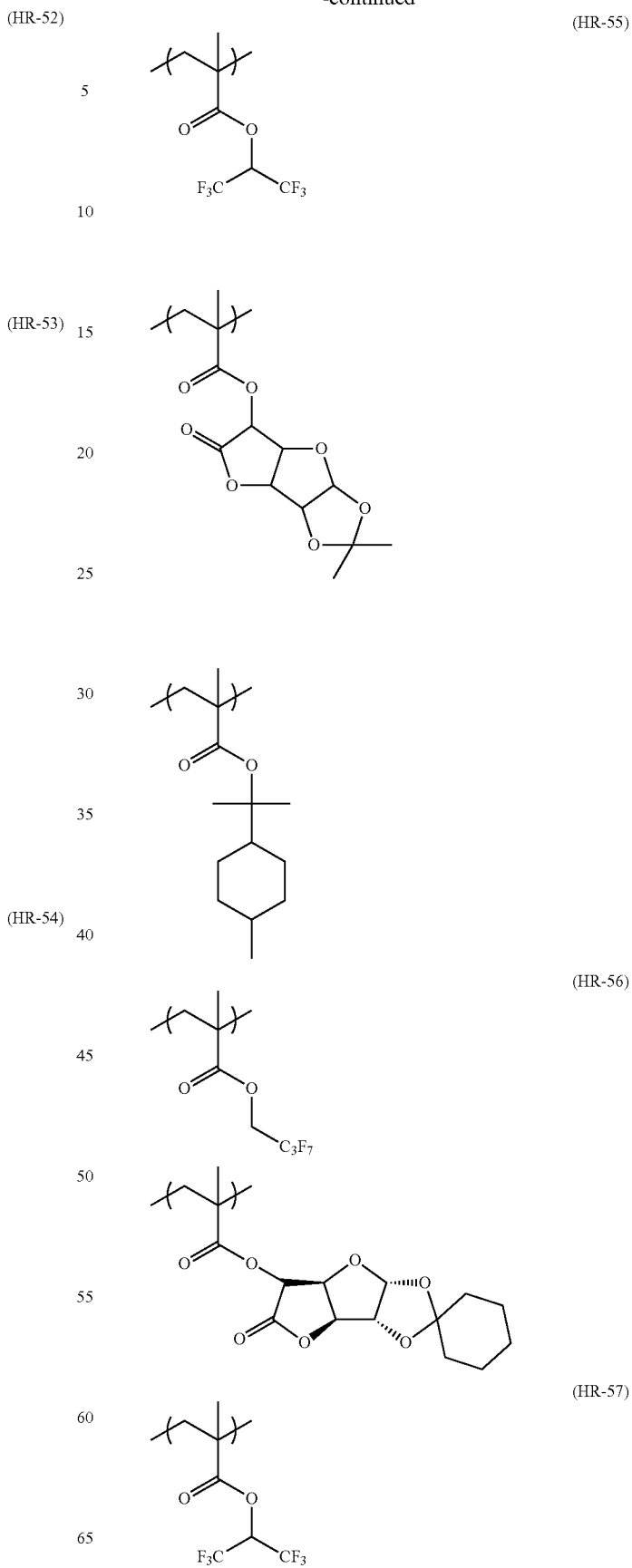

-continued
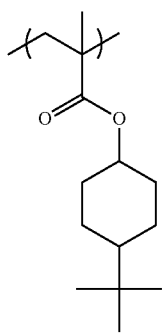
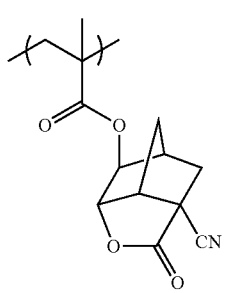
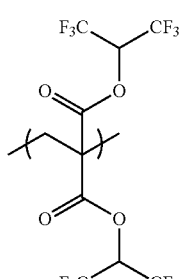
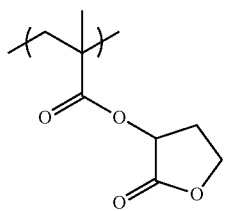
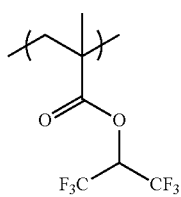
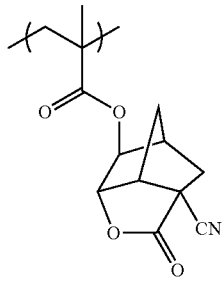
-continued
(HR-60)
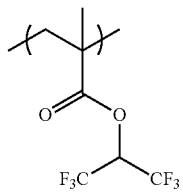
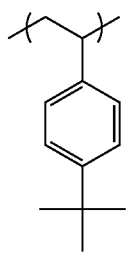
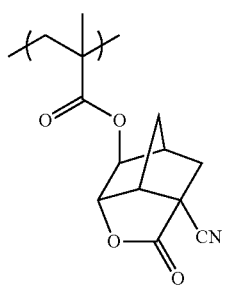
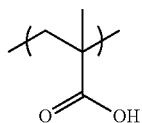
(HR-61)
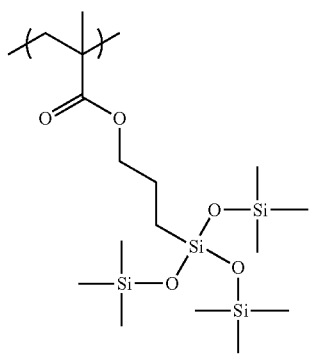
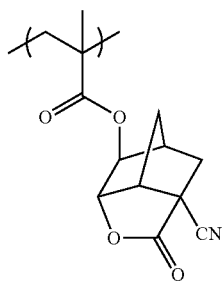
(HR-58)
(HR-59)

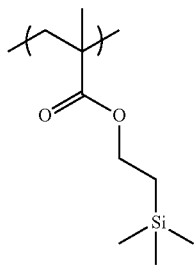
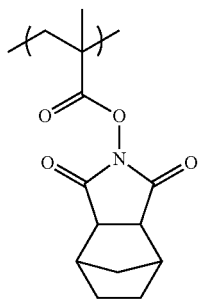
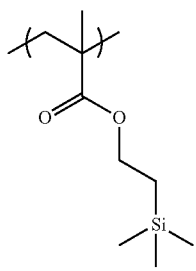
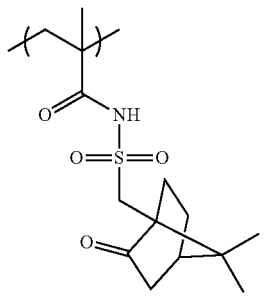
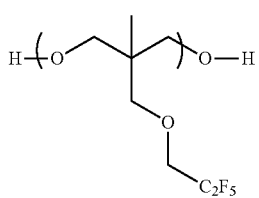
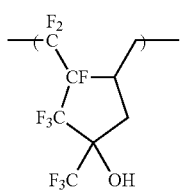
(HR-62)
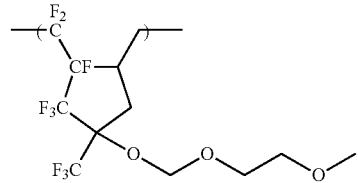
(HR-63)
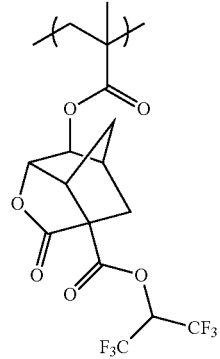
(HR-64)
(HR-65)
(HR-66)
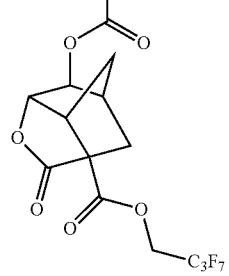
(HR-67)
(HR-68)
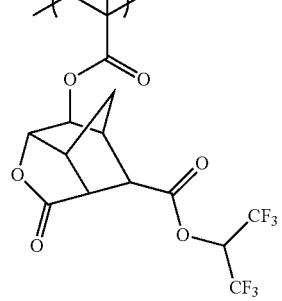
(HR-69)

-continued
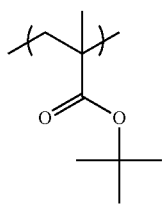
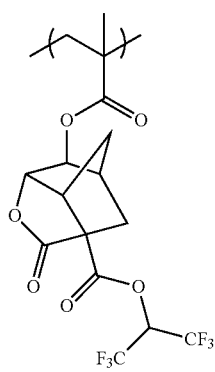
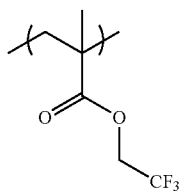
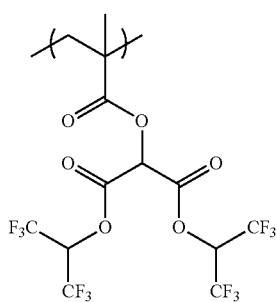
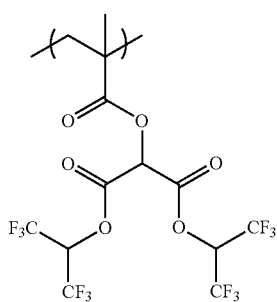
-continued
(HR-70)
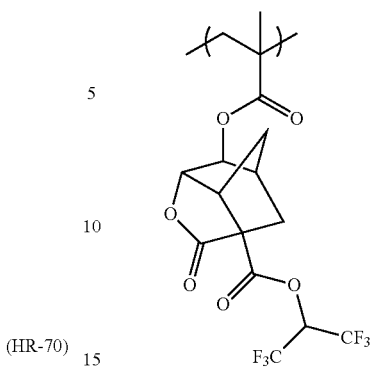
(HR-73)
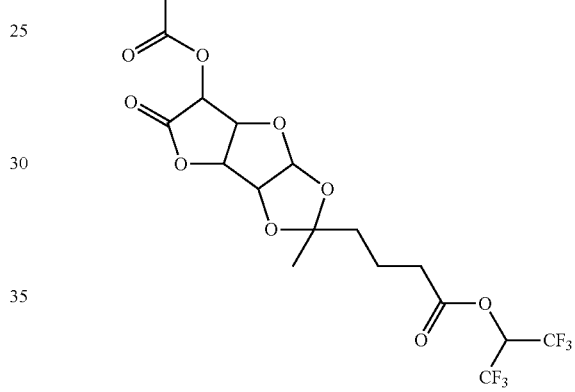
(HR-71)
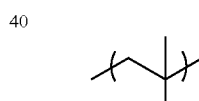
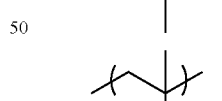
(HR-72)
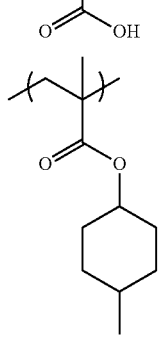

(HR-74)
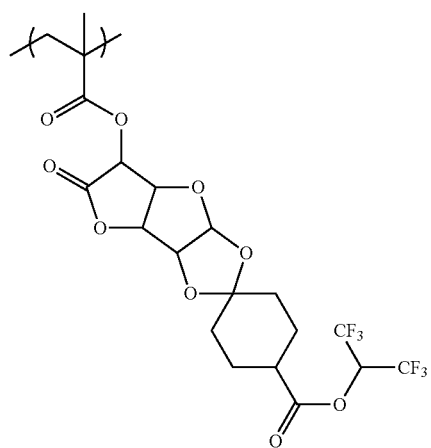
(HR-75)
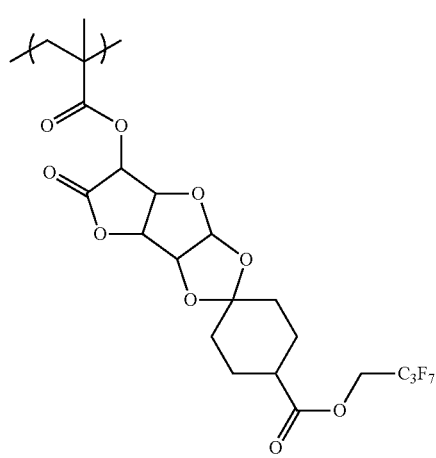
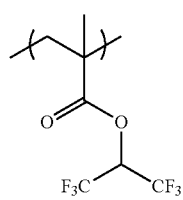
(HR-76)
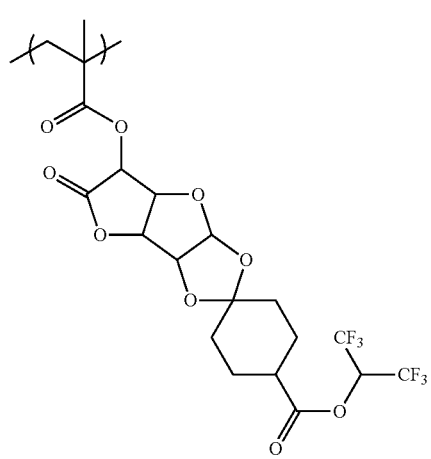
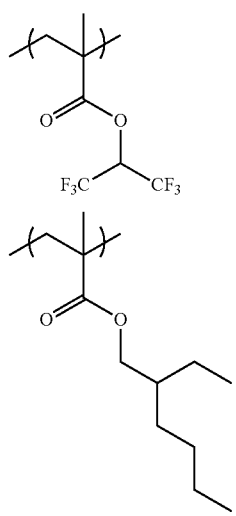
(HR-77)
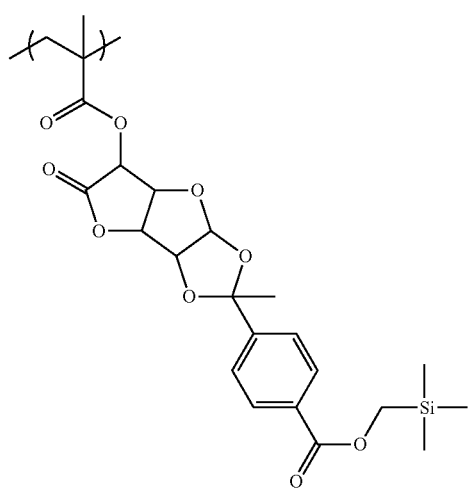
(HR-78)
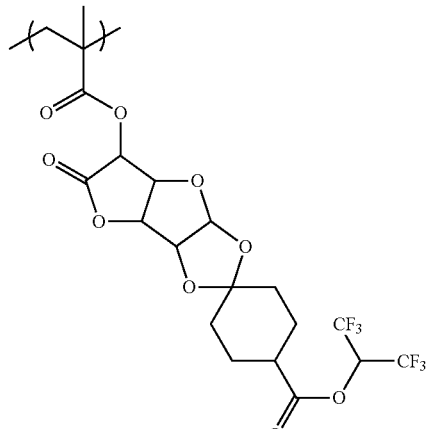
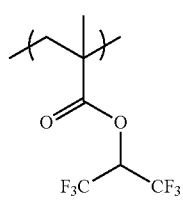

(HR-79)
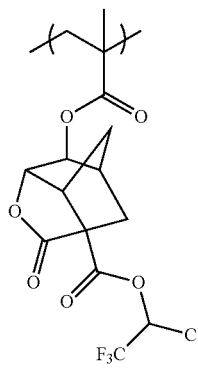
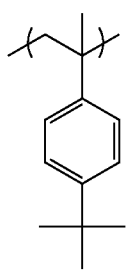
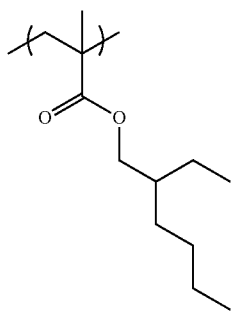
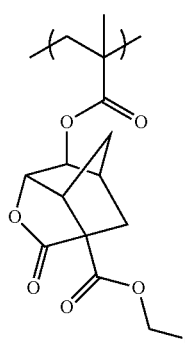
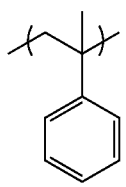
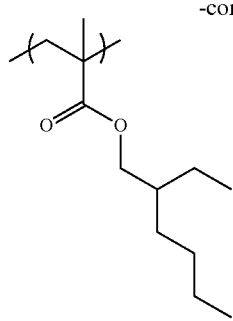
(HR-81)
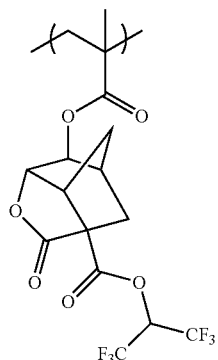
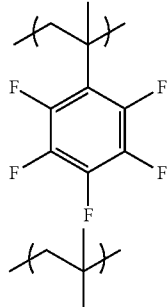
(HR-80)
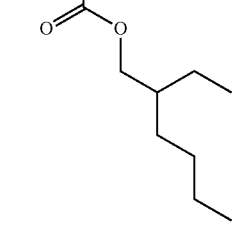
(HR-82)

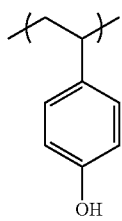
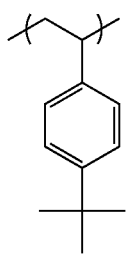
(HR-83)
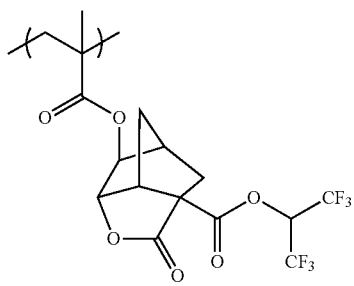
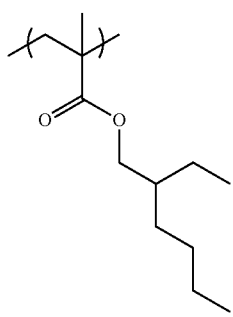
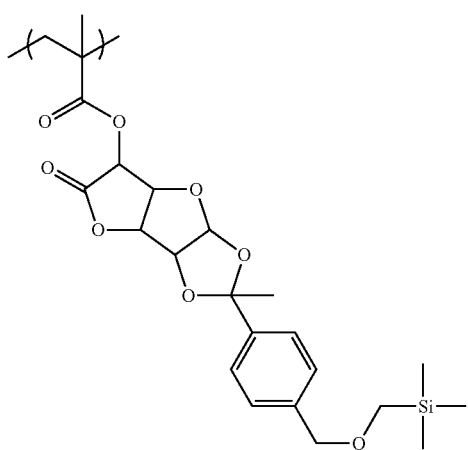
(HR-85)
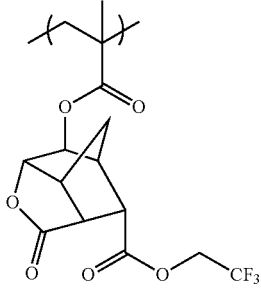
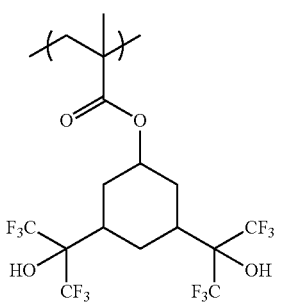
(HR-86)
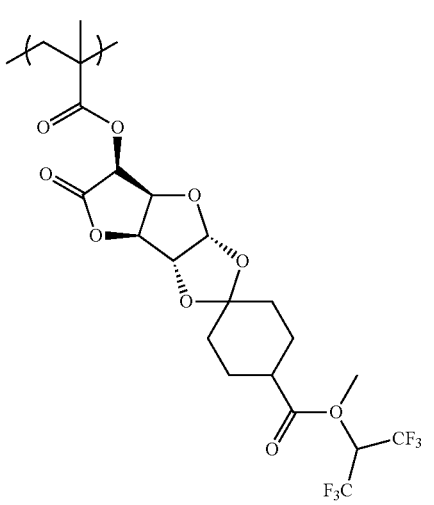

(HR-87)
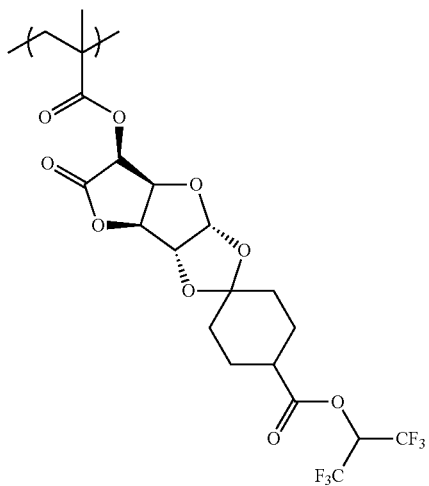
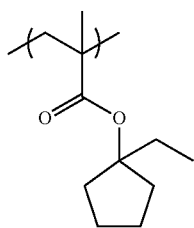
(HR-88)
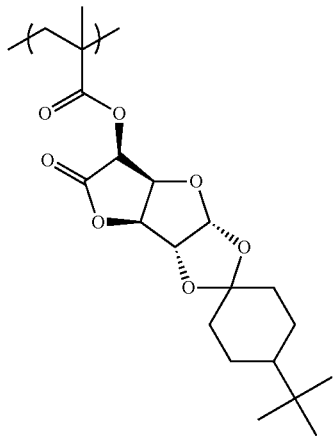
(HR-89)
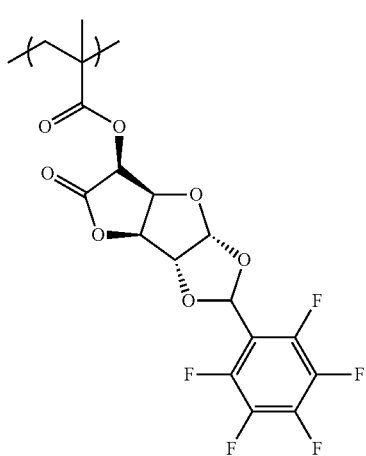
(HR-90)
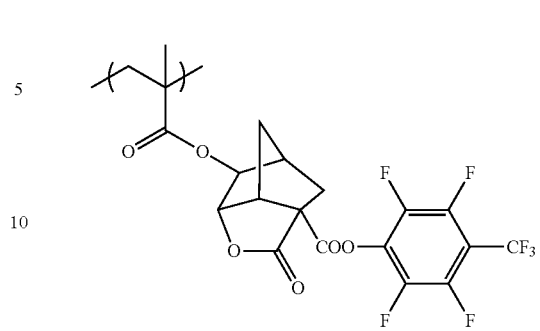
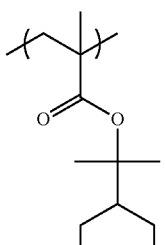
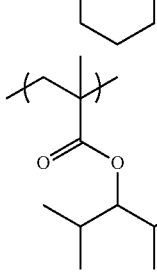
TABLE 2
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |

TABLE 2-continued

| Resin | Composition | Mw | Mw/Mn |
|---|---|---|---|
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

When the hydrophobic resin (HR) contains fluorine atoms, the content of the fluorine atoms based on the molecular weight of the hydrophobic resin (HR) is preferably in the range of 5 to 80 mass %, and more preferably 10 to 80 mass %. The repeating unit containing fluorine atoms preferably exists in the hydrophobic resin (HR) in an amount of 10 to 100 mass %, more preferably 30 to 100 mass %.

When the hydrophobic resin (HR) contains silicon atoms, the content of the silicon atoms based on the molecular weight of the hydrophobic resin (HR) is preferably in the range of 2 to 50 mass %, more preferably 2 to 30 mass %. The repeating unit containing silicon atoms preferably exists in the hydrophobic resin (HR) in an amount of 10 to 90 mass %, more preferably 20 to 80 mass %.

The weight average molecular weight of the hydrophobic resin (HR) in terms of standard polystyrene molecular weight is preferably in the range of 1,000 to 100,000, more preferably 1,000 to 50,000, and still more preferably 2,000 to 15,000.

The hydrophobic resin may either be used individually or in combination. The content of the hydrophobic resin (HR) in the composition based on the total solids thereof can be adjusted for enabling the receding contact angle to fall within the abovementioned range, but is preferably in the range of 0.01 to 10 mass %, more preferably 0.1 to 9 mass %, and most preferably 0.5 to 8 mass %.

Impurities such as metals in the hydrophobic resin (HR) should naturally be of low quantity as in the acid-decomposable resin. The content of residual monomers and oligomer components is preferably in the range of 0 to 10 mass %, more preferably 0 to 5 mass %, and still more preferably 0 to 1 mass %. Accordingly, there can be obtained a composition being free from in-liquid foreign matters and a change in sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 3, more preferably 1 to 2, still more preferably 1 to 1.8, and most preferably 1 to 1.5.

A variety of commercially available products can be used as the hydrophobic resin (HR), and also the resin can be synthesized in accordance with conventional methods (for example, by radical polymerization). As general synthesizing methods, a batch polymerization method in which a monomer species and an initiator are dissolved in a solvent and heated to carry out polymerization and a dropping polymerization method in which a solution of monomer species and initiator is dropped into a hot solvent over a period of 1 to 10 hours can be exemplified. Of these, the dropping polymerization method is preferred. As a reaction solvent, ethers such as tetrahydrofuran, 1,4-dioxane or diisopropyl ether, ketones such as methyl ethyl ketone or methyl isobutyl ketone, ester solvents such as ethyl acetate, amide solvents such as dimethylformamide or dimethylacetamide, and the aforementioned solvent capable of dissolving the composition according to the present invention, such as propylene glycol monomethyl ether acetate (PGMEA), propylene glycol monomethyl ether (PGME) or cyclohexanone can be exemplified. Preferably, the polymerization is carried out with the use of the same solvent as that used in the composition according to the present invention. This would inhibit particle generation during storage.

The polymerization reaction is preferably carried out in an atmosphere consisting of an inert gas such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxy group are more preferred. As specific preferred initiators, azobisisobutyronitrile, azobisdimethylvaleronitrile, and dimethyl 2,2'-azobis (2-methylpropionate) can be exemplified. The reaction concentration is in the range of 5 to 50 mass %, preferably 30 to 50 mass %. The reaction temperature is generally in the range of 10° to 150° C., preferably 30° to 120° C., and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents, and the like. Of these, it is preferred to employ a solvent containing at least an alcohol (especially methanol or the like) or water as the precipitation or re-precipitation solvent.

The amount of precipitation or re-precipitation solvent used can be determined according to intended efficiency, yield, etc. and is generally in the range of 100 to 10,000 parts by mass, preferably 200 to 2,000 parts by mass, and more preferably 300 to 1,000 parts by mass per 100 parts by mass of the polymer solution.

The temperature at which the precipitation or re-precipitation is carried out can be determined according to efficiency and operation easiness, and is generally in the range of about 0° to 50° C., and preferably about room temperature (for example, about 20° to 35° C.). The operation of precipitation or re-precipitation can be carried out by a known method such as a batch or continuous method, with the use of a common mixing vessel such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° C. to 100° C., preferably about 30° C. to 50° C. at ordinary pressure or reduced pressure (preferably at reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d), and separating the precipitated resin (step e).

A liquid immersion exposure may be carried out for the film produced from the composition of the present invention. Namely, the film may be exposed to actinic rays or radiation under the conditions that the space between the film and a lens is filled with a liquid whose refractive index is higher than that of air. Any liquid whose refractive index is higher than that of air can be employed as the immersion liquid. However, pure water is especially preferred.

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

For the attainment of further wavelength shortening, use can be made of a medium whose refractive index is 1.5 or higher. Such a medium may be either an aqueous solution or an organic solvent.

In the use of water as a liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase a surface activating power.

The additive is preferably an aliphatic alcohol with a refractive index approximately equal to that of water, for example, methyl alcohol, ethyl alcohol, isopropyl alcohol, etc. The addition of an alcohol with a refractive index approximately equal to that of water is advantageous in that even when the alcohol component is evaporated from water to cause a change of content concentration, the change of refractive index of the liquid as a whole can be minimized. On the other hand, when a substance being opaque in 193 nm rays or an impurity whose refractive index is greatly different from that of water is mixed therein, the mixing would invite a distortion of optical image projected on the resist film. Accordingly, it is preferred to use distilled water as the liquid immersion water. Furthermore, use may be made of pure water having been filtered through, for example, an ion exchange filter.

Desirably, the electrical resistance of the water is 18.3 MΩcm or higher, and the TOC (organic matter concentration) thereof is 20 ppb or below. Prior deaeration of the water is also desired.

Raising the refractive index of the liquid for liquid immersion would enable an enhancement of lithography performance. From this viewpoint, an additive suitable for refractive index increase may be added to the water. Alternatively, heavy water ($D_2O$) may be used in place of water.

For the prevention of direct contact of a film with a liquid for liquid immersion, a film that is highly insoluble in the liquid for liquid immersion (hereinafter also referred to as a "top coat") may be provided between the film formed by the composition according to the present invention and the liquid for liquid immersion. The functions to be fulfilled by the top coat are applicability to an upper layer portion of the film, transparency in radiation of especially 193 nm, and high insolubility in the liquid for liquid immersion. Preferably, the top coat does not mix with the film and is uniformly applicable to an upper layer of the film.

From the viewpoint of transparency in radiation of 193 nm, the top coat preferably consists of a polymer not abundantly containing an aromatic moiety. As such, a hydrocarbon polymer, an acrylic ester polymer, polymethacrylic acid, polyacrylic acid, polyvinyl ether, a siliconized polymer, and a fluoropolymer can be exemplified. The aforementioned hydrophobic resins (HR) also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or a separate peeling agent may be used. The peeling agent preferably consists of a solvent having low permeation into the film. Detachability by a developer containing an organic solvent or an alkali developer is preferred from the viewpoint of simultaneous attainment of the detachment step with the development processing step for the resist film.

Preferably, the refractive index difference between the top coat and the liquid for liquid immersion is nil or slight. If so, the resolving power can be enhanced. When the exposure light source is an ArF excimer laser (wavelength: 193 nm), it is preferred to use water as the liquid for liquid immersion. From the viewpoint of making the relative index be close to that of immersion liquid, the top coat preferably contains fluorine atoms. Further, from the viewpoint of transparency and refractive index, it is preferred for the top coat to be a thin film.

Preferably, the top coat does not mix with the film and also does not mix with the liquid for liquid immersion. From this viewpoint, when the liquid for liquid immersion is water, it is preferred for the solvent used in the top coat to be highly insoluble in the solvent used in the actinic ray-sensitive or radiation-sensitive resin composition and be a non-water-soluble medium. When the liquid for liquid immersion is an organic solvent, the top coat may be soluble or insoluble in water.

(f) Surfactant

The composition according to the present invention may further contain one or more surfactants. The composition according to the present invention when containing the above surfactant would, in the use of an exposure light source of 250 nm or below, especially 220 nm or below, realize favorable sensitivity and resolving power and produce a resist pattern with less adhesion and development defects.

It is especially preferred to use a fluorinated and/or siliconized surfactant as the surfactant.

As fluorinated and/or siliconized surfactants, there can be mentioned, for example, those described in section [0276] of US Patent Application Publication No. 2008/0248425. Further, as useful commercially available surfactants, fluorinated surfactants or siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and $R_{08}$ (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS) can be exemplified. Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). In particular, polymers each having a fluoroaliphatic group derived from such a fluoroaliphatic compound may be used as the surfactant. The fluorinated aliphatic compound can be synthesized by the process described in JP-A-2002-90991.

The polymer having a fluorinated aliphatic group is preferably a copolymer from a monomer having a fluorinated aliphatic group and a poly(oxyalkylene) acrylate and/or poly(oxyalkylene) methacrylate, in which copolymer may have an irregular distribution or may result from block copolymerization.

As the poly(oxyalkylene) group, a poly(oxyethylene) group, a poly(oxypropylene) group, and a poly(oxybutylene) group can be exemplified. Further, use can be made of a unit having alkylene groups of different chain lengths in a single chain, such as poly(oxyethylene-oxypropylene-oxyethylene block concatenation) or poly(oxyethylene-oxypropylene block concatenation).

Moreover, the copolymer from a monomer having a fluorinated aliphatic group and a poly(oxyalkylene) acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene) acrylates (or methacrylates), etc.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene) acrylate (or methacrylate), a copolymer from an acrylate (or methacrylate) having a $C_6F_{13}$ group, poly(oxyethylene) acrylate (or methacrylate) and poly(oxypropylene) acrylate (or methacrylate), a copolymer from an acrylate (or methacrylate) having a $C_8F_{17}$ group and a poly(oxyalkylene) acrylate (or methacrylate), a copolymer from an acrylate (or methacrylate) having a $C_8F_{17}$ group, poly(oxyethylene) acrylate (or methacrylate) and poly(oxypropylene) acrylate (or methacrylate), or the like.

Further, use may be made of surfactants other than the fluorinated and/or siliconized surfactants, described in section [0280] of US Patent Application Publication No. 2008/0248425.

These surfactants may be used either individually or in combination.

When the resist composition according to the present invention contains the surfactant, the total amount thereof used based on the total solids of the composition is preferably in the range of 0.0001 to 2 mass %, more preferably 0.0001 to 1.5 mass %, and most preferably 0.0005 to 1 mass %.

(g) Other Additive

The composition according to the present invention may further contain a dissolution inhibiting compound, a dye, a plasticizer, a photosensitizer, a light absorber, a compound capable of increasing the solubility in a developer (for example, a phenolic compound of 1000 or less molecular weight or a carboxylated alicyclic or aliphatic compound of 1000 or less molecular weight), etc.

The resist composition according to the present invention may further contain a dissolution inhibiting compound. Here the "dissolution inhibiting compound" means compound having 3000 or less molecular weight that is decomposed by the action of an acid to decrease the solubility in a developer containing an organic solvent or to increase the solubility in an alkali developer.

From the viewpoint of preventing lowering of the transmission at the wavelength of 220 nm or shorter, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure can be the same as described earlier.

When the composition according to the present invention is exposed to a KrF excimer laser or irradiated with electron beams, preferred use is made of one having a structure resulting from substitution of the phenolic hydroxy group of a phenol compound with an acid-decomposable group. The phenol compound preferably contains 1 to 9 phenol skeletons, more preferably 2 to 6 phenol skeletons.

When the composition according to the present invention contains the dissolution inhibiting compound, the total amount thereof used based on the total solids of the composition is preferably in the range of 3 to 50 mass %, and more preferably 5 to 40 mass %.

Specific examples of the dissolution inhibiting compound will be shown below.

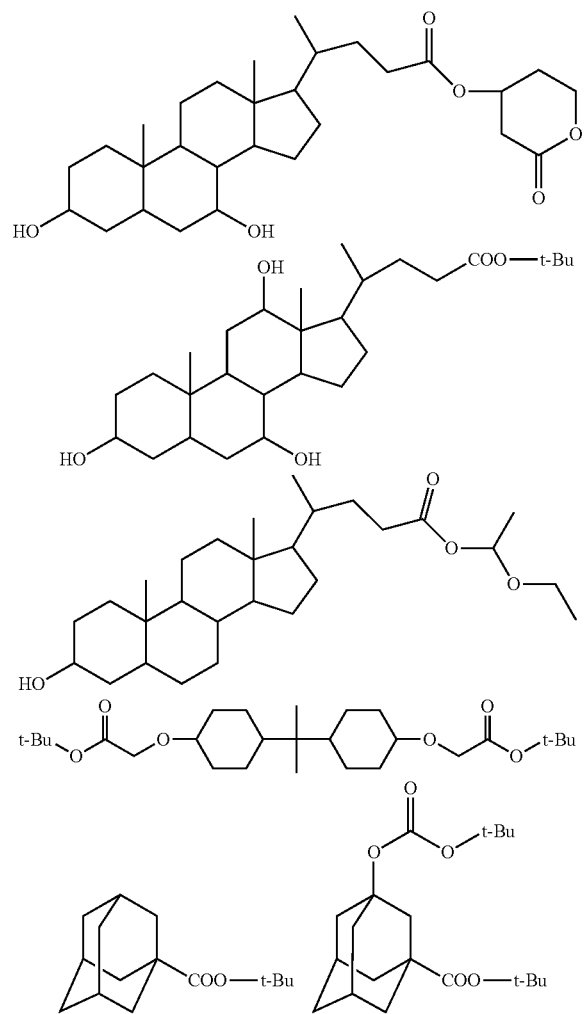

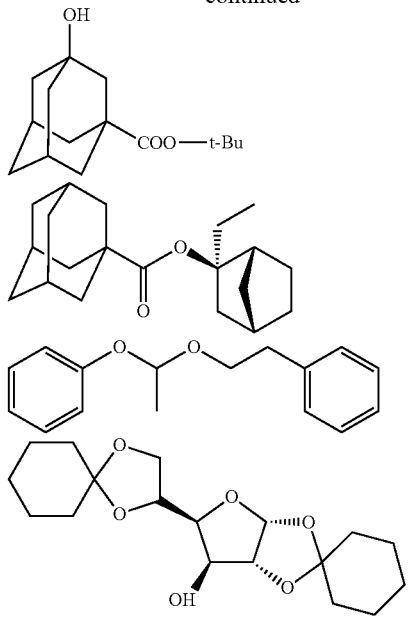

The above phenolic compound of 1000 or less molecular weight can be easily synthesized by persons of ordinary skill in the art while consulting the processes described in, for example, JP-As 4-122938 and 2-28531, U.S. Pat. No. 4,916,210, and EP 219294.

As the nonlimiting examples of the carboxylated alicyclic or aliphatic compound, a carboxylic acid derivative of steroid structure such as cholic acid, deoxycholic acid or lithocholic acid, an adamantanecarboxylic acid derivative, adamantanedicarboxylic acid, cyclohexanecarboxylic acid, and cyclohexanedicarboxylic acid can be exemplified.

<Method of Forming a Pattern>

The method of forming a pattern according to the present invention comprises (A) forming any of the above described compositions into a film, (B) exposing the film to light and (C) developing the exposed film.

The composition of the present invention as aforementioned may be used in negative development and also positive development. Namely, the development may be carried out using a developer containing an organic solvent or an alkali developer.

(Negative Development)

When the negative development is performed, The method of forming a pattern according to the present invention comprises (A) forming any of the above described resist compositions into a film, (B) exposing the film to light and (C) developing the exposed film using a developer containing an organic solvent, thereby forming a negative pattern. This method may further comprise (D) rinsing the negative pattern by use of a rinse liquid.

The method preferably comprises a prebake (PB) operation performed after the film formation but before the exposure operation. The method also preferably comprises a post-exposure bake (PEB) operation performed after the exposure operation but before the development operation.

In both the PB operation and the PEB operation, the baking is preferably performed at 40 to 130° C., more preferably 50 to 120° C. and further more preferably 60 to 110° C. The exposure latitude (EL) and resolving power can be markedly enhanced by carrying out the PEB operation at low temperatures ranging from 60 to 90° C.

The baking time is preferably in the range of 30 to 300 seconds, more preferably 30 to 180 seconds, and further more preferably 30 to 90 seconds.

In the method of forming a pattern according to the present invention, the operation of forming a film of the composition on a substrate, the operation of exposing the film to light, the baking operation and the developing operation can be carried out using generally known techniques.

The light source for use in the above exposure is not limited. As such, there can be mentioned, for example, a KrF excimer laser (wavelength: 248 nm), an ArF excimer laser (wavelength: 193 nm), an $F_2$ excimer laser (wavelength: 157 nm), an EUV exposure apparatus (wavelength: 13 nm), and an electron beam exposure apparatus. Note that, in this specification, examples of "light" include an electron beam.

In the exposure of the film formed from the composition of the present invention, a liquid immersion exposure may be carried out. The resolution can be enhanced by the liquid immersion exposure. Any liquid with a refractive index higher than that of air can be employed as the immersion medium. Preferably, pure water is employed.

In the liquid immersion exposure, the above-mentioned hydrophobic resin may be added to the composition in advance. Alternatively, the formation of the film may be followed by providing thereon a film that is highly insoluble in the immersion liquid (hereinafter also referred to as a "top coat"). The expected performance of the top coat, the method of using the same, etc. are described in Chapter 7 of "Process and Material of Liquid Immersion Lithography" published by CMC Publishing Co., Ltd.

From the viewpoint of the transparency to a laser of 193 nm wavelength, the top coat is preferably formed of a polymer not abundantly containing an aromatic moiety. As such a polymer, there can be mentioned, for example, a hydrocarbon polymer, an acrylic ester polymer, polymethacrylic acid, polyacrylic acid, polyvinyl ether, a siliconized polymer or a fluoropolymer. Any of the above-mentioned hydrophobic resins can be appropriately used as the top coat, and commercially available top coat materials can also be appropriately used.

At the detachment of the top coat after the exposure, use may be made of a developer. Alternatively, a separate peeling agent may be used. The peeling agent is preferably a solvent exhibiting less permeation into the film. Detachability by a developer is preferred from the viewpoint of simultaneously performing the detachment operation and the operation of film development processing.

The substrate for film formation in the present invention is not particularly limited. Use can be made of substrates commonly employed in a semiconductor production process for an IC or the like, a circuit board production process for a liquid crystal, a thermal head or the like and other photoapplication lithography processes. As such substrates, there can be mentioned, for example, inorganic substrates of silicon, SiN, $SiO_2$ and the like, and coated inorganic substrates, such as SOG. Further, according to necessity, an organic antireflection film may be provided between the film and the substrate.

As the developers containing an organic solvent, there can be mentioned, for example, developers containing a polar solvent, such as a ketone solvent, an ester solvent, an alcohol solvent, an amide solvent or an ether solvent, and a hydrocarbon solvent.

As the ketone solvent, there can be mentioned, for example, 1-octanone, 2-octanone, 1-nonanone, 2-nonanone, acetone, methyl amyl ketone (MAK, 2-heptanone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone or propylene carbonate.

As the ester solvent, there can be mentioned, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate (EEP), 3-methoxybutyl acetate, 3-methyl-3-methoxybutyl acetate, methyl formate, ethyl formate, butyl formate, propyl formate, ethyl lactate, butyl lactate, propyl lactate, methyl propionate, ethyl propionate or propyl propionate. In particular, acetic acid alkyl esters, such as methyl acetate, butyl acetate, ethyl acetate, isopropyl acetate and amyl acetate, and propionic acid alkyl esters, such as methyl propionate, ethyl propionate and propyl propionate, are preferred.

As the alcohol solvent, there can be mentioned, for example, an alcohol, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol, such as ethylene glycol, diethylene glycol or triethylene glycol; or a glycol ether, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol.

As the ether solvent, there can be mentioned, for example, not only any of the above-mentioned glycol ethers but also dioxane, tetrahydrofuran or the like.

As the amide solvent, there can be mentioned, for example, N-methyl-2-pyrrolidone, N,N-dimethylacetamide, N,N-dimethylformamide, hexamethylphosphoric triamide or 1,3-dimethyl-2-imidazolidinone.

As the hydrocarbon solvent, there can be mentioned, for example, an aromatic hydrocarbon solvent, such as toluene or xylene, or an aliphatic hydrocarbon solvent, such as pentane, hexane, octane or decane.

Two or more of these solvents may be mixed together before use. Alternatively, each of the solvents may be used in a mixture with a solvent other than those mentioned above and/or water within a proportion not detrimental to full exertion of performance. The water content of the whole developer is preferably below 10 mass %. More preferably, the developer contains substantially no water. Namely, it is preferred for the developer to consist substantially only of an organic solvent. Even if so, the developer can contain any of surfactants to be described hereinafter. Also, even if so, the developer may contain unavoidable impurities from the atmosphere.

The amount of organic solvent used in the developer is preferably in the range of 80 to 100 mass %, more preferably 90 to 100 mass % and further more preferably 95 to 100 mass % based on the whole amount of the developer.

It is especially preferred for the organic solvent contained in the developer to be at least one member selected from among a ketone solvent, an ester solvent, an alcohol solvent, an amide solvent and an ether solvent.

The vapor pressure of the developer containing an organic solvent at 20° C. is preferably 5 kPa or below, more preferably 3 kPa or below and most preferably 2 kPa or below. When the vapor pressure of the developer is 5 kPa or below, the evaporation of the developer on the substrate or in a development cup can be suppressed so that the temperature uniformity within the plane of the wafer can be enhanced to thereby improve the dimensional uniformity within the plane of the wafer.

As particular examples of the developers exhibiting a vapor pressure of 5 kPa or below, there can be mentioned a ketone solvent, such as 1-octanone, 2-octanone, 1-nonanone, 2-nonanone, methyl amyl ketone (MAK: 2-heptanone), 4-heptanone, 2-hexanone, diisobutyl ketone, cyclohexanone, methylcyclohexanone, phenylacetone or methyl isobutyl ketone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, butyl formate, propyl formate, ethyl lactate, butyl lactate or propyl lactate; an alcohol solvent, such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an ether solvent, such as tetrahydrofuran; an amide solvent, such as N-methyl-2-pyrrolidone, N,N-dimethylacetamide or N,N-dimethylformamide; an aromatic hydrocarbon solvent, such as toluene or xylene, and an aliphatic hydrocarbon solvent, such as octane or decane.

As particular examples of the developers exhibiting a vapor pressure of 2 kPa or below, there can be mentioned a ketone solvent, such as 1-octanone, 2-octanone, 1-nonanone, 2-nonanone, methyl amyl ketone (MAK: 2-heptanone), 4-heptanone, 2-hexanone, diisobutyl ketone, cyclohexanone, methylcyclohexanone or phenylacetone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate,3-methyl-3-methoxybutyl acetate, ethyl lactate, butyl lactate or propyl lactate; an alcohol solvent, such as n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an amide solvent, such as N-methyl-2-pyrrolidone, N,N-dimethylacetamide or N,N-dimethylformamide; an aromatic hydrocarbon solvent, such as xylene, and an aliphatic hydrocarbon solvent, such as octane or decane.

According to necessity, an appropriate amount of surfactant can be added to the developer.

The surfactant is not particularly limited. For example, use can be made of any of ionic and nonionic fluorinated and/or siliconized surfactants. As such fluorinated and/or siliconized surfactants, there can be mentioned, for example, those described in JP-A's S62-36663, S61-226746, S61-226745, S62-170950, S63-34540, H7-230165, H8-62834, H9-54432 and H9-5988 and U.S. Pat. Nos. 5,405,720, 5,360,692, 5,529,881, 5,296,330, 5,436,098, 5,576,143, 5,294,511 and 5,824,451. Nonionic surfactants are preferred. Using a nonionic fluorinated surfactant or siliconized surfactant is more preferred.

The amount of surfactant used is generally in the range of 0.001 to 5 mass %, preferably 0.005 to 2 mass % and further more preferably 0.01 to 0.5 mass % based on the whole amount of the developer.

As the development method, use can be made of, for example, a method in which the substrate is dipped in a tank filled with a developer for a given period of time (dip method), a method in which a developer is puddled on the surface of the substrate by its surface tension and allowed to stand still for a given period of time to thereby effect development (puddle method), a method in which a developer is sprayed onto the surface of the substrate (spray method), or a method in which a developer is continuously discharged onto the substrate being rotated at a given speed while scanning a developer discharge nozzle at a given speed (dynamic dispense method).

With respect to the above various development methods, when the operation of discharging a developer toward a resist film through a development nozzle of a development apparatus is included, the discharge pressure of discharged developer (flow rate per area of discharged developer) is preferably 2 mL/sec/mm$^2$ or below, more preferably 1.5 mL/sec/mm$^2$ or below and further more preferably 1 mL/sec/mm$^2$ or below. There is no particular lower limit of the flow rate. However, from the viewpoint of through-put, it is preferred for the flow rate to be 0.2 mL/sec/mm$^2$ or higher.

Pattern defects attributed to any resist residue after development can be markedly reduced by regulating the discharge pressure of discharged developer so as to fall within the above range.

The detail of the mechanism thereof is not apparent. However, it is presumed that regulating the discharge pressure so as to fall within the above range would lower the pressure of the developer on the resist film, thereby inhibiting inadvertent shaving or crumbling of the resist film and/or resist pattern.

The discharge pressure of developer (mL/sec/mm$^2$) refers to a value at the outlet of the development nozzle of the development apparatus.

For the regulation of the discharge pressure of developer, there can be employed, for example, a method in which the discharge pressure is regulated using a pump or the like, or a method in which the discharge pressure is changed through pressure regulation by supply from a pressure tank.

The development operation may be followed by the operation of discontinuing the development by replacement with a different solvent.

It is preferred for the method of forming a pattern according to the present invention to include a rinse operation (operation of rinsing the film with a rinse liquid containing an organic solvent) to be conducted after the development operation.

The rinse liquid for use in the rinse operation is not particularly limited as long as it does not dissolve the pattern after development, and solutions containing common organic solvents can be used.

As the rinse liquid, there can be mentioned, for example, one containing at least one organic solvent selected from among a hydrocarbon solvent, a ketone solvent, an ester solvent, an alcohol solvent, an amide solvent and an ether solvent. It is preferred for the rinse liquid to be one containing at least one organic solvent selected from among a ketone solvent, an ester solvent, an alcohol solvent and an amide solvent. A rinse liquid containing an alcohol solvent or an ester solvent is more preferred.

The rinse liquid further more preferably contains a monohydric alcohol, most preferably a monohydric alcohol having 5 or more carbon atoms.

The monohydric alcohol may be in the form of a linear chain, a branched chain or a ring. Particular examples of the monohydric alcohols include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. Particular examples of the monohydric alcohols each having 5 or more carbon atoms include 1-hexanol, 2-hexanol, 4-methyl-2-pentanol, 1-pentanol and 3-methyl-1-butanol.

Two or more of these components may be mixed together before use. Also, they may be mixed with other organic solvents before use.

The water content of the rinse liquid is preferably below 10 mass %, more preferably below 5 mass % and further more preferably below 3 mass %. Namely, the amount of organic solvent used in the rinse liquid is preferably in the range of 90 to 100 mass %, more preferably 95 to 100 mass % and most preferably 97 to 100 mass % based on the whole amount of the rinse liquid. Favorable development performance can be attained by controlling the water content of the rinse liquid at below 10 mass %.

The vapor pressure of the rinse liquid at 20° C. is preferably in the range of 0.05 to 5 kPa, more preferably 0.1 to 5 kPa and further more preferably 0.12 to 3 kPa. When the vapor pressure of the rinse liquid is in the range of 0.05 to 5 kPa, not only can the temperature uniformity within the plane of the wafer be enhanced but also the swell attributed to the penetration of the rinse liquid can be suppressed to thereby improve the dimensional uniformity within the plane of the wafer.

An appropriate amount of surfactant may be added to the rinse liquid.

In the rinse operation, the wafer having undergone the development is rinsed using the above rinse liquid. The method of rinse treatment is not particularly limited. For example, use can be made of any of a method in which the rinse liquid is continuously applied onto the substrate being rotated at a given speed (spin application method), a method in which the substrate is dipped in a tank filled with the rinse liquid for a given period of time (dip method) and a method in which the rinse liquid is sprayed onto the surface of the substrate (spray method). Preferably, the rinse treatment is carried out according to the spin application method, and thereafter the substrate is rotated at a rotating speed of 2000 to 4000 rpm to thereby remove the rinse liquid from the top of the substrate.

The method of forming a pattern according to the present invention may include the operation of developing with an alkali developer (positive pattern forming operation) in addition to the operation of developing with a developer containing an organic solvent. The order of the operation of developing with an alkali developer and operation of developing with a developer containing an organic solvent is not particularly limited. However, it is preferred to carry out the development with an alkali developer before the development with a developer containing an organic solvent. The operation of baking is preferably conducted before each of the development operations.

The type of the alkali developer is not particularly limited. However, an aqueous solution of tetramethylammonium hydroxide is generally used. An appropriate amount of alcohol and/or surfactant may be added to the alkali developer.

The alkali concentration of the alkali developer is generally in the range of 0.1 to 20 mass %. The pH value of the alkali developer is generally in the range of 10.0 to 15.0. It is especially preferred to use a 2.38 mass % aqueous tetramethylammonium hydroxide solution as the alkali developer.

When a rinse treatment is conducted after the development using an alkali developer, typically, pure water is used as the rinse liquid. An appropriate amount of surfactant may be added to the rinse liquid.

(Positive Development)

When a positive development is carried out, the method of forming a pattern according to the present invention comprises (A') forming any of the above described compositions into a film, (B') exposing the film to light and (C') developing the exposed film with an alkali developer. This method may further comprise (D') rinsing the developed film by use of a rinse liquid.

Generally, an aqueous solution of any of quaternary ammonium salts, a typical example thereof being tetramethylammonium hydroxide, is employed as the alkali developer for use in the development operation. However, other aqueous alkali solutions of an inorganic alkali, a primary amine, a secondary amine, a tertiary amine, an alcoholamine, a cycloamine, etc. can also be employed. An appropriate amount of alcohol and/or surfactant may be added to the alkali developer.

The alkali concentration of the alkali developer is generally in the range of 0.1 to 20 mass %. The pH value of the alkali developer is generally in the range of 10.0 to 15.0.

Pure water is used as the rinse liquid. An appropriate amount of surfactant may be added to the rinse liquid before use. The development operation or rinse operation may be followed by the operation for removing any portion of developer or rinse liquid adhering onto the pattern by use of a supercritical fluid.

EXAMPLE

The present invention will now be described in greater detail with reference to Examples, which however in no way limit the scope of the present invention.

<Acid-Decomposable Resin>

The following resins (P-1) to (P-8) were synthesized in the following manner. Further, a resin (CA-1) was provided.

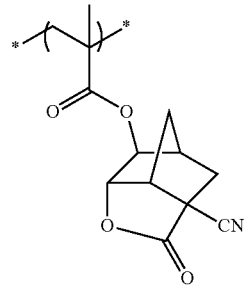

P-1

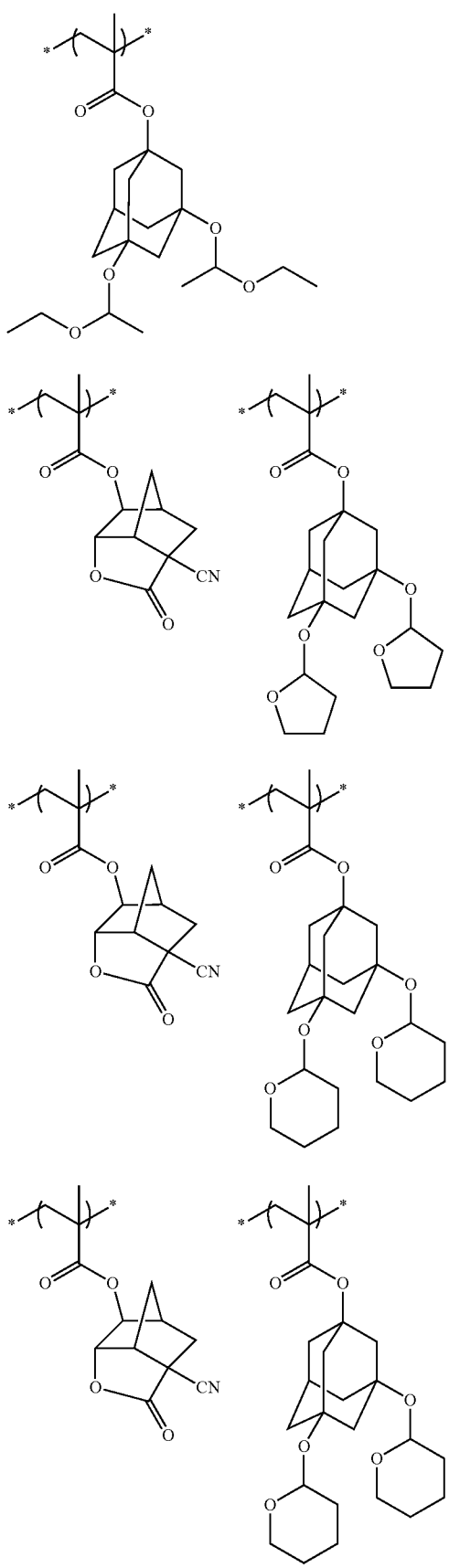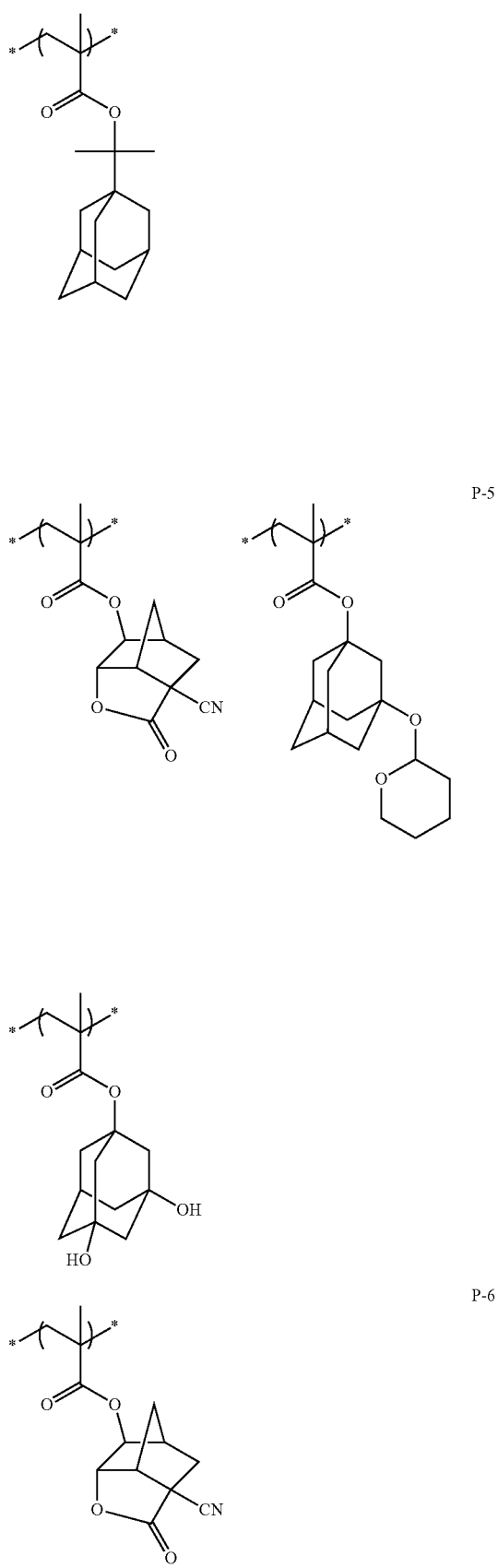

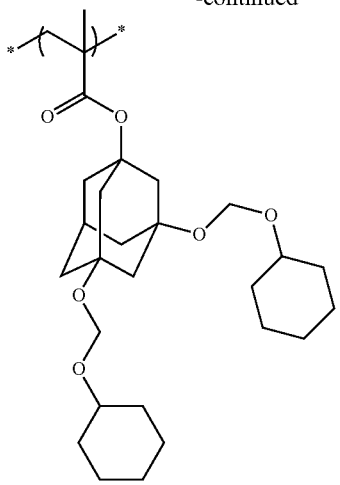
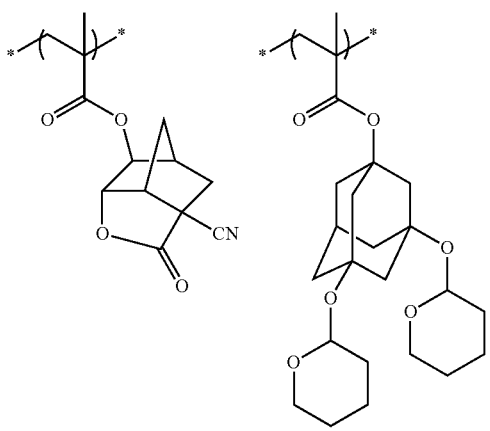
P-7
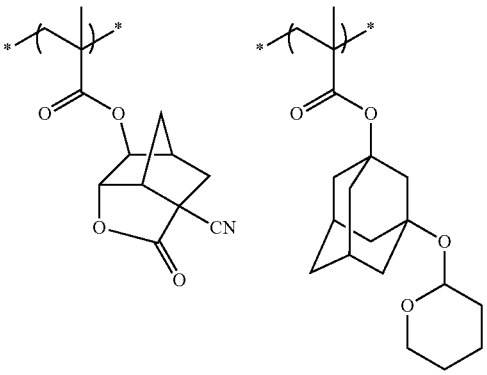
P-8
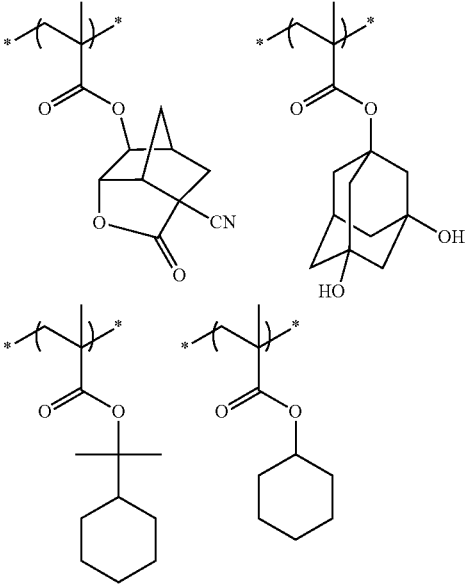
CP-1
With respect to each of these resins, the weight average molecular weight, the molecular weight dispersity (Mw/Mn), and the component ratio are summarized in Table 3 below.
TABLE 3
| No. | Mw | Mw/Mn | Molar Ratio | | |
|---|---|---|---|---|---|
| P-1 | 9800 | 1.76 | 40 | 60 | |
| P-2 | 11300 | 1.82 | 50 | 50 | |
| P-3 | 9500 | 1.75 | 40 | 60 | |
| P-4 | 7300 | 1.83 | 40 | 50 | 10 |
| P-5 | 8800 | 1.79 | 10 | 70 | 20 |
| P-6 | 7800 | 1.82 | 55 | 45 | |
| P-7 | 11500 | 1.84 | 40 | 30 | 30 |

TABLE 3-continued

| No. | Mw | Mw/Mn | Molar Ratio | | | |
|---|---|---|---|---|---|---|
| P-8 | 9700 | 1.78 | 40 | 45 | 15 | |
| CP-1 | 10200 | 1.80 | 30 | 20 | 40 | 10 |

[Synthetic Example of an Acid-Decomposable Resin]

In a nitrogen stream, 200 g of cyclohexanone was placed in a three-necked flask, and heated at 80° C. Thus, a solvent 1 was obtained. Separately, the following monomer-1 (29.7 g) and monomer-2 (71.4 g) were dissolved in cyclohexanone (372 g), thereby obtaining a monomer solution. Further, a polymerization initiator V601 (produced by Wako Pure Chemical Industries, Ltd.) was added in an amount of 6.6 mol % based on the total amount of monomers to the solution and dissolved therein. The thus obtained solution was dropped into the solvent 1 over a period of six hours. After the completion of the dropping, reaction was continued at 80° C. for two hours. The reaction liquid was allowed to cool, and dropped into a liquid mixture of 7736 g of heptane and 859 g of ethyl acetate. The thus precipitated powder was collected by filtration and dried. Thus, 73 g of resin (P-1) was obtained. With respect to the thus obtained resin (P-1), the weight average molecular weight was 9800, the molecular weight dispersity (Mw/Mn) 1.76 and the component ratio determined by $^{13}$C-NMR 40:60.

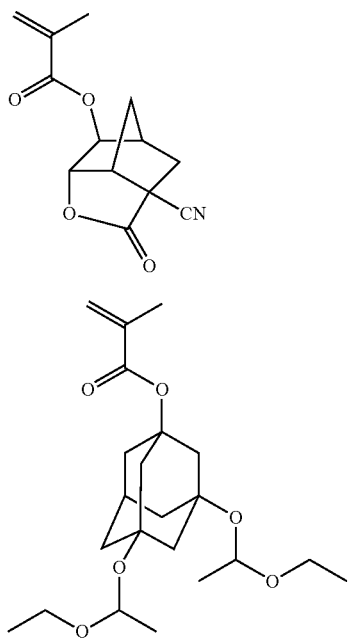

monomer-1 monomer-2

The resins (P-2) to (P-8) were synthesized in the same manner as for the resin (P-1). The weight average molecular weight, the molecular weight dispersity (Mw/Mn), and the component ratio thereof were as shown in Table 3 above.

<Acid Generator>

The aforementioned compounds (b-1) to (B-14) and the following compounds (Cb-1) to (Cb-3) were synthesized by the method shown below.

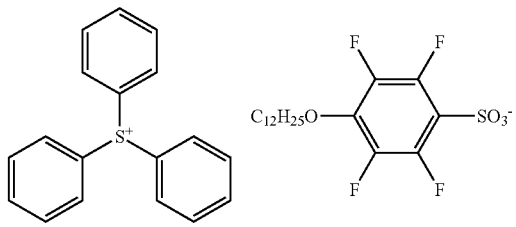

(Cb-1)

pKa-1.87

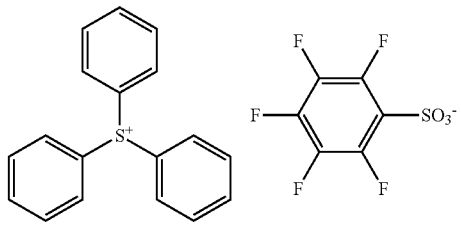

(Cb-2)

pKa-2.20

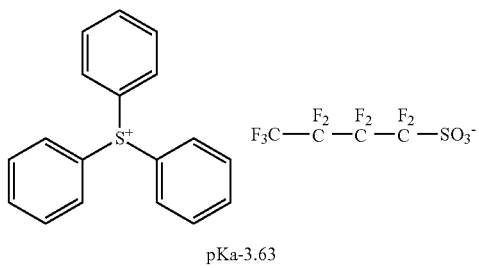

(Cb-3)

pKa-3.63

[Synthetic Example of an Acid Generator]

A mixture of 7.52 g (30 mmol) of (+)-camphorsulfonyl chloride, 3.42 g (36 mmol) of methanesulfonamide, 0.18 g (1.5 mmol) of dimethylaminopyridine and 30 ml of dimethylacetamide was cooled with ice, and 7.29 g (72 mmol) of triethylamine was dropped into the mixture over a period of 10 minutes. The mixture was agitated while cooling with ice for an hour, and further agitated at room temperature for 3 hours. Thereafter, 200 ml of ethyl acetate and 200 ml of 1N aqueous hydrochloric acid were added to the mixture, and a liquid separating operation was carried out. Thus, a water phase was obtained. The water phase was neutralized by adding 30 g of sodium bicarbonate. A mixture of 10.30 g (30 mmol) of triphenylsulfonium bromide and 200 ml of methanol was added to the neutralized water phase, and agitated at room temperature for 2 hours. The solvent was distilled off, and 200 ml of chloroform was added to the residue. The thus obtained organic phase was washed with water, and the solvent was removed. The residue was washed with a mixture of 100 ml of butyl acetate and 100 ml of hexane. The thus obtained crystal was collected by filtration and dried, thereby obtaining a white-solid desired compound (B-7) (10.1 g).

$^1$H-NMR (400 MHz in (CD$_3$)$_2$CO): δ (ppm)=0.82 (s, 3H), 1.15 (s, 3H), 1.22-1.32 (m, 1H), 1.58-1.69 (m, 1H), 1.81 (d, 18.4 Hz, 1H), 1.90-2.05 (m, 2H), 2.22-2.32 (m, 1H), 2.75-2.85 (m, 1H), 2.99 (s, 3H), 3.38 (d, 14.8 Hz, 1H), 3.54 (d, 14.8 Hz, 1H), 7.64-7.86 (m, 15H).

Other acid generators were synthesized in the same way.

<Basic Compound>

The following compounds (N-1) to (N-8) were provided as the basic compounds.

<Hydrophobic Resin>

The aforementioned resins (HR-1) to (HR-90) were employed as the hydrophobic resin.

<Surfactant>

The following surfactants were provided.

W-1: Megafac F176 (produced by Dainippon Ink & Chemicals, Inc., fluorinated);

W-2: Megafac $R_{08}$ (produced by Dainippon Ink & Chemicals, Inc., fluorinated and siliconized); and W-3: polysiloxane polymer KP-341 (produced by Shin-Etsu Chemical Co., Ltd., siliconized).

W-4: W-4: Troy Sol S-366 (produced by Troy Chemical Co., Ltd.),

W-5: KH-20 (produced by Asahi Kasei Corporation), and

W-6: PolyFox PF-6320 (produced by OMNOVA SOLUTIONS, INC., fluorinated).

<Solvent>

The following solvents were provided.

(Group a)

SL-1: propylene glycol monomethyl ether acetate,

SL-2: propylene glycol monomethyl ether propionate, and

SL-3: 2-heptanone.

(Group b)

SL-4: ethyl lactate,

SL-5: propylene glycol monomethyl ether, and

SL-6: cyclohexanone.

(Group c)

SL-7: γ-butyrolactone, and

SL-8: propylene carbonate.

<Negative Development>

(Preparation of Resist)

Resist compositions were prepared by dissolving individual components indicated in Table 4 below in solvents indicated in the table to a solid content of 3.5 wt. % and passing each of the solutions through a polyethylene filter of 0.03 μm pore size. Separately, an organic antireflection film ARC29SR (produced by Nissan Chemical Industries, Ltd.) was applied onto a silicon wafer and baked at 205° C. for 60 seconds, thereby forming a 95 nm-thick antireflection film. Each of the prepared resist compositions was applied thereonto and baked (PB) at 100° C. for 60 seconds, thereby forming a 100 nm-thick resist film.

Each of the resultant wafers was patternwise exposed through an exposure mask (line/space=binary mask 60 nm/60 nm) by means of an ArF excimer laser liquid-immersion scanner (manufactured by ASML, XT1700i, NA 1.20, C-Quad, outer sigma 0.981, inner sigma 0.895, XY deflection). Ultrapure water was used as the immersion liquid. Thereafter, the exposed wafer was baked at 100° C. for 60 seconds (PEB). The baked wafer was developed by puddling a developer (butyl acetate) for 30 seconds and, while spinning off the developer, rinsed by puddling a rinse liquid (4-methyl-2-pentanol) for 30 seconds. The rinsed wafer was rotated at a rotating speed of 4000 rpm for 30 seconds and baked at 90° C. for 60 seconds. Thus, a 60 nm (1:1) line-and-space resist pattern was obtained.

(Evaluation of Resist)

[Sensitivity (Eopt)]

Each of the obtained patterns was observed by means of a scanning electron microscope (SEM model S-9380II manufactured by Hitachi, Ltd.). The sensitivity (Eopt) was defined as the exposure energy in which a 60 nm (1:1) line-and-space resist pattern was resolved. The smaller this sensitivity value, the higher the sensitivity.

[PED Stability]

The width of the line at the bottom portion of the pattern formed with 0-hour PED was measured and denoted as $X_0$. On the other hand, the width of the line at the bottom portion of the pattern formed with 1-hour PED, namely, formed through allowing the wafer to stand still for an hour in a clean room after exposure was measured and denoted as $X_1$. The ratio of line width change expressed by the following formula was calculated. The closer to 0 the numeric value, the higher the PED stability.

$$\frac{X_0}{X_1} \times 100(\%) - 100(\%) = \text{The ratio of line width change (\%)}$$

[Resolving Power (Pre-Bridge Dimension)]

With respect to a 60 nm (1:1) line-and-space resist pattern under the optimum focus, while changing the exposure amount, the minimum space dimension free of any bridge defect was observed. The smaller the value, the less the occurrence of the bridge defect, thus, the better the performance.

[Etching rate (nm/sec)]

Each of the obtained patterns was etched using 1000 ml/min of Ar gas, 20 ml/min of $C_4F_6$ gas and 40 ml/min of $O_2$ gas. The etching rate was defined as the film thickness decreased per second. The smaller the value, the higher the etching resistance.

The obtained evaluation results are given in Table 4 below.

TABLE 4

| | Acid-decomposable resin | (g) | Acid generator | (g) | Hydrophobic resin | (g) | Basic compound | (g) | Surfactant | Solvent | (mass ratio) |
|---|---|---|---|---|---|---|---|---|---|---|---|
| Ex. | | | | | | | | | | | |
| 1 | P-3 | 10 | b-1 | 0.9 | HR-3 | 0.06 | N-1 | 0.15 | W-2 | SL-1/SL-5 | 60/40 |
| 2 | P-4 | 10 | b-2 | 1 | HR-24 | 0.06 | N-2 | 0.15 | W-3 | SL-1/SL-5 | 60/40 |
| 3 | P-7 | 10 | b-3 | 1.2 | HR-9 | 0.06 | N-3 | 0.15 | W-1 | SL-1/SL-5 | 60/40 |
| 4 | P-6 | 10 | b-4 | 0.8 | HR-26 | 0.06 | N-4 | 0.15 | W-4 | SL-1/SL-5 | 80/20 |
| 5 | P-6 | 10 | b-5 | 1 | HR-24 | 0.06 | N-5 | 0.15 | W-5 | SL-7/SL-5 | 70/30 |
| 6 | P-4 | 10 | b-6 | 0.8 | HR-3 | 0.06 | N-6 | 0.15 | W-6 | SL-1 | 100 |
| 7 | P-3 | 10 | b-7 | 1 | HR-24 | 0.06 | N-7 | 0.15 | W-2 | SL-6/SL-5 | 70/30 |
| 8 | P-5 | 10 | b-8 | 1 | HR-9 | 0.06 | N-8 | 0.15 | W-3 | SL-1/SL-5 | 60/40 |
| 9 | P-3 | 10 | b-9 | 1.2 | HR-26 | 0.06 | N-1 | 0.15 | W-1 | SL-1/SL-5 | 60/40 |
| 10 | P-4 | 10 | b-10 | 0.9 | HR-9 | 0.06 | N-3 | 0.15 | W-4 | SL-1/SL-5 | 60/40 |
| 11 | P-4 | 10 | b-11 | 0.8 | HR-3 | 0.06 | N-5 | 0.15 | W-5 | SL-1/SL-5 | 70/30 |
| 12 | P-3 | 10 | b-12 | 1 | HR-24 | 0.06 | N-7 | 0.15 | W-6 | SL-1/SL-5 | 70/30 |
| 13 | P-1 | 10 | b-13 | 1 | HR-9 | 0.06 | N-2 | 0.15 | W-2 | SL-1/SL-5 | 70/30 |
| 14 | P-2 | 10 | b-14 | 1 | HR-26 | 0.06 | N-4 | 0.15 | W-3 | SL-1/SL-5 | 60/40 |
| 15 | P-3/P-6 | 5/5 | b-1 | 1 | HR-3 | 0.06 | N-6 | 0.15 | W-1 | SL-1/SL-5 | 60/40 |
| 16 | P-4 | 10 | b-3/b-12 | 0.6/0.4 | HR-24 | 0.06 | N-8 | 0.15 | W-4 | SL-1 | 100 |
| 17 | P-3 | 10 | b-7 | 1 | HR-83/HR-24 | 0.06 | N-3 | 0.15 | W-5 | SL-1/SL-5 | 80/20 |
| 18 | P-5 | 10 | b-8 | 0.8 | HR-9 | 0.06 | N-3/N-7 | 0.08/0.07 | W-6 | SL-6/SL-5 | 80/20 |
| 19 | P-2 | 10 | b-14 | 0.9 | HR-3 | 0.06 | N-4 | 0.15 | W-2/W-3 | SL-1/SL-5 | 70/30 |
| 20 | P-8 | 10 | b-2 | 0.8 | HR-3 | 0.06 | N-4 | 0.15 | W-2 | SL-1/SL-5 | 70/30 |
| Comp. Ex. | | | | | | | | | | | |
| 1 | CP-1 | 10 | b-5 | 1 | HR-24 | 0.06 | N-5 | 0.15 | W-3 | SL-6/SL-5 | 80/20 |
| 2 | CP-1 | 10 | Cb-3 | 1 | HR-3 | 0.06 | N-6 | 0.15 | W-6 | SL-1/SL-5 | 60/40 |

| | Sensitivity [mJ/cm$^2$] | PED stability [%] | Pre-bridge dimension [nm] | pKa of generated acid | Etching rate [nm/sec] |
|---|---|---|---|---|---|
| Ex. | | | | | |
| 1 | 28.4 | −2 | 28 | −0.60 | 7.4 |
| 2 | 31.0 | −1 | 29 | −0.20 | 7.3 |
| 3 | 29.2 | 1 | 30 | 0.27 | 7.6 |
| 4 | 30.5 | 3 | 28 | −0.95 | 7.7 |
| 5 | 25.3 | −2 | 32 | −1.45 | 7.5 |
| 6 | 27.7 | 3 | 31 | −0.31 | 7.4 |
| 7 | 27.5 | 2 | 28 | −0.42 | 7.6 |
| 8 | 30.1 | 1 | 30 | −0.20 | 7.7 |
| 9 | 28.8 | −1 | 29 | −0.20 | 7.3 |
| 10 | 26.9 | 3 | 30 | −0.63 | 7.5 |
| 11 | 25.6 | 2 | 28 | −0.57 | 7.6 |
| 12 | 29.8 | 0 | 31 | 0.21 | 7.4 |
| 13 | 30.9 | 3 | 30 | 3.04 | 7.7 |
| 14 | 32.0 | 2 | 31 | 1.92 | 7.5 |
| 15 | 27.4 | 2 | 29 | −0.60 | 7.5 |

TABLE 4-continued

| | | | | | |
|---|---|---|---|---|---|
| 16 | 30.1 | −1 | 29 | 0.27/0.21 | 7.6 |
| 17 | 28.6 | 2 | 28 | −0.42 | 7.4 |
| 18 | 29.1 | 1 | 30 | −0.20 | 7.6 |
| 19 | 31.9 | 1 | 30 | 1.92 | 7.5 |
| 20 | 41.8 | 3 | 27 | −0.20 | 7.6 |
| Comp. Ex. | | | | | |
| 1 | 78.5 | 2 | 28 | −1.45 | 8.3 |
| 2 | 35.2 | 2 | 43 | −3.63 | 8.2 |

As apparent from the results of Table 4, the compositions of the working examples excelled in the sensitivity, PED stability, resolving power (pre-bridge dimension) and etching resistance as compared with those of the compositions of Comparative Examples.

<Positive Development>
(Preparation of Resist)

Resist compositions were prepared by dissolving individual components indicated in Table 5 below in solvents indicated in the table to a solid content of 3.5 wt. % and passing each of the solutions through a polyethylene filter of 0.03 μm pore size.

Resist patterns were obtained in the same manner as described above except that an aqueous solution of tetramethylammonium hydroxide (2.38 mass %) was used as the developer and that pure water was used as the rinse liquid.

(Evaluation of Resist)
[Sensitivity (Eopt)]
The sensitivity was evaluated in the same manner as described above.
[PED Stability]
The PED stability was evaluated in the same manner as described above.

The obtained evaluation results are given in Table 5 below.

As apparent from the results of Table 5, the compositions of the working examples excelled in the sensitivity and PED stability as compared with those of the compositions of Comparative Examples.

As described above, the composition and the method of forming a pattern according to the present invention makes it possible to obtain an excellent resist pattern. The composition and the method thus ensure manufacturing of a semiconductor device which can show an excellent performance.

The invention claimed is:

1. An actinic-ray- or radiation-sensitive resin composition, comprising:
   a resin containing a repeating unit containing a group that is decomposed when acted on by an acid to thereby produce an alcoholic hydroxyl group, and
   a compound that generates an acid of pKa≥−1.5 when exposed to actinic rays or radiation,
   wherein
   the group that is decomposed when acted on by an acid to thereby produce an alcoholic hydroxyl group is expressed by at least one selected from the group consisting of general formulae (II-1) to (II-4) below,
   the resin contains no fluorine atom, and

TABLE 5

| | Acid-decomposable resin | Acid (g) generator | Hydrophobic (g) resin | Basic (g) compound | (g) | Surfactant | Solvent | (mass ratio) |
|---|---|---|---|---|---|---|---|---|
| Ex. | | | | | | | | |
| 1 | P-3 | 10 B-1 | 0.9 HR-3 | 0.06 N-1 | 0.15 | W-2 | SL-1/SL-5 | 60/40 |
| 2 | P-4 | 10 B-2 | 1 HR-24 | 0.06 N-2 | 0.15 | W-3 | SL-1/SL-5 | 60/40 |
| 3 | P-3 | 10 B-7 | 1 HR-24 | 0.06 N-7 | 0.15 | W-2 | SL-6/SL-5 | 70/30 |
| Comp. Ex. | | | | | | | | |
| 1 | CP-1 | 10 B-5 | 1 HR-24 | 0.06 N-5 | 0.15 | W-3 | SL-6/SL-5 | 80/20 |
| 2 | P-1 | 10 CB-1 | 1.2 HR-9 | 0.06 N-2 | 0.15 | W-1 | SL-1/SL-5 | 80/20 |

| | Sensitivity [mJ/cm$^2$] | PED stability [%] | pKa of generated acid |
|---|---|---|---|
| Ex. | | | |
| 1 | 29.8 | −2 | −0.60 |
| 2 | 32.7 | −1 | −0.20 |
| 3 | 28.5 | 2 | −0.42 |
| Comp. Ex. | | | |
| 1 | 81.7 | 2 | −1.45 |
| 2 | 29.5 | 8 | −1.87 | the acid of pKa≥−1.5 generated by the compound is at least one member selected from the group consisting of a carboxylic acid, an imidic acid, and a methide acid,

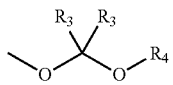  (II-1)

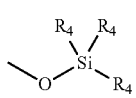  (II-2)

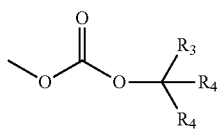  (II-3)

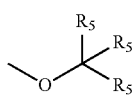  (II-4)

in which $R_3$, or each of $R_3$s independently, represents a hydrogen atom or a monovalent organic group, provided that two $R_3$s may be bonded to each other to thereby form a ring;

$R_4$, or each of $R_4$s independently, represents a monovalent organic group, provided that at least two $R_4$s may be bonded to each other to thereby form a ring and that $R_3$ and $R_4$ may be bonded to each other to thereby form a ring; and each of $R_5$s independently represents a hydrogen atom, an alkyl group, a cycloalkyl group, an aryl group, an alkenyl group or an alkynyl group, provided that at least two $R_5$s may be bonded to each other to thereby form a ring and that when one or two of three $R_5$s are a hydrogen atom, at least one of the rest of $R_5$s represents an aryl group, an alkenyl group or an alkynyl group.

2. The composition according to claim 1, further comprising a hydrophobic resin.

3. The composition according to claim 1, wherein the resin further contains any of the repeating units of general formulae (I) and (II) below:

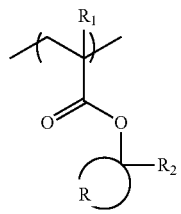  (I)

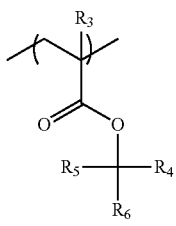  (II)

in which each of $R_1$ and $R_3$ independently represents a hydrogen atom, an optionally substituted methyl group or any of the groups of the formula —$CH_2$—$R_9$ in which $R_9$ represents a monovalent organic group;

each of $R_2$, $R_4$, $R_5$ and $R_6$ independently represents an alkyl group or a cycloalkyl group; and R represents an atomic group required for forming an alicyclic structure in cooperation with a carbon atom.

4. An actinic-ray- or radiation-sensitive resin composition, comprising:

a resin containing a repeating unit containing a group that is decomposed when acted on by an acid to thereby produce an alcoholic hydroxyl group, and a compound that generates an acid of pKa≥−1.5 when exposed to actinic rays or radiation, wherein the group that is decomposed when acted on by an acid to thereby produce an alcoholic hydroxyl group is expressed by at least one selected from the group consisting of general formulae (II-1) to (II-4) below, and the acid of pka≥−1.5 generated by the compound is expressed by any one of general formulae (B-2) and (B-3) below,

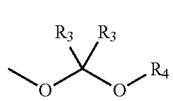  (II-1)

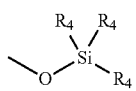  (II-2)

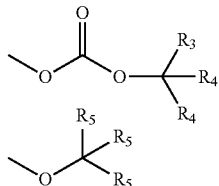  (II-3)

  (II-4)

in which $R_3$, or each of $R_3$s independently, represents a hydrogen atom or a monovalent organic group, provided that two $R_3$s may be bonded to each other to thereby form a ring;

$R_4$, or each of $R_4$s independently, represents a monovalent organic group, provided that at least two $R_4$s may be bonded to each other to thereby form a ring and that $R_3$ and $R_4$ may be bonded to each other to thereby form a ring; and each of $R_5$s independently represents a hydrogen atom, an alkyl group, a cycloalkyl group, an aryl group, an alkenyl group or an alkynyl group, provided that at least two $R_5$s may be bonded to each other to thereby form a ring and that when one or two of three $R_5$s are a hydrogen atom, at least one of the rest of $R_5$s represents an aryl group, an alkenyl group or an alkynyl group,

  (B-2)

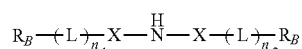  (B-3)

in which $R_B$, or each of $R_B$s independently, represents a monovalent organic group, provided that in general formula (B-3), two $R_B$s may be bonded to each other to thereby form a ring;

each of X's independently represents —CO—, —SO2- or —SO—;

L, or each of L's independently, represents a bivalent connecting group; and each of $n_1$ and $n_2$ independently is 0 or 1; and wherein the resin contains no fluorine atom.

5. The composition according to claim 4, wherein the resin further contains any of the repeating units of general formulae (I) and (II) below:

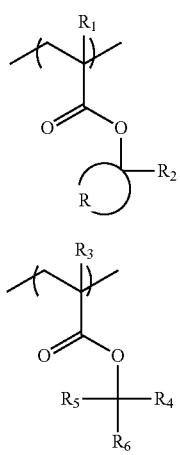

in which each of $R_1$ and $R_3$ independently represents a hydrogen atom, an optionally substituted methyl group or any of the groups of the formula —CH$_2$—R$_9$ in which R$_9$ represents a monovalent organic group;

each of $R_2$, $R_4$, $R_5$ and $R_6$ independently represents an alkyl group or a cycloalkyl group; and R represents an atomic group required for forming an alicyclic structure in cooperation with a carbon atom.

6. An actinic-ray- or radiation-sensitive resin composition, comprising:

a resin containing a repeating unit containing a group that is decomposed when acted on by an acid to thereby produce an alcoholic hydroxyl group, and a compound that generates an acid of pKa≥-1.5 when exposed to actinic rays or radiation, wherein the group that is decomposed when acted on by an acid to thereby produce an alcoholic hydroxyl group is expressed by at least one selected from the group consisting of general formulae (II-1), (II-2) and (II-4) below, the acid of pka≥-1.5 generated by the compound is at least one member selected from the group consisting of a carboxylic acid, an imidic acid, and a methide acid, and the resin contains no fluorine atom,

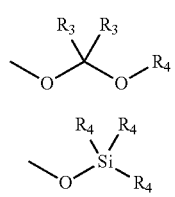

(II-1)

(II-2)

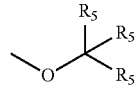

(II-4)

in which $R_3$, or each of $R_3$s independently, represents a hydrogen atom or a monovalent organic group, provided that two $R_3$s may be bonded to each other to thereby form a ring;

$R_4$, or each of $R_4$s independently, represents a monovalent organic group, provided that at least two $R_4$s may be bonded to each other to thereby form a ring and that $R_3$ and $R_4$ may be bonded to each other to thereby form a ring; and each of $R_5$s independently represents a hydrogen atom, an alkyl group, a cycloalkyl group, an aryl group, an alkenyl group or an alkynyl group, provided that at least two $R_5$s may be bonded to each other to thereby form a ring and that when one or two of three $R_5$s are a hydrogen atom, at least one of the rest of $R_5$s represents an aryl group, an alkenyl group or an alkynyl group.

7. The composition according to claim 6, wherein the acid generated by the compound is expressed by any one of general formulae (B-2) to (B-3) below:

$$R_B-\text{COOH} \quad (B\text{-}2)$$

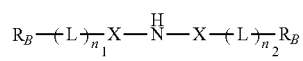

(B-3)

in which $R_B$, or each of $R_B$s independently, represents a monovalent organic group, provided that in general formula (B-3), two $R_B$s may be bonded to each other to thereby form a ring;

each of X's independently represents —CO—, —SO$_2$— or —SO—;

L, or each of L's independently, represents a bivalent connecting group;

and each of $n_1$ and $n_2$ independently is 0 or 1.

8. The composition according to claim 6, further comprising a hydrophobic resin.

9. An actinic-ray- or radiation-sensitive resin composition, comprising:

a resin (a) containing a repeating unit containing a group that is decomposed when acted on by an acid to thereby produce an alcoholic hydroxyl group, a compound that generates an acid of pKa≥-1.5 when exposed to actinic rays or radiation, and a hydrophobic resin (HR), wherein the group that is decomposed when acted on by an acid to thereby produce an alcoholic hydroxyl group is expressed by at least one selected from the group consisting of general formulae (II-1), (II-2) and (II-4) below, and the resin (a) contains no fluorine atom,

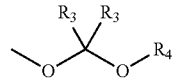

(II-1)

-continued

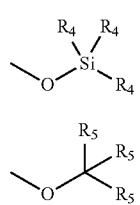

(II-2)

(II-4)

in which

R$_3$, or each of R$_3$s independently, represents a hydrogen atom or a monovalent organic group, provided that two R$_3$s may be bonded to each other to thereby form a ring;

R$_4$, or each of R$_4$s independently, represents a monovalent organic group, provided that at least two R$_4$s may be bonded to each other to thereby form a ring and that R$_3$ and R$_4$ may be bonded to each other to thereby form a ring; and each of R$_5$s independently represents a hydrogen atom, an alkyl group, a cycloalkyl group, an aryl group, an alkenyl group or an alkynyl group, provided that at least two R$_5$s may be bonded to each other to thereby form a ring and that when one or two of three R$_5$s are a hydrogen atom, at least one of the rest of R$_5$s represents an aryl group, an alkenyl group or an alkynyl group.

\* \* \* \* \*